(12) United States Patent
Yajima

(10) Patent No.: US 11,444,605 B2
(45) Date of Patent: Sep. 13, 2022

(54) SPIKE GENERATION CIRCUIT, INFORMATION PROCESSING CIRCUIT, POWER CONVERSION CIRCUIT, DETECTOR, AND ELECTRONIC CIRCUIT

(71) Applicant: JAPAN SCIENCE AND TECHNOLOGY AGENCY, Kawaguchi (JP)

(72) Inventor: Takeaki Yajima, Tokyo (JP)

(73) Assignee: JAPAN SCIENCE AND TECHNOLOGY AGENCY, Kawaguchi (JP)

( * ) Notice: Subject to any disclaimer, the term of this patent is extended or adjusted under 35 U.S.C. 154(b) by 0 days.

(21) Appl. No.: 17/408,599

(22) Filed: Aug. 23, 2021

(65) Prior Publication Data

US 2022/0014179 A1    Jan. 13, 2022

Related U.S. Application Data

(63) Continuation of application No. PCT/JP2020/006045, filed on Feb. 17, 2020.

(30) Foreign Application Priority Data

Feb. 28, 2019   (JP) .............................. JP2019-036951

(51) Int. Cl.
*H03K 3/00* (2006.01)
*H03K 3/02* (2006.01)
(Continued)

(52) U.S. Cl.
CPC ................. *H03K 3/02* (2013.01); *H03K 5/01* (2013.01); *H03K 19/20* (2013.01); *H03K 2005/00013* (2013.01)

(58) Field of Classification Search
CPC ............ H03K 3/02; H03K 5/01; H03K 19/20; H03K 2005/00013
(Continued)

(56) References Cited

U.S. PATENT DOCUMENTS 5,812,001 A    9/1998  Imamiya
6,242,988 B1 *  6/2001  Sarpeshkar .......... G06N 3/0635
                                                  331/111
(Continued)

FOREIGN PATENT DOCUMENTS

JP         8-242148 A    9/1996
JP         9-50051 A    2/1997
(Continued)

OTHER PUBLICATIONS

International Search Report dated Apr. 14, 2020, issued in counterpart application No. PCT/JP2020/006045 (6 pages).

*Primary Examiner* — Ryan Jager
(74) *Attorney, Agent, or Firm* — WHDA, LLP

(57) ABSTRACT

A spike generation circuit includes a first CMOS inverter connected between a first power supply and a second power supply, an output node of the first CMOS inverter being coupled to a first node that is an intermediate node coupled to an input terminal to which an input signal is input, a switch connected in series with the first CMOS inverter, between the first power supply and the second power supply, a first inverting circuit that outputs an inversion signal of a signal of the first node to a control terminal of the switch, and a delay circuit that delays the signal of the first node, outputs a delayed signal to an input node of the first CMOS inverter, and outputs an isolated output spike signal to an output terminal.

38 Claims, 86 Drawing Sheets

(51) Int. Cl.
*H03K 5/01* (2006.01)
*H03K 19/20* (2006.01)
*H03K 5/00* (2006.01)

(58) Field of Classification Search
USPC .......................................................... 327/261
See application file for complete search history.

(56) References Cited

U.S. PATENT DOCUMENTS

| | | | | |
|---|---|---|---|---|
| 8,975,935 | B1* | 3/2015 | Yung | G06N 3/049 327/263 |
| 8,996,431 | B2* | 3/2015 | Cruz-Albrecht | G06N 3/049 706/15 |
| 2013/0024409 | A1* | 1/2013 | Hunzinger | G06N 3/049 706/25 |
| 2014/0032460 | A1 | 1/2014 | Cruz-Albrecht et al. | |
| 2016/0032460 | A1* | 2/2016 | Schmiege | H01J 37/32009 428/457 |
| 2016/0364643 | A1* | 12/2016 | Cruz-Albrecht | G06N 3/063 |
| 2019/0318232 | A1* | 10/2019 | Cruz-Albrecht | G06N 3/0635 |
| 2019/0378002 | A1 | 12/2019 | Yajima et al. | |

FOREIGN PATENT DOCUMENTS

| | | |
|---|---|---|
| JP | 10-341588 A | 12/1998 |
| JP | 2000-106521 A | 4/2000 |
| JP | 2001-148619 A | 5/2001 |
| JP | 2002-100961 A | 4/2002 |
| JP | 2006-243877 A | 9/2006 |
| JP | 2012-044265 A | 3/2012 |
| JP | 2014-523592 A | 9/2014 |
| JP | 2019-022047 A | 2/2019 |
| WO | 2011/030848 A1 | 3/2011 |
| WO | 2018/100790 A1 | 6/2018 |

* cited by examiner

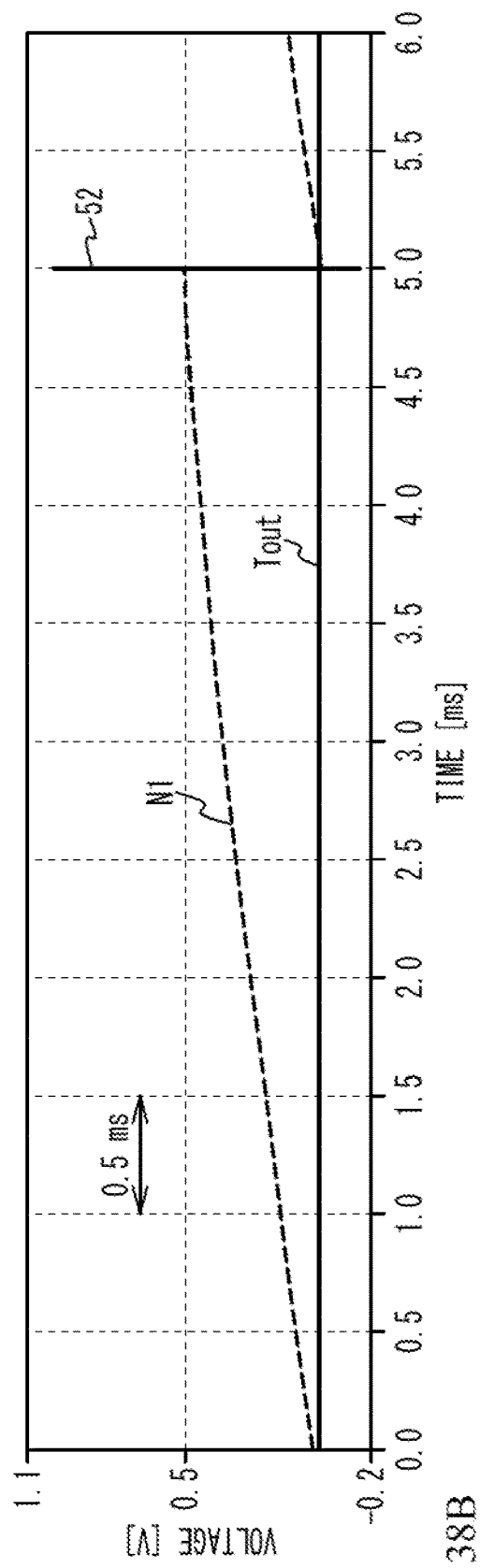
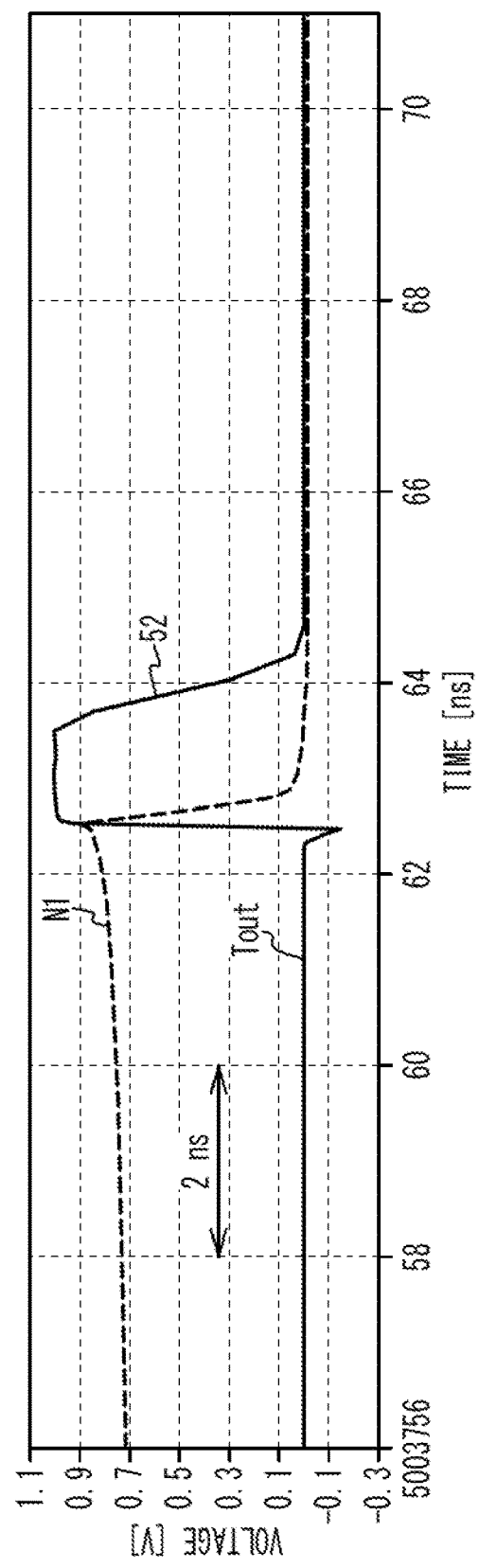
FIG. 38A
FIG. 38B

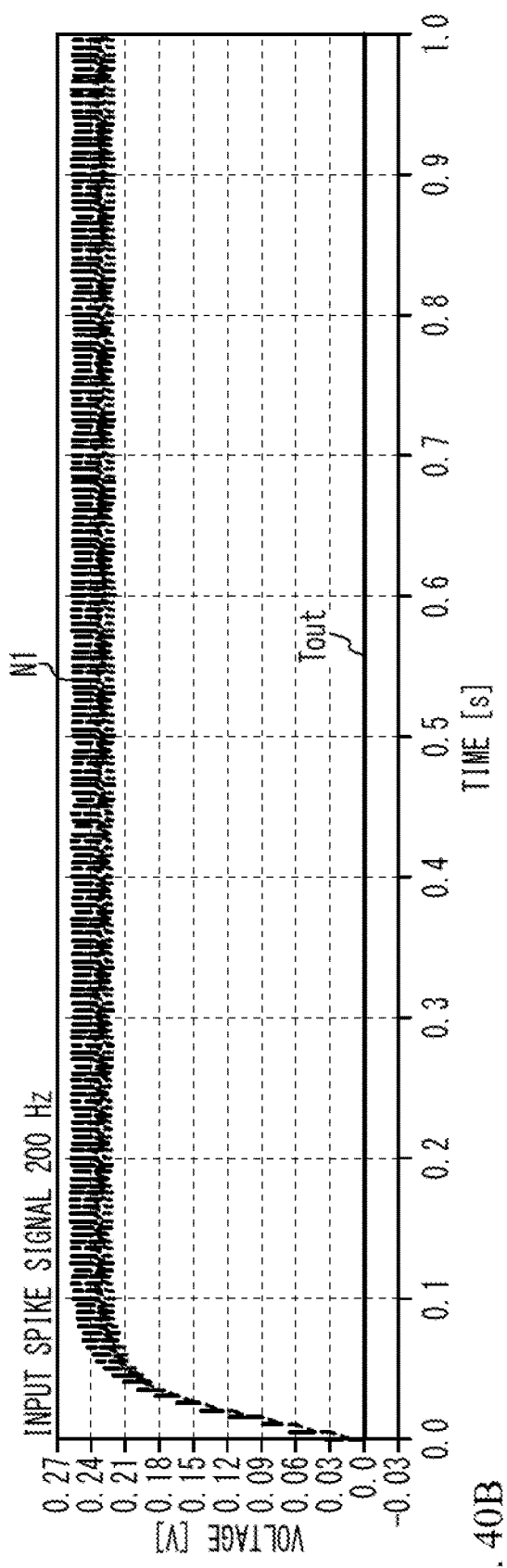
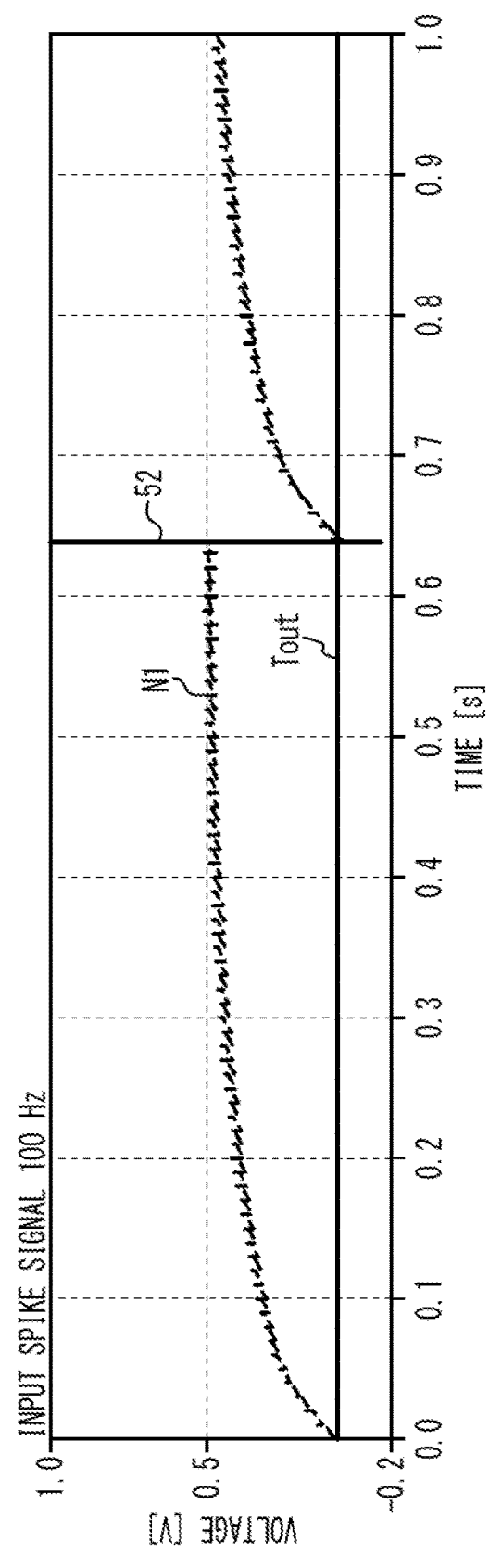
FIG. 40A
FIG. 40B

SPIKE GENERATION CIRCUIT, INFORMATION PROCESSING CIRCUIT, POWER CONVERSION CIRCUIT, DETECTOR, AND ELECTRONIC CIRCUIT

CROSS-REFERENCE TO RELATED APPLICATION

This application is based upon and claims the benefit of priority of the prior International Patent Application No. PCT/JP2020/006045, filed on Feb. 17, 2020, which claims the benefit of priority of Japanese Patent Application No. 2019-036951 filed on Feb. 28, 2019, the entire contents of which are incorporated herein by reference.

TECHNICAL FIELD

A certain aspect of embodiments described herein relates to a spike generation circuit, an information processing circuit, a power conversion circuit, a detector, and an electronic circuit.

BACKGROUND ART

Spike generator circuits such as neuron circuits used in neural networks have been known as disclosed in, for example, Japanese Patent Application Publication Nos. 2001-148619 and 2006-243877 and International Publication No. 2018/100790. Circuits in which a plurality of inverters are connected in multiple stages have been known as disclosed in, for example, Japanese Patent Application Publication Nos. 2012-44265, H8-242148, 2000-106521.

SUMMARY

According to an aspect of the present disclosure, there is provided a spike generation circuit including: a first CMOS inverter connected between a first power supply and a second power supply, an output node of the first CMOS inverter being coupled to a first node that is an intermediate node coupled to an input terminal to which an input signal is input; a switch connected in series with the first CMOS inverter, between the first power supply and the second power supply; a first inverting circuit that outputs an inversion signal of a signal of the first node to a control terminal of the switch; and a delay circuit that delays the signal of the first node, outputs a delayed signal to an input node of the first CMOS inverter, and outputs an isolated output spike signal to an output terminal.

In the above configuration, the first inverting circuit may be configured to output the inversion signal of the signal of the first node to the control terminal of the switch and a second node, and the delay circuit may include the first inverting circuit, and a second inverting circuit configured to output an inversion signal of a signal of the second node to the input node of the first CMOS inverter and a third node coupled to the output terminal.

In the above configuration, the first inverting circuit may include an odd number of second CMOS inverters connected in a single stage or multiple stages between the first node and the second node, input nodes of the odd number of second CMOS inverters being coupled to the first node, output nodes of the odd number of second CMOS inverters being coupled to the second node, and the second inverting circuit may include an odd number of third CMOS inverters connected in a single stage or multiple stages between the second node and the third node, input nodes of the odd number of third CMOS inverters being coupled to the second node, output nodes of the odd number of third CMOS inverters being coupled to the third node.

In the above configuration, the second inverting circuit may include three or more third CMOS inverters.

In the above configuration, a first capacitance element having a first end coupled to a fourth node and a second end coupled to a first reference potential terminal, the fourth node being between the three or more third CMOS inverters may be provided.

In the above configuration, a capacitance value of the first capacitance element may be equal to or greater than a gate capacitance value of one FET in the three or more third CMOS inverters.

In the above configuration, a second capacitance element having a first end coupled to the first node and a second end coupled to a second reference potential terminal may be provided.

According to another aspect of the present disclosure, there is provided a spike generation circuit including: a first CMOS inverter connected between a first power supply and a second power supply, an output node of the first CMOS inverter being coupled to a first node; a first switch connected in series with the first CMOS inverter, between the first power supply and the second power supply; an inverting circuit that outputs an inversion signal of a signal of the first node to a control terminal of the first switch; a delay circuit that delays the signal of the first node, outputs a delayed signal to an input node of the first CMOS inverter, and outputs an output spike signal to an output terminal; and an intermediate node provided in the inverting circuit and coupled to an input terminal to which an input signal is input.

In the above configuration, the first CMOS inverter may be configured to output a first level, which is one of a high level and a low level, and outputs a second level, which is the other of the high level and the low level, the first switch may be configured to be turned on when the first level is input to a control terminal, and turned off when the second level is input to the control terminal, the inverting circuit may include a first inverting circuit and a second inverting circuit, the first inverting circuit being configured to output the first level to the control terminal of the first switch when the first node changes from the first level to the second level, the second inverting circuit being configured to output the second level to the control terminal of the first switch when an output of the delay circuit becomes the second level, and the intermediate node may be provided in the second inverting circuit.

In the above configuration, the second inverting circuit may include a second switch that has a control terminal coupled to an output of the delay circuit and connects the intermediate node to a power supply, to which an initial level of the input signal is supplied, when the delay circuit outputs the second level.

In the above configuration, a second CMOS inverter having an input node coupled to the intermediate node and an output node coupled to the control terminal of the first switch may be provided.

In the above configuration, the first inverting circuit may include a third switch that has a control terminal coupled to the first node and connects the control terminal of the first switch to a power supply, to which the first level is supplied, when the first node becomes at the second level.

In the above configuration, a fourth switch that has a control terminal coupled to the control terminal of the first switch and connects the first node to a power supply, to which the first level is supplied, when the control terminal of the first switch is at the second level may be provided.

In the above configuration, a voltage of the second power supply may be higher than a voltage of the first power supply, and the switch may be an N-channel transistor and may be connected between the first node and the first power supply, or the switch may be a P-channel transistor and may be connected between the first node and the second power supply.

In the above configuration, a voltage conversion circuit that outputs, to the intermediate node, a signal obtained by converting a voltage of the input signal may be provided, and the delay circuit may be configured not to output the output spike signal when the voltage of the input signal is within a predetermined range.

In the above configuration, a time constant circuit that increases a time constant of a rise of the input signal, and outputs a resulting signal to the intermediate node may be provided, and the delay circuit may be configured to output the output spike signal after a delay time relating to a time constant of the time constant circuit after the input signal is input.

In the above configuration, an input circuit that increases or decreases a voltage of the intermediate node when an input spike signal is input as the input signal may be provided, and the delay circuit may be configured to output the output spike signal when a frequency with which the input spike signal is input becomes within a predetermined range.

In the above configuration, an input circuit that varies a voltage of the intermediate node according to an amount of change in the input signal with respect to time may be provided, and the delay circuit may be configured to output the output spike signal when the amount of change in the input signal with respect to time becomes within a predetermined range.

According to another aspect of the present disclosure, there is provided an information processing circuit including: the above spike generation circuit; a condition setting circuit that processes an input signal and outputs a processed signal to the spike generation circuit to set a condition for the spike generation circuit to output the output spike signal; and a spike processing circuit that processes the output spike signal output by the spike generation circuit.

According to another aspect of the present disclosure, there is provided a power conversion circuit including: a switch element; and a control circuit that includes the above spike generation circuit, and controls on and off of the switch element.

According to another aspect of the present disclosure, there is provided a spike generation circuit including: a time constant circuit that increases a time constant of a rise of an input signal input to an input terminal, and outputs a resulting signal to an intermediate node from an output node; and an output circuit that outputs an isolated output spike signal to an output terminal and resets a voltage of the intermediate node in response to a voltage of the intermediate node becoming a threshold voltage, wherein the output circuit outputs the output spike signal after a delay time relating to a time constant of the time constant circuit after the input signal is input.

In the above configuration, the time constant circuit may include: a capacitor having a first end coupled to the output node and a second end coupled to a first reference potential terminal, and a constant current element or constant current circuit that has a first end coupled to the input terminal and a second end coupled to the output node, and generates a constant current corresponding to a voltage difference between the first end and the second end.

In the above configuration, the constant current circuit may be a current mirror circuit including: a first transistor having a current input terminal and a current output terminal, one of the current input terminal and the current output terminal being coupled to the input terminal, the other of the current input terminal and the current output terminal being coupled to the output node, and a second transistor having a control terminal, a current input terminal, and a current output terminal, the control terminal being coupled to a control terminal of the first transistor, one of the current input terminal and the current output terminal being coupled to the input terminal through a first diode connected in a forward direction, the other of the current input terminal and the current output terminal being coupled to a second reference potential terminal through a second diode connected in a backward direction.

In the above configuration, the constant current element may be a diode connected in a backward direction or a transistor having a control terminal to which a voltage is applied so that the transistor is in an on-state.

According to another aspect of the present disclosure, there is provided a spike generation circuit including: a voltage conversion circuit that outputs, to an intermediate node, a signal obtained by converting a voltage of an input signal input to an input terminal; and an output circuit that outputs an isolated output spike signal to an output terminal and resets a voltage of the intermediate node in response to the voltage of the intermediate node becoming a threshold voltage, wherein the output circuit does not output the output spike signal when the voltage of the input signal is within a predetermined range.

In the above configuration, a capacitor having a first end coupled to the intermediate node and a second end coupled to a first reference potential terminal may be provided, and the voltage conversion circuit may include: a first element and a second element connected in series between the input terminal and a second reference potential terminal, and a resistance element having a first end coupled to a node, which is between the first element and the second element, and a second end coupled to the intermediate node.

In the above configuration, a product of a resistance value of the resistor and a capacitance value of the capacitor may be greater than a width of the output spike signal.

According to another aspect of the present disclosure, there is provided a spike generation circuit including: an input circuit that increases a voltage of an intermediate node by an amount corresponding to an input spike signal when the input spike signal is input to an input terminal, and/or decreases the voltage of the intermediate node by the amount corresponding to the input spike signal when the input spike signal is input to the input terminal; and an output circuit that outputs an isolated output spike signal to an output terminal and resets the voltage of the intermediate node in response to the voltage of the intermediate node becoming a threshold voltage, wherein the output circuit outputs the output spike signal when a frequency with which the input spike signal is input becomes within a predetermined range, and wherein the voltage of the intermediate node gradually decreases or increases over a time period longer than a width of the input spike signal during a time period when the input spike signal is not input to the input terminal.

According to another aspect of the present disclosure, there is provided a spike generation circuit including: an input circuit that increases a voltage of an intermediate node by an amount corresponding to an input spike signal when the input spike signal is input to at least one of input terminals, and/or decreases the voltage of the intermediate node by the amount corresponding to a height of the input spike signal when the input spike signal is input to at least one of the input terminals; and an output circuit that outputs an isolated output spike signal to an output terminal and resets the voltage of the intermediate node in response to the voltage of the intermediate node becoming a threshold voltage, wherein the output circuit outputs the output spike signal when times at which the input spike signal is input to at least two of the input terminals is within a certain time period, and gradually decreases or increases the voltage of the intermediate node over a time period longer than a width of the input spike signal during a time period when no input spike signal is input to the input terminals.

According to another aspect of the present disclosure, there is provided a spike generation circuit including: an input circuit that varies a voltage of an intermediate node according to an amount of change in an input signal input to an input terminal with respect to time; and an output circuit that outputs an isolated output spike signal to an output terminal and resets the voltage of the intermediate node in response to the voltage of the intermediate node becoming a threshold voltage, wherein the output circuit outputs the output spike signal when the amount of change in the input signal with respect to time becomes within a predetermine range.

BRIEF DESCRIPTION OF THE DRAWINGS

FIG. 38A and FIG. 38B illustrate the voltage of the node N1 and the output voltage with respect to time in the variation 3 of the fifth embodiment;

FIG. 40A and FIG. 40B illustrate the voltage of the node N1 and the output voltage with respect to time in the variation 4 of the fifth embodiment;

MODES FOR CARRYING OUT THE INVENTION

Spike generator circuits such as neuron circuits are required to reduce their power consumption.

Embodiments of the present disclosure are made in view of above problems, and the objective thereof is to reduce the power consumption.

Hereinafter, with reference to the accompanying drawings, a description will be given of embodiments of the present invention.

First Embodiment

Figure 1A:
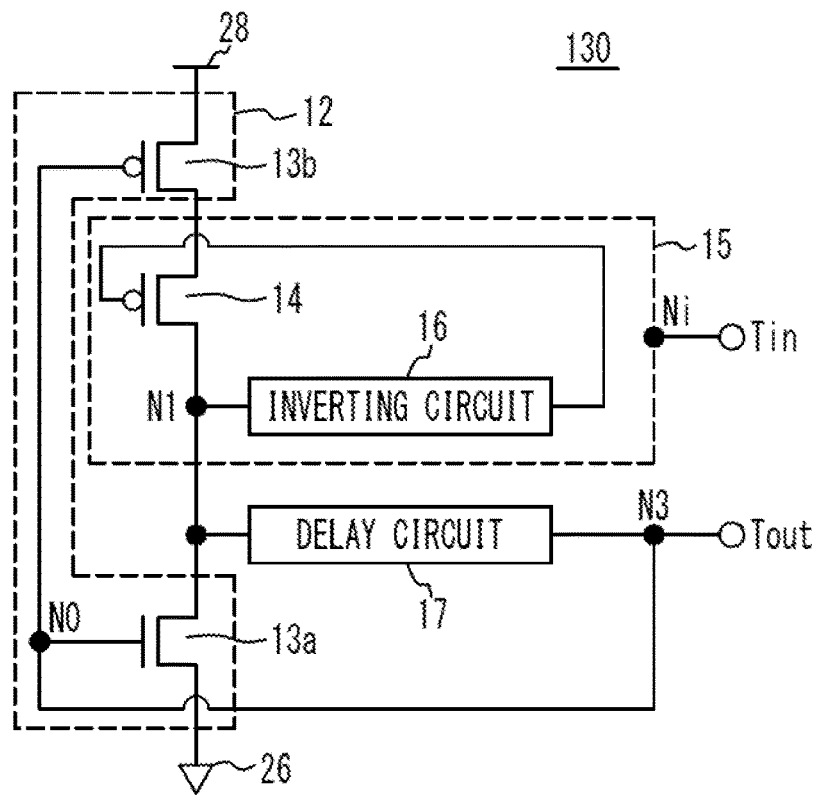
FIG. 1A and FIG. 1B are circuit diagrams of spike generation circuits in accordance with a first embodiment and a variation 1 thereof, respectively.
Figure 1B:
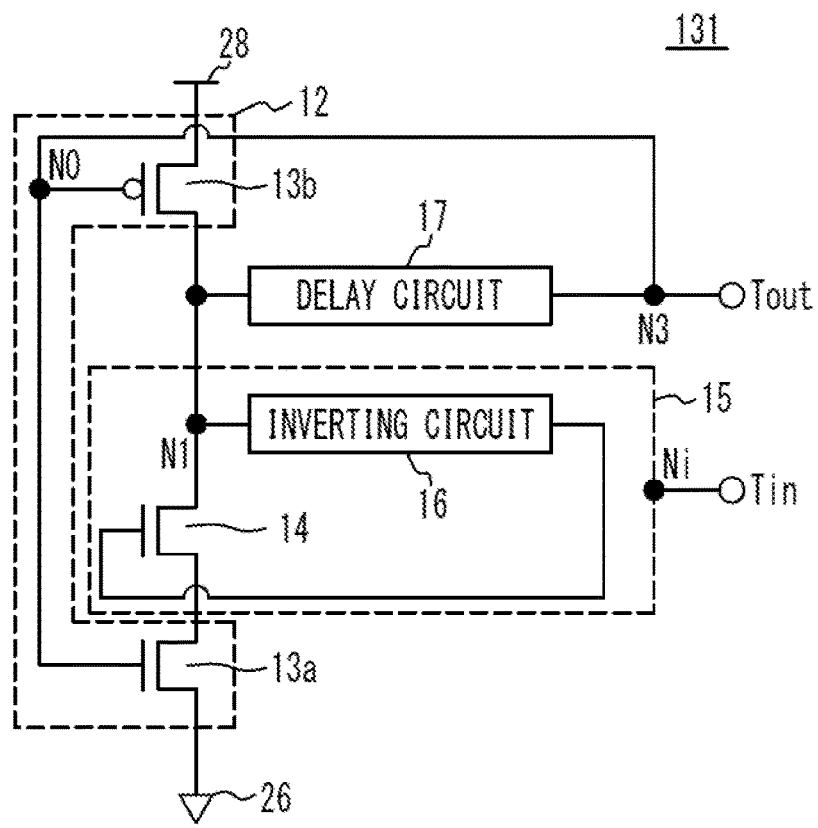

FIG. 1A and FIG. 1B are circuit diagrams of spike generation circuits in accordance with a first embodiment and a variation 1 thereof, respectively. As illustrated in FIG. 1A, a spike generation circuit 130 of the first embodiment includes an inverter 12, a field effect transistor (FET) 14, an inverting circuit 16, and a delay circuit 17. The inverter 12 is a complementary metal oxide semiconductor (CMOS) inverter, and includes an N-channel FET (NFET) 13a, and a P-channel FET (PFET) 13b.

The source of the NFET 13a is coupled to a ground line 26, the drain is coupled to a node N1, and the gate is coupled to a node N0. The source of the PFET 13b is coupled to a power line 28, the drain is coupled to the node N1, and the gate is coupled to the node N0. The node N0 is the input node of the inverter 12, and the node N1 is the output node of the inverter 12. The FET 14 is a PFET, and is connected in series with the PFET 13b between the node N1 and the power line 28. The source of the FET 14 is coupled to the power line 28 through the PFET 13b, and the drain is coupled to the node N1.

The inverting circuit 16 inverts the level of the node N1, and outputs the inverted level to the gate of the FET 14. The delay circuit 17 delays the level of the node N1, and outputs the delayed level to a node N3. The node N3 is coupled to the input node N0 of the inverter 12 and an output terminal Tout. The inverting circuit 16 and the FET 14 form a positive feedback loop 15. An input terminal Tin is coupled to an intermediate node Ni in the positive feedback loop 15. Note that the location of the intermediate node Ni in the positive feedback loop 15 is specifically illustrated in FIG. 2A, FIG. 3A, FIG. 4A, and FIG. 5A.

[Variation 1 of the First Embodiment]

As illustrated in FIG. 1B, in a spike generation circuit 131 of the variation 1 of the first embodiment, the FET 14 is an NFET, and is connected in series with the NFET 13a between the node N1 and the ground line 26. The source of the FET 14 is coupled to the ground line 26 through the NFET 13a, and the drain is coupled to the node N1. Other configurations are the same as those of the first embodiment, and the description thereof is thus omitted.

A description will be given of a variation 2 of the first embodiment where the intermediate node Ni, to which the input terminal Tin is coupled, in the first embodiment is the node N1, and a variation 3 of the first embodiment where the intermediate node Ni in the first embodiment is provided in the inverting circuit 16.

[Variation 2 of the First Embodiment]

Figure 2A:
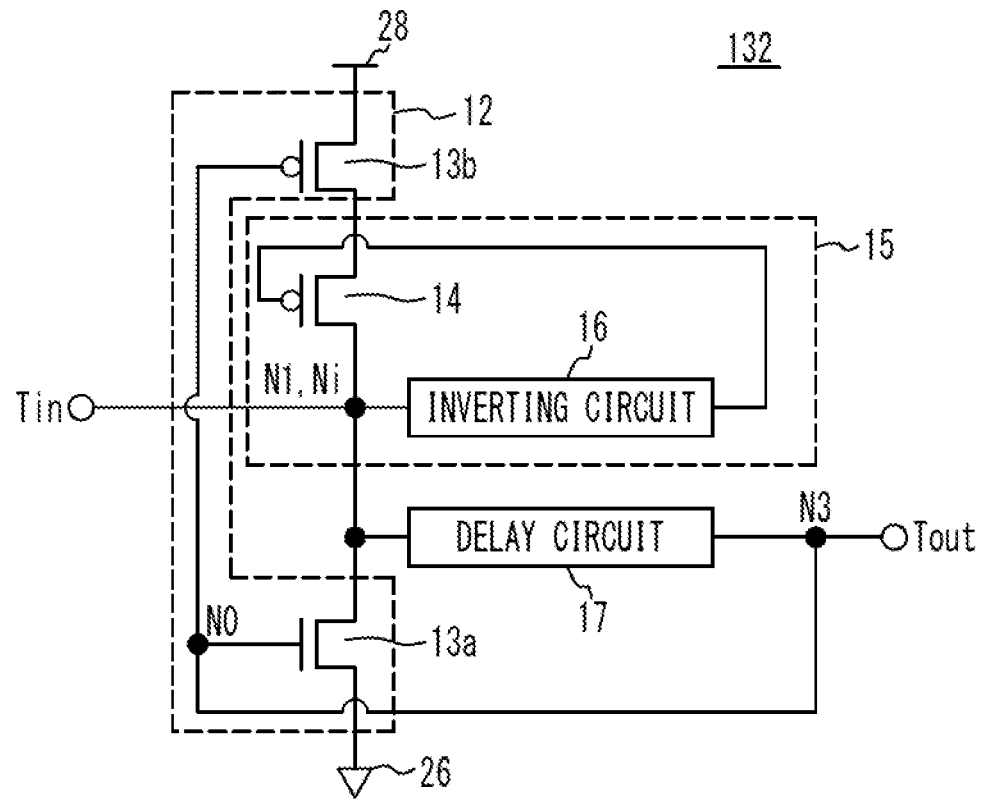
FIG. 2A is a circuit diagram of a spike generation circuit in accordance with a variation 2 of the first embodiment.
Figure 2B:
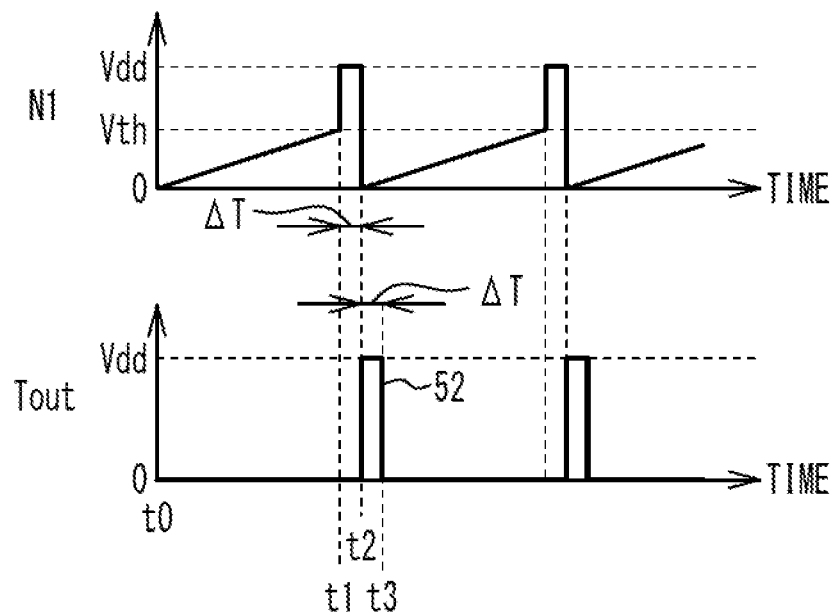
FIG. 2B illustrates respective voltages of a node N1 and an output terminal Tout.

The variation 2 of the first embodiment is an example where the intermediate node Ni in the first embodiment is the node N1. FIG. 2A is a circuit diagram of a spike generation circuit in accordance with the variation 2 of the first embodiment, and FIG. 2B illustrates respective voltages of the node N1 and the output terminal Tout. As illustrated in FIG. 2A, in a spike generation circuit 132, the input terminal Tin is coupled to the nodes N1 and Ni. Therefore, the input signal is input to the node N1. Other configurations are the same as those of the first embodiment, and the description thereof is thus omitted.

Although the order of the description of the circuit operation is back and forth, the circuit operation of the variation 2 of the first embodiment will be described first using FIG. 2B. The case illustrated in FIG. 2B is a case where the voltage of the node N1 increases from 0 V at a constant rate, and the description will be given of this operation. This case corresponds to a case where a constant current is applied to the input terminal Tin. At time to, the voltage of the node N1 is a low level (0 V). The output of the inverting circuit 16 is a high level, and the FET 14 is off. The voltage of the output terminal Tout is the low level (0 V). Since the FET 14 is off, the inverter 12 does not function.

The voltage of the node N1 increases at a constant rate with time. When the voltage of the node N1 is lower than the threshold voltage Vth of the inverting circuit 16, the output of the inverting circuit 16 is the high level, the output of the delay circuit 17 is the low level, and the voltage of the output terminal Tout maintains the low level. As described above, the threshold voltage Vth is set for the inverting circuit 16.

When the voltage of the node N1 reaches the threshold voltage Vth of the inverting circuit 16 at time t1, the inverting circuit 16 outputs the low level. The FET 14 is turned on, and thereby, the inverter 12 is activated. The input node of the inverter 12 is N0, and the output node of the inverter 12 is N1. When the FET 14 is off, the FET 13b and the node N1 are disconnected, and thereby the inverter 12 does not function as the inverter. When the FET 14 is turned on, the FET 13b and the node N1 are connected, and the function as the inverter is obtained. "The function as the inverter is obtained" is referred as "the inverter is activated". Since the voltage of the output terminal Tout is the low level, the inverter 12 changes the voltage of the node N1 to the high level (Vdd).

At time t2 delayed from time t1 by the delay time ΔT of the delay circuit 17, the output of the delay circuit 17 becomes the high level. The FET 13a changes from off to on. The inverter 12 changes the node N1 to the low level. The output of the inverting circuit 16 becomes the high level, and the FET 14 is turned off. The voltage of the node N1 returns to the low level. At time t3 delayed from time t2 by ΔT, the delay circuit 17 changes the voltage of the output terminal Tout to the low level. This causes a spike signal 52 having a pulse width equal to the delay time of the delay circuit 17 to be output from the output terminal Tout. As described above, since the spike signal having a pulse width corresponding to the delay time of the delay circuit 17 has a narrow pulse width, the power consumption can be reduced.

[Variation 3 of the First Embodiment]

Figure 3A:
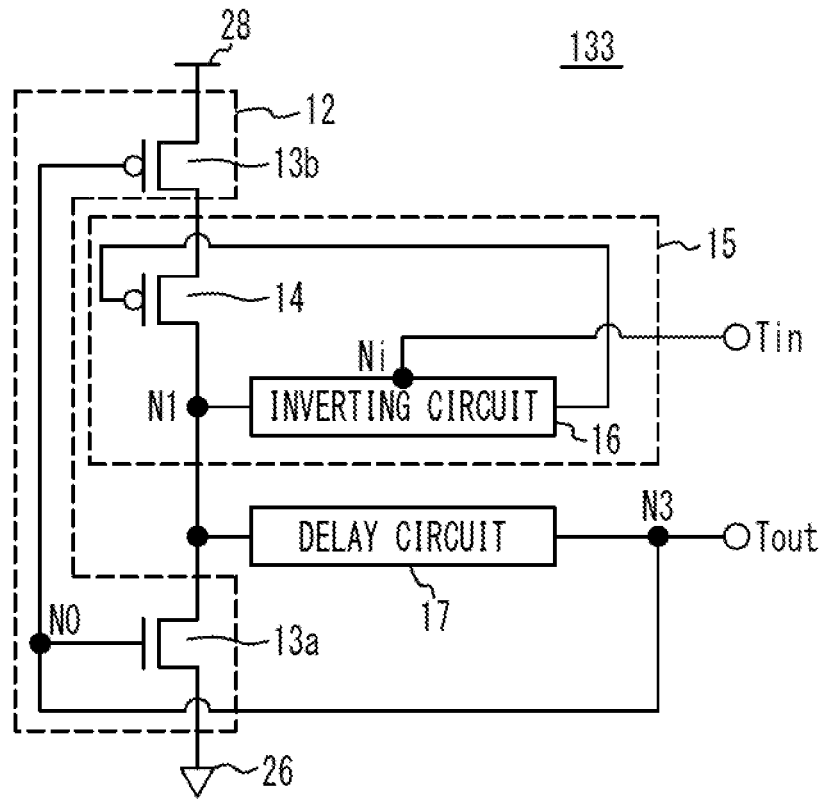
FIG. 3A is a circuit diagram of a spike generation circuit in accordance with a variation 3 of the first embodiment.
Figure 3B:
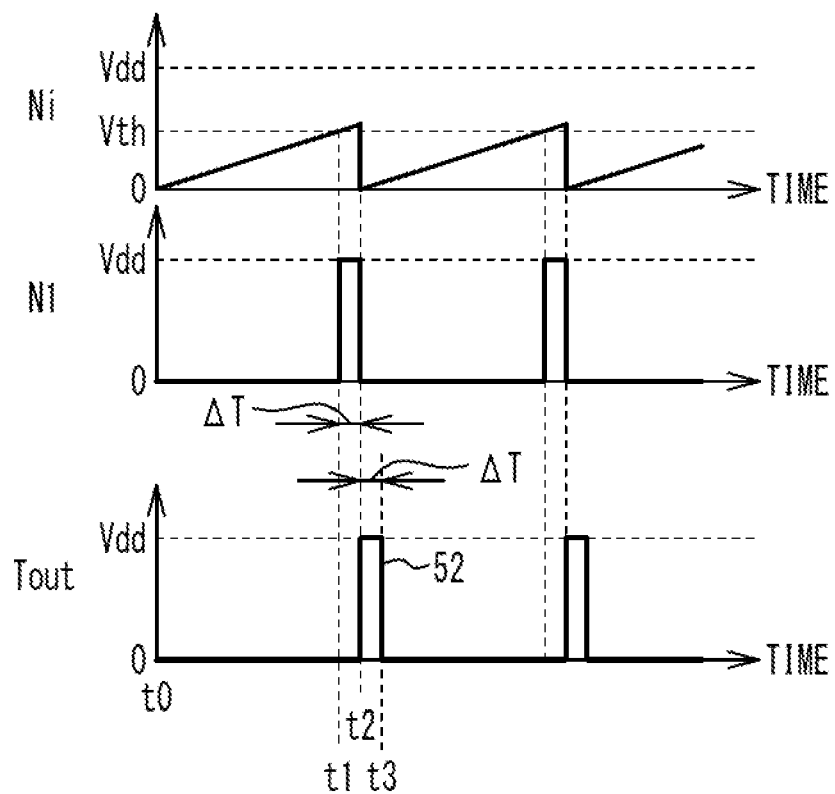
FIG. 3B illustrates respective voltages of nodes Ni and N1 and the output terminal Tout.

The variation 3 of the first embodiment is an example where the intermediate node Ni in the first embodiment is provided in the inverting circuit 16. Examples of the location where the intermediate node Ni is provided will be described in a fourth embodiment and variations thereof. FIG. 3A is a circuit diagram of a spike generation circuit in accordance with the variation 3 of the first embodiment, and FIG. 3B illustrates respective voltages of the nodes Ni and N1 and the output terminal Tout. As illustrated in FIG. 3A, in a spike generation circuit 133, the input terminal Tin is coupled to the intermediate node Ni provided in the inverting circuit 16. Other configurations are the same as those of the first embodiment, and the description thereof is thus omitted.

As illustrated in FIG. 3B, at time t0, the voltage of the node Ni is the low level, and the gate of the FET 14 is at the high level. At time t0, the FET 13a is in an on-state. The FET 14 is off, and the voltage of the node N1 is the low level. The voltage of the output terminal Tout is the low level. The voltage of the node Ni increases at a constant rate with time. When the voltage of the node Ni reaches the threshold voltage Vth at time t1, the gate of the FET 14 becomes at the low level. Since the FET 14 is turned on and the inverter 12 thereby functions, the node N1 becomes at the high level. When the voltage of the output terminal Tout becomes the high level at time t2 delayed from time t1 by the delay time ΔT of the delay circuit 17, the node N1 is changed to the low level by the inverter 12. At time t3, the output terminal Tout becomes at the low level. The operations thereafter are the same as those of the variation 2 of the first embodiment, and the description thereof is thus omitted.

A description will be given of a variation 4 of the first embodiment where the intermediate node Ni, to which the input terminal Tin is coupled, in the variation 1 of the first embodiment is the node N1, and a variation 5 of the first embodiment where the intermediate node Ni in the variation 1 of the first embodiment is provided in the inverting circuit 16.

[Variation 4 of the First Embodiment]

Figure 4A:
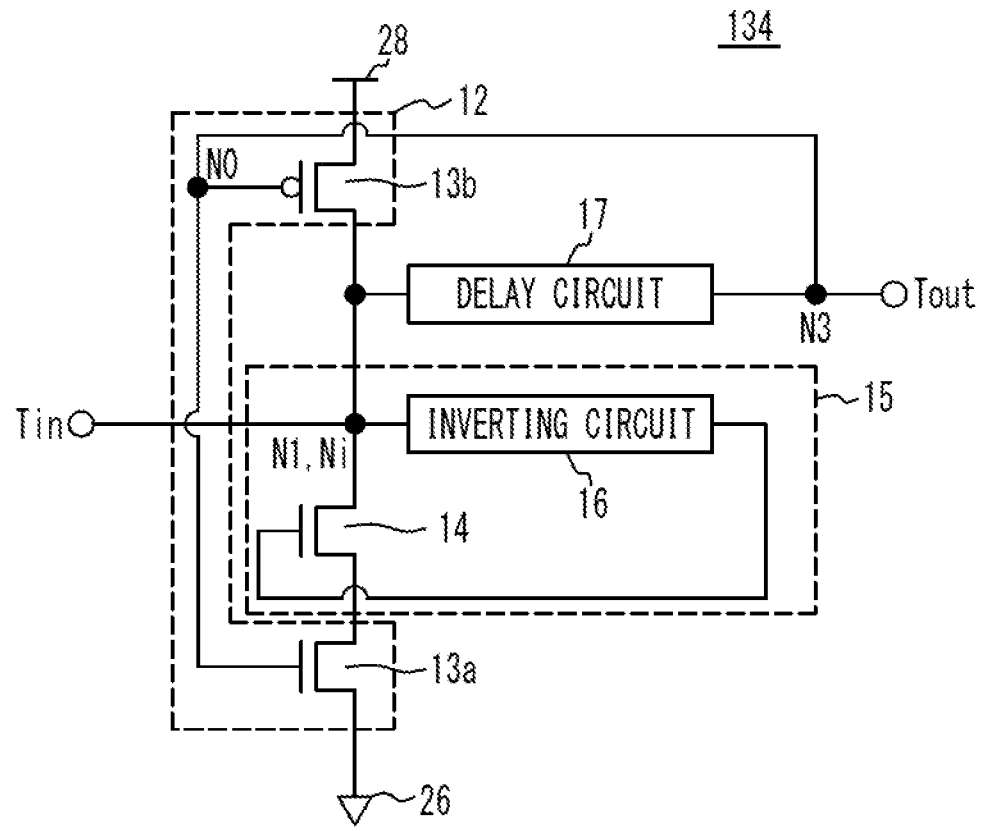
FIG. 4A is a circuit diagram of a spike generation circuit in accordance with a variation 4 of the first embodiment.
Figure 4B:
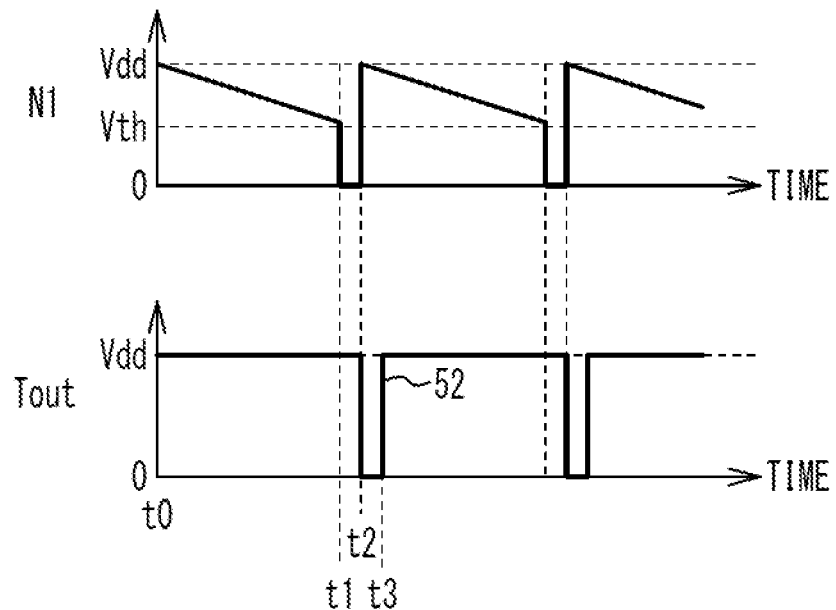
FIG. 4B illustrates respective voltages of the node N1 and the output terminal Tout.

The variation 4 of the first embodiment is an example where the intermediate node Ni in the variation 1 of the first embodiment is the node N1. FIG. 4A is a circuit diagram of a spike generation circuit in accordance with the variation 4 of the first embodiment, and FIG. 4B illustrates respective voltages of the node N1 and the output terminal Tout. As illustrated in FIG. 4A, in a spike generation circuit 134, the input terminal Tin is coupled to the nodes N1 and Ni. Therefore, the input signal is input to the node N1. Other configurations are the same as those of the variation 1 of the first embodiment, and the description thereof is thus omitted.

A case where the voltage of the node N1 decreases from Vdd at a constant rate as illustrated in FIG. 4B will be described. This case corresponds to a case where a constant current is applied to the input terminal Tin when a capacitor is shunt-connected between the input terminal Tin and the intermediate node Ni as illustrated in FIG. 19B of a variation 3 of the third embodiment described later. At time to, the voltage of the node N1 is the high level (Vdd). The output of the inverting circuit 16 is the low level (0 V), and the FET 14 is off. The voltage of the output terminal Tout is the high level. Since the FET 14 is off, the inverter 12 does not function.

The voltage of the node N1 decreases at a constant rate with time. When the voltage of the node N1 is higher than the threshold voltage Vth of the inverting circuit 16, the output of the inverting circuit 16 is the low level, the output of the delay circuit 17 is the high level, and the voltage of the output terminal Tout maintains the high level.

When the voltage of the node N1 reaches the threshold voltage Vth of the inverting circuit 16 at time t1, the inverting circuit 16 outputs the high level. The FET 14 is turned on, and thereby, the inverter 12 is activated. Since the voltage of the output terminal Tout is the high level, the inverter 12 changes the voltage of the node N1 to the low level (0 V).

At time t2, the output of the delay circuit 17 becomes the low level. The inverter 12 changes the node N1 to the high level. The output of the inverting circuit 16 becomes the low level, and the FET 14 is turned off. The voltage of the node N1 returns to the high level. At time t3, the delay circuit 17 changes the voltage of the output terminal Tout to the high level. This causes the spike signal 52 with a width of ΔT to be output from the output terminal Tout.

[Variation 5 of the First Embodiment]

Figure 5A:
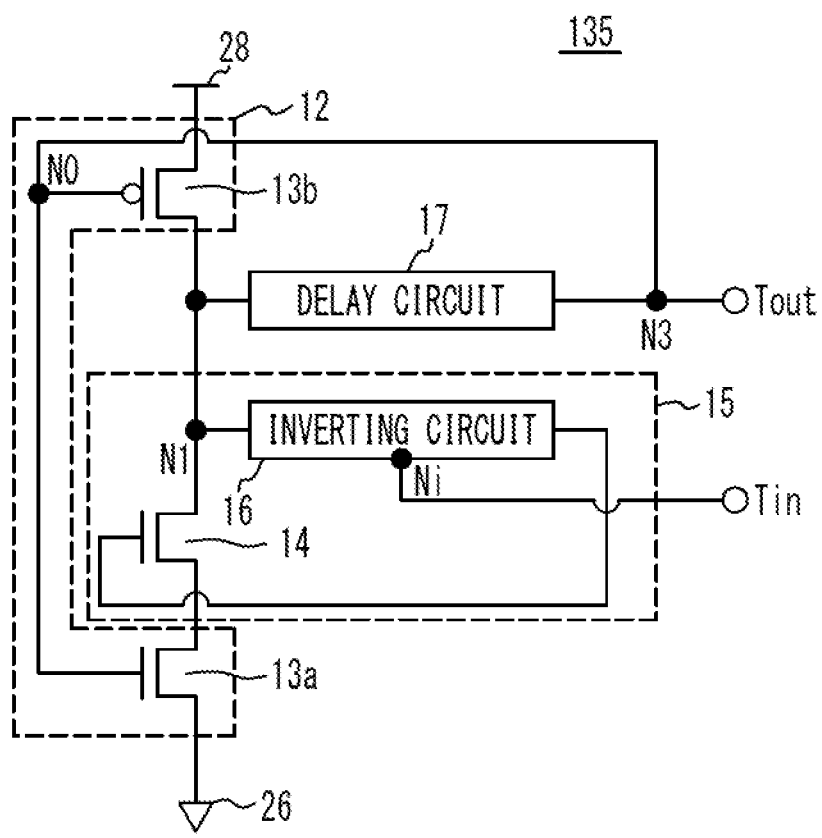
FIG. 5A is a circuit diagram of a spike generation circuit in accordance with a variation 5 of the first embodiment.
Figure 5B:
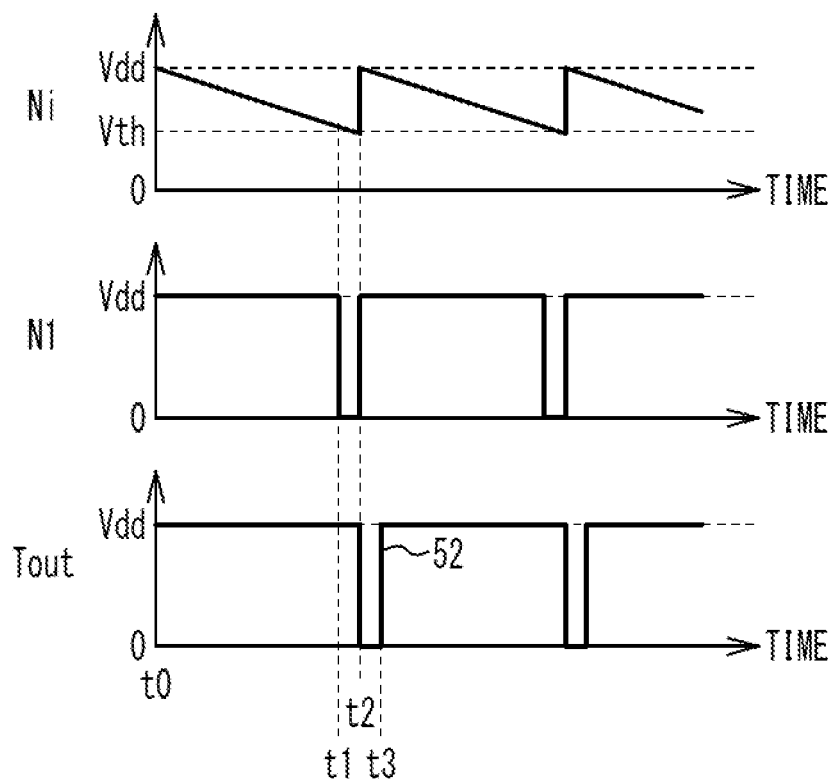
FIG. 5B illustrates respective voltages of the nodes Ni and N1 and the output terminal Tout.

The variation 5 of the first embodiment is an example where the intermediate node Ni in the variation 1 of the first embodiment is provided in the inverting circuit 16. Examples of the location where the intermediate node Ni is provided will be described in the fourth embodiment and the variations thereof. FIG. 5A is a circuit diagram of a spike generation circuit in accordance with the variation 5 of the first embodiment, and FIG. 5B illustrates respective voltages of the nodes Ni and N1 and the output terminal Tout. As illustrated in FIG. 5A, in a spike generation circuit 135, the input terminal Tin is coupled to the inside of the inverting circuit 16. Other configurations are the same as those of the variation 1 of the first embodiment, and the description thereof is thus omitted.

As illustrated in FIG. 5B, when the voltage of the node Ni reaches the threshold voltage Vth at time t1, the inverting circuit 16 outputs the high level. The FET 14 is turned on, and the node N1 becomes at the low level. The operations thereafter are the same as those of the variation 4 of the first embodiment, and the description thereof is thus omitted.

In the first embodiment and the variations thereof, the inverter 12 (a first CMOS inverter) is connected between the ground line 26 and the power line 28 (between a first power supply and a second power supply), and the output node of the inverter 12 is coupled to the node N1 (a first node). The FET 14 (a switch or a first switch) is connected in series with the inverter 12 between the ground line 26 and the power line 28. The inverting circuit 16 (a first inverting circuit) outputs an inversion signal of the signal of the node N1 to the gate (a control terminal) of the FET 14. The delay circuit 17 delays the signal of the node N1 and outputs the delayed signal to the input node of the inverter 12, and outputs the output spike signal 52 to the output terminal Tout.

In such a configuration, the node N1 is the intermediate node Ni coupled to the input terminal Tin to which the input signal is input, in the variations 2 and 4 of the first embodiment. Therefore, as illustrated in FIG. 2B and FIG. 4B, when the voltage of the node N1 exceeds the threshold voltage Vth at time t1, the inverting circuit 16 changes the gate of the FET 14 to the high level (FIG. 2B) or the low level (FIG. 4B). This causes the FET 14 to be turned on, causing the node N1 to be at the high level (FIG. 2B) or at the low level (FIG. 4B). In this manner, positive feedback is applied through the inverting circuit 16.

When the delay circuit 17 outputs the high level (FIG. 2B) or the low level (FIG. 4B) at time t2, the output of the inverter 12 inverts, and the node N1 becomes at the low level (FIG. 2B) or at the high level (FIG. 4B). In this manner, negative feedback is applied through the delay circuit 17.

Therefore, the rise and fall of the spike signal 52 steepen, and the spike signal 52 with a narrow pulse width can be generated. Since the FET 13a or 13b is turned off, the current penetrating from the power line 28 to the ground line 26 is reduced. In addition, since the FET 14 is turned off, the current penetrating to the ground line 26 from the power line 28 can be reduced. This can reduce the power consumption. In the first embodiment and the variations thereof, the inverting circuit 16 and the delay circuit 17 may share each other's components in part or in whole.

In the variations 3 and 5 of the first embodiment, the intermediate node Ni coupled to the input terminal Tin is provided in the inverting circuit 16. This configuration applies positive feedback from the node N1 through the inverting circuit 16 at time t1 as illustrated in FIG. 3B and FIG. 5B. Negative feedback is applied from the node N1 through the delay circuit 17 at time t2. Therefore, the spike signal 52 with a narrow pulse width can be generated, and the power consumption can be reduced.

Second Embodiment

Figure 6A:
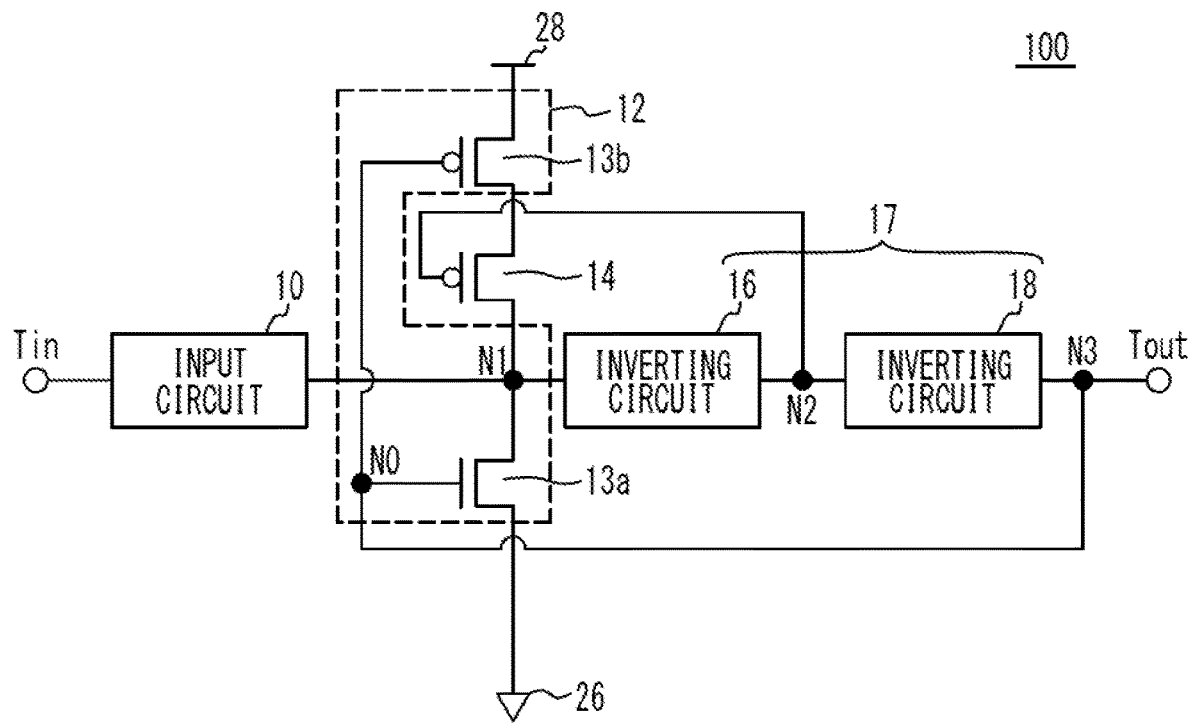
FIG. 6A is a circuit diagram of a spike generation circuit in accordance with a second embodiment.
Figure 6B:
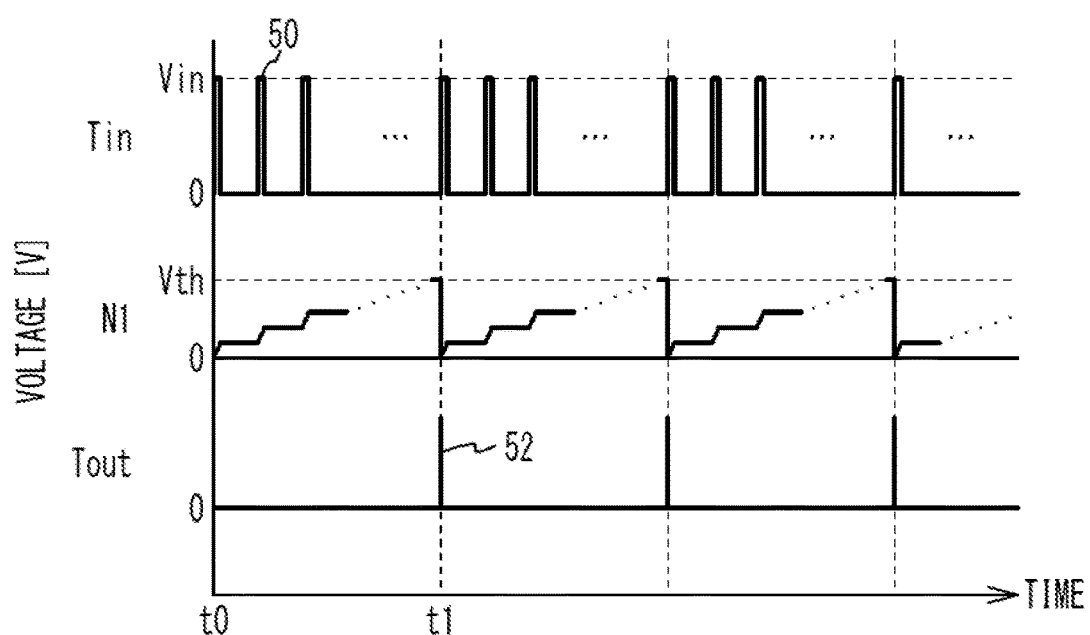
FIG. 6B illustrates voltages with respect to time.

A second embodiment is a specific example of the variations 2 and 4 of the first embodiment, and an exemplary spike generation circuit used in neuron circuits and the like. FIG. 6A is a circuit diagram of a spike generation circuit in accordance with the second embodiment, and FIG. 6B illustrates voltages with respect to time. As illustrated in FIG. 6A, a spike generation circuit 100 of the second embodiment includes an input circuit 10, the inverter 12, the FET 14, and inverting circuits 16 and 18. The inverting circuits 16 and 18 form the delay circuit 17. The input circuit 10 is a circuit that sets conditions for generating a spike signal with respect to the input signal input to the input terminal Tin. The inverter 12 is a CMOS inverter, and includes the NFET 13a and the PFET 13b.

The source of the NFET 13a is coupled to the ground line 26, the drain is coupled to the node N1, and the gate is coupled to the node NO. The source of the PFET 13b is coupled to the power line 28, the drain is coupled to the node N1, and the gate is coupled to the node NO. The nodes NO and N1 are the input node and the output node of the inverter 12, respectively. The FET 14 is a PFET, and is connected in series with the PFET 13b between the node N1 and the power line 28. The source of the FET 14 is coupled to the power line 28 through the PFET 13b, and the drain is coupled to the node N1.

The inverting circuit 16 inverts the level of the node N1, and outputs the inverted level to the gate of the FET 14 and a node N2. The inverting circuit 18 inverts the level of the node N2, and outputs the inverted level to the node N3. The node N3 is coupled to the input node NO of the inverter 12 and the output terminal Tout.

FIG. 6B illustrates respective voltages of the input terminal Tin, the node N1, and the output terminal Tout with respect to time. An integrating circuit that integrates the input signal that has been input to the input terminal Tin and outputs the resulting signal to the node N1 will be described as an example of the input circuit 10.

The respective voltages of the input terminal Tin and the output terminal Tout during a steady state are equal to the voltage (0 V) of the ground line 26. Immediately before time t0, the voltage of the node N1 is 0 V. The node N2 is at the high level, and the node N3 is at the low level. The gate of the FET 14 is at the high level, and the FET 14 is off. Since the input node of the inverter 12 is at the low level and the FET 14 is off, the node N1 is disconnected from the ground line 26 and the power line 28. Therefore, immediately before time t0, the voltage of the node N1 is maintained.

During the time period between time t0 and time t1, a spike signal 50 is input to the input terminal Tin as the input signal in time series. When the spike signal 50 is input to the input terminal Tin, the voltage of the input terminal Tin becomes Vin higher than 0 V. The input circuit 10 increases the voltage of the node N1 each time the spike signal 50 is input. This gradually increases the voltage of the node N1. When the voltage of the node N1 is lower than the threshold voltage Vth of the inverting circuit 16, the node N2 is at the high level, and the node N3 is at the low level. Therefore, the voltage of the output terminal Tout is maintained at 0 V. The node N1 is disconnected from the ground line 26 and the power line 28.

At time t1, the voltage of the node N1 exceeds the threshold voltage Vth. The inverting circuit 16 changes the node N2 from the high level to the low level. Since the low level is applied to the gate of the FET 14, the FET 14 is turned on, and positive feedback is applied to the node N1. This causes the node N1 to rise to the high level (the voltage Vdd of the power line 28). When the node N2 changes from the high level to the low level, the inverting circuit 18 changes the node N3 from the low level to the high level. Since the input node NO of the inverter 12 becomes at the high level, negative feedback is applied to the node N1, and the node N1 falls to the low level (the voltage 0 V of the ground line). The node N2 becomes at the high level and the node N3 becomes at the low level, and the spike signal 52 with a narrow pulse width is output to the output terminal Tout. The FET 14 is turned off, and the node N1 is disconnected from the ground line 26 and the power line 28.

Since the spike signals 50 are successively input as the input signal to the input terminal Tin in time series, after time t1, in the same manner, every time the voltage of the node N1 exceeds the threshold voltage Vth, the spike signal 52 is output to the output terminal Tout. As seen above, since negative feedback is applied to the node N1 immediately after positive feedback is applied to the node N1, the spike signal 52 with a narrow pulse width can be generated. In addition, immediately after the FET 14 is turned on by the positive feedback, the FET 13a is turned on by the positive feedback. At this time, the FET 13b is turned off by the negative feedback simultaneously. Therefore, a current penetrating to the ground line 26 from the power line 28 can be reduced. Thereby, the power consumption can be reduced.

[Variation 1 of the Second Embodiment]

Figure 7A:
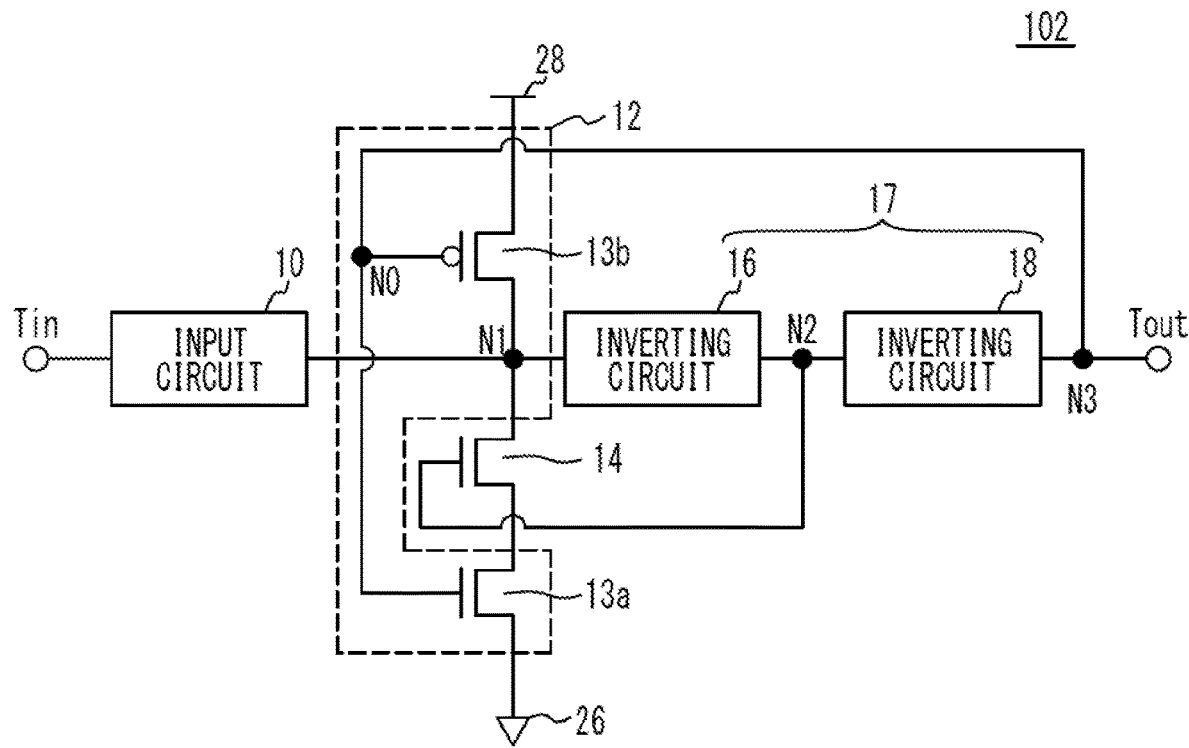
FIG. 7A is a circuit diagram of a spike generation circuit in accordance with a variation 1 of the second embodiment.
Figure 7B:
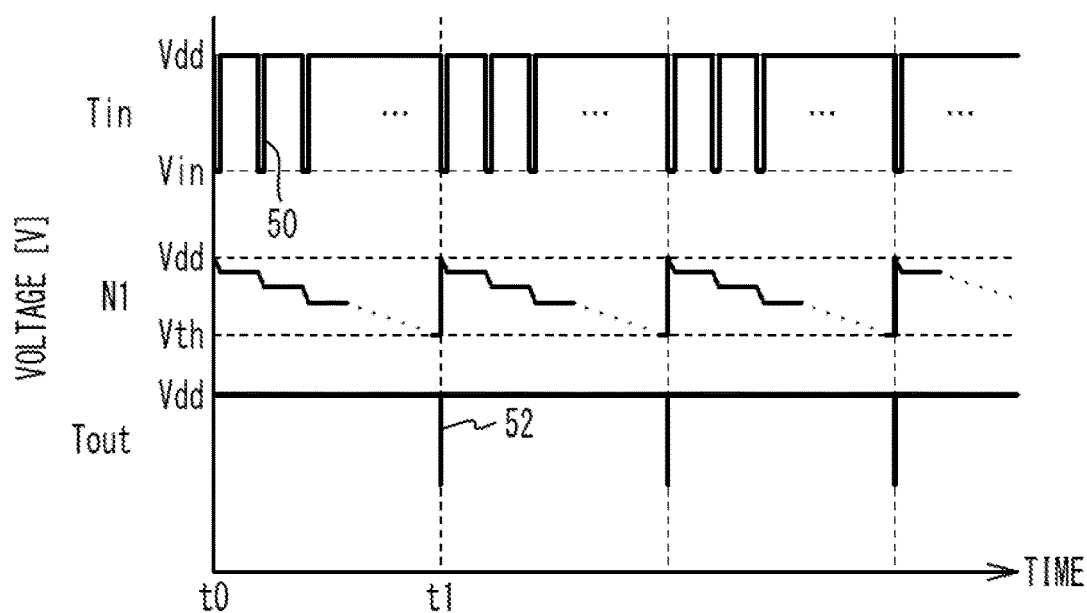
FIG. 7B illustrates voltages with respect to time.

FIG. 7A is a circuit diagram of a spike generation circuit in accordance with a variation 1 of the second embodiment, and FIG. 7B illustrates voltages with respect to time. In a spike generation circuit 102 of the variation 1 of the second embodiment, the FET 14 is an NFET, and is connected in series with the NFET 13a between the node N1 and the ground line 26. The source of the FET 14 is coupled to the ground line 26 through the NFET 13a, and the drain is coupled to the node N1. The node N2 is coupled to the gate of the FET 14. Other configurations are the same as those of the second embodiment illustrated in FIG. 6A, and the description thereof is thus omitted.

FIG. 7B illustrates respective voltages of the input terminal Tin, the node N1, and the output terminal Tout. The voltages of the input terminal Tin and the output terminal Tout during a steady state are equal to the voltage Vdd of the power line 28. Immediately before time t0, the voltage of the node N1 is Vdd.

During the time period between time t0 and time t1, the spike signal 50 is input to the input terminal Tin in time series. When the spike signal 50 is input, the voltage of the input terminal Tin becomes Vin lower than Vdd. The input circuit 10 integrates the spike signal 50, and outputs the resulting signal to the node N1. This gradually decreases the voltage of the node N1. When the voltage of the node N1 is higher than the threshold voltage Vth of the inverting circuit 16, the node N2 is at the low level, and the node N3 is at the high level. Therefore, the voltage of the output terminal Tout is maintained at Vdd. In the variation 1 of the second embodiment, the case where the voltage decreases corresponds to the rise, and the case where the voltage increases corresponds to the fall.

At time t1, the voltage of the node N1 becomes lower than the threshold voltage Vth. The inverting circuit 16 changes the node N2 from the low level to the high level. Since the high level is applied to the gate of the FET 14, the FET 14 is turned on, and positive feedback is applied to the node N1. This causes the node N1 to rise to the low level. When the node N2 changes from the low level to the high level, the inverting circuit 18 changes the node N3 from the high level to the low level. Since the input node NO of the inverter 12 becomes at the low level, negative feedback is applied to the node N1, and the node N1 falls to the high level. This causes the spike signal 52 with a narrow pulse width to be output to the output terminal Tout.

As seen above, the variation 1 of the second embodiment can generate the spike signal 52 with a narrow pulse width by adopting an NFET as the FET 14 and providing the FET 14 between the ground line 26 and the node N1. In addition, the power consumption can be reduced by the FET 13*b*.

In FIG. 6B and FIG. 7B, the spike signal 50 is described as an example of the input signal, but the input signal may have an arbitrary waveform. The input circuit 10 may be any circuit that converts the input signal so that the voltage of the node N1 reaches the threshold voltage Vth when the condition for generating the spike signal 52 is satisfied.

In the second embodiment and the variations thereof, the input signal is input to the input terminal Tin. The output node of the inverter 12 (a first CMOS inverter) is coupled to the node N1 (a first node) coupled to the input terminal Tin, and the inverter 12 is connected between the ground line 26 (a first power supply) and the power line 28 (a second power supply having a higher voltage than the first power supply). The FET 14 (a switch) is connected in series with the inverter 12 between the ground line 26 and the power line 28. The inverting circuit 16 (a first inverting circuit) outputs an inversion signal of the signal of the node N1 to the gate (a control terminal) of the FET 14. The delay circuit 17 delays the signal of the node N1, and outputs the delayed signal to the input node NO of the inverter 12 and outputs the spike signal 52 (an output spike signal) to the output terminal Tout.

This causes positive feedback through the inverting circuit 16 and negative feedback through the delay circuit 17 to be applied, therefore allowing the spike signal 52 with a narrow pulse width to be generated. In addition, since the FET 13*b* is turned off, the current penetrating to the ground line 26 from the power line 28 can be reduced. Therefore, the power consumption can be reduced.

As described previously, the inverting circuit 16 outputs an inversion signal of the signal of the node N1 to the gate of the FET 14 and the node N2 (a second node). The delay circuit 17 includes the inverting circuit 16, and the inverting circuit 18 that outputs an inversion signal of the signal of the node N2 to the input node NO of the inverter 12 and the node N3 (a third node). This allows the inverting circuit 16 to provide positive feedback of the signal of the node N1 to the gate of the FET 14, and the inverting circuit 18 to provide negative feedback of the signal of the node N1 to the input node NO of the inverter 12.

As illustrated in FIG. 6A, when the FET 14 is a PFET (a P-channel transistor), the FET 14 is connected between the node N1 and the power line 28. This configuration allows the positive-going spike signal 52 to be generated as illustrated in FIG. 6B. As illustrated in FIG. 7A, when the FET 14 is an NFET (an N-channel transistor), the FET 14 is connected between the node N1 and the ground line 26. This configuration allows the negative-going spike signal 52 to be generated as illustrated in FIG. 7B.

Third Embodiment

Figure 8:
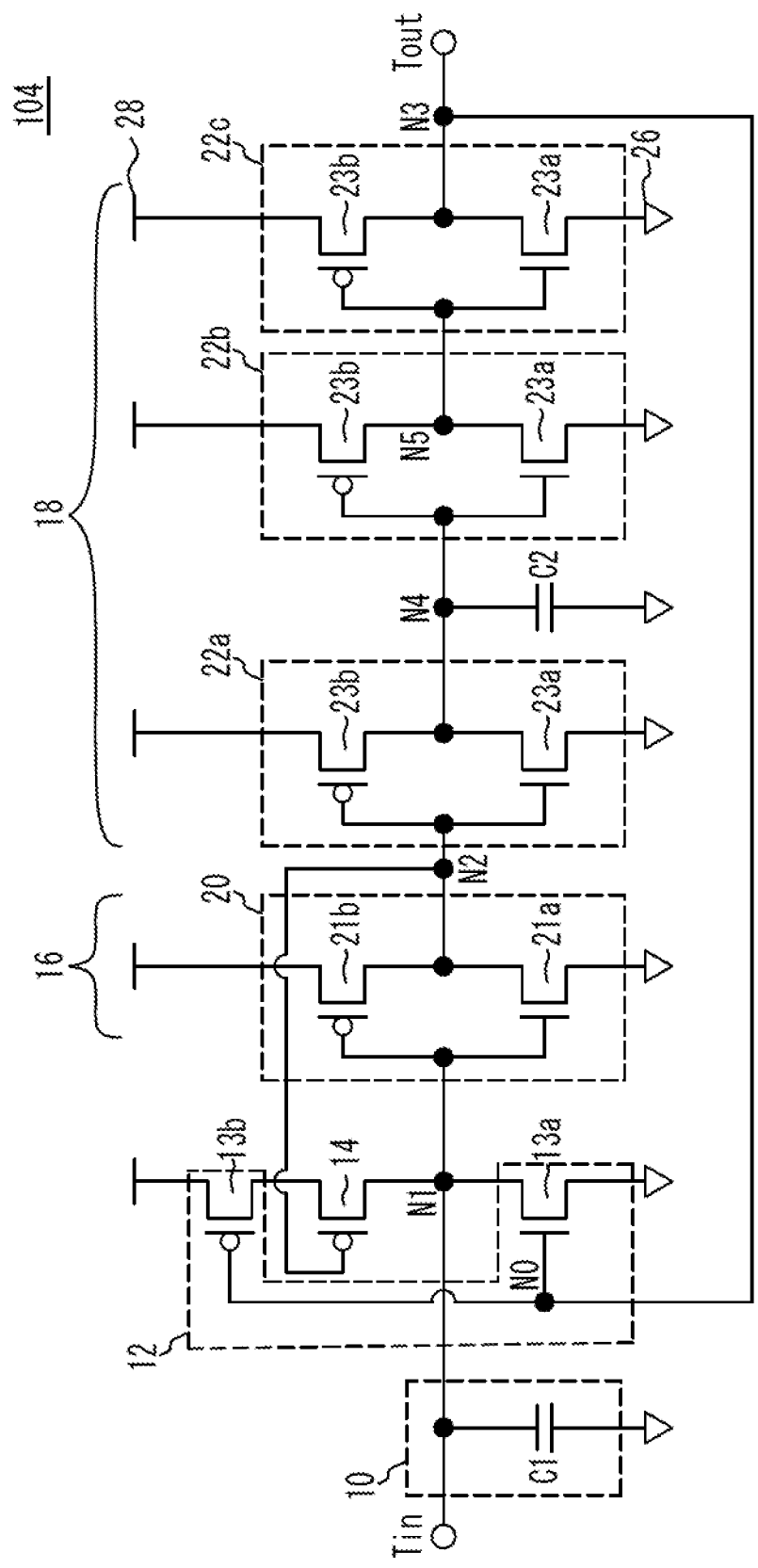
FIG. 8 is a circuit diagram of a spike generation circuit in accordance with a third embodiment.

A third embodiment is a specific example of the spike generation circuit in accordance with the second embodiment and the variations thereof. FIG. 8 is a circuit diagram of a spike generation circuit in accordance with the third embodiment. As illustrated in FIG. 8, in a spike generation circuit 104 of the third embodiment, the input circuit 10 is a capacitor C1 having a first end coupled to the node N1 and a second end coupled to the ground line 26.

The inverting circuit 16 is an inverter 20 having an input node coupled to the N1 and an output node coupled to the node N2. The inverter 20 is a CMOS inverter, and includes an NFET 21*a* and a PFET 21*b*. The source of the NFET 21*a* is coupled to the ground line 26, the drain is coupled to the node N2, and the gate is coupled to the node N1. The source of the PFET 21*b* is coupled to the power line 28, the drain is coupled to the node N2, and the gate is coupled to the node N1.

The inverting circuit 18 includes inverters 22*a* to 22*c* and a capacitor C2. The inverters 22*a* to 22*c* are connected in multiple stages between the nodes N2 and N3. That is, the inverters 22*a* to 22*c* are connected in series with each other between the nodes N2 and N3. The inverters 22*a* to 22*c* are CMOS inverters, and each of the inverters 22*a* to 22*c* includes an NFET 23*a* and a PFET 23*b*. The source of the NFET 23*a* is coupled to the ground line 26, the drain is coupled to the output node, and the gate is coupled to the input node. The source of the PFET 23*b* is coupled to the power line 28, the drain is coupled to the output node, and the gate is coupled to the input node. The input node of the inverter 22*a* is coupled to the node N2, and the output node is coupled to a node N4. The input node of the inverter 22*b* is coupled to the node N4, and the output node is coupled to a node N5. The input node of the inverter 22*c* is coupled to the node N5, and the output node is coupled to the node N3. The capacitor C2 has a first end coupled to the node N4, and a second end coupled to the ground line 26. Other configurations are the same as those of the second embodiment, and the description thereof is thus omitted.

Voltages in the third embodiment were simulated using simulation program with integrated circuit emphasis (SPICE). The simulation conditions are as follows. NFET:
  Type: N-channel MOS using silicon on insulator (SOI),
  Gate length: 100 nm,
  Gate width: 100 nm,
  Threshold voltage: +0.8 V,
  Gate capacitance: 1 fF
PFET:
  Type: P-channel MOSFET using SOI,
  Gate length: 100 nm,
  Gate width: 200 nm,
  Threshold voltage: −0.8 V,
  Gate capacitance: 1 fF
Capacitor C1:
  Capacitance value: 10 fF
Capacitor C2:
  Capacitance value: 4 fF
Ground line 26:
  Voltage: 0 V
Power line 28:
  Voltage Vdd: 1 V A constant current of 1 pA was applied to the input terminal Tin.

Figure 9A:
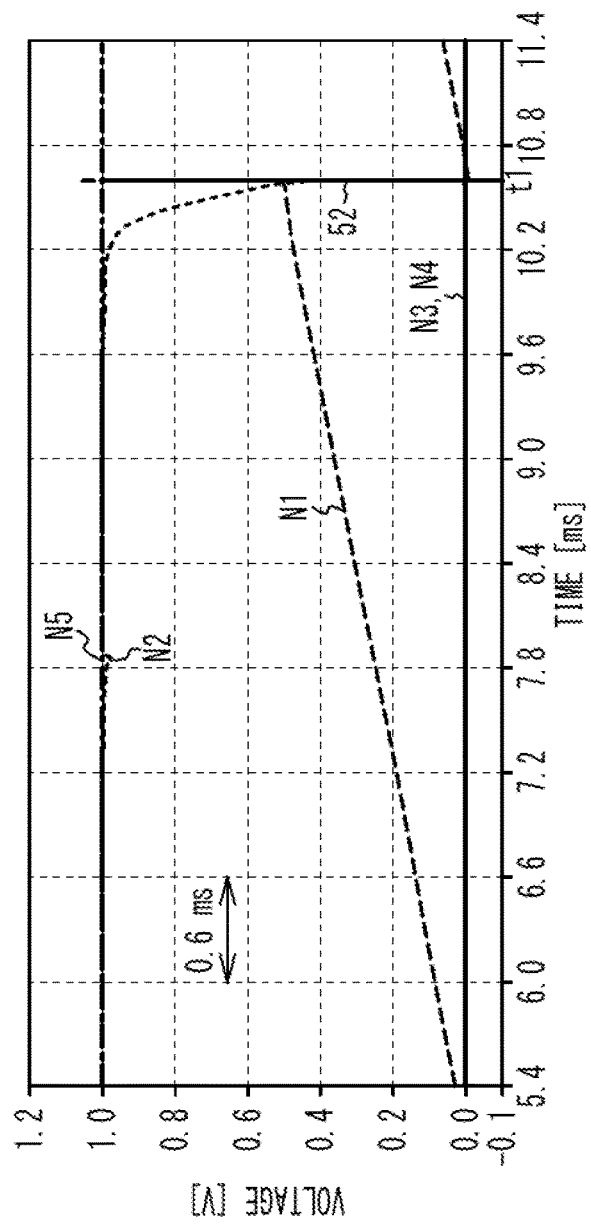
FIG. 9A and FIG. 9B illustrate respective voltages of nodes with respect to time in the third embodiment.
Figure 9B:
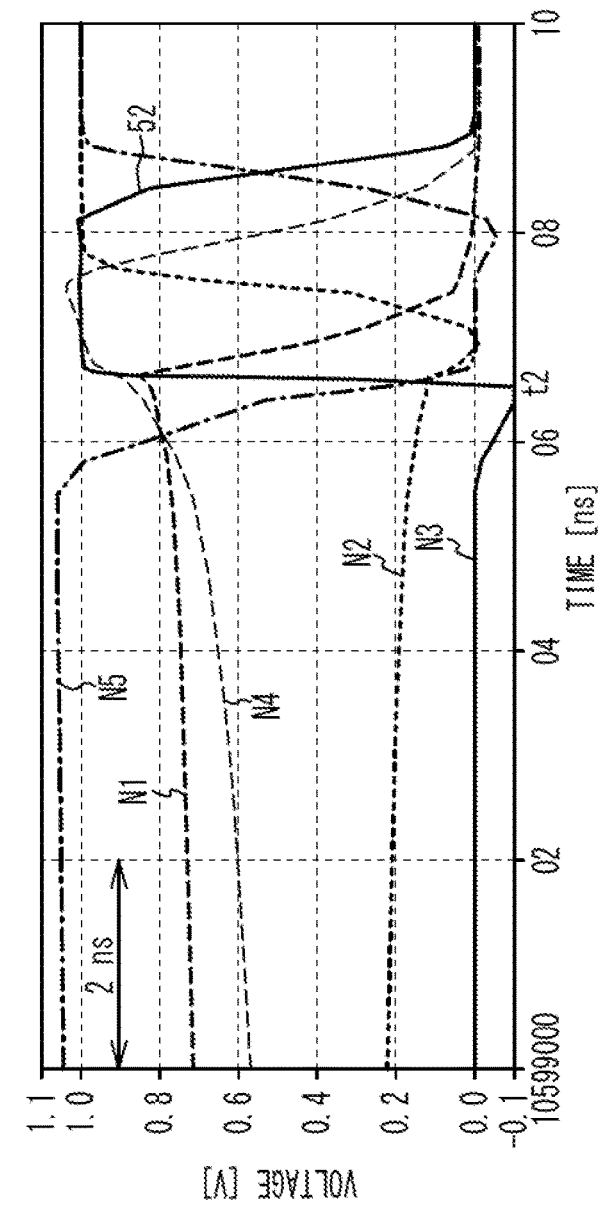

FIG. 9A and FIG. 9B illustrate respective voltages of nodes with respect to time in the third embodiment. FIG. 9B is an enlarged view around the spike signal 52 in FIG. 9A. In FIG. 9B, the first scale of the horizontal axis indicates 10599000 ns corresponding to the time in FIG. 9A, and the subsequent scales indicate only the last two digits. The same applies to enlarged views hereinafter.

As illustrated in FIG. 9A, the voltage of the node N1 increases with time, and when the voltage of the node N1 exceeds 0.5 V, which is the threshold voltage, at time t1, the spike signal 52 is output to the node N3.

As illustrated in FIG. 9B, during the time period from time t1 to time t2, the voltage of the node N1 increases from 0.5 V to 0.8 V. The voltage of the node N1 rapidly increases in the time axis of FIG. 9A, but gradually increases in the time axis of FIG. 9B. In FIG. 9B, time t1 corresponds to the time prior to the time 10599000 ns. During the time period from time t1 to time t2, the voltage of the node N2 gradually varies from the high level to the low level. The voltage of the node N4 varies from the low level to the high level slightly faster than that of the node N2 during the time period from time t1 to time t2. The voltage of the node N5 varies from the high level to the low level very quickly compared with that of the node N4. The voltage of the node N3 varies from the low level to the high level very steeply at time t2.

At and after time t2, the voltage varies more steeply in the order of the nodes N1, N2, N4, N5, and N3. Therefore, the width of the spike signal 52 is narrow and approximately 2 ns. In addition, the rise and fall of the spike signal 52 steepen. In the CMOS inverter, through-current flows from the power line 28 to the ground line 26 during the transition period of the voltage, but by reducing the leakage current of the NFET and the PFET in the CMOS inverter, the through-current can be sufficiently reduced, and the power consumption can be reduced. Since the rise and fall of the spike signal 52 are steep as described in the third embodiment, the power consumption of the spike generation circuit 104 can be further reduced.

Figure 10A:
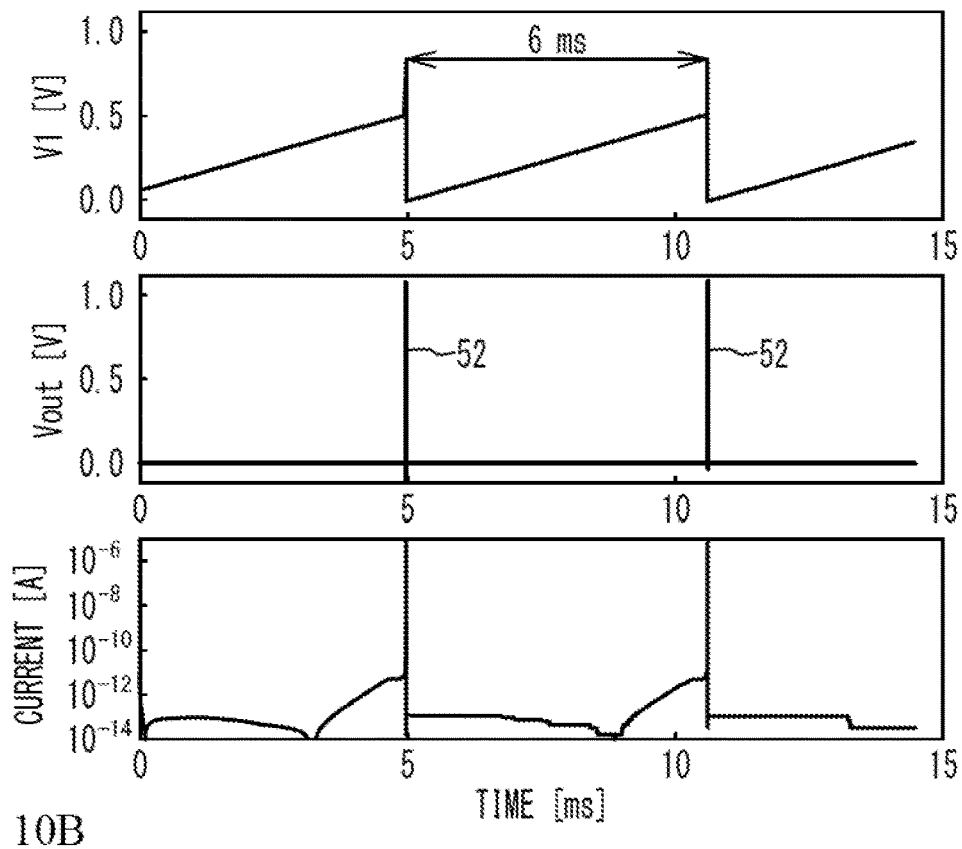
FIG. 10A and FIG. 10B illustrate an input voltage, an output voltage, and a consumption current with respect to time in the third embodiment.
Figure 10B:
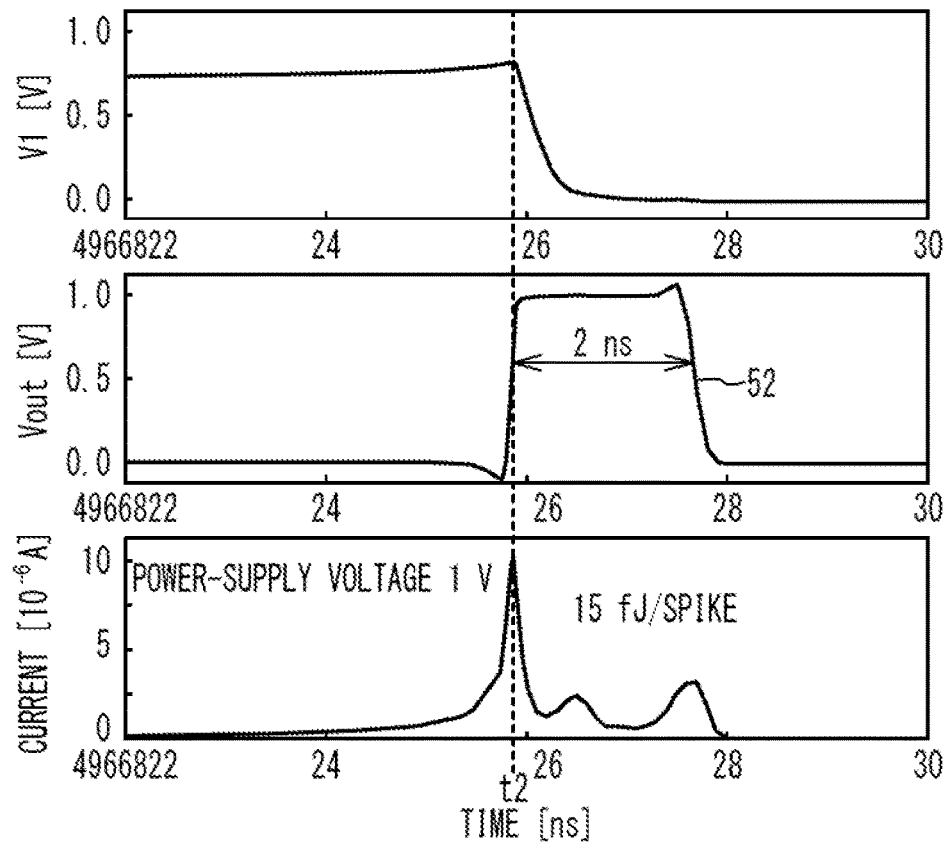

FIG. 10A and FIG. 10B illustrate an input voltage, an output voltage, and a consumption current with respect to time in the third embodiment. FIG. 10B is an enlarged view around the spike signal 52 in FIG. 10A. As illustrated in FIG. 10A, from time 0 ms to time 5 ms, the voltage V1 of the node N1 gradually increases, and when the voltage V1 reaches 0.5 V, the voltage V1 rapidly increases to 0.8 V, and then becomes 0 V. At time 5 ms, the voltage Vout of the output terminal Tout becomes 1 V, and the spike signal 52 is output. The consumption current is $10^{-11}$ A or less during the time period from time 0 ms to time 5 ms.

As illustrated in FIG. 10B, at time t2, the voltage V1 of the node N1 rapidly decreases from 0.8 V to 0 V. The spike signal 52 with a width of approximately 2 ns is output to the output terminal Tout. At time t2, the current becomes approximately $1 \times 10^{-6}$ A and largest. In the spike generation circuit 104, most of the power is consumed when the spike signal 52 is generated. When the power-supply voltage is 1 V, the consumption energy per spike is approximately 15 fJ. As seen above, the power consumption (the consumption energy) for spike generation can be made to be very small.

A description will be given of the function of the capacitor C2 in the third embodiment. The output voltage Vout with respect to time was simulated for different capacitance values of the capacitor C2 in the third embodiment. FIG. 11A to FIG. 12D illustrate the output voltage with respect to time in the third embodiment. The capacitance value of the capacitor C2 in FIG. 11A to FIG. 12D is 0 F, 1 fF, 2 fF, 3 fF, 4 fF, 6 fF, 10 fF, and 20 fF, respectively.

Figure 11A:
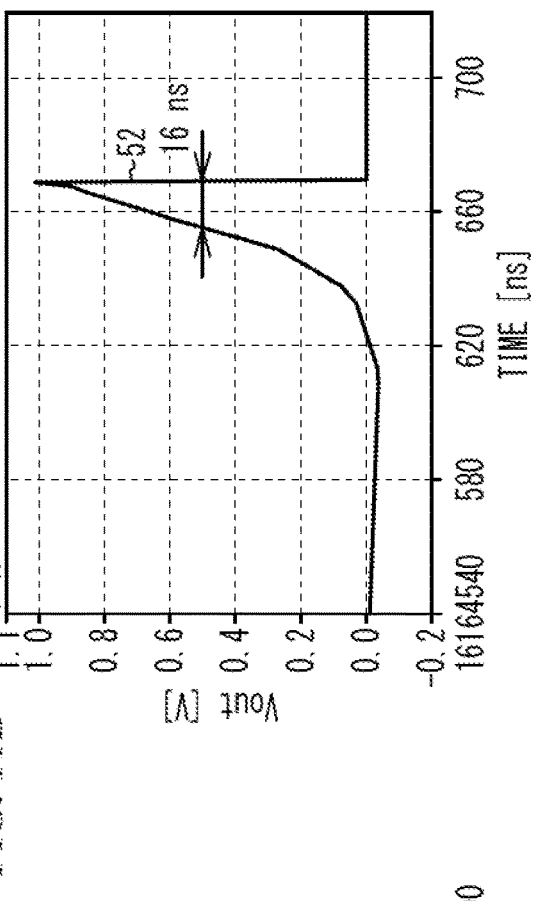
FIG. 11A to FIG. 11D illustrate the output voltage with respect to time in the third embodiment.
Figure 11B:
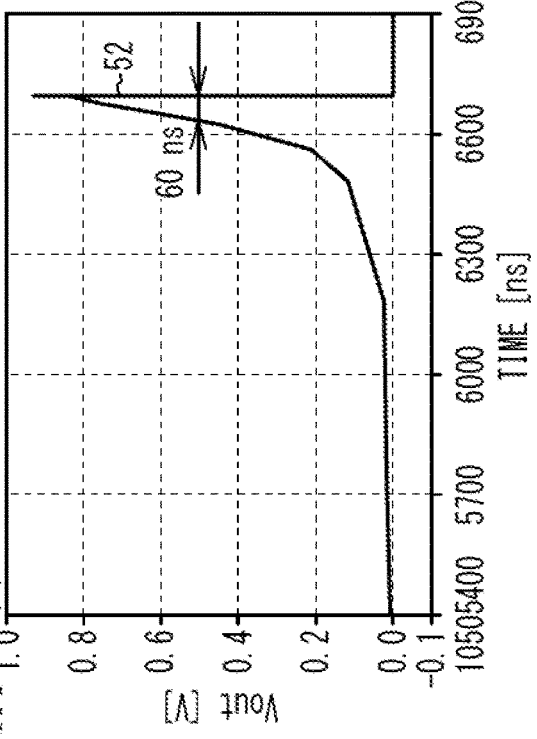
Figure 11C:
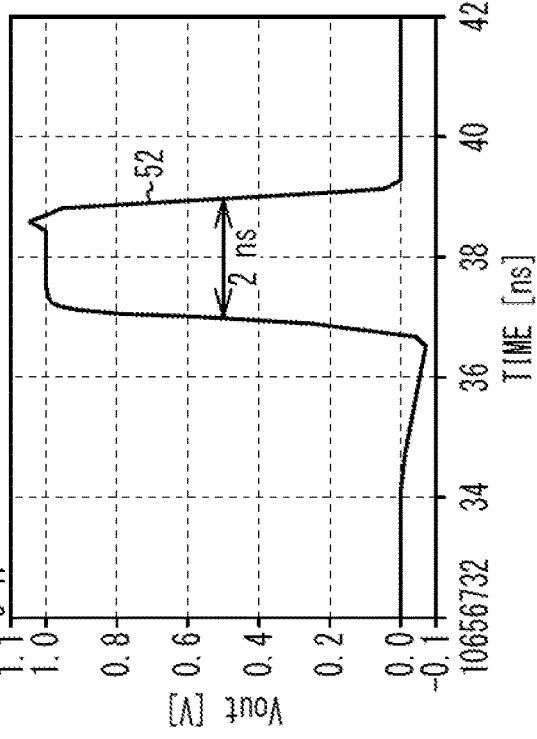
Figure 11D:
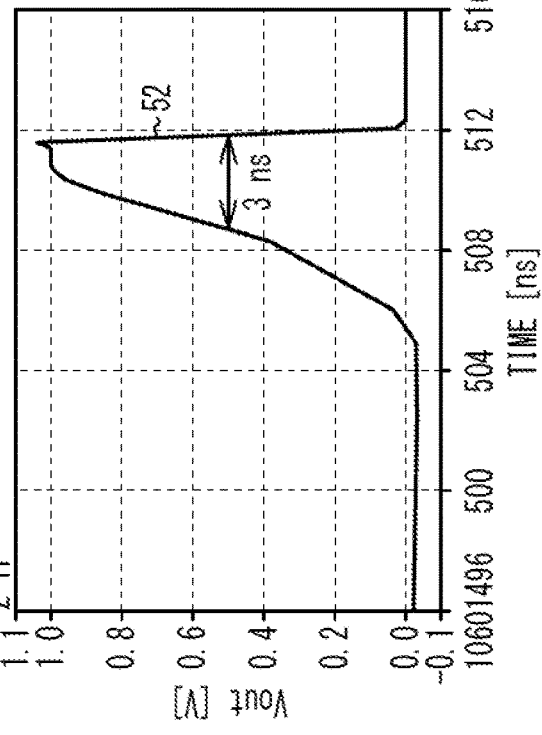

As illustrated in FIG. 11A, when the capacitor C2 has a capacitance value of 0 F, the width of the spike signal 52 is approximately 60 ns, and the rise is gradual. As illustrated in FIG. 11B, when the capacitor C2 has a capacitance value of 1 fF, the width of the spike signal 52 is smaller, approximately 16 ns, and the rise is slightly steeper. As illustrated in FIG. 11C, when the capacitor C2 has a capacitance value of 2 fF, the width of the spike signal 52 is even smaller, approximately 3 ns, and the rise is even steeper. As illustrated in FIG. 11D, when the capacitor C2 has a capacitance value of 3 fF, the width of the spike signal 52 is smallest, approximately 2 ns, and the rise is even steeper.

Figure 12B:
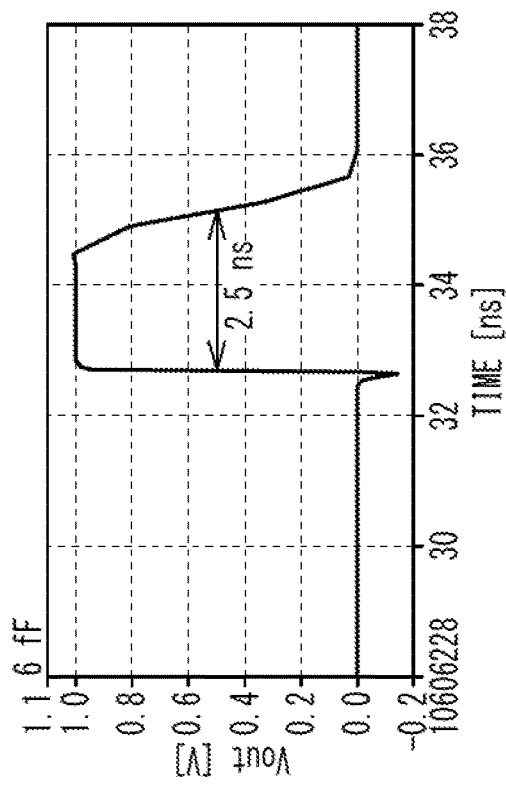
FIG. 12A to FIG. 12D illustrate the output voltage with respect to time in the third embodiment.
Figure 12D:
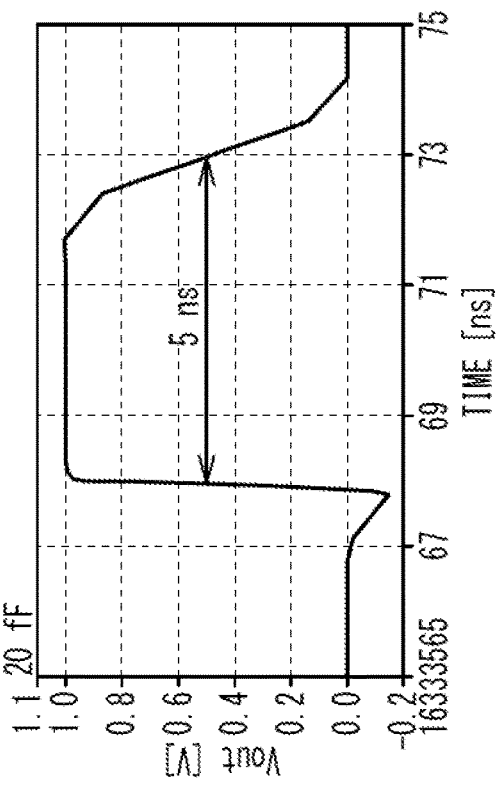
Figure 12A:
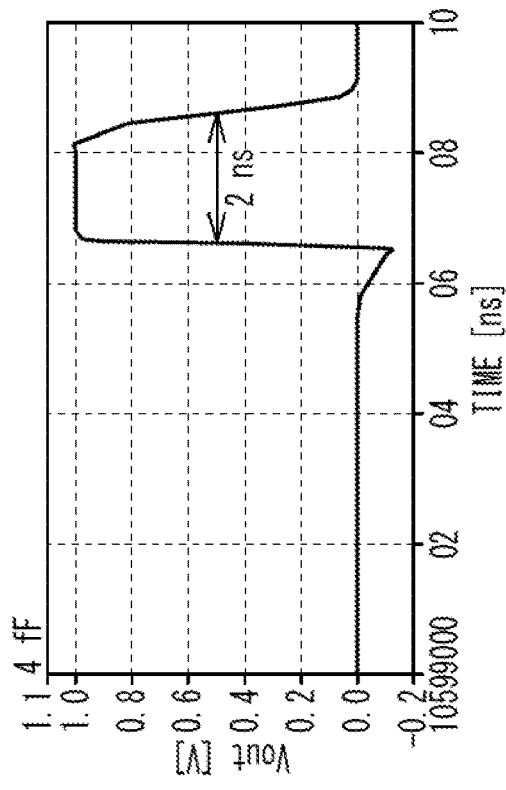
Figure 12C:
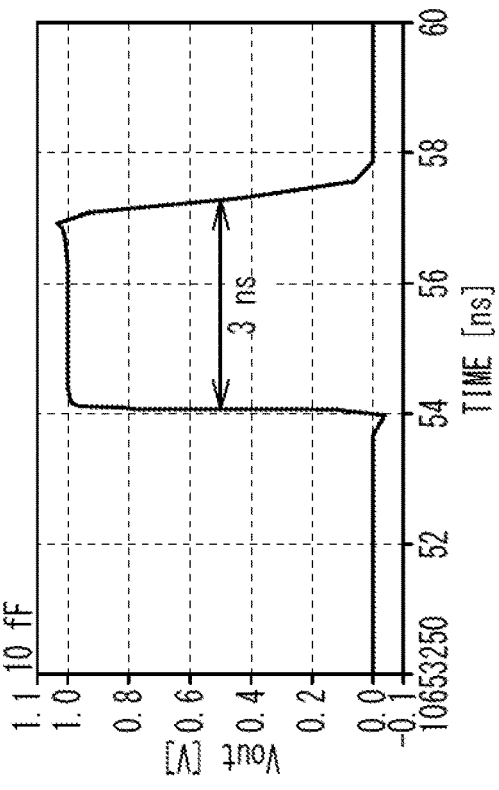

As illustrated in FIG. 12A, when the capacitor C2 has a capacitance value of 4 fF, the width of the spike signal 52 is smallest, approximately 2 ns, and the rise is even steeper. As illustrated in FIG. 12B, when the capacitor C2 has a capacitance value of 6 fF, the width of the spike signal 52 is slightly larger, approximately 2.5 ns, the rise is approximately the same, and the fall is slightly more gradual. As illustrated in FIG. 12C, when the capacitor C2 has a capacitance value of 10 fF, the width of the spike signal 52 is even larger, approximately 3 ns, and the rise is slightly more gradual. As illustrated in FIG. 12D, when the capacitor C2 has a capacitance value of 20 fF, the width of the spike signal 52 is even larger, approximately 5 ns, and the rise and the fall are slightly more gradual.

As seen above, the provision of the capacitor C2 can narrow the width of the spike signal 52 and steepen the rise and the fall. Therefore, the power consumption is further reduced. The gate capacitance values of the NFET and the PFET are 0.1 fF, and the capacitance value of the capacitor C2 is preferably equal to or greater than 1 time, more preferably equal to or greater than 2 times, further preferably equal to or greater than 3 times the gate capacitance value. The capacitance value of the capacitor C2 is preferably equal to or less than 1000 times, more preferably equal to or less than 50 times the gate capacitance value.

Figure 13A:
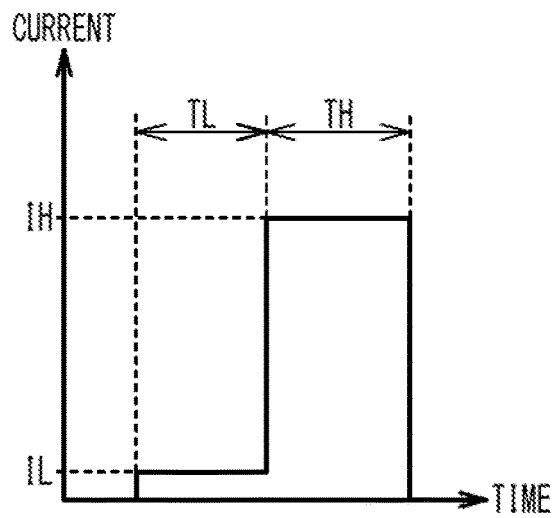
FIG. 13A to FIG. 13D are diagrams for describing the function of a capacitor C2.

FIG. 13A to FIG. 13D are diagrams for describing the function of the capacitor C2. FIG. 13A schematically illustrates a current flowing through the output node when the output of the inverter is inverted, with respect to time. As illustrated in FIG. 13A, when the output of the CMOS inverter is inverted, a low current IL flows to the output node. Thereafter, a high current IH flows. To give further details, the output current of the inverter in the previous stage is small at first and then increases. In other words, before the voltage of the input node of the inverter in the previous stage reaches the threshold voltage, a current flows a little, and when the voltage of the input node reaches the threshold voltage, the current flows all at once. Assuming that the currents IL and IH are constant, the time period during which the current IL flows is represented by TL, and the time period during which the current IH flows is represented by TH.

Figure 13B:
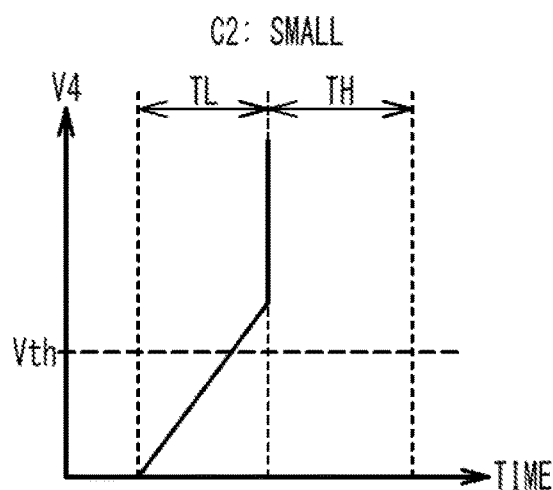
Figure 13C:
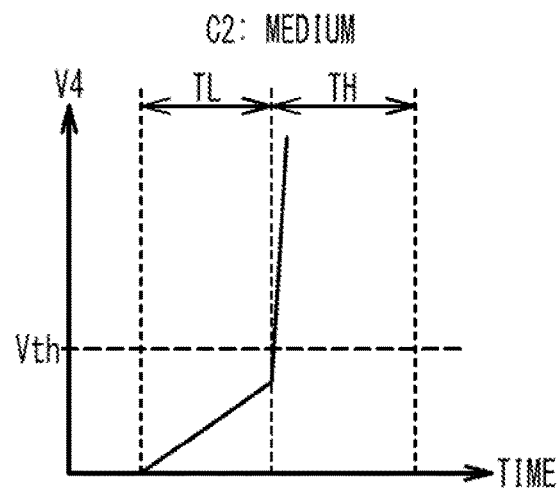
Figure 13D:
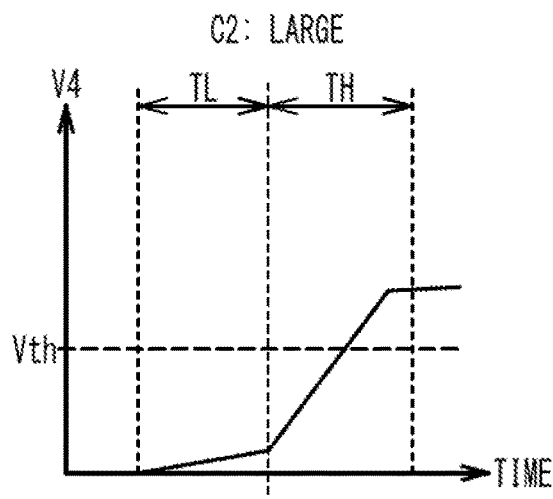

FIG. 13B to FIG. 13D schematically illustrate the voltage V4 of the node N4 with respect to time in the third embodiment. As illustrated in FIG. 13B, when the capacitance value of the capacitor C2 is small, the increase in the voltage of the node N4 depends on the time for the gate capacitance value of the inverter 22b to be charged. During the time period TL, the current IL is low. Thus, the voltage V4 of the node N4 gradually increases during the period TL. During the time period TH, the current IH is high. Thus, the voltage V4 rapidly increases. When the voltage V4 exceeds the threshold voltage Vth in the time period TL, the inverter 22b gradually inverts. Since the input current is small, the inverter 22b gradually inverts. This makes the rise and fall of the spike signal 52 gradual. In addition, when the capacitance value of the capacitor C2 is small, the timing of negative feedback is too early, preventing the positive feedback, which results in a further gradual rise.

As illustrated in FIG. 13C, when the capacitance value of the capacitor C2 is medium, the current IL is accumulated in the capacitor C2 in addition to the gate capacitance of the inverter 22b. Thus, the voltage V4 does not exceed the threshold voltage Vth during the time period TL. When the voltage V4 exceeds the threshold voltage Vth in the time period TH, the output of the inverter 22b rapidly inverts. Therefore, the rise and fall of the spike signal 52 steepen.

As illustrated in FIG. 13D, when the capacitance value of the capacitor C2 is large, the rise of the voltage V4 during the period TH is gradual. Therefore, the output of the inverter 22b gradually inverts. Thus, the rise and fall of the spike signal 52 become gradual. Furthermore, the width of the spike signal 52 widens.

As described above, in the third embodiment, the provision of the capacitor C2 can narrow the width of the spike signal 52 and steepen the rise and fall of the spike signal 52. Therefore, the power consumption can be reduced.

A MOS capacitor or a metal insulator semiconductor (MIS) capacitor can be used as the capacitor C2. The parasitic capacitance of the MOSFET may be used as the capacitor C2.

Figure 14A:
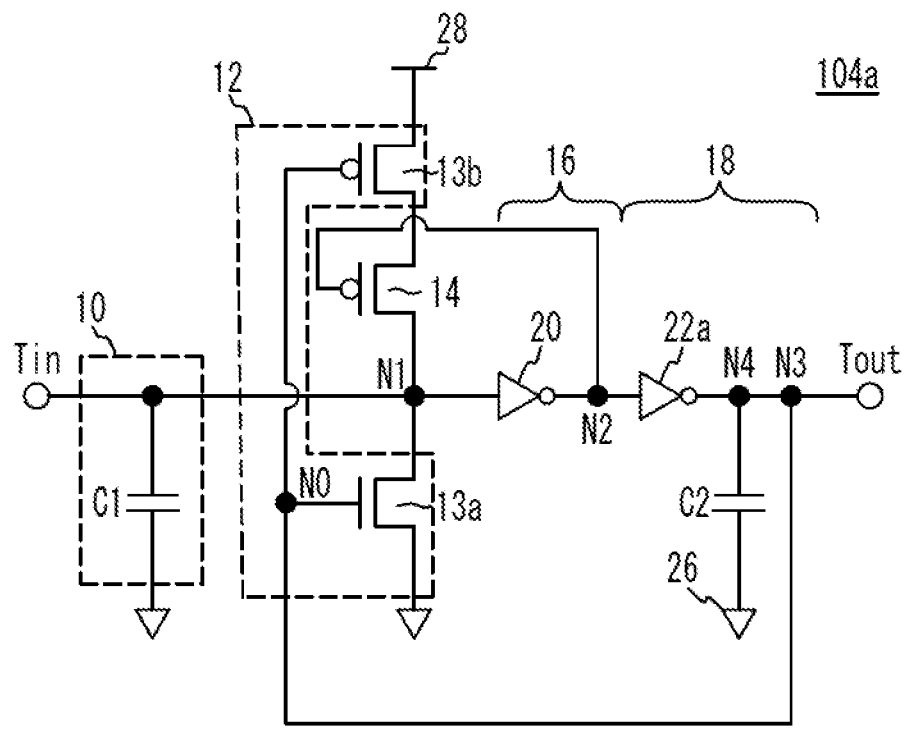
FIG. 14A and FIG. 14B are circuit diagrams of spike generation circuits in the third embodiment.
Figure 14B:
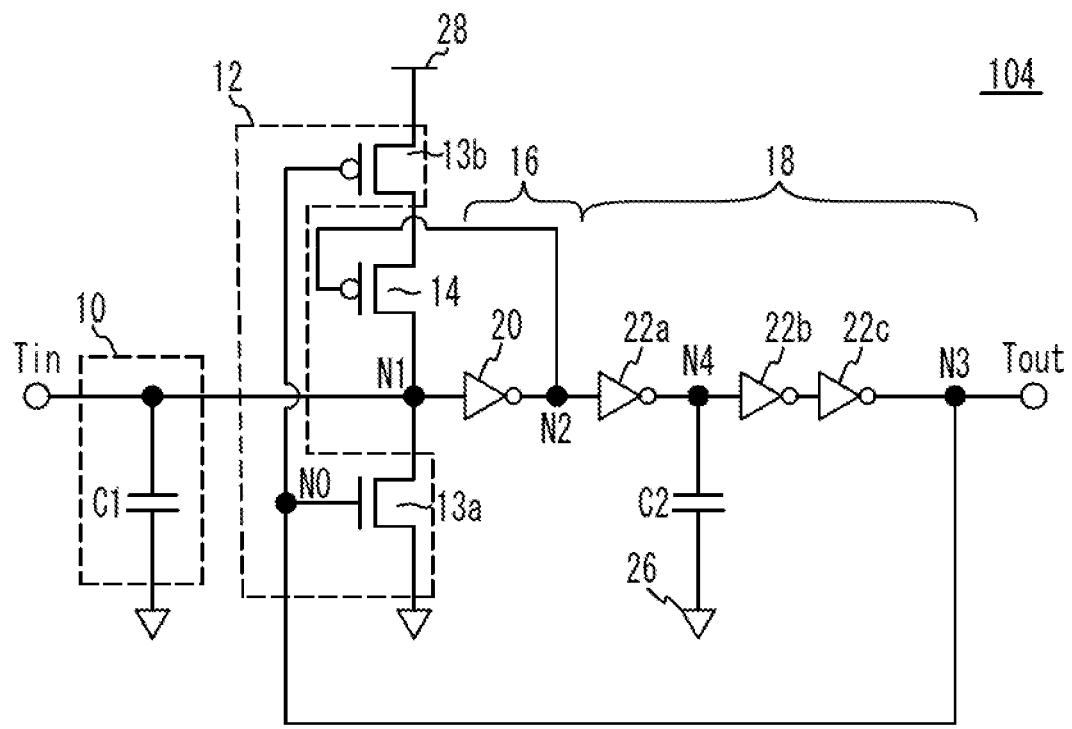

A simulation was conducted for different numbers of inverters in the inverting circuit 18 of the third embodiment. FIG. 14A to FIG. 15B are circuit diagrams of spike generation circuits in the third embodiment. As illustrated in FIG. 14A, in a spike generation circuit 104a, the inverting circuit 18 includes one inverter 22a and one capacitor C2. The capacitor C2 is coupled to the node N4 in the stage subsequent to the inverter 22a. As illustrated in FIG. 14B, in the spike generation circuit 104, the inverting circuit 18 includes three inverters 22a to 22c as in FIG. 8 of the third embodiment. The capacitor C2 is coupled to the node N4 between the inverters 22a and 22b.

Figure 15A:
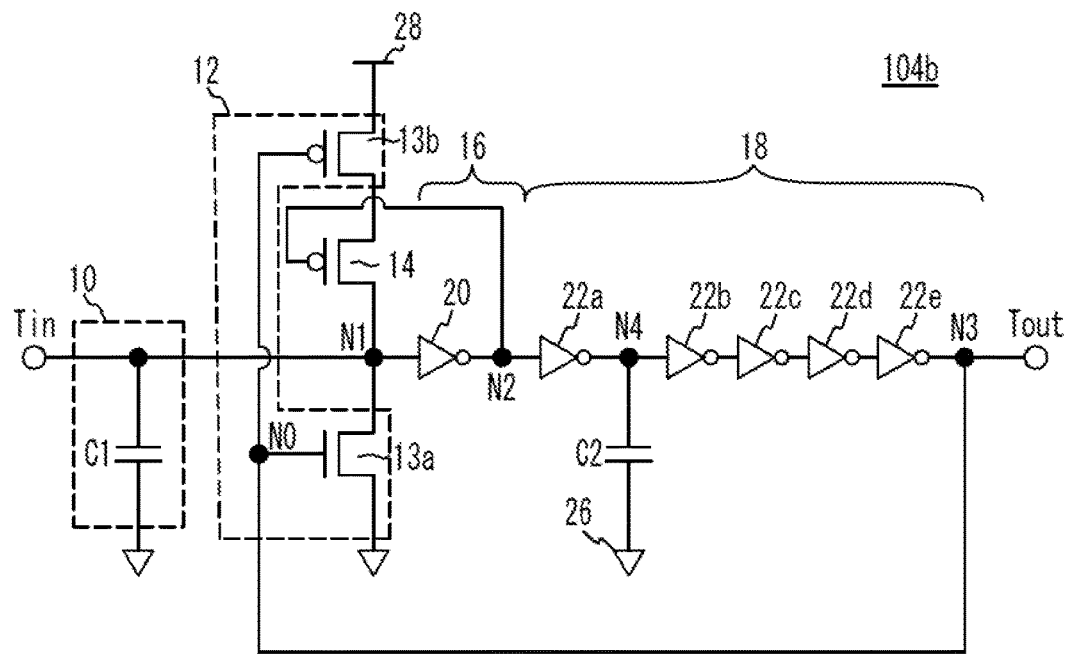
FIG. 15A and FIG. 15B are circuit diagrams of spike generation circuits in the third embodiment.
Figure 15B:
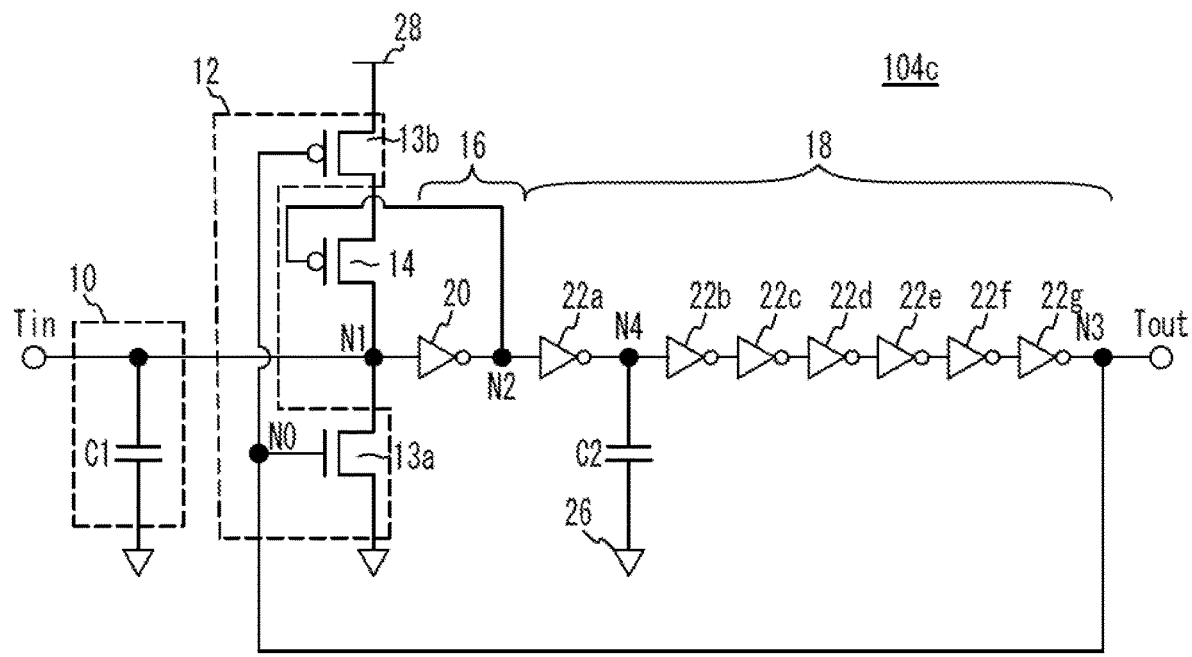

As illustrated in FIG. 15A, in a spike generation circuit 104b, the inverting circuit 18 includes five inverters 22a to 22e. The capacitor C2 is coupled to the node N4 between the inverters 22a and 22b. As illustrated in FIG. 15B, in a spike generation circuit 104c, the inverting circuit 18 includes seven inverters 22a to 22g. The capacitor C2 is coupled to the node N4 between the inverters 22a and 22b.

Figure 16A:
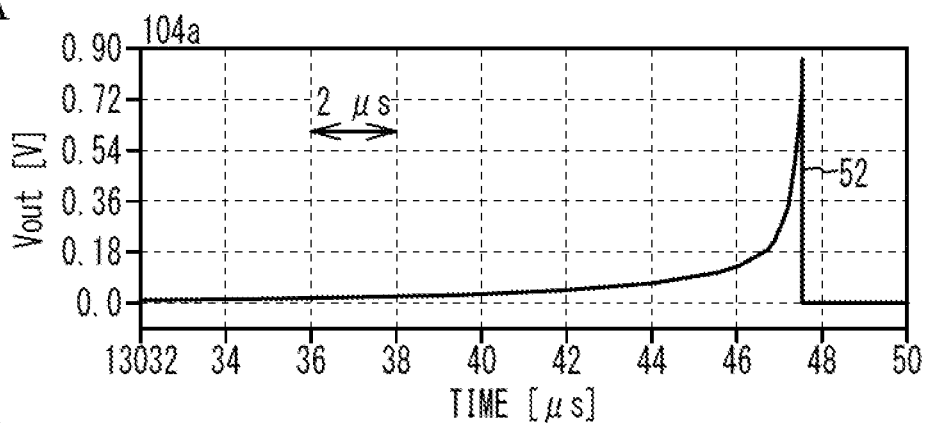
FIG. 16A to FIG. 16D illustrate the output voltage of the spike generation circuit with respect to time in the third embodiment.
Figure 16B:
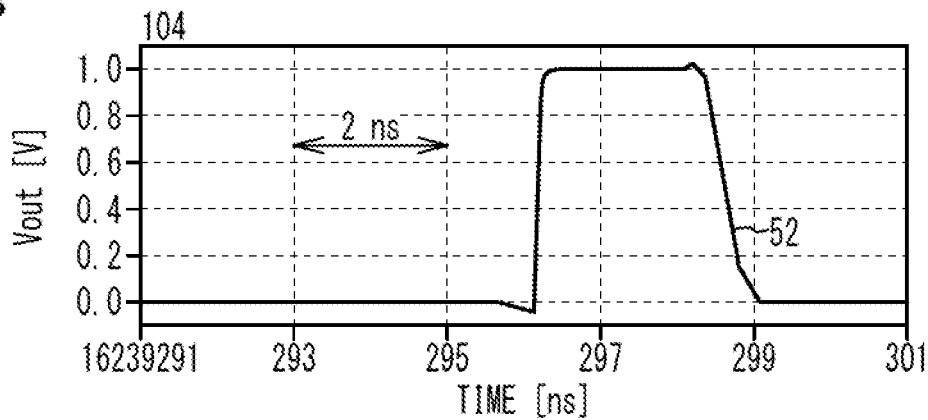
Figure 16C:
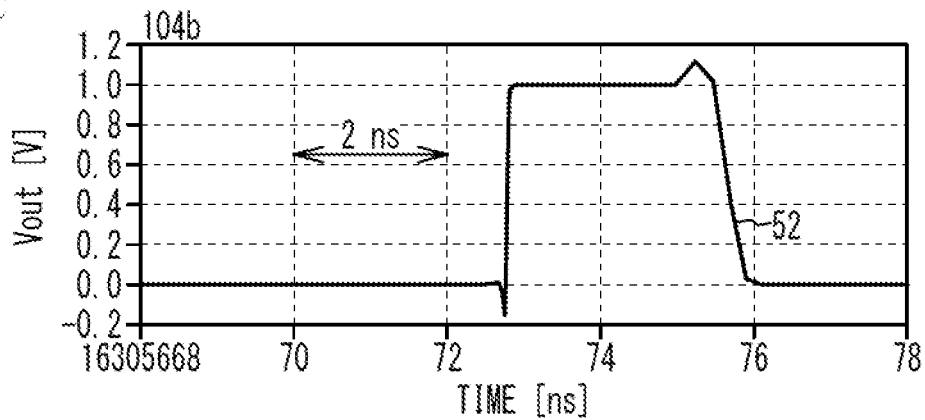
Figure 16D:
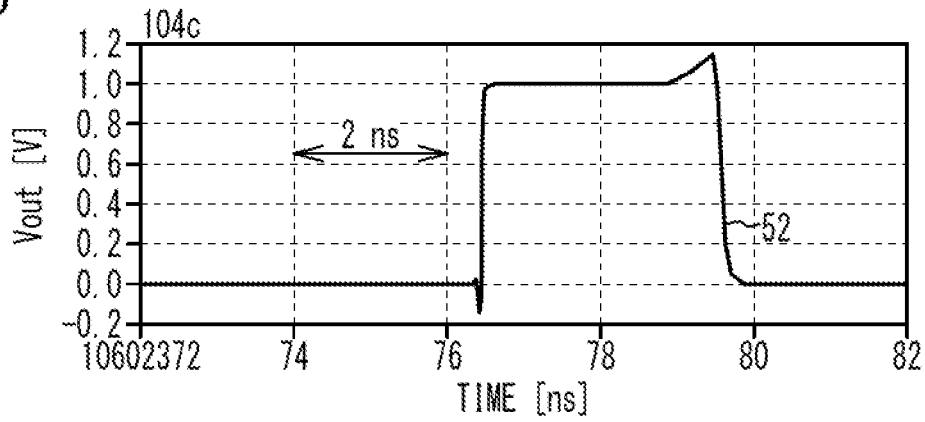

FIG. 16A to FIG. 16D illustrate the output voltage of the spike generation circuit with respect to time in the third embodiment. As illustrated in FIG. 16A, in the spike generation circuit 104a, the rise of the spike signal 52 is gradual, and the width of the spike signal 52 is wide. As illustrated in FIG. 16B, in the spike generation circuit 104, the rise of the spike signal 52 is steeper, and the width of the spike signal 52 is approximately 2 ns. As illustrated in FIG. 16C, in the spike generation circuit 104b, the width of the spike signal 52 is slightly wider, but the rise is steep. As illustrated in FIG. 16D, in the spike generation circuit 104c, the width of the spike signal 52 is slightly wider, but the rise is steep.

As apparent from above, the spike generation circuit is achieved by adjusting the number of inverters in the inverting circuit 18 to be an odd number. If the number of the inverters in the circuit between the nodes N2 and N3 is an even number, the same level as that of the node N2 is output to the node N3. Therefore, in this case, the circuit between the nodes N2 and N3 does not operate as the inverting circuit. The number of the inverters in the inverting circuit 18 is adjusted to be an odd number. To narrow the width of the spike signal 52 and steepen the rise and fall of the spike signal 52, the number of the inverters 22a to 22g is preferably three or greater. The number of the inverters 22a to 22g is more preferably three.

[Variation 1 of the Third Embodiment]

Figure 17:
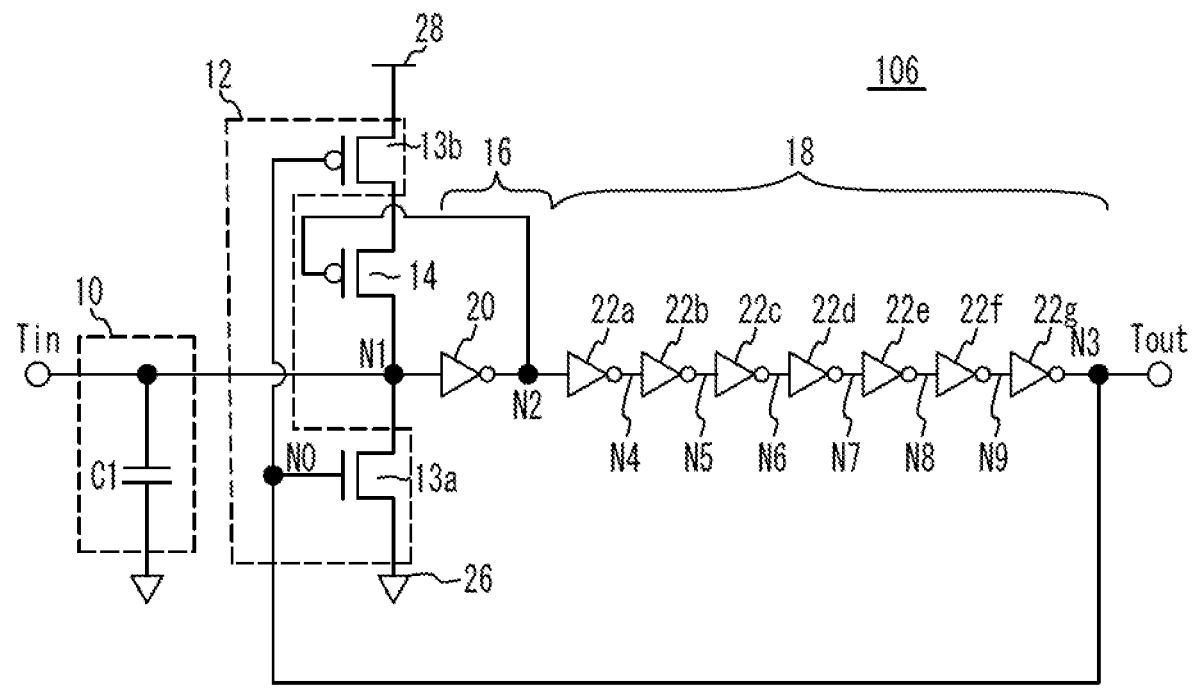
FIG. 17 is a circuit diagram of a spike generation circuit of a variation 1 of the third embodiment.

FIG. 17 is a circuit diagram of a spike generation circuit in accordance with a variation 1 of the third embodiment. As illustrated in FIG. 17, in a spike generation circuit 106 of the variation 1 of the third embodiment, no capacitor C2 is provided. The number of inverters in the inverting circuit 18 is an odd number, for example, seven. The node between the inverters 22a and 22b is N4, the node between the inverters 22b and 22c is N5, the node between the inverters 22c and 22d is N6, the node between the inverters 22d and 22e is N7, the node between the inverters 22e and 22f is N8, and the node between the inverters 22f and 22g is N9. Other configurations are the same as those of the third embodiment, and the description thereof is thus omitted.

Figure 18:
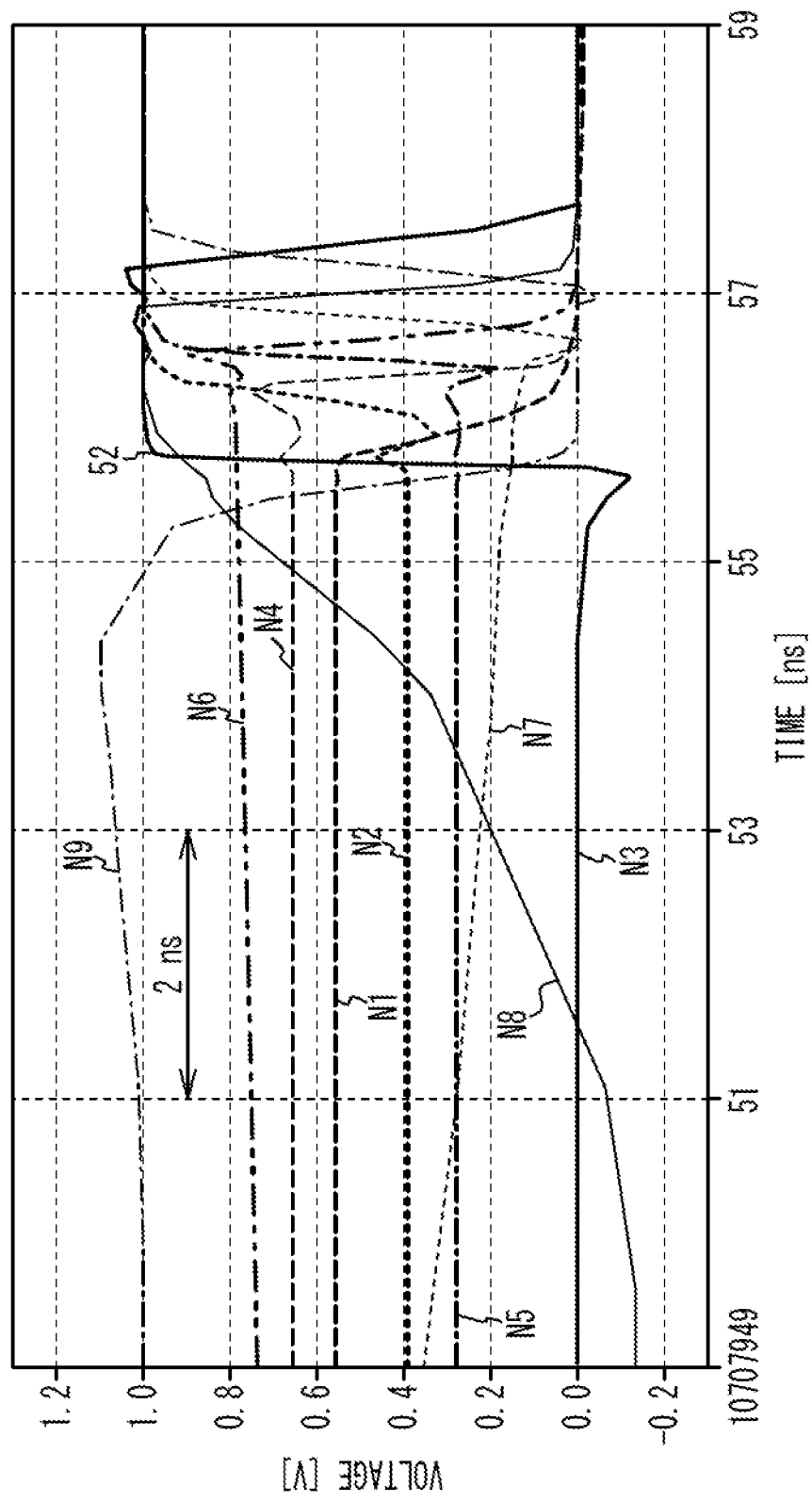
FIG. 18 illustrates respective voltages of nodes with respect to time in the variation 1 of the third embodiment.

The voltage of each node in the variation 1 of the third embodiment was simulated. FIG. 18 illustrates respective voltages of the nodes with respect to time in the variation 1 of the third embodiment. As illustrated in FIG. 18, the transition of the voltage becomes steeper in the order of the nodes N1, N2, N4, N5, N6, N7, N8, N9, and N3. In particular, at the node N9, the change from the high level to the low level is steep, and the rise and fall of the spike signal 52 at the node N3 is as steep as those illustrated in FIG. 9B of the third embodiment.

As clear from above, even when no capacitor C2 is provided, the rise and fall of the spike signal 52 can be steepened by increasing the number of the inverters 22a to 22g. This is because of the following reason. As the number of the inverters 22a to 22g increases, the delay time in the inverting circuit 18 increases. As a result, the operation of the inverting circuit 18 and the operation of the inverting circuit 16 no longer interfere with each other, and the rise and fall of the spike signal 52 can be steepened.

Figure 19A:
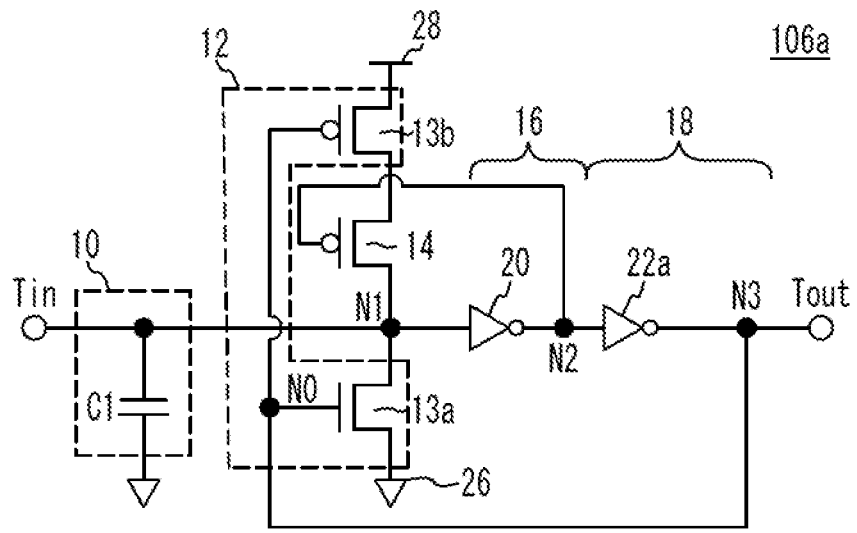
FIG. 19A is a circuit diagram illustrating another example of the spike generation circuit in accordance with the variation 1 of the third embodiment.
Figure 19B:
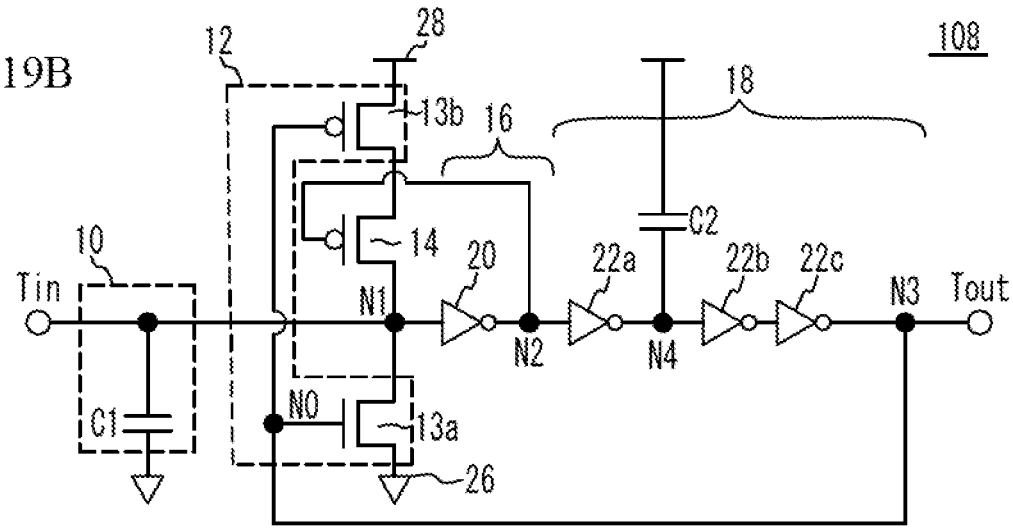
FIG. 19B and FIG. 19C are circuit diagrams of spike generation circuits in accordance with variations 2 and 3 of the third embodiment, respectively.

FIG. 19A is a circuit diagram illustrating another example of the spike generation circuit in accordance with the variation 1 of the third embodiment. As illustrated in FIG. 19A, in a spike generation circuit 106a, the number of the inverter 22a in the inverting circuit 18 is one.

As illustrated in FIG. 17 and FIG. 19A, at least, the number of the inverter 22a is an odd number. When no capacitor C2 is provided, in order to steepen the rise and fall of the spike signal 52, the number of the inverters 22a to 22g is preferably three or greater, more preferably five or greater, further preferably seven or greater.

[Variation 2 of the Third Embodiment]

FIG. 19B is a circuit diagram of a spike generation circuit in accordance with a variation 2 of the third embodiment. As illustrated in FIG. 19B, in a spike generation circuit 108, a first end of the capacitor C2 is coupled to the power line 28, and a second end is coupled to the node N4. Other configurations are the same as those of the third embodiment, and the description thereof is thus omitted.

As in the variation 2 of the third embodiment, the capacitor C2 may be coupled to the power line 28. The capacitor C2 may be coupled to a reference potential terminal to which a certain electric potential is supplied, other than the ground line 26 and the power line 28.

[Variation 3 of the Third Embodiment]

Figure 19C:
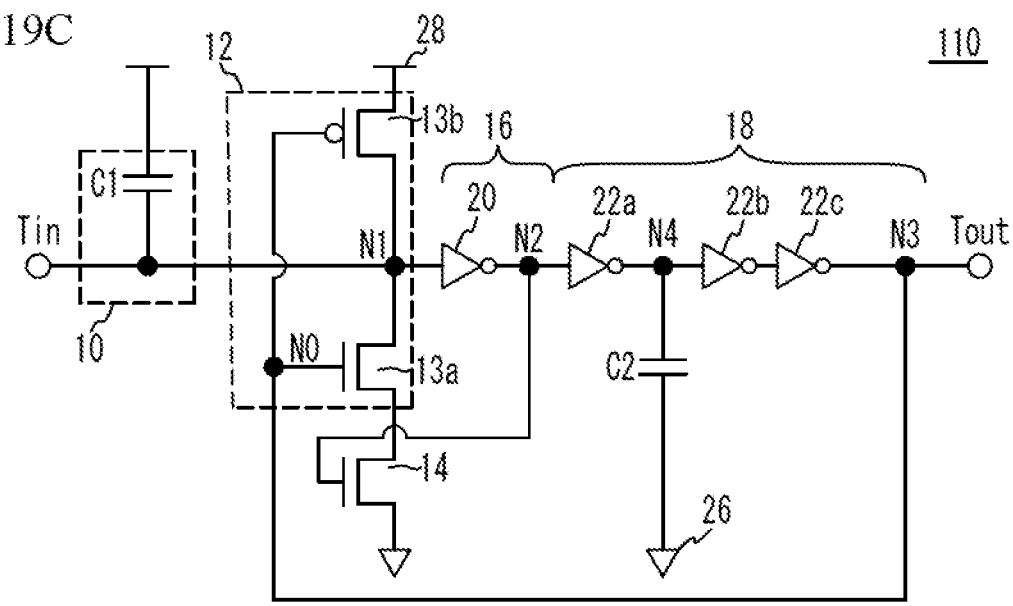

FIG. 19C is a circuit diagram of a spike generation circuit in accordance with a variation 3 of the third embodiment. As illustrated in FIG. 19C, in a spike generation circuit 110, a first end of the capacitor C1 is coupled to the power line 28, and a second end is coupled to the node N1. The FET 14 is an NFET, and the source is coupled to the ground line 26, the drain is coupled to the node N1 through the NFET 13*a*, and the gate is coupled to the node N2. Other configurations are the same as those of the third embodiment, and the description thereof is thus omitted.

Figure 20A:
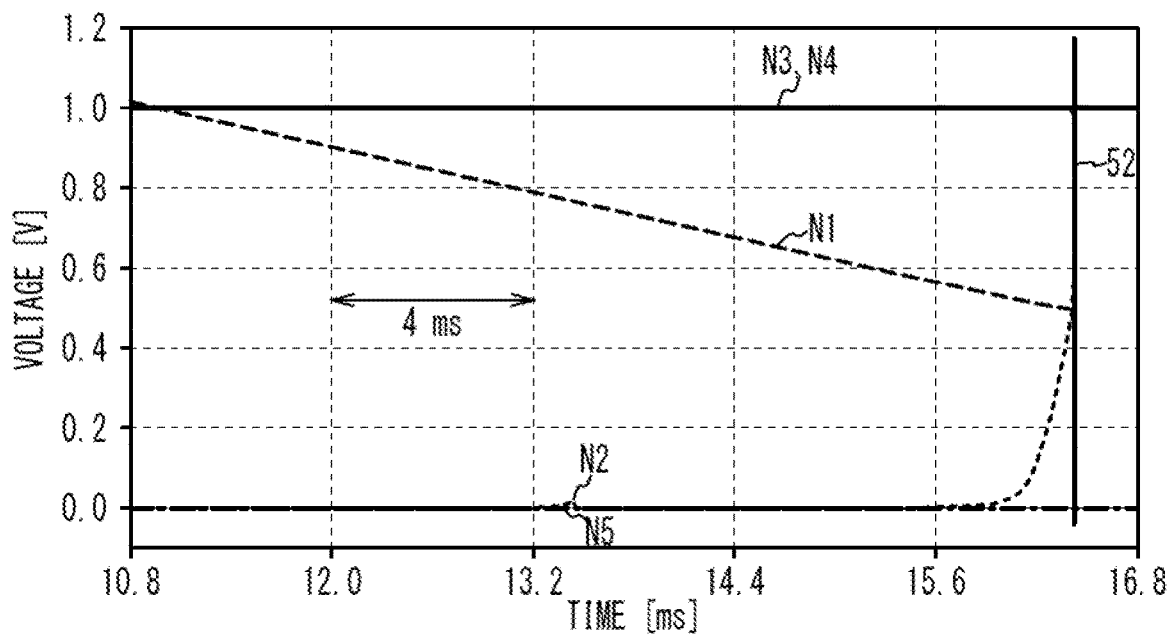
FIG. 20A and FIG. 20B illustrate respective voltages of nodes with respect to time in the variation 3 of the third embodiment.
Figure 20B:
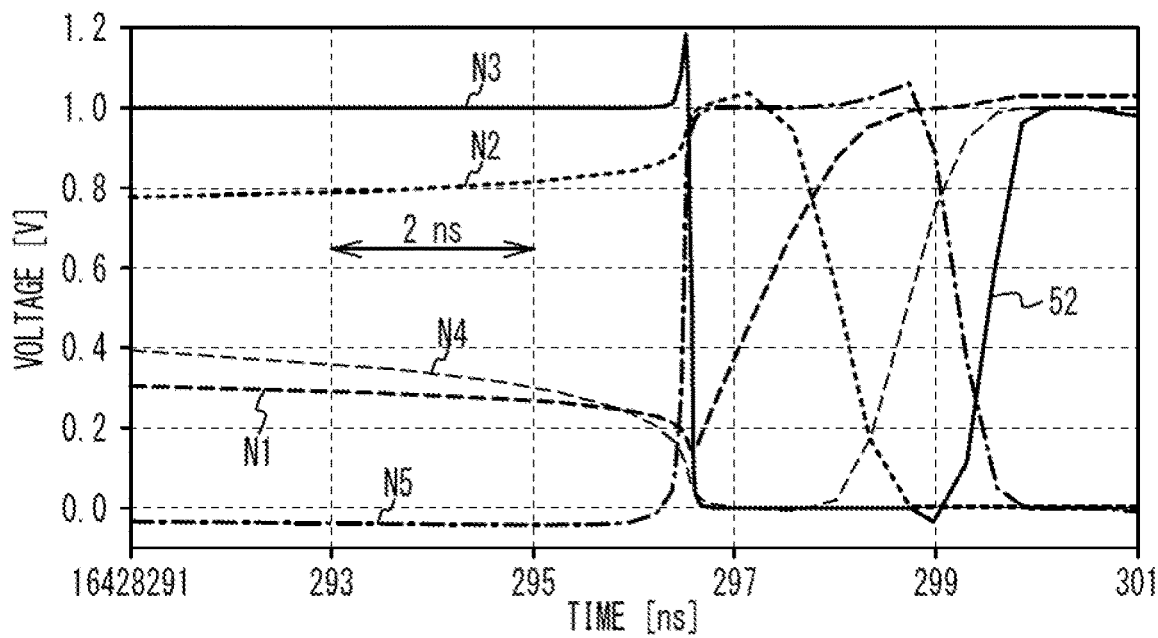

FIG. 20A and FIG. 20B illustrate respective voltages of the nodes with respect to time in the variation 3 of the third embodiment. FIG. 20B is an enlarged view around the spike signal 52 in FIG. 20A.

As illustrated in FIG. 20A, the voltage of the node N1 decreases from 1 V, which is Vdd, with time. When the voltage of the node N1 becomes 0.5 V or less, the spike signal 52 is generated.

As illustrated in FIG. 20B, the respective voltages of the nodes N1 to N5 have waveforms obtained by inverting the top and bottom of the voltages illustrated in FIG. 9B of the third embodiment, respectively. The width of the spike signal 52 is approximately 2 ns, which is approximately equal to that of the third embodiment, and the rise and fall is as steep as those of the third embodiment.

By using an NFET as the FET 14 as described in the variation 3 of the third embodiment, it is possible to handle cases of the negative-going spike signal 50 as in the variation 1 of the second embodiment.

As in the variation 3 of the third embodiment, the capacitor C1 may be coupled to the power line 28. The capacitor C1 may be coupled to a reference potential terminal to which a certain electric potential is supplied, other than the ground line 26 and the power line 28.

[Variation 4 of the Third Embodiment]

Figure 21:
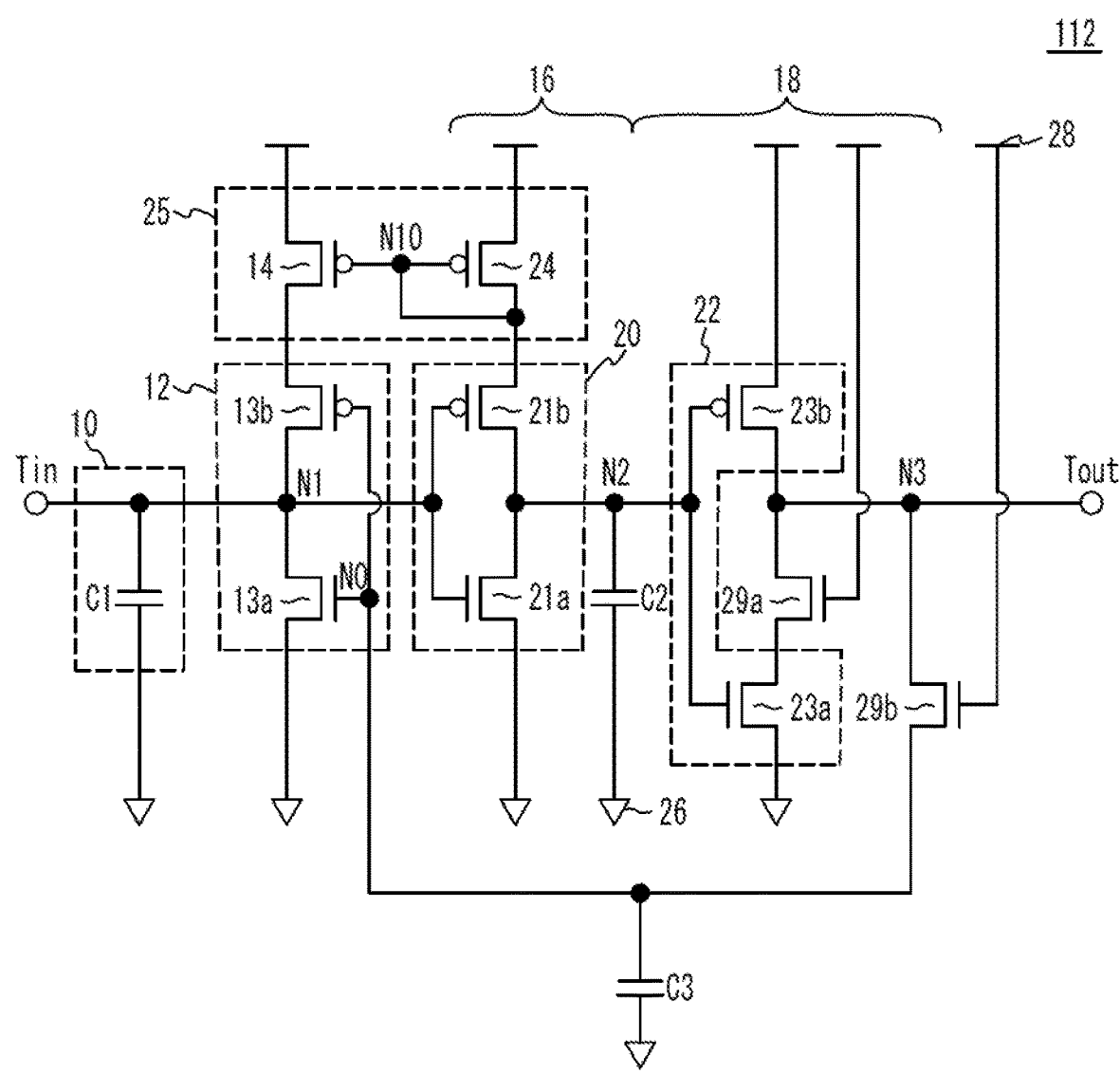
FIG. 21 is a circuit diagram of a spike generation circuit in accordance with a variation 4 of the third embodiment.

FIG. 21 is a circuit diagram of a spike generation circuit in accordance with a variation 4 of the third embodiment. As illustrated in FIG. 21, in a spike generation circuit 112 of the variation 4 of the third embodiment, the inverting circuit 16 includes the inverter 20 and an FET 24. The FET 24 is a PFET, and is connected between the inverter 20 and the power line 28. The gate of the FET 24 and the gate of the FET 14 are coupled to a node N10. The node N10 is coupled to the drain of the FET 24. The FETs 14 and 24 form a current mirror circuit.

When the voltage of the node N1 exceeds the threshold voltage, the node N2 becomes at the low level. The current flowing between the source and the drain of the FET 24 increases. Therefore, the voltage of the node N10 decreases, and the source-drain current of the FET 14 becomes approximately equal to the source-drain current of the FET 24. This applies positive feedback to the node N1.

The inverting circuit 18 includes an inverter 22, the capacitor C2, and NFETs 29*a* and 29*b*. The capacitor C2 is connected between the node N2 and the ground line 26. The input node of the inverter 22 is coupled to the node N2, and the output node is coupled to the node N3. The NFET 29*a* is connected between the node N3 and the NFET 23*a*. The NFET 29*b* is connected between the node N3 and the input node NO of the inverter 20. The gates of the NFETs 29*a* and 29*b* are coupled to the power line 28. A first end of the capacitor C3 is coupled to the node NO, and a second end of the capacitor C3 is coupled to the ground line 26. The capacitor C3 and the NFETs 29*a* and 29*b* serve as a time constant circuit for delaying negative feedback. The NFETs 29*a* and 29*b* serve as resistors. The inverting circuit 18 applies negative feedback to the node N1.

As in the variation 4 of the third embodiment, the gate of the FET 14 does not have to be coupled to the output node N2 of the inverter 20. At least, the inverting circuit 16 outputs an inversion signal of the signal of the node N1 to the gate of the FET 14 when the level of the inverter 20 changes.

As in the third embodiment and the variations thereof, the inverting circuit 16 includes an odd number of the inverters 20 (second CMOS inverters) connected in series with each other between the node N1 and the node N2. The input nodes of the odd number of the inverters 20 are coupled to the node N1 and the output nodes of the odd number of the inverters 20 are coupled to the node N2. The inverting circuit 18 includes an odd number of the inverters 22*a* to 22*g* (third CMOS inverters) connected in series with each other between the nodes N2 and N3. The input nodes of the odd numbers of the inverters 22*a* to 22*g* are coupled to the node N2, and the output nodes of the odd numbers of the inverters 22*a* to 22*g* are coupled to the node N3. This configuration allows the inverting circuit 16 to apply positive feedback and the inverting circuit 18 to apply negative feedback.

The inverting circuit 16 may include three or more inverters 20, but to reduce the size, the number of the inverters 20 is preferably one.

The inverting circuit 18 includes three or more inverters 22*a* to 22*g*. This configuration can narrow the width of the spike signal 52, and steepen the rise and fall of the spike signal 52.

The capacitor C2 (a first capacitance element) having a first end coupled to the node N4 (a fourth node), which is between any adjacent two of three or more inverters 22*a* to 22*g*, and a second end coupled to the ground line 26 or the power line 28 (a first reference potential terminal) is provided. This configuration can narrow the width of the spike signal 52 and steepen the rise and fall of the spike signal 52 as described in the third embodiment and the variation 2 of the embodiment.

The capacitance value of the capacitor C2 is equal to or greater than the gate capacitance value of one FET in the inverters 22*a* to 22*g*. This configuration can narrow the width of the spike signal 52 and steepen the rise and fall of the spike signal 52. For example, the capacitance value of the capacitor C2 is adjusted to be equal to or greater than the gate capacitance value of the FET having the smallest gate capacitance value among the inverters 22*a* to 22*g*.

The input circuit 10 includes the capacitor C1 (a second capacitance element) having a first end coupled to the node N1 and a second end coupled to the ground line 26 or the power line 28 (a second reference potential terminal). This configuration allows the input signal input to the input terminal Tin to be integrated, and the resulting signal to be output to the node N1.

In the second and third embodiments and the variations thereof, to reduce the power consumption in a standby mode other than when generating the spike signal 52, a leakage current of each FET when each FET is off is preferably reduced. Thus, it is preferable to configure the threshold voltage of each FET to be high. For example, the threshold voltages of all FETs or the threshold voltages of some FETs are preferably 0.3×Vdd (the voltage of the power line 28—the voltage of the ground line 26) or greater, more preferably 0.5×Vdd or greater, further preferably 0.8×Vdd or greater. A threshold voltage of 0.3×Vdd or greater means a threshold voltage of +0.3×Vdd or greater in the NFET and a threshold voltage of −0.3×Vdd or less in the PFET. The same applies to the threshold voltages of other FETs.

A voltage higher than the low level (the voltage of the ground line 26), for example, a voltage slightly lower than the threshold voltage Vth is applied to the node N1 over a long period of time. Therefore, the FET of which the leakage current is likely to become largest is the NFET 21a and the PFET 21b of the inverter 20 of which the input node is coupled to the node N1. Therefore, the threshold voltages of the NFET 21a and the PFET 21b of the inverter 20 (when a plurality of the inverters 20 are provided, the inverter in the first stage) is preferably configured to be 0.3× Vdd or greater, more preferably 0.5×Vdd or greater, further preferably 0.8×Vdd or greater.

The allowable maximum leakage current of the spike generation circuit during operations other than the spike generation operation is represented by IK. For example, let's consider making the power consumption of the spike generation circuit equal to or less than a desired electric power when a voltage of approximately Vdd/2 is applied to the node N1 over a long period of time. In this case, when it is assumed that most of the leakage current of the spike generation circuit is the leakage current of the inverter 20, the power consumption of the spike generation circuit can be made to be equal to or less than the desired electric power by adjusting the leakage currents of the NFET 21a and the PFET 21b of the inverter 20 to be equal to or less than IK. The gate voltages of the NFET 21a and the PFET 21b with which the leakage currents of the channels become IK when the sources are grounded are represented by Vn_IK and −(Vp_IK), respectively. In this case, even when a voltage of approximately Vdd/2 is applied to the node N1 over a long period of time, the power consumption can be made to be equal to or less than the desired electric power by achieving Vdd≤Vn_IK+Vp_IK. For example, when the desired electric power is 1 nW, a leakage current IK is $1\times10^{-9}$/Vdd. To further reduce the power consumption, the leakage current IK is preferably made to be $5\times10^{-10}$/Vdd or less, more preferably made to be $2\times10^{-19}$/Vdd or less.

To reduce the leakage current of each FET, the FET is preferably an FET using a silicon on insulator (SOI) substrate. Since this FET has a small leakage current between the source and the drain, the power consumption can be reduced. For example, the leakage current in one FET can be made to be 1 pA or less.

Fourth Embodiment

Figure 22A:
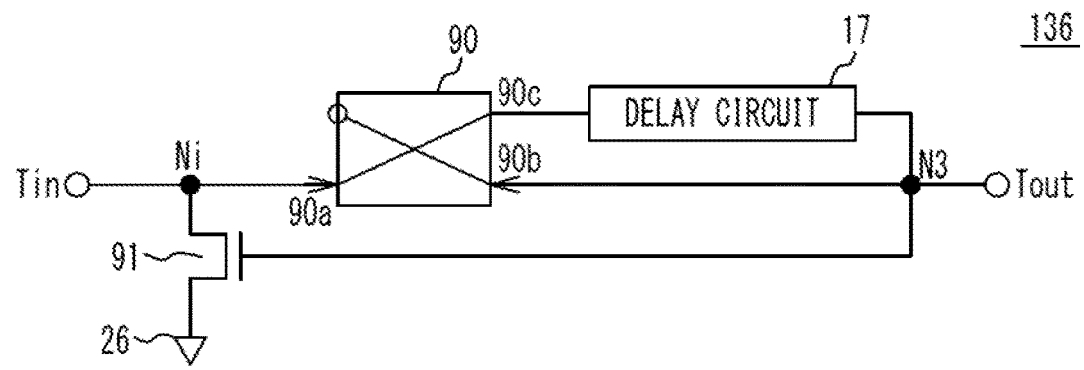
FIG. 22A and FIG. 22B are circuit diagrams of spike generation circuits in accordance with a fourth embodiment.

A fourth embodiment describes specific examples of the variations 3 and 5 of the first embodiment. FIG. 22A to FIG. 23B are circuit diagrams of spike generation circuits in accordance with the fourth embodiment. As illustrated in FIG. 22A, a spike generation circuit 136 of the fourth embodiment includes a flip-flop circuit 90, the delay circuit 17, and an FET 91. The delay circuit 17 is a circuit in which inverters are cascade-connected in an even number of stages as in the delay circuit 17 including the inverting circuits 16 and 18 of the second embodiment and the variation 1 of the second embodiment, for example.

The flip-flop circuit 90 changes an output node 90c to the high level when an input node 90a becomes at the high level, and maintains the high level of the output node 90c until the high level is input to an input node 90b. The flip-flop circuit 90 changes the output node 90c to the low level when the input node 90b becomes at the high level, and maintains the low level of the output node 90c until the high level is input to the input node 90a.

The input node 90a is coupled to the intermediate node Ni coupled to the input terminal Tin. The input node 90b is coupled to the node N3. The output node 90c is coupled to the input node of the delay circuit 17, and the output node of the delay circuit 17 is coupled to the node N3. The FET 91 is an NFET, and the source is coupled to the ground line 26, the drain is coupled to the intermediate node Ni, and the gate is coupled to the node N3.

Figure 22B:
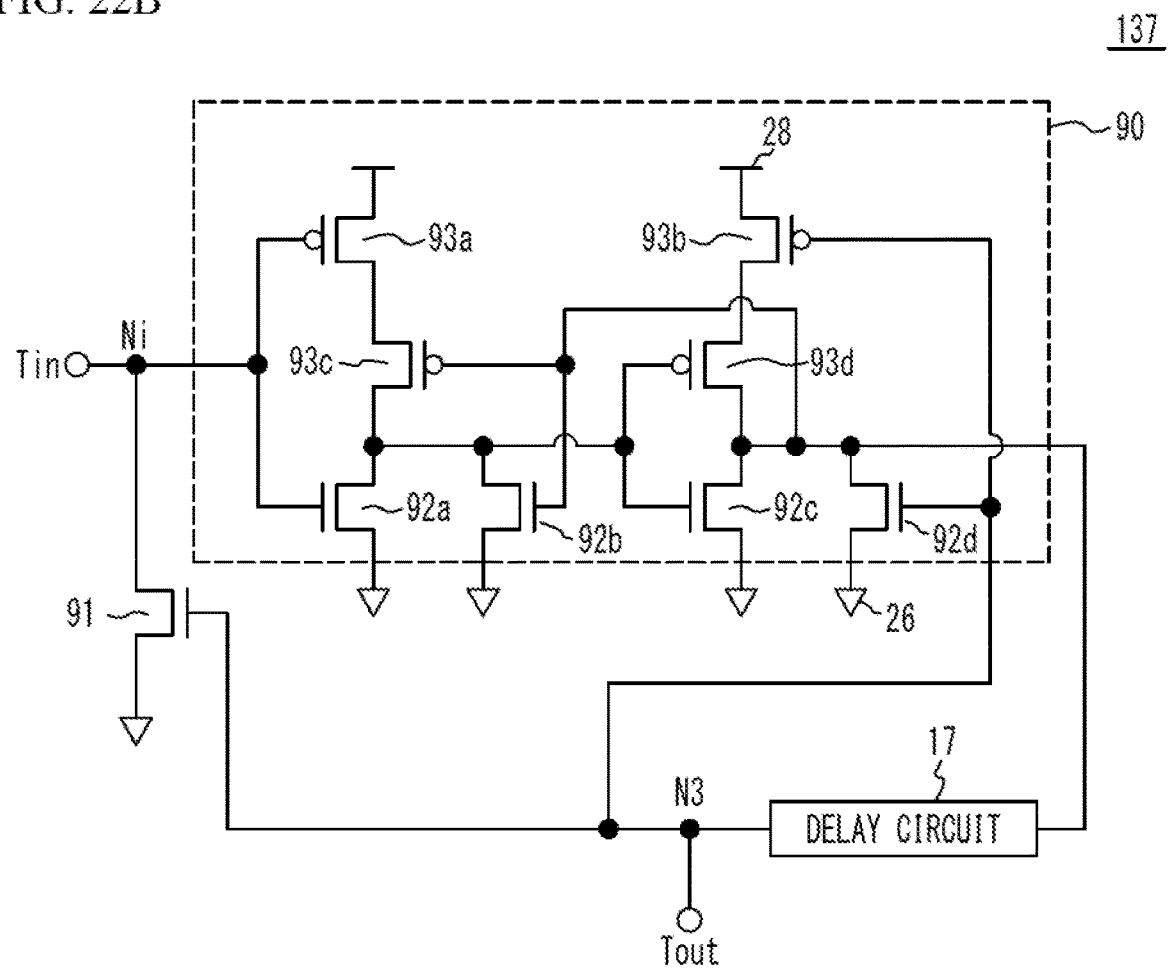
Figure 23A:
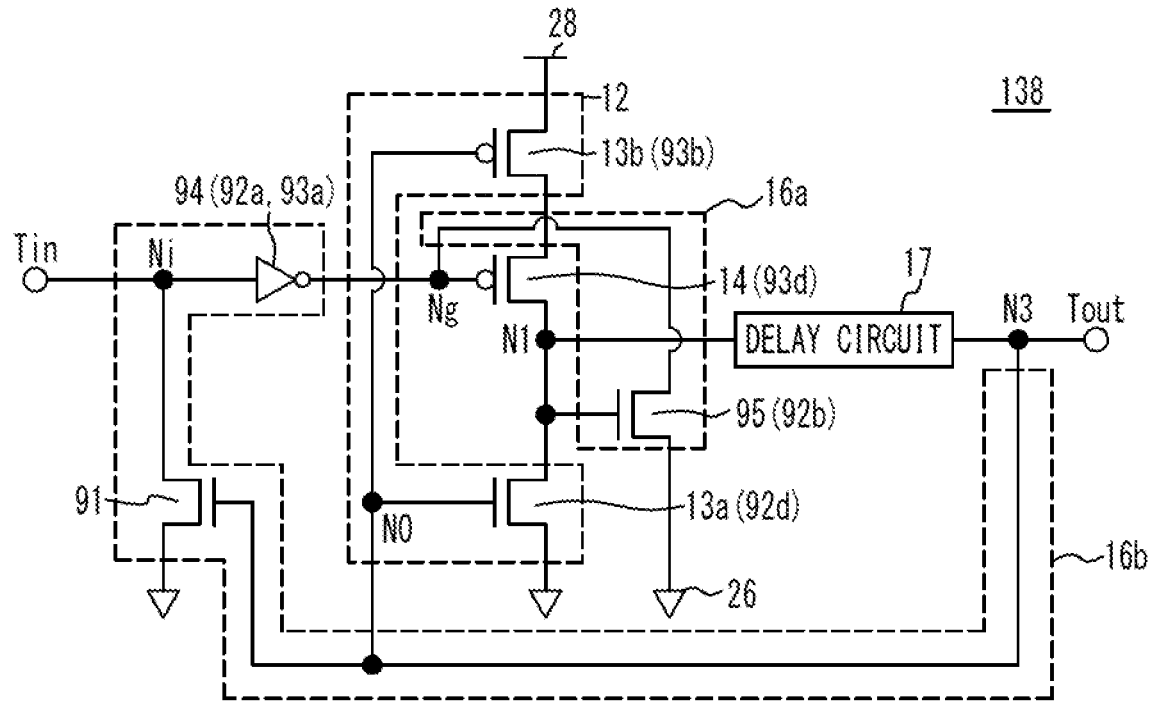
FIG. 23A and FIG. 23B are circuit diagrams of spike generation circuits in accordance with the fourth embodiment.

As illustrated in FIG. 22B, in a spike generation circuit 137, NFETs 92a to 92d and PFETs 93a to 93d are used as the flip-flop circuit 90 in FIG. 22A. In FIG. 22B, the NFET 92c and the PFET 93c can be omitted, and an example where the NFET 92c and the PFET 93c are omitted will be described below. As illustrated in FIG. 23A, in a spike generation circuit 138, neither the NFET 92c nor the PFET 93c is provided. The NFET 92d corresponds to the NFET 13a, and the PFET 93b corresponds to the PFET 13b. The NFET 13a and the PFET 13b are connected in series between the power line 28 and the ground line 26 to form the CMOS inverter 12. The PFET 93d corresponds to the FET 14. The FET 14 is connected in series with the PFET 13b between the node N1 and the power line 28. The gate of the FET 14 is coupled to the node Ng.

The NFET 92b corresponds to an FET 95. The source, the drain, and the gate of the FET 95 are coupled to the ground line 26, the node Ng, and the node N1, respectively. The NFET 92a and the PFET 93a correspond to the CMOS inverter 94. The input node and the output node of the CMOS inverter 94 are coupled to the nodes Ni and Ng, respectively. The input node and the output node of the delay circuit 17 are coupled to the nodes N1 and N3, respectively.

The inverting circuit 16 includes inverting circuits 16a and 16b. The inverting circuit 16a includes the FET 95. The inverting circuit 16b includes the FET 91 and the inverter 94.

Figure 23B:
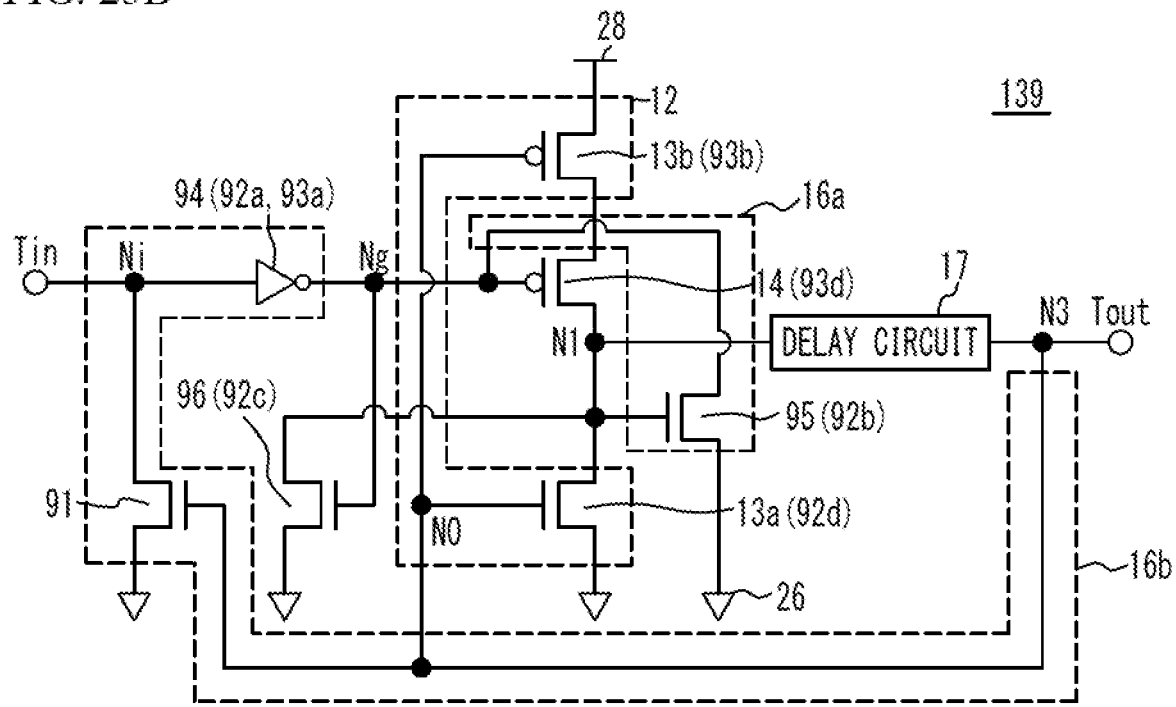

As illustrated in FIG. 23B, in a spike generation circuit 139, the NFET 92c of FIG. 22B is provided to the spike generation circuit 138 of FIG. 23A. The NFET 92c corresponds to an FET 96. The source, the drain, and the gate of the FET 96 are coupled to the ground line 26, the node N1, and the node Ng, respectively. In the spike generation circuit 138 of FIG. 23A, when the FET 14 is turned off, the node N1 becomes floating. In the spike generation circuit 139, when the FET 14 is turned off, the FET 96 is turned on, and therefore, the node N1 becomes at the low level. This prevents the node N1 from becoming floating. The fourth embodiment may be any of the circuits illustrated in FIG. 22A to FIG. 23B.

Figure 24:
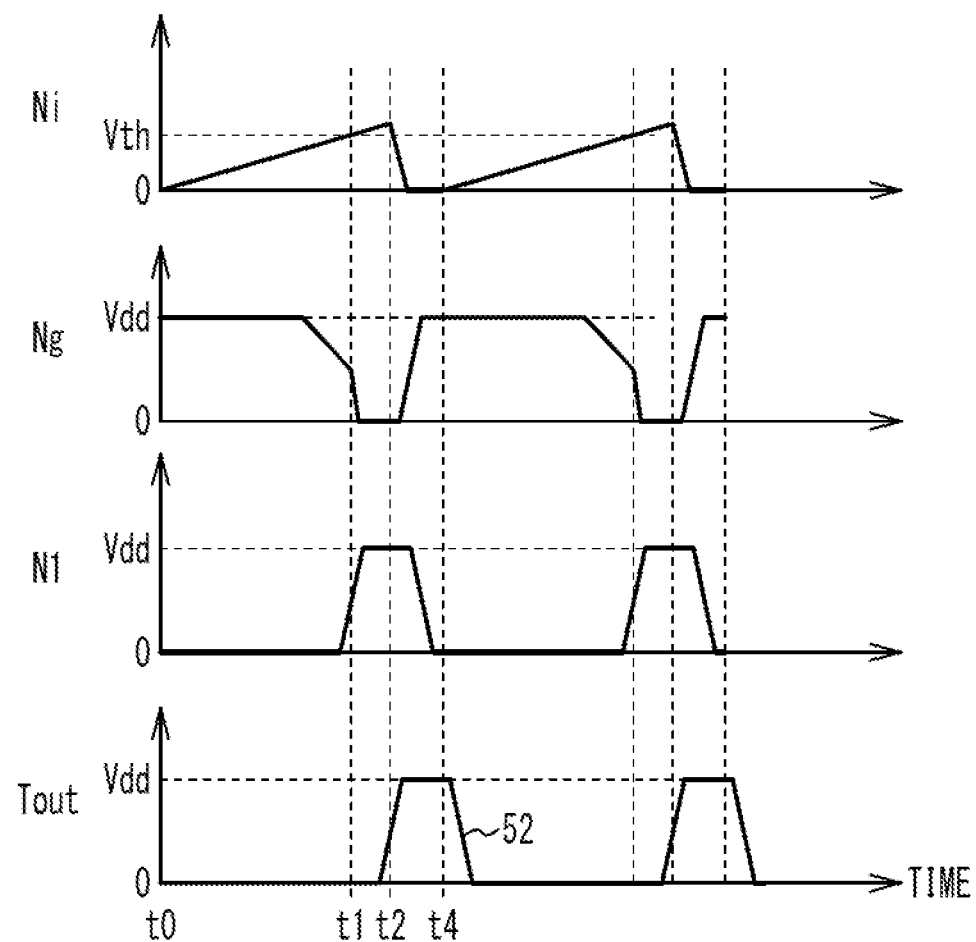
FIG. 24 illustrates respective voltages of a terminal and nodes with respect to time in the fourth embodiment.

The operation of the fourth embodiment will be described using the circuit illustrated in FIG. 23B as an example. FIG. 24 illustrates respective voltages of the terminals and the nodes with respect to time in the fourth embodiment, and illustrates respective voltages of the node Ni, the node Ng corresponding to the gate of the FET 14, the node N1, and the output terminal Tout (i.e., the node N3). At time t0, the voltage of the node Ni is 0 V, the voltage of the node Ng is the high level (Vdd), the voltage of the node N1 is the low level (0 V), and the voltage of the output terminal Tout is the low level (0 V). The input node N0 of the inverter 12 is at the low level. Since the node Ng is at the high level and the FET 14 is off, the inverter 12 does not function. In addition, since the FET 96 is turned on, the node N1 becomes at the low level.

An example where the voltage, as the input signal, increases at a constant rate with time will be described. At and after time t0, the voltage of the node Ni increases with time. When the voltage of the node Ni does not reach the threshold voltage of the inverter 94a, the voltage of the node Ng is Vdd. As the voltage of the node Ni becomes closer to the threshold voltage Vth, the voltage of the node Ng gradually decreases. This is because the output voltage of the inverter gradually decreases even before the input voltage of the inverter reaches the threshold voltage as the inverter is not an ideal inverter. In this state, since the FET 14 is off and the FET 96 is on, the node N1 maintains at the low level.

When the voltage of the node Ni reaches the threshold voltage Vth at time t1, the voltage of the node Ng reaches the threshold voltage of the FET 14. Therefore, the voltage of the node N1 increases. When the FET 95 is turned on, the voltage of the node Ng becomes the low level. The FET 14 is turned on, and the FET 96 is turned off. Therefore, the voltage of the node N1 becomes the high level. As seen above, the FET 95 serves as the inverting circuit 16*a* that changes the node Ng to the low level when the node N1 becomes at the high level. Positive feedback is applied to the node N1 by the inverting circuit 16*a* and the FET 14, and thereby, the voltage of the node N1 steeply rises.

The delay circuit 17 changes the output terminal Tout to the high level at time t2 delayed from time t1. Since the gate of the FET 91 becomes at the high level, the FET 91 is turned on, and the voltage of the node Ni becomes 0 V. The node Ng becomes at the high level. Since the FET 14 is turned off and the FET 96 is turned on, the node N1 becomes at the low level. As seen above, the FET 91 and the inverter 94 serve as the inverting circuit 16*b* that changes the node Ng to the high level and the node N1 to the low level when the node N3 becomes at the high level.

The delay circuit 17 changes the output terminal Tout to the low level at time t4 delayed from time t2. Accordingly, the spike signal 52 with a pulse width of (t4–t2) is output to the output terminal Tout.

A case where no inverter 94 is provided and the control terminal of the FET 14 is coupled to the node Ni in FIG. 23B will be discussed. In this case, the node Ni is included in the positive feedback loop from the node N1 through the FETs 95 and 14, and the node Ni is maintained at the low level. Therefore, it is preferable to provide the inverter 94 between the intermediate node Ni and the gate of the FET 14.

Figure 25:
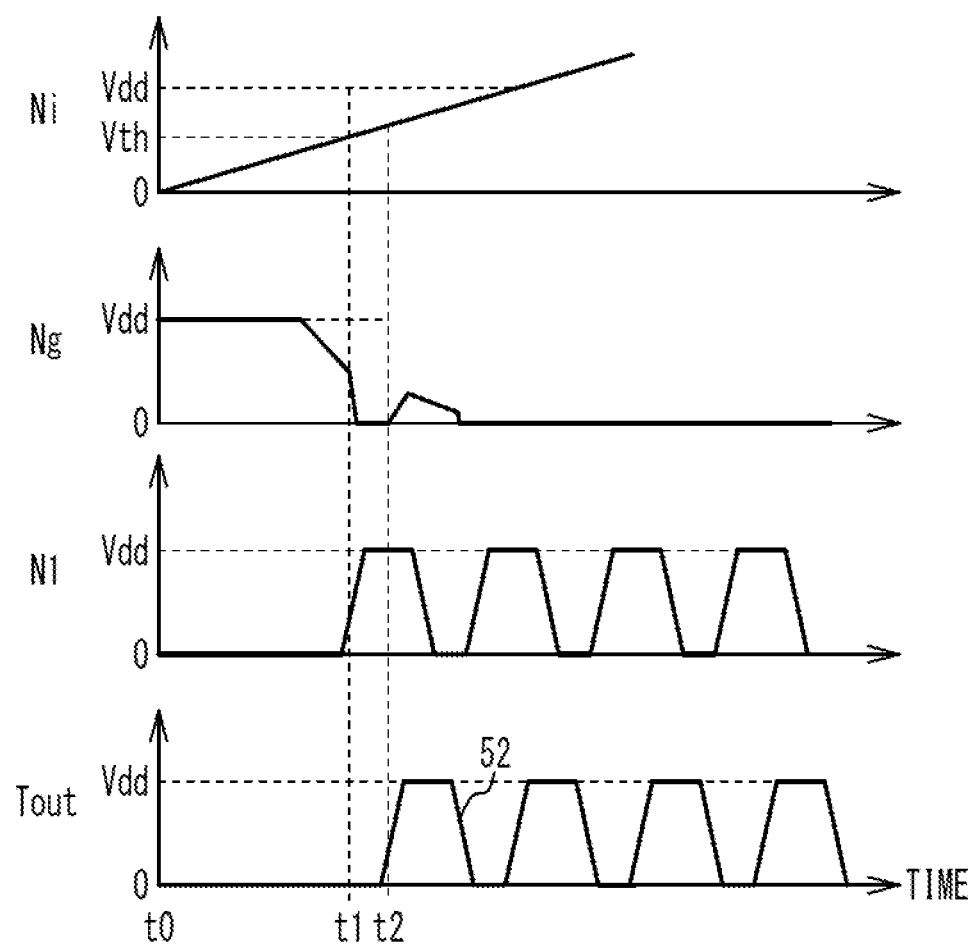
FIG. 25 illustrates voltages with respect to time when no FET 91 is provided.

In FIG. 23B, a case where no FET 91 is provided and the output terminal Tout is not fed back to the intermediate node Ni will be discussed. FIG. 25 illustrates voltages with respect to time when no FET 91 is provided. As illustrated in FIG. 25, even when the output terminal Tout becomes at the high level at time t2, the voltage of the node Ni does not become 0 V, and continues to increase. Since the positive feedback through the FET 95 and the negative feedback through the delay circuit 17 are alternately applied, the voltage of the node N1 alternately become the low level and the high level, repeatedly, and the spike signal 52 is repeatedly output from the output terminal Tout. In such a case, that is, when the inverting circuit 16*a* does not change the gate of the FET 14 to the high level even when the node N1 becomes at the low level, it is preferable to provide the FET 91. Provision of the FET 91 can prevent the spike signal from being repeatedly output.

[Variation 1 of the Fourth Embodiment]

Figure 26A:
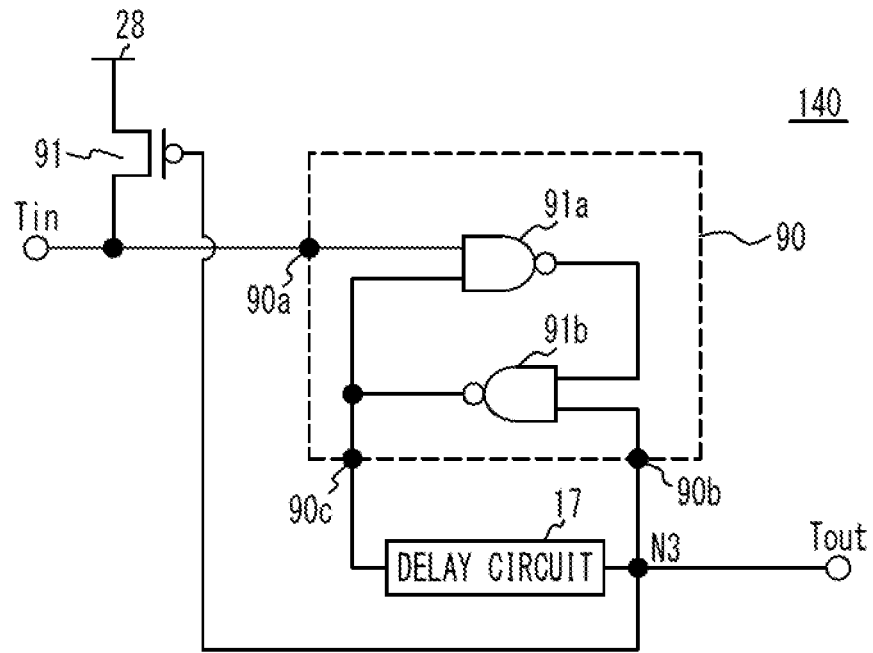
FIG. 26A and FIG. 26B are circuit diagrams of spike generation circuits in accordance with a variation 1 of the fourth embodiment.
Figure 26B:
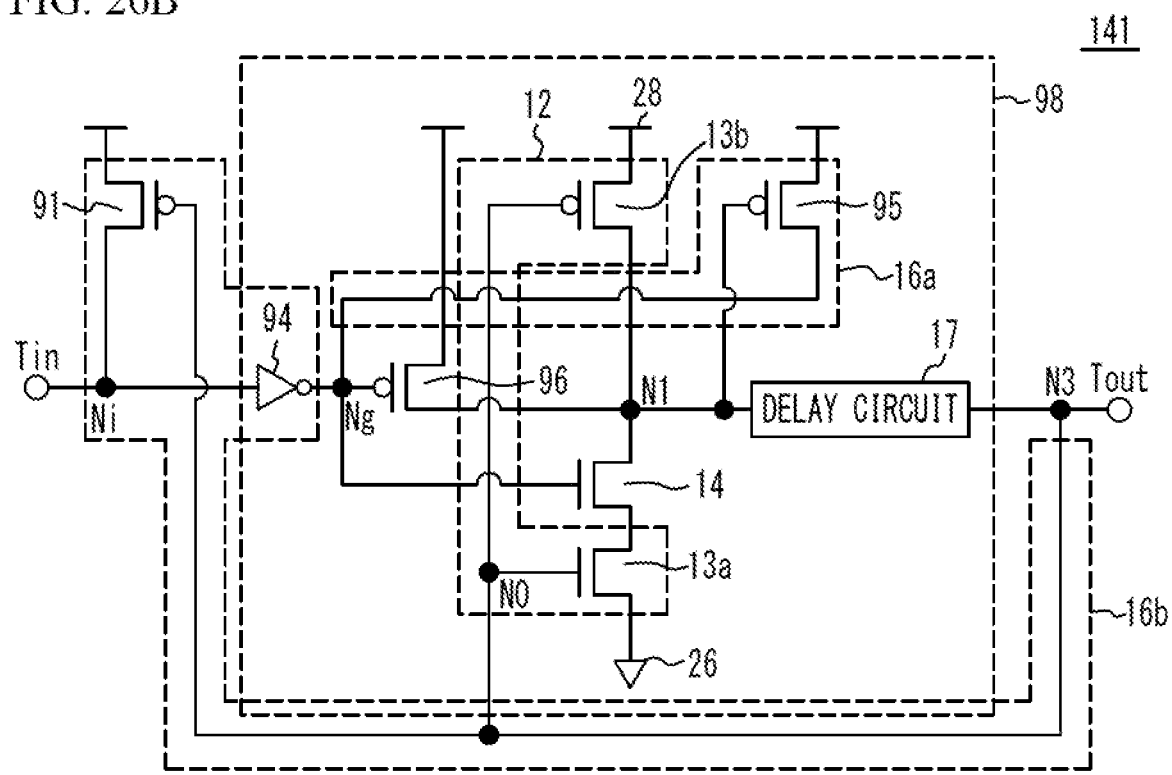

FIG. 26A and FIG. 26B are circuit diagrams of spike generation circuits in accordance with a variation 1 of the fourth embodiment. As illustrated in FIG. 26A, in a spike generation circuit 140, a latch including NAND circuits 91*a* and 91*b* is used as the flip-flop circuit 90. The FET 91 is a PFET, and the source of the FET 91 is coupled to the power line 28. Other configurations are the same as those of the spike generation circuit 136 in FIG. 22A, and the description thereof is thus omitted.

As illustrated in FIG. 26B, in a spike generation circuit 141, the flip-flop circuit 90 is rewritten using FETs, and the FET that can be omitted is omitted. Compared with the spike generation circuit 139 in FIG. 23B, the FET 14 is an NFET, and the FET 14 is connected in series with the FET 13*a* between the node N1 and the ground line 26. The FETs 95 and 96 are PFETs. The sources of the FETs 95 and 96 are coupled to the power line 28. The inverter 94 to the delay circuit 17 form a circuit 98. Other configurations are the same as those of the spike generation circuit 139 illustrated in FIG. 23B, and the description thereof is thus omitted.

In the variation 1 of the third embodiment, the input signal input to the input terminal Tin is a signal that drops from the high level to the low level like the signal of the input terminal Tin illustrated in FIG. 5B of the variation 5 of the first embodiment. The spike signal 52 with the low level is output from the output terminal Tout as illustrated in FIG. 5B.

The spike generation circuit 135 of the variation 5 of the first embodiment can be achieved by using an NFET as the FET 14 as in the spike generation circuit 141.

[Variation 2 of the Fourth Embodiment]

Figure 27A:
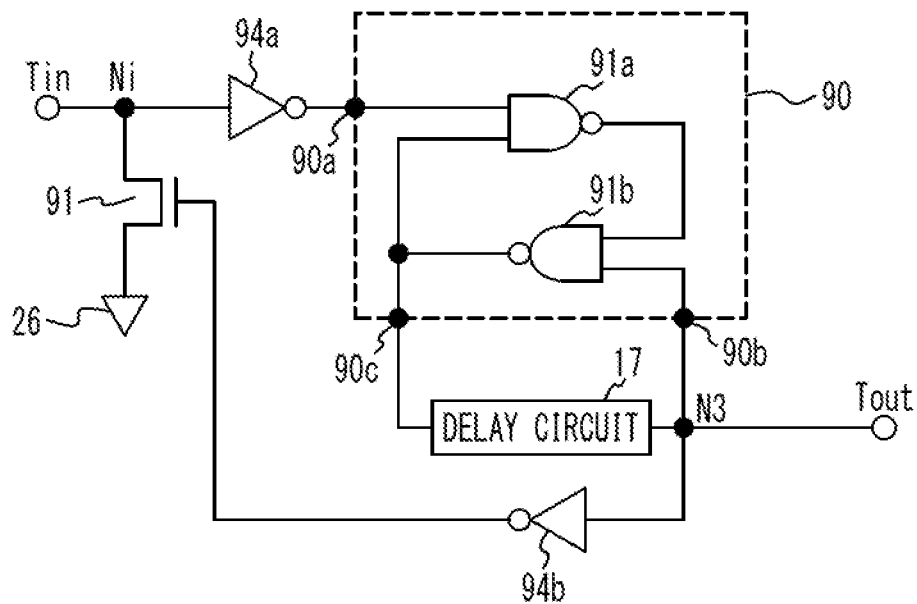
FIG. 27A and FIG. 27B are circuit diagrams of spike generation circuits in accordance with a variation 2 of the fourth embodiment.
Figure 27B:
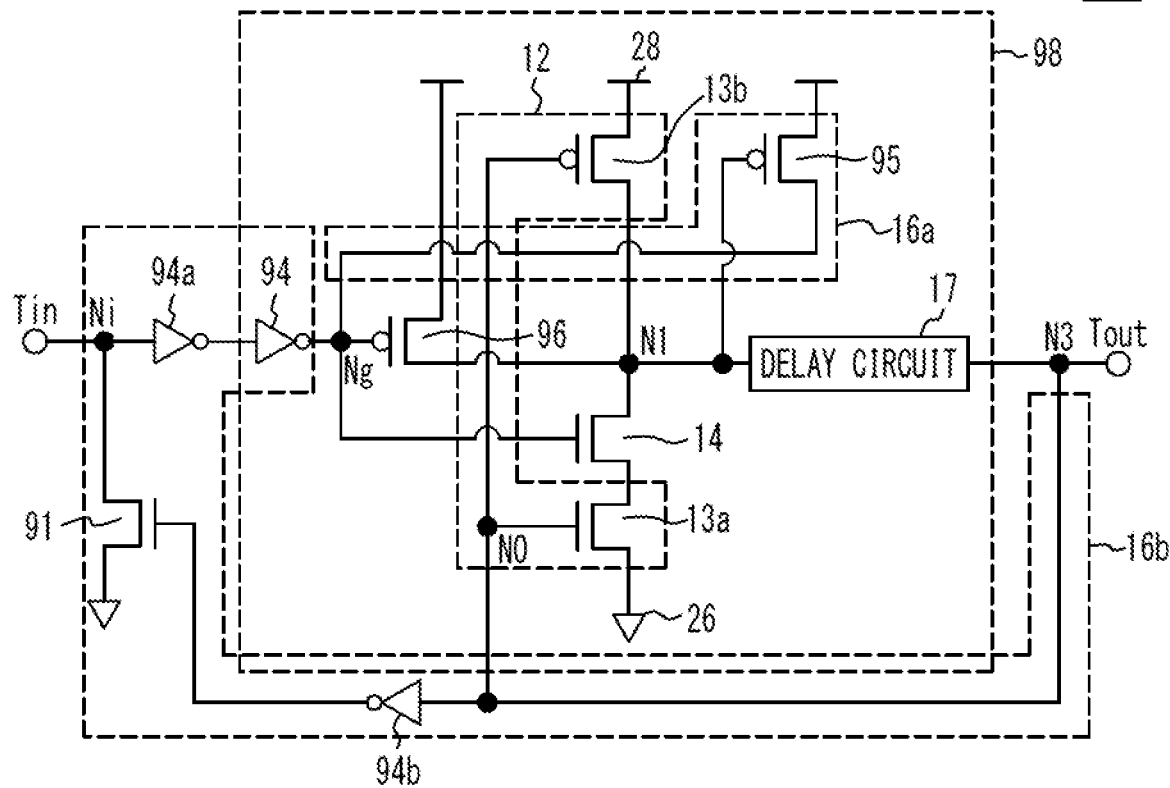

FIG. 27A and FIG. 27B are circuit diagrams of spike generation circuits in accordance with a variation 2 of the fourth embodiment. As illustrated in FIG. 27A, in a spike generation circuit 142, in addition to the spike generation circuit 140 of FIG. 26A, inverters 94*a* and 94*b* are provided. The inverter 94*a* is connected between the node Ni and the input node 90*a* of the flip-flop circuit 90, and the inverter 94*b* is connected between the node N3 and the gate of the FET 91. The FET 91 is an NFET, and its source is coupled to the ground line 26. Other configurations are the same as those of the spike generation circuit 140 illustrated in FIG. 26A, and the description thereof is thus omitted.

As illustrated in FIG. 27B, in a spike generation circuit 143, the flip-flop circuit 90 is rewritten using FETs, and the FET that can be omitted is omitted. The circuit 98 of the spike generation circuit 143 is the same as the circuit 98 of the spike generation circuit 141 in FIG. 26B. The FET 91 is an NFET, and the inverters 94*a* and 94*b* are provided. The inverting circuit 16*b* includes inverters 94, 94*a*, and 94*b* and the FET 91. Other configurations are the same as those of the spike generation circuit 141 in FIG. 26B, and the description thereof is thus omitted.

The input signal input to the input terminal Tin is a signal that rises from the low level to the high level like the signal of the input terminal Tin illustrated in FIG. 3B of the variation 3 of the first embodiment. The inverter 94*a* converts the input signal to a signal that drops from the high level to the low level like the signal of the input terminal Tin in FIG. 5B of the variation 5 of the first embodiment. The spike signal 52 with the low level as illustrated in FIG. 5B is output from the output terminal Tout. The inverter 94*b* inverts the signal of the node N3, and outputs the inverted signal to the gate of the FET 91.

As with the spike generation circuit 143, the input signal may be inverted. In this case, the node Ni can be reset by providing the inverter 94*b*.

[Variation 3 of the Fourth Embodiment]

Figure 28A:
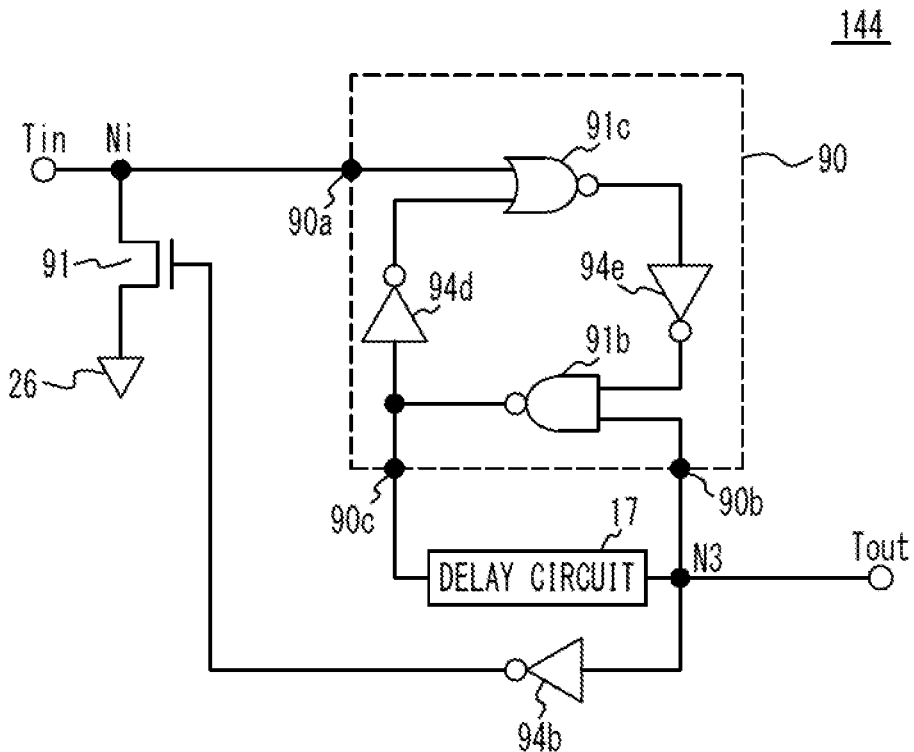
FIG. 28A and FIG. 28B are circuit diagrams of spike generation circuits in accordance with a variation 3 of the fourth embodiment.
Figure 28B:
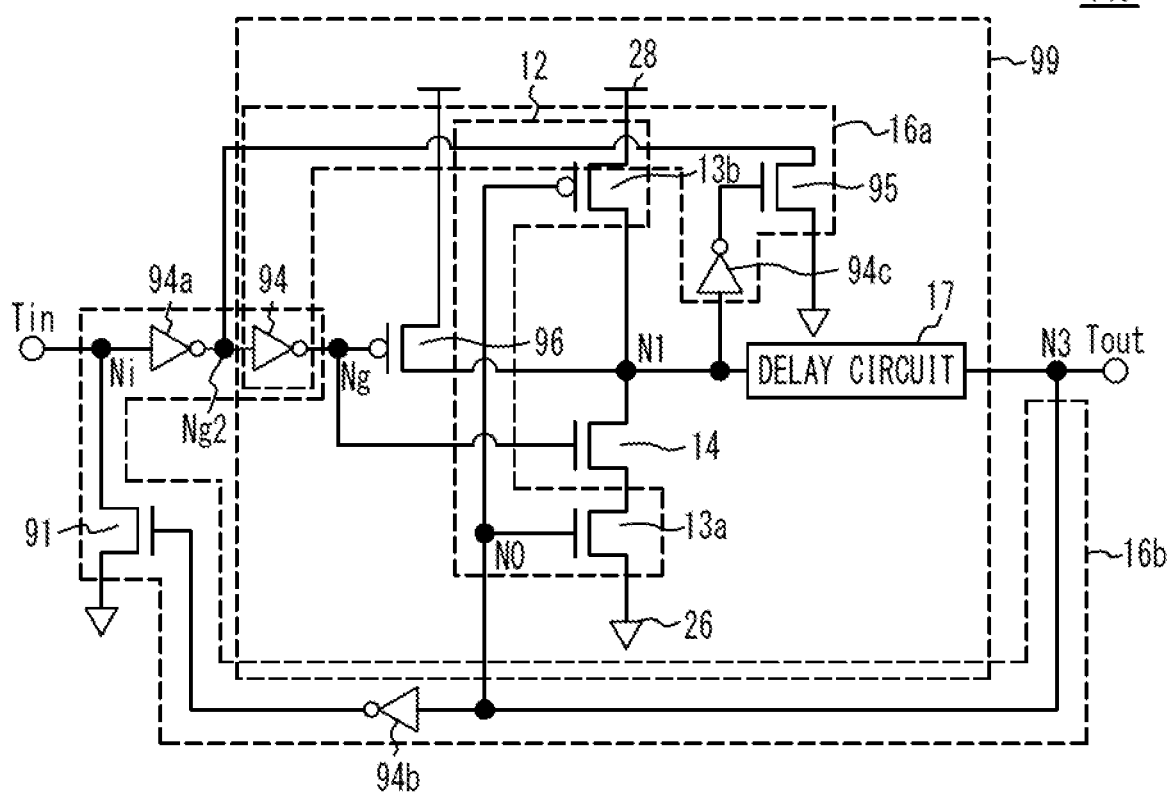

FIG. 28A and FIG. 28B are circuit diagrams of spike generation circuits in accordance with a variation 3 of the fourth embodiment. As illustrated in FIG. 28A, in a spike generation circuit 144, a latch including an NOR circuit 91*c* and a NAND circuit 91*b* are used as the flip-flop circuit 90. Inverters 94*d* and 94*e* are provided in the loop of the NOR circuit 91*c* and the NAND circuit 91*b*. No inverter 94*a* is provided. Other configurations are the same as those of the spike generation circuit 142 in FIG. 27A, and the description thereof is thus omitted.

As illustrated in FIG. 28B, in a spike generation circuit 145, the flip-flop circuit 90 is rewritten using FETs, and the FET that can be omitted is omitted. Compared with the spike generation circuit 143 in FIG. 27B, the FET 95 is an NFET. An inverter 94*c* inverts the signal of the node N1, and outputs the inverted signal to the gate of the FET 95. The drain of the FET 95 is coupled to a node Ng2 between the inverters 94*a* and 94. The inverter 94 inverts the signal of the node Ng2, and outputs the inverted signal to the node Ng. The inverting circuit 16*a* includes the inverters 94 and 94*c* and the FET 95. The inverting circuit 16*b* includes the inverters 94, 94*a*, and 94*b* and the FET 91. Other configurations are the same as those of the spike generation circuit 143 illustrated in FIG. 27B, and the description thereof is thus omitted.

The input signal is a signal that rises from the low level to the high level. The signal of the node Ng2 is a signal that drops from the high level to the low level. A circuit 99, which includes the inverter 94 to the delay circuit 17, outputs the spike signal 52 with the low level as the spike generation circuit 135 of the variation 5 of the first embodiment does.

The inverting circuit 16*a* may include the inverters 94 and 94*c* in addition to the FET 95 as the spike generation circuit 145 does. The inverting circuits 16*a* and 16*b* may share one or some of the circuit elements (for example, the inverter 94).

[Variation 4 of the Fourth Embodiment]

Figure 29A:
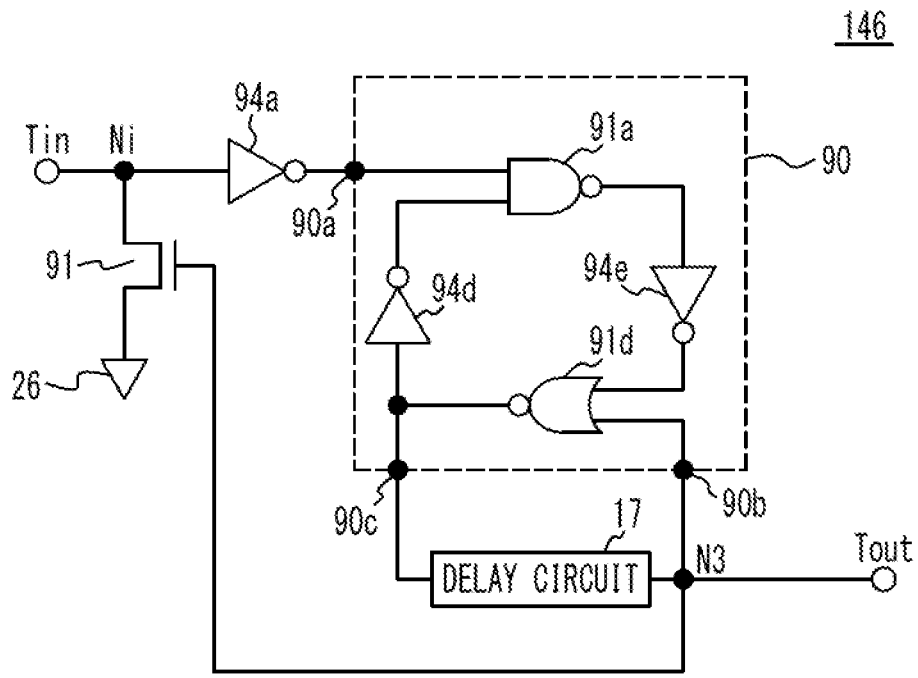
FIG. 29A and FIG. 29B are circuit diagrams of spike generation circuits in accordance with a variation 4 of the fourth embodiment.
Figure 29B:
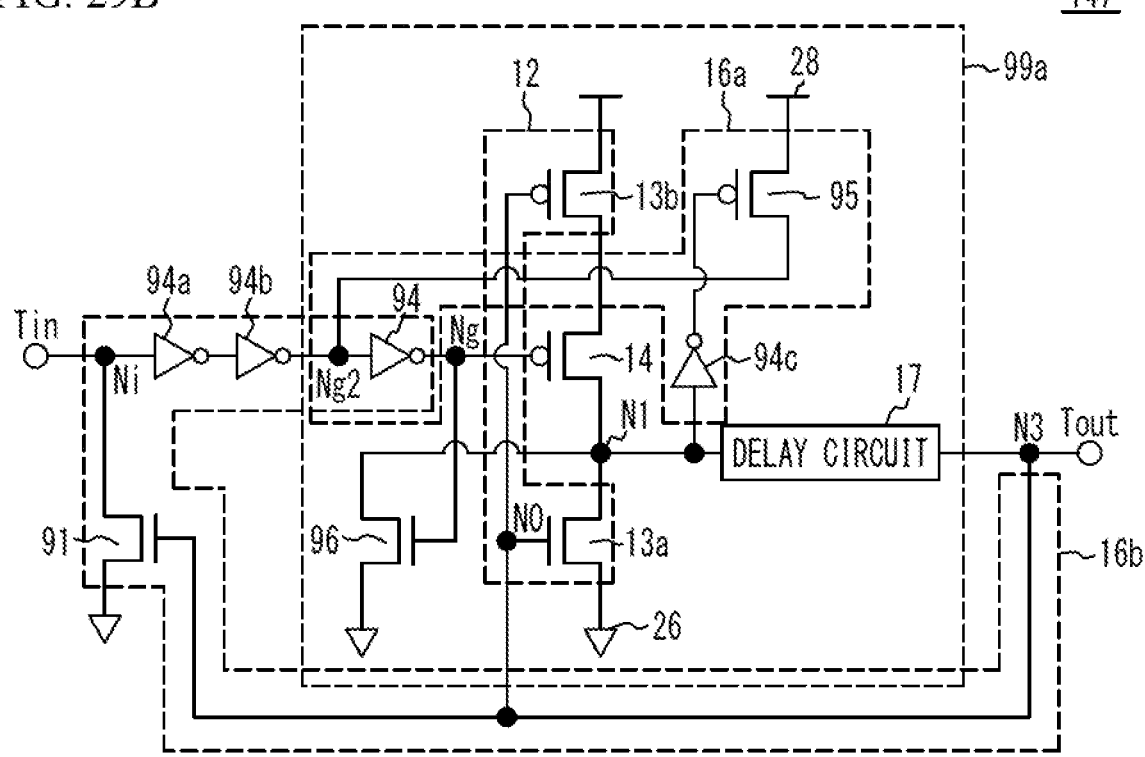

FIG. 29A and FIG. 29B are circuit diagrams of spike generation circuits in accordance with a variation 4 of the fourth embodiment. As illustrated in FIG. 29A, in a spike generation circuit 146, a latch including the NAND circuit 91*a* and an NOR circuit 91*d* is used as the flip-flop circuit 90. The inverters 94*d* and 94*e* are provided in the loop of the NAND circuit 91*a* and the NOR circuit 91*d*. The inverter 94*a* is provided between the node Ni and the input node 90*a* of the flip-flop circuit 90, and no inverter 94*b* is provided between the output terminal Tout and the gate of the FET 91. Other configurations are the same as those of the spike generation circuit 144 illustrated in FIG. 28A, and the description thereof is thus omitted.

As illustrated in FIG. 29B, in a spike generation circuit 147, the flip-flop circuit 90 is rewritten using FETs, and the FET that can be omitted is omitted. Compared with the spike generation circuit 145 in FIG. 28B, the inverter 94*b* is provided between the inverters 94*a* and 94, and no inverter is provided between the node N3 and the gate of the FET 91. The FET 96 is an NFET, and the FETs 14 and 95 are PFETs. The inverting circuit 16*a* includes the inverters 94 and 94*c* and the FET 95. The inverting circuit 16*b* includes the inverters 94, 94*a*, and 94*b* and the FET 91. Other configurations are the same as those of the spike generation circuit 145 illustrated in FIG. 28B, and the description thereof is thus omitted.

The input signal is a signal that rises from the low level to the high level. The signal of the node Ng2 is a signal that rises from the low level to the high level. A circuit 99*a*, which includes the inverter 94 to the delay circuit 17, outputs the spike signal 52 with the high level as the spike generation circuit 133 of the third variation 5 of the first embodiment does.

As in the spike generation circuits 143, 145, and 147, the inverting circuits 16*a* and 16*b* may include an inverter as appropriate.

[Variation 5 of the Fourth Embodiment]

Figure 30A:
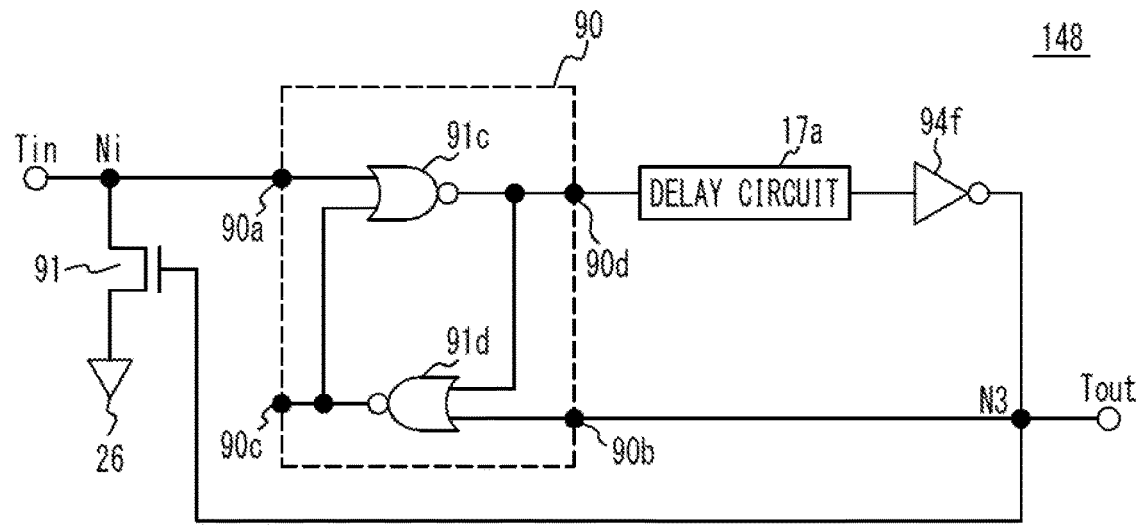
FIG. 30A and FIG. 30B are circuit diagrams of spike generation circuits in accordance with a variation 5 of the fourth embodiment.
Figure 30B:
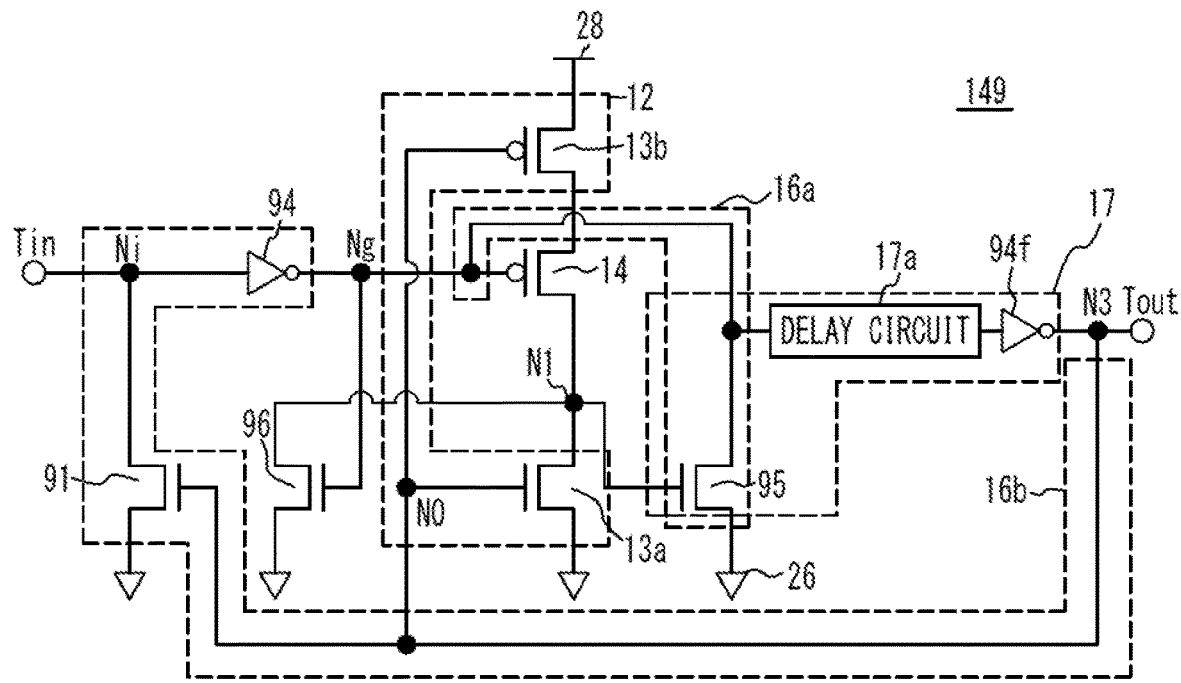

FIG. 30A and FIG. 30B are circuit diagrams of spike generation circuits in accordance with a variation 5 of the fourth embodiment. As illustrated in FIG. 30A, in a spike generation circuit 148, a latch including the NOR circuits 91*c* and 91*d* is used as the flip-flop circuit 90. An inverter 94*f* is connected in series with a delay circuit 17*a* between an output node 90*d*, which is complementary to the output node 90*c* of the flip-flop circuit 90, and N3. The output node 90*d* outputs a signal complementary to that of the output node 90*c*. Thus, the provision of the inverter 94*f* in the stage prior to or subsequent to the delay circuit 17*a* enables to obtain the function substantially equal to the function obtained when the delay circuit 17*a* is coupled to the output node 90*c*. Also in the spike generation circuits 136, 138, 140, 142, 144, and 146, the delay circuit 17*a* and the inverter 94*f* may be connected between the output node complementary to the output node 90*c* and the node N3. Other configurations are the same as those of the spike generation circuit 136 illustrated in FIG. 22A, and the description thereof is thus omitted.

As illustrated in FIG. 30B, in a spike generation circuit 149, the flip-flop circuit 90 is rewritten using FETs, and the FET that can be omitted is omitted. Compared with the spike generation circuit 139 illustrated in FIG. 23B, the input node of the delay circuit 17*a* is coupled to the node Ng (i.e., the drain of the FET 95), and the output of the delay circuit 17*a* is coupled to the node N3 through the inverter 94*f*. The FET 95, the delay circuit 17*a*, and the inverter 94*f* serve as the delay circuit 17. Other configurations are the same as those of the spike generation circuit 139 illustrated in FIG. 23B, and the description thereof is thus omitted.

As in the spike generation circuit 149, the inverting circuit 16*a* and the delay circuit 17 may share one or some of the circuit elements (for example, the FET 95).

In the fourth embodiment and the variation 1 thereof, the inverter 12 outputs a first level (one of the high level and the low level) and a second level (the other of the high level and the low level). The FET 14 (a first switch) is turned on when the first level is input to the gate (a control terminal), and is turned off when the second level is input to the gate. When the FET 14 is an NFET, the first level is the high level, and the second level is the low level. When the FET 14 is a PFET, the first level is the low level and the second level is the high level.

The inverting circuit 16*a* (a first inverting circuit) outputs the first level to the gate of the FET 14 when the node N1 changes from the first level to the second level. For example, in the spike generation circuits 139, 147, and 149 illustrated in FIG. 23B, FIG. 29B, and FIG. 30B, respectively, when the node N1 changes from the low level to the high level, the inverting circuit 16*a* outputs the low level to the gate of the FET 14. In the spike generation circuits 141, 143, and 145 illustrated in FIG. 26B, FIG. 27B, and FIG. 28B, respectively, when the node N1 changes from the high level to the low level, the inverting circuit 16*a* outputs the high level to the gate of the FET 14.

The inverting circuit 16*b* (a second inverting circuit) outputs the second level to the gate of the FET 14 when the output of the delay circuit 17 becomes at the second level. For example, in the spike generation circuits 139, 147, and 149 illustrated in FIG. 23B, FIG. 29B, and FIG. 30B, respectively, when the node N3 becomes at the high level, the inverting circuit 16*b* outputs the high level to the gate of the FET 14. In the spike generation circuits 141, 143, and 145 illustrated in FIG. 26B, FIG. 27B, and FIG. 28B, respectively, when the node N3 becomes at the low level, the inverting circuit 16*b* outputs the low level to the gate of the FET 14. The intermediate node Ni is provided in the inverting circuit 16*b*.

Thus, as illustrated in FIG. 24, the power consumption can be reduced and the spike signal 52 having a narrow pulse width can be generated.

The inverting circuit 16b includes the FET 91 (a second switch) of which the gate (the control terminal) is coupled to the output (the node N3) of the delay circuit 17. The FET 91 connects the power supply, to which an initial level of the input signal is supplied, to the intermediate node Ni when the delay circuit 17 outputs the second level. For example, when the initial level of the input signal is the low level as illustrated in FIG. 3B, the FET 91 is an NFET, and connects the intermediate node Ni to the ground line 26. For example, when the initial level of the input signal is the high level as illustrated in FIG. 5B, the FET 91 is a PFET, and connects the intermediate node Ni to the power line 28. This can reset the intermediate node Ni and change the node Ng to the second level.

The input node of the inverter 94 (a second MOS inverter) is coupled to the node Ni, and the output node of the inverter 94 is coupled to the gate (the node Ng) of the FET 14. In this configuration, the node Ni is not included in the positive feedback loop 15. Thus, the voltage of the node Ng can vary with the input signal.

The inverting circuit 16a includes the FET 95 (a third switch) of which the gate is coupled to the node N1, and the FET 95 connects the gate (the node Ng) of the FET 14 to the power supply, to which the first level is supplied, when the node N1 becomes at the second level. This configuration allows the FET 95 to be used as the inverting circuit 16a.

The FET 96 (a fourth switch) has the gate coupled to the gate (the node Ng) of the FET 14, and connects the node N1 to the power supply, to which the first level is supplied, when the node N1 is at the second level. This prevents the node N1 from becoming floating.

In the same node (or the same terminal), the high level is a voltage higher than that of the low level. High levels may be different voltages among different nodes (or different terminals), and low voltages may be different voltages among different nodes (or different terminals).

The input circuit 10 in the second and third embodiments and the variations thereof may be provided between the input terminal Tin and the intermediate node Ni of the fourth embodiment and the variations thereof.

Fifth Embodiment

Figure 31:
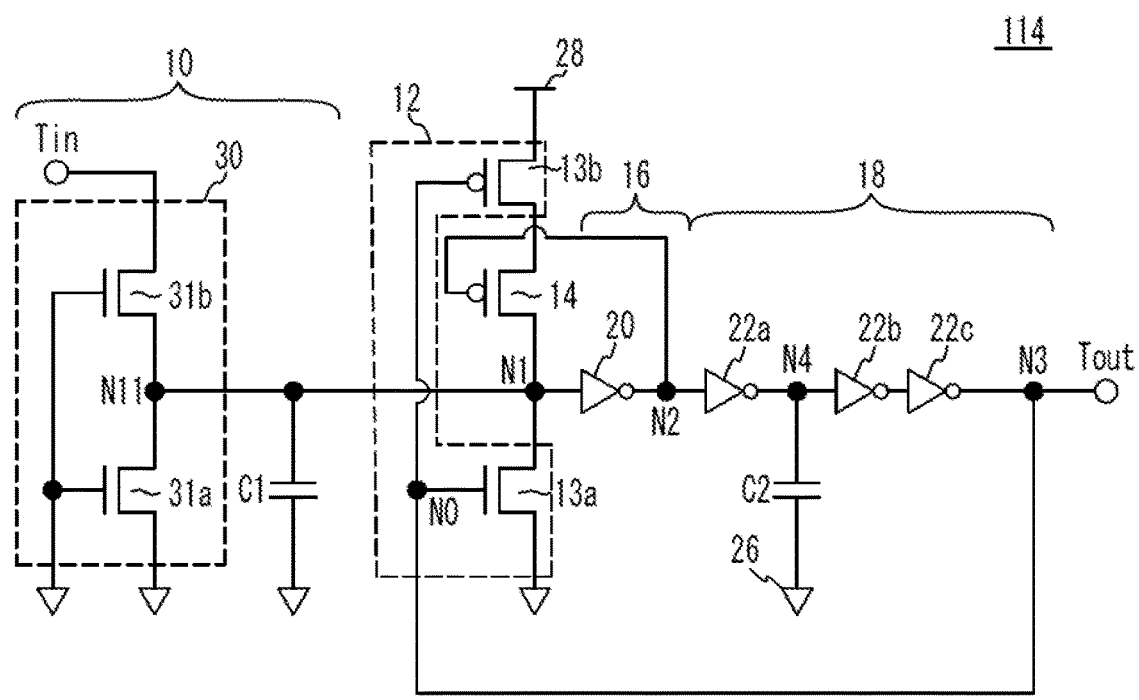
FIG. 31 is a circuit diagram of a spike generation circuit in accordance with a fifth embodiment.

A fifth embodiment is an example where any one of the first to fourth embodiments and the variations thereof is used as a voltage determination circuit. FIG. 31 is a circuit diagram of a spike generation circuit in accordance with the fifth embodiment. As illustrated in FIG. 31, in a spike generation circuit 114 of the fifth embodiment, a voltage conversion circuit 30 is connected between the capacitor C1 and the input terminal Tin. The input circuit 10 includes the capacitor C1 and the voltage conversion circuit 30.

The voltage conversion circuit 30 includes NFETs 31a and 31b. The source and the gate of the NFET 31a are coupled to the ground line 26, and the drain of the NFET 31a is coupled to a node N11. The source of the NFET 31b is coupled to the node N11, the gate is coupled to the ground line 26, and the drain is coupled to the input terminal Tin. Because the NFETs 31a and 31b are off, the NFETs 31a and 31b between the source and the drain serve as high-resistance resistors. The input signal input to the input terminal Tin is divided by the NFETs 31a and 31b, and the resulting signal is output to the node N11. Other configurations are the same as those of the third embodiment, and the description thereof is thus omitted.

The spike signal 52 output to the output terminal Tout was simulated for different voltages of the input signal input to the input terminal Tin. FIG. 32A to FIG. 33D illustrate the voltage of the node N1 and the output voltage with respect to time in the fifth embodiment. In FIG. 32A to FIG. 33D, the input signal was a signal with a constant voltage Vin. The voltage Vin was set at 0.9 V, 1.0 V, 1.2 V, 1.5 V, 2 V, 3 V, 5 V, 7 V and 10 V. The voltage conversion circuit 30 divides the voltage of the input terminal Tin into approximately ½ of the voltage of the input terminal Tin.

Figure 32A:
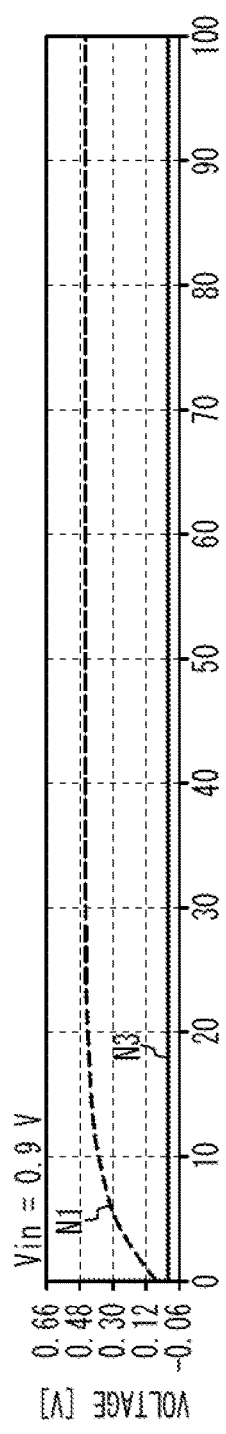
FIG. 32A to FIG. 32E illustrate the voltage of the node N1 and the output voltage with respect to time in the fifth embodiment.
Figure 32B:
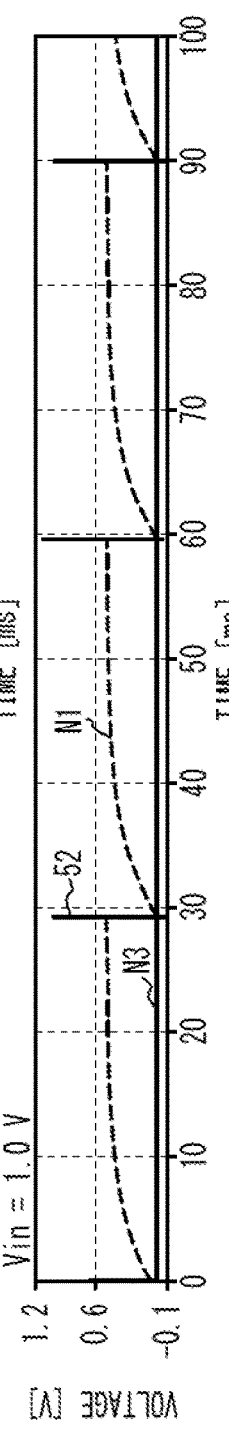

As illustrated in FIG. 32A, when the voltage Vin is 0.9 V, the voltage of the node N1 saturates at 0.45 V, which is 0.9 V×½. As a result, the voltage of the node N1 does not reach 0.5 V that is the threshold voltage. Therefore, the spike signal 52 is not generated. As illustrated in FIG. 32B, when the voltage Vin is 1 V, the voltage of the node N1 reaches 0.5 V. Thus, the spike signal 52 is generated. The intervals at which the spike signal 52 is generated are 30.3 ms, and the frequency is 33 Hz.

Figure 32C:
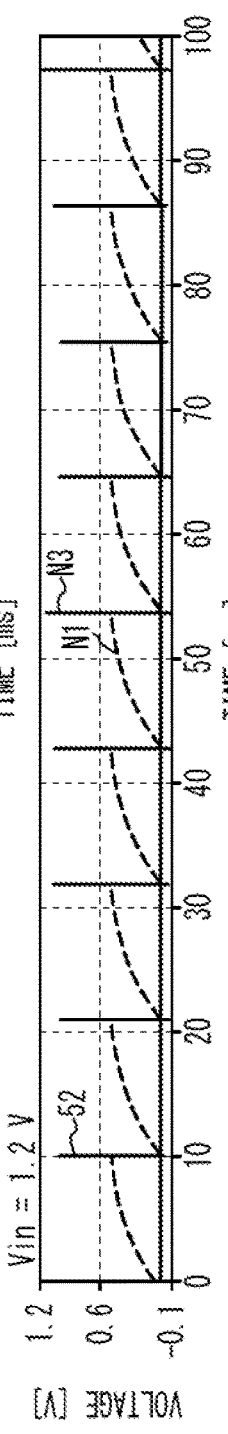
Figure 32D:
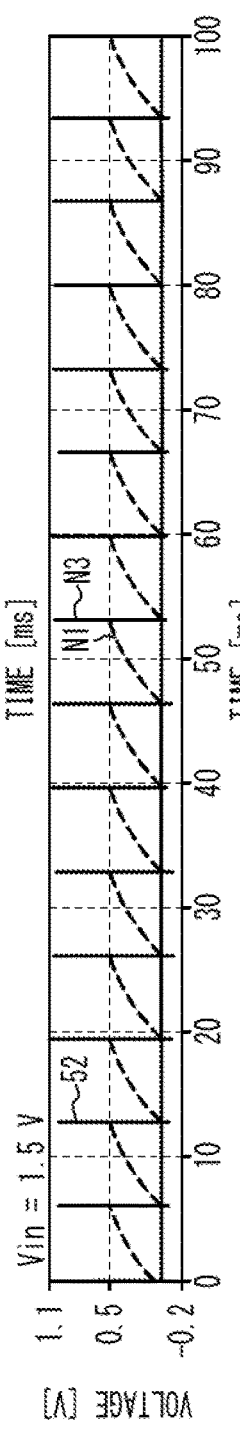
Figure 32E:
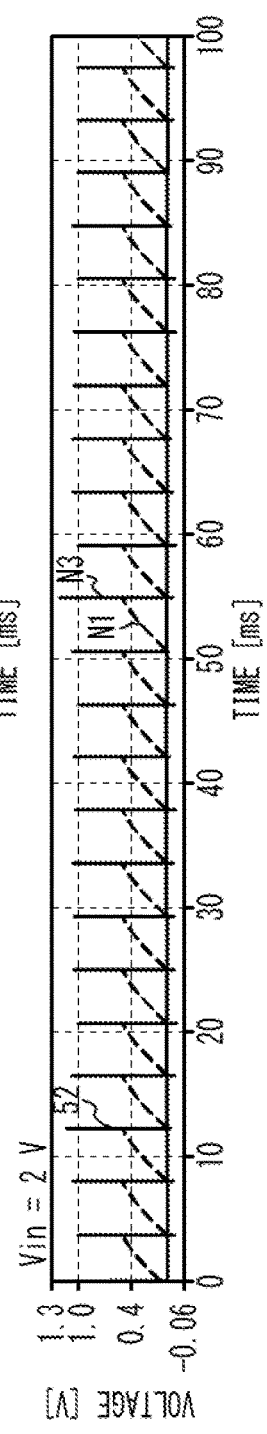

As illustrated in FIG. 32C, when the voltage Vin is 1.2 V, the capacitor C1 is charged faster than when the voltage Vin is 1 V. Thus, the voltage of the node N1 reaches 0.5 V faster than when the voltage Vin is 1 V. Therefore, the intervals at which the spike signal 52 is generated is shorter, 15.9 ms, and the frequency is higher, 62.8 Hz. As illustrated in FIG. 32D, when the voltage Vin is 1.5 V, the intervals at which the spike signal 52 is generated is even shorter, 6.71 ms, and the frequency is even higher, 149 Hz. As illustrated in FIG. 32E, when the voltage Vin is 2 V, the intervals at which the spike signal 52 is generated are 4.27 ms, and the frequency is 234 Hz.

Figure 33A:
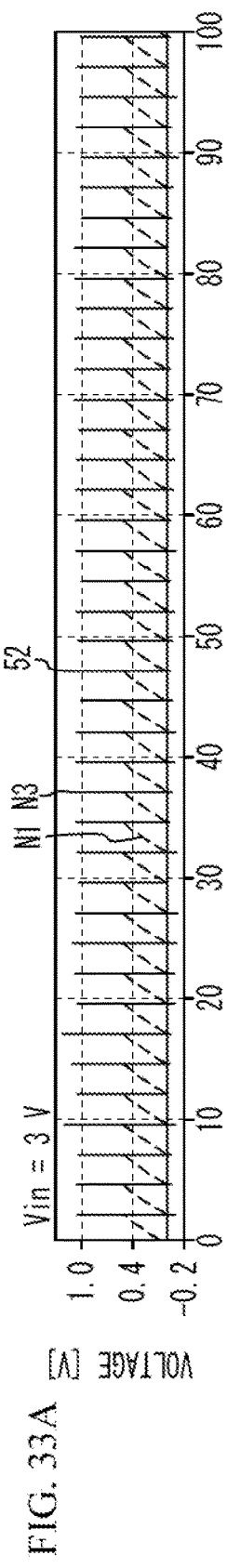
FIG. 33A to FIG. 33D illustrate the voltage of the node N1 and the output voltage with respect to time in the fifth embodiment.
Figure 33B:
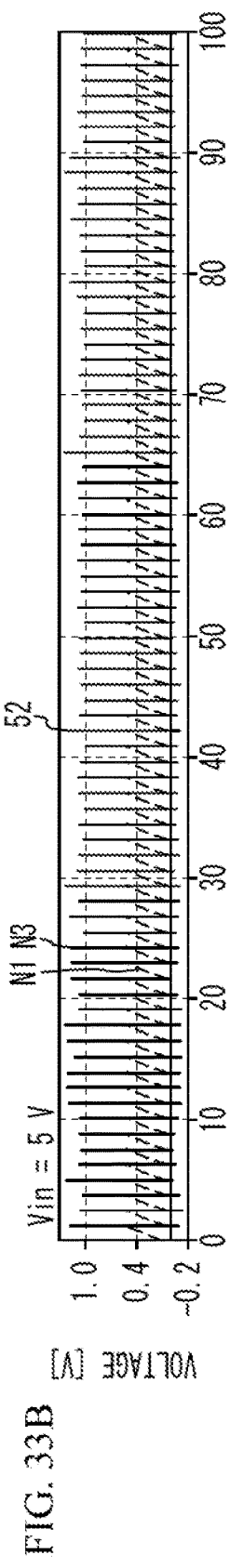
Figure 33C:
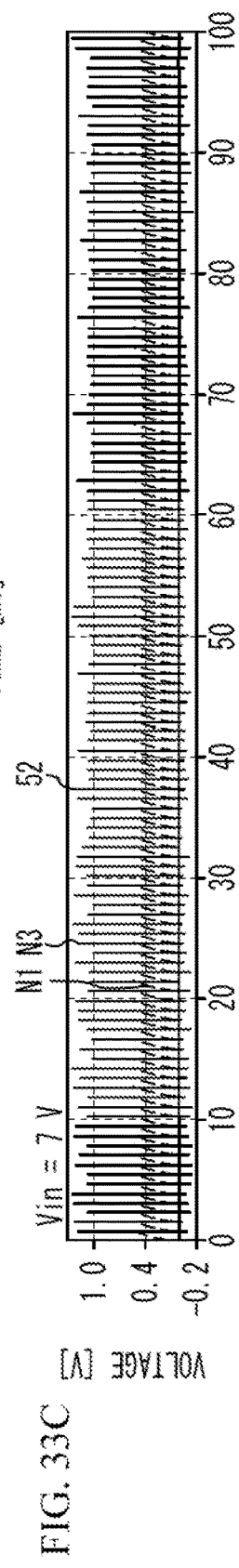
Figure 33D:
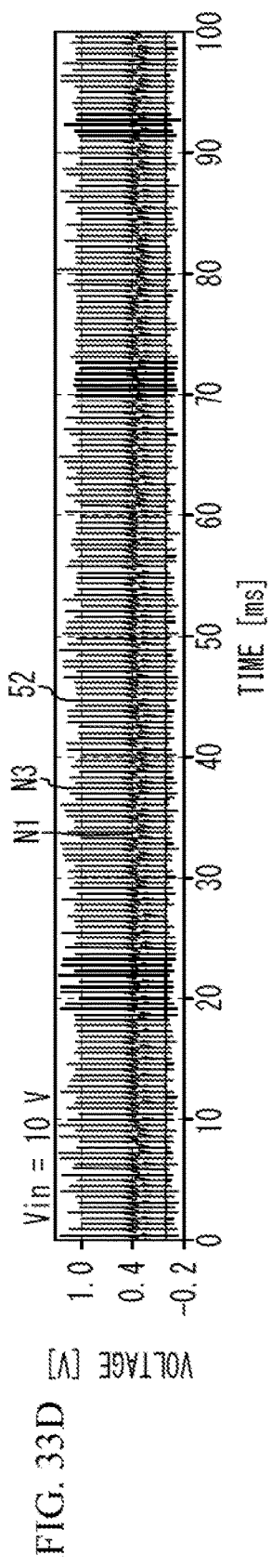

As illustrated in FIG. 33A, when the voltage Vin is 3 V, the intervals at which the spike signal 52 is generated are 2.50 ms, and the frequency is 400 Hz. As illustrated in FIG. 33B, when the voltage Vin is 5 V, the intervals at which the spike signal 52 is generated are 1.28 ms, and the frequency is 782 Hz. As illustrated in FIG. 33C, when the voltage Vin is 7 V, the intervals at which the spike signal 52 is generated are 0.792 ms, and the frequency is 1262 Hz. As illustrated in FIG. 33D, when the voltage Vin is 10 V, the intervals at which the spike signal 52 is generated are 0.454 ms, and the frequency is 2203 Hz.

Figure 34A:
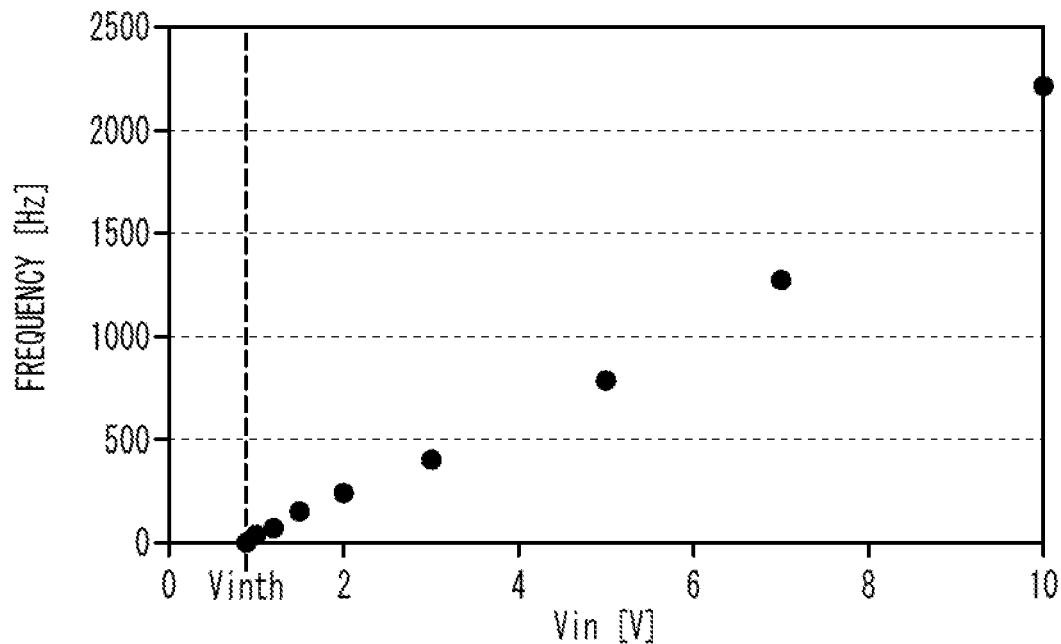
FIG. 34A illustrates frequency with respect to the input voltage in the fifth embodiment.
Figure 34B:
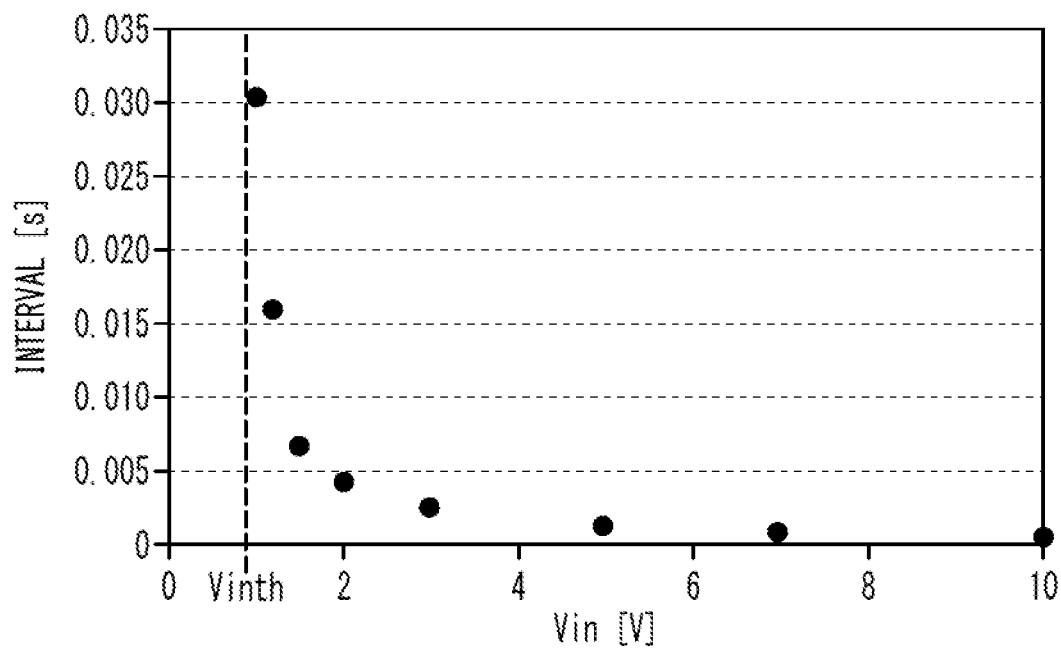
FIG. 34B illustrates an interval with respect to the input voltage in the fifth embodiment.

FIG. 34A and FIG. 34B illustrate the frequency and the interval with respect to the input voltage in the fifth embodiment, respectively. As illustrated in FIG. 34A, as the voltage Vin increases, the frequency of the spike signal 52 increases. As illustrated FIG. 34B, as the voltage Vin increases, the intervals at which the spike signal 52 is generated decrease. When the voltage Vin is lower than the threshold voltage Vinth, the spike signal 52 is not generated. In FIG. 34A and FIG. 34B, Vinth is approximately 1 V.

As seen above, in the fifth embodiment, when the voltage of the input signal that is input is lower than the threshold voltage Vinth, no spike signal 52 is generated, and when the voltage of the input signal is higher than the threshold voltage Vinth, the spike signal 52 is generated. Accordingly, the spike generation circuit 114 serves as a determination circuit that determines the voltage of the input terminal Tin. When the spike signal is input to the input terminal Tin, the number of input spike signals causing the spike signal 52 to be output can be set by setting the capacitance value of the capacitor C1.

The spike generation circuit 114 serves as a circuit that converts the voltage of the input terminal Tin to the frequency of the spike signal 52. The threshold voltage Vinth can be freely set using the ratio of the resistance value of the NFET 31a and the resistance value of the NFET 31b of the voltage conversion circuit 30. The voltage conversion circuit 30 may be a circuit other than the resistance voltage-dividing circuit as long as it is a circuit that divides the voltage of the input signal.

The voltage conversion circuit 30 outputs the signal obtained by dividing the voltage of the input signal to the node Ni. The inverting circuit 18 outputs the spike signal 52 when the absolute value of the voltage of the input signal is greater than the threshold voltage Vinth (a predetermined value), and outputs no spike signal 52 when the voltage of the input signal is equal to or lower than Vinth. In this manner, a voltage determination circuit with low power consumption can be achieved.

[Variation 1 of the Fifth Embodiment]

Figure 35:
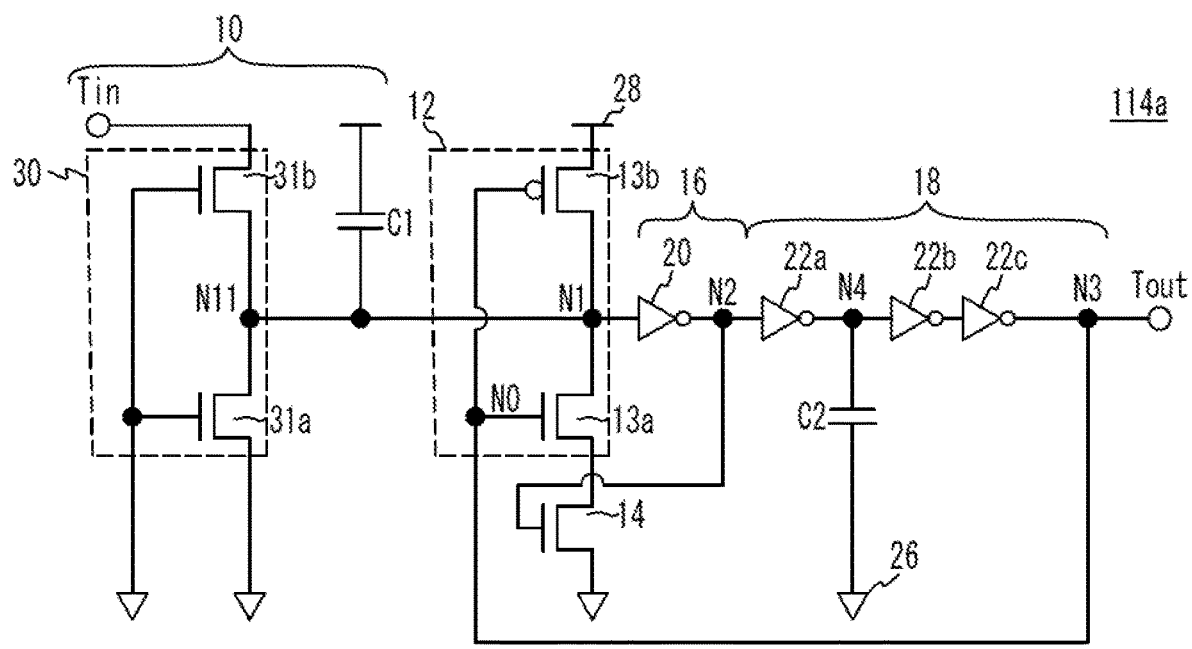
FIG. 35 is a circuit diagram of a spike generation circuit in accordance with a variation 1 of the fifth embodiment.

FIG. 35 is a circuit diagram of a spike generation circuit in accordance with a variation 1 of the fifth embodiment. As illustrated in FIG. 35, in a spike generation circuit 114a of the variation 1 of the fifth embodiment, the voltage conversion circuit 30 is provided to the spike generation circuit of the variation 3 of the third embodiment. Other configurations are the same as those of the fifth embodiment, and the description thereof is thus omitted.

In the variation 1 of the fifth embodiment, the inverting circuit 18 outputs the spike signal 52 when the absolute value of the voltage of the input signal is lower than the threshold voltage, and outputs no spike signal 52 when the voltage of the input signal is Vinth or higher.

[Variation 2 of the Fifth Embodiment]

Figure 36A:
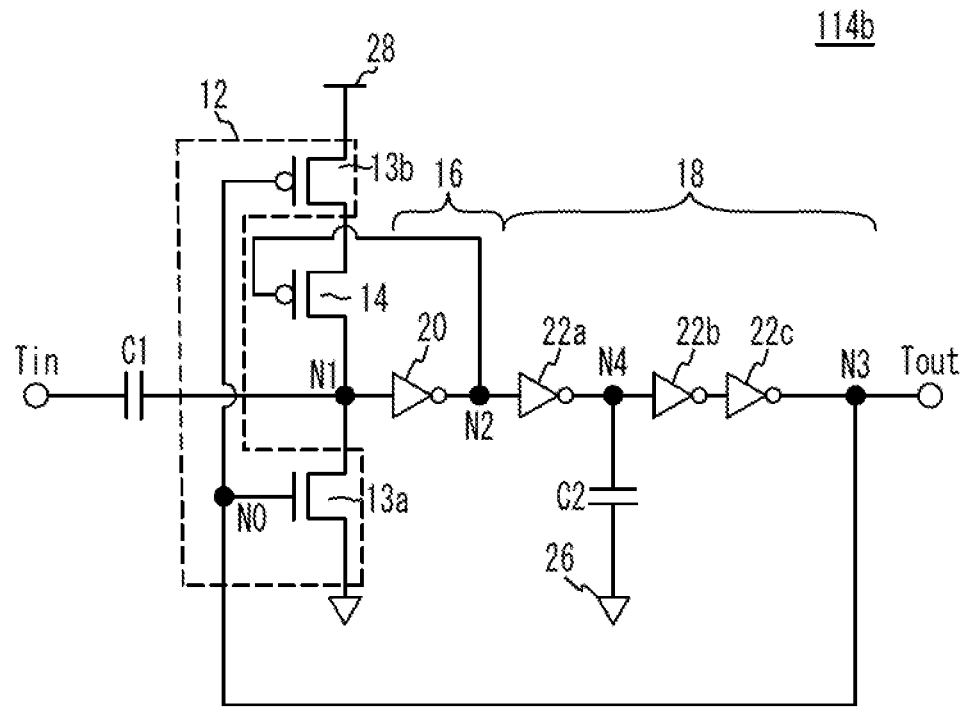
FIG. 36A is a circuit diagram of a spike generation circuit in accordance with a variation 2 of the fifth embodiment.

FIG. 36A is a circuit diagram of a spike generation circuit in accordance with a variation 2 of the fifth embodiment. As illustrated in FIG. 36A, in a spike generation circuit 114b of the variation 2 of the fifth embodiment, a first end of the capacitor C1 is coupled to the input terminal Tin, and a second end of the capacitor C1 is coupled to the node Ni. Other configurations are the same as those of the third embodiment, and the description thereof is thus omitted.

Figure 36B:
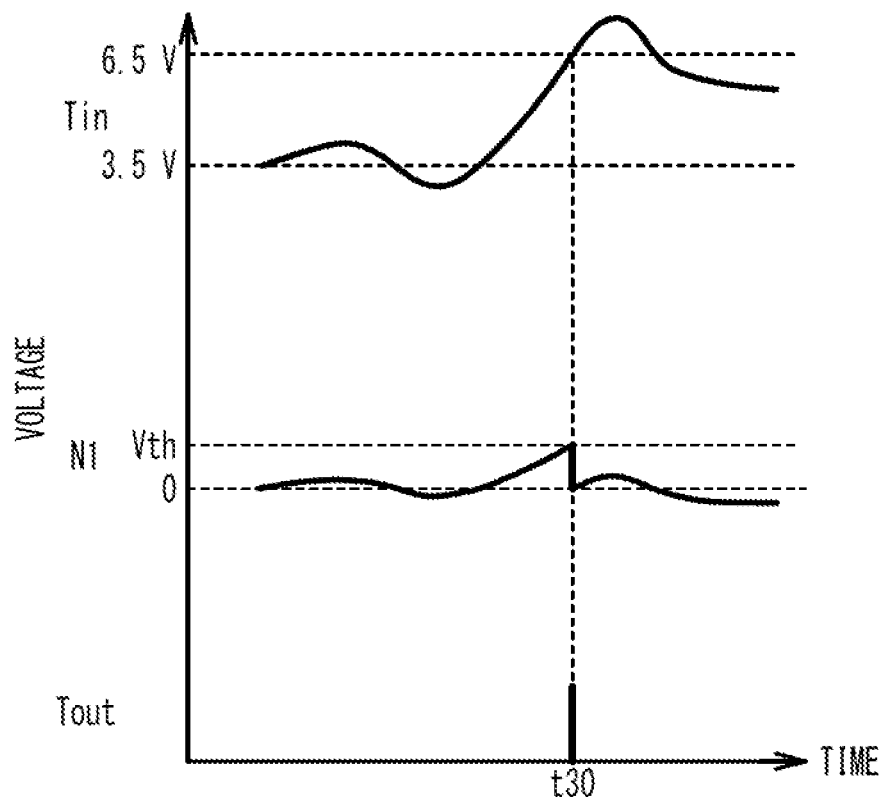
FIG. 36B is a timing chart of the variation 2 of the fifth embodiment.

FIG. 36B is a timing chart of the variation 2 of the fifth embodiment. As illustrated in FIG. 36B, the voltage of the input signal that is input to the input terminal Tin varies with respect to time. For example, the low-frequency component of the input signal is 3.5V. The low-frequency component of the voltage of the node N1 is cut by the capacitor C1. Thus, the voltage of the node N1 becomes equal to the amount of change in the input signal (the voltage excluding the direct-current (DC) component). The magnitude of the voltage of the node N1 can be freely set by adjusting the magnitude of the capacitance of the capacitor C1. That is, the capacitor C1 serves as a voltage conversion circuit. When the amount of change in the input signal from the low-frequency component reaches 3 V at time t30, the voltage of the node N1 becomes Vth. As a result, the spike signal is output from the output terminal Tout.

In the variation 2 of the fifth embodiment, the inverting circuit 18 generates the spike signal 52 when the amount of change in the input signal from the low-frequency component is within a predetermined range, and generates no spike signal 52 when the amount of change in the input signal from the low-frequency component is out of the predetermined range.

In the fifth embodiment and the variations 1 and 2 thereof, the voltage conversion circuit 30 (or the capacitor C1) outputs a signal obtained by converting the voltage of the input signal to the node N1. The inverting circuit 18 outputs no spike signal 52 when the voltage of the input signal is within a predetermined range, and outputs the spike signal 52 when the voltage of the input signal is out of the predetermined range. This configuration achieves a voltage determination circuit with low power consumption.

[Variation 3 of the Fifth Embodiment]

Figure 37:
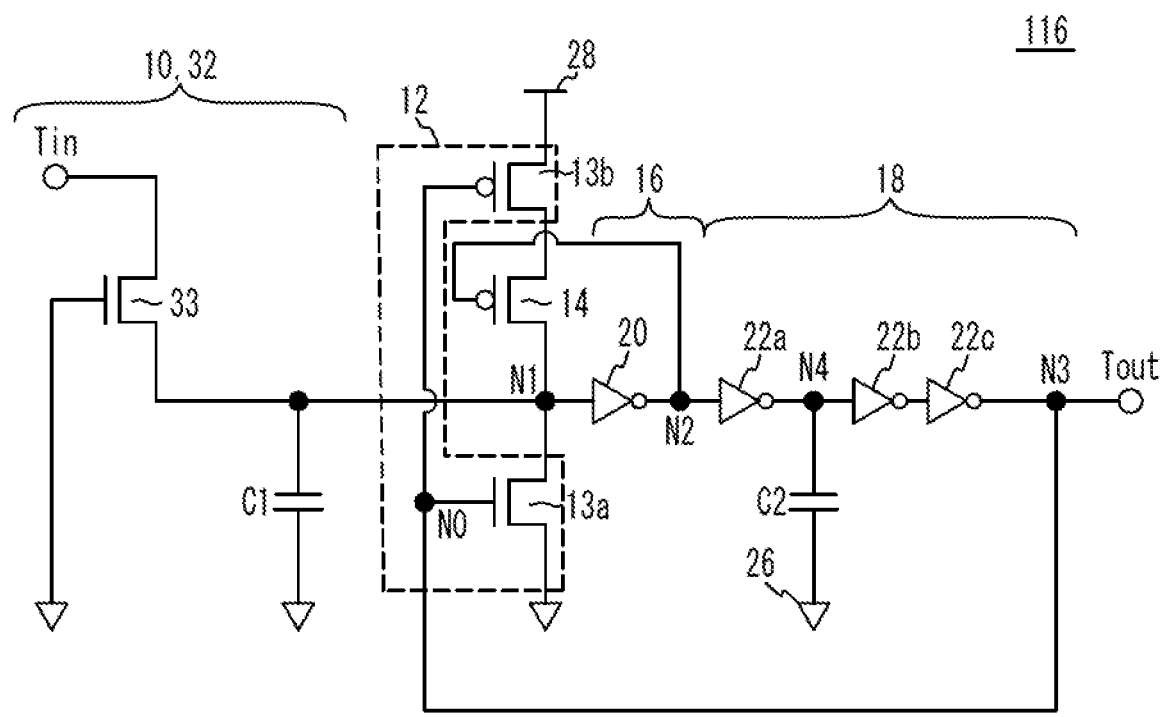
FIG. 37 is a circuit diagram of a spike generation circuit in accordance with a variation 3 of the fifth embodiment.

A variation 3 of the fifth embodiment is an example where any one of the first to fourth embodiments and the variations thereof is applied to a delay circuit. FIG. 37 is a circuit diagram of a spike generation circuit in accordance with the variation 3 of the fifth embodiment. As illustrated in FIG. 37, in a spike generation circuit 116 of the variation 3 of the fifth embodiment, an NFET 33 is connected between the capacitor C1 and the input terminal Tin. Since the NFET 33 is off, the NFET 33 between the source and the drain serves as a high-resistance resistor. The NFET 33 and the capacitor C1 form a time constant circuit 32 that is the input circuit 10. The time constant circuit 32 increases the time constant of the rise of the input signal input to the input terminal Tin. The time constant of the rise of the voltage of the node N1 is the time constant determined by the NFET 33 and the capacitor C1. Other configurations are the same as those of the third embodiment, and the description thereof is thus omitted.

The voltage of the node N1 and the spike signal 52 output to the output terminal Tout when the input signal is input to the input terminal Tin were simulated. The capacitance value of the capacitor C1 was configured to be 5.75 fF. A signal that transitions from the low level to the high level in a sufficiently short time compared with the time constant of the time constant circuit 32 was input as the input signal.

FIG. 38A and FIG. 38B illustrate the voltage of the node N1 and the output voltage with respect to time in the variation 3 of the fifth embodiment. FIG. 38B is an enlarged view of FIG. 38A. As illustrated in FIG. 38A, the voltage of the node N1 rises with the time constant of the time constant circuit 32. When the voltage of the node N1 becomes equal to or greater than 0.5 V, which is the threshold voltage, the spike signal 52 is output to the output terminal Tout. As illustrated in FIG. 38B, the width of the spike signal 52 is approximately 2 ns, and the rise and fall of the spike signal 52 are steep.

As seen above, the spike generation circuit 116 serves as a delay circuit that outputs the spike signal 52 when a predetermined delay time passes after a high-level signal is input to the input terminal Tin. The spike signal 52 to be output can be made to have a small width and a steep waveform. The time constant circuit 32 may be a circuit other than the RC circuit as long as it is a circuit that can increase the time constant of the rise and/or fall of the input signal. The delay time may be freely set by varying the time constant of the time constant circuit 32.

In the variation 3 of the fifth embodiment, the time constant circuit 32 increases the time constant with which the input signal rises, and outputs the resulting signal to the node N1. After the input signal is input, the output terminal Tout outputs the spike signal 52 after the delay time relating to the time constant of the time constant circuit 32. Accordingly, a delay circuit that can output the spike signal 52 having steep rise and steep fall, with low power consumption can be achieved.

[Variation 4 of the Fifth Embodiment]

Figure 39:
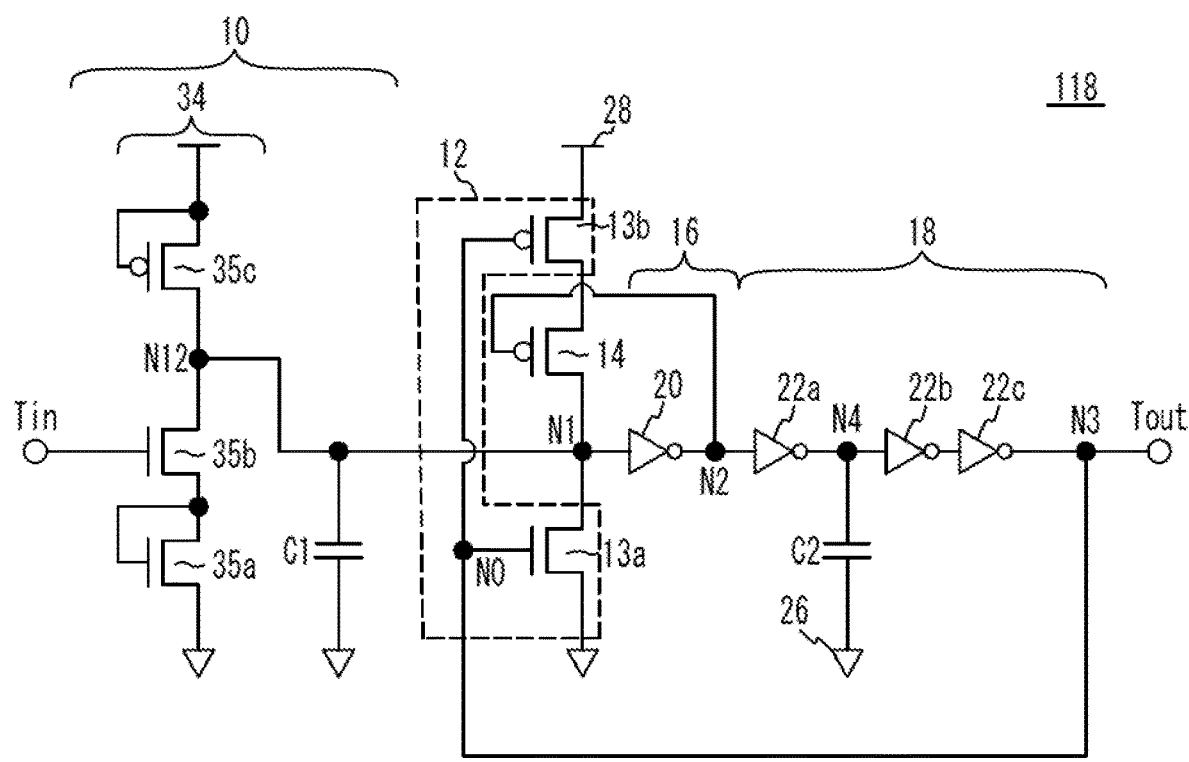
FIG. 39 is a circuit diagram of a spike generation circuit in accordance with a variation 4 of the fifth embodiment.

A variation 4 of the fifth embodiment is an example where any one of the second and third embodiments is applied to a frequency decrease detection circuit that generates the spike signal 52 when the frequency of the input spike signal 50 decreases. FIG. 39 is a circuit diagram of a spike generation circuit in accordance with the variation 4 of the fifth embodiment. As illustrated in FIG. 39, in a spike generation circuit 118 of the variation 4 of the fifth embodiment, an inhibitory circuit 34 is connected between the capacitor C1 and the input terminal Tin. The input circuit 10 includes the inhibitory circuit 34 and the capacitor C1.

The inhibitory circuit 34 includes NFETs 35a and 35b and a PFET 35c. The NFETs 35a and 35b and the PFET 35c are connected in series between the ground line 26 and the power line 28. A node N12 between the NFET 35b and the PFET 35c is coupled to the capacitor C1. The gate of the NFET 35a is coupled to the drain, while the gate of the PFET 35c is coupled to the source. Because of this configuration, the NFET 35a and the PFET 35c serve as loads. The input terminal Tin is coupled to the gate of the NFET 35b. Because of this configuration, the inhibitory circuit 34 serves as a source ground circuit.

The capacitor C1 is charged by the current flowing from the power line 28 to the capacitor C1 through the PFET 35c. When the spike signal 50 is input to the input terminal Tin, the FET 35b is turned on, and decreases the voltage of the node N12. When the frequency of the spike signal 50 is high, the voltage of the node N12 (i.e., N1) decreases moderately, and therefore, the voltage of the node N1 does not reach the threshold voltage Vth. However, as the frequency of the spike signal 50 decreases, the voltage of the node N12 increases, and reaches the threshold voltage Vth.

The voltage of the node N1 and the spike signal 52 output to the output terminal Tout when the spike signal 50 was input to the input terminal Tin at a constant frequency were simulated. The height and the width of the spike signal 50, which is the input signal, were configured to be 1 V and 2 ns, respectively.

FIG. 40A and FIG. 40B illustrate the voltage of the node N1 and the output voltage with respect to time in the variation 4 of the fifth embodiment. FIG. 40A presents a case where the frequency of the input spike signal was 200 Hz, while FIG. 40B presents a case where the frequency of the input spike signal was 100 Hz.

As illustrated in FIG. 40A, when the capacitor C1 is charged by the current flowing from the power line 28 through the PFET 35c, the voltage of the node N1 increases. When the spike signal 50 is input, the NFET 35b is turned on, and decreases the voltage of the node N12. The current flowing from the power line 28 to the node N12 through the PFET 35c and the current flowing from the node N12 to the ground line 26 through the NFET 35b saturate the voltage of the node N1 to a predetermined voltage. When the frequency of the input spike signal 50 is 200 Hz, the voltage of the node N1 saturates to approximately 0.24 V. Therefore, the voltage of the node N1 does not become equal to or higher than 0.5 V, which is the threshold voltage of the inverting circuit 16. Therefore, the spike signal 52 is not output from the output terminal Tout.

As illustrated in FIG. 40B, when the frequency of the input spike signal 50 is 100 Hz, the frequency with which the NFET 35b is turned on is low, and thereby, the voltage of the node N1 is higher than that in FIG. 40A. Therefore, the voltage of the node N1 becomes equal to or higher than 0.5V, which is the threshold voltage of the inverting circuit 16. Thus, the spike signal 52 is output from the output terminal Tout.

As seen above, the spike generation circuit 118 outputs the spike signal 52 to the output terminal Tout when the frequency of the spike signal 50 input to the input terminal Tin becomes low. The frequency of the input spike signal 50 to be the threshold value for outputting the spike signal 52 can be set as desired by varying the resistance values of the NFET 35a and the PFET 35c.

In the variation 4 of the fifth embodiment, the inhibitory circuit 34 decreases the voltage of the node N1 when the input spike signal 50 is input as the input signal. The output terminal Tout outputs the spike signal 52 when the frequency with which the input spike signal 50 is input becomes lower than a predetermined frequency. A frequency decrease detection circuit that generates the spike signal 52 when the frequency of the input spike signal 50 decreases can be achieved.

When the input spike signal 50 is a positive-going spike as in the second embodiment, the inhibitory circuit 34 decreases the voltage of the node N1 when the input spike signal 50 is input as in the variation 2 of the fifth embodiment. When the input spike signal 50 is a negative going spike as in the variation 1 of the second embodiment, the inhibitory circuit 34 increases the voltage of the node N1 in response to the input of the input spike signal 50.

[Variation 5 of the Fifth Embodiment]

Figure 41:
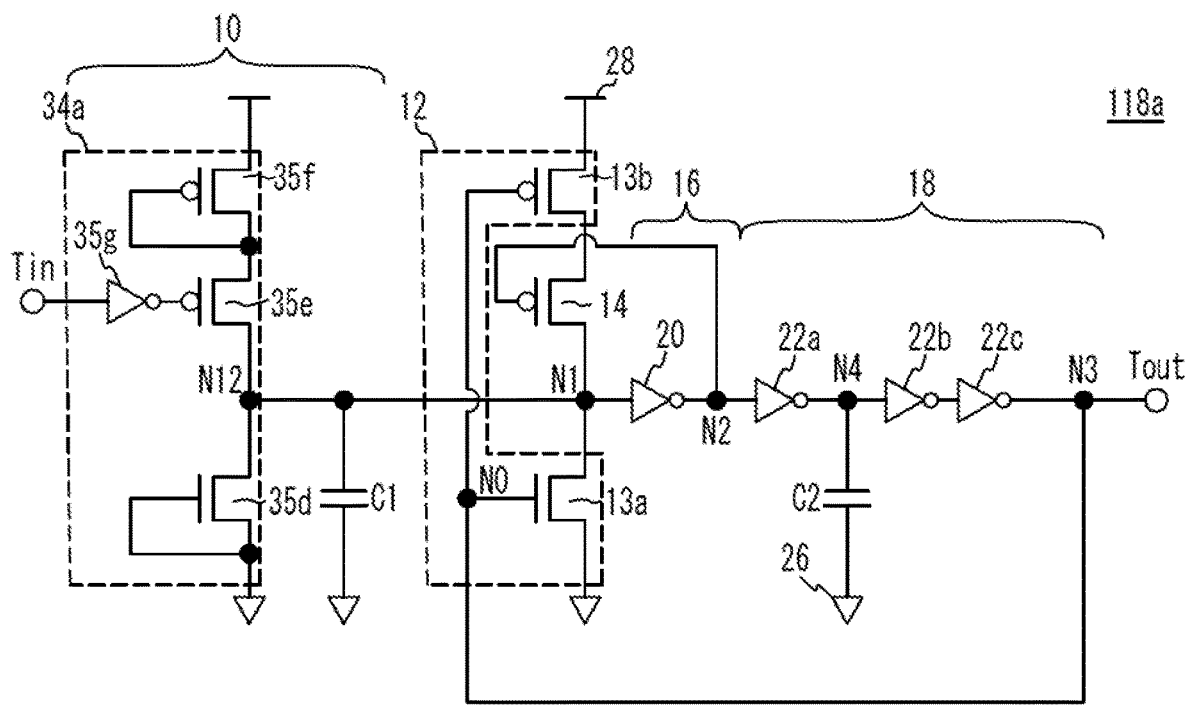
FIG. 41 is a circuit diagram of a spike generation circuit in accordance with a variation 5 of the fifth embodiment.

FIG. 41 is a circuit diagram of a spike generation circuit in accordance with a variation 5 of the fifth embodiment. As illustrated in FIG. 41, in a spike generation circuit 118a of the variation 5 of the fifth embodiment, an activation circuit 34a includes an NFET 35d, PFETs 35e and 35f, and an inverter 35g. The NFET 35d, the PFET 35e, and the PFET 35f are connected in series between the ground line 26 and the power line 28. The node N12 between the NFET 35d and the PFET 35e is coupled to the capacitor C1. The gate of the NFET 35d is coupled to the source, while the gate of the PFET 35f is coupled to the drain. Therefore, the NFET 35d and the PFET 35f serve as loads. The input terminal Tin is coupled to the gate of the PFET 35e through the inverter 35g.

The capacitor C1 is charged by the current flowing from the node N12 to the ground line through the NFET 35d. When the spike signal 50 is input to the input terminal Tin, the PFET 35e is turned on, and increases the voltage of the node N12. When the frequency of the spike signal 50 is high, the voltage of the node N12 (i.e., N1) increases moderately. Therefore, the voltage of the node N1 reaches the threshold voltage Vth, and the spike signal 52 is generated. On the other hand, when the frequency of the spike signal 50 becomes low, the voltage of the node N12 becomes low, and the voltage of the node N1 does not reach the threshold voltage Vth.

As seen above, in the variation 5 of the fifth embodiment, the activation circuit 34a increases the voltage of the node N1 when the input spike signal 50 is input as the input signal. When the frequency with which the input spike signal 50 is input becomes higher than a predetermined frequency, the output terminal Tout outputs the spike signal 52.

In the variations 4 and 5 of the fifth embodiment, the inhibitory circuit 34 and the activation circuit 34a (an input circuit) increase or decrease the voltage of the node N1 when the input spike signal 50 is input as the input signal. The inverting circuit 18 outputs the spike signal 52 when the frequency with which the spike signal 50 is input becomes within a predetermined range, and does not output the spike signal 52 when the frequency with which the spike signal 50 is input is out of the predetermined range. As seen above, a frequency detection circuit that generates the spike signal 52 based on the frequency of the spike signal 50 can be achieved.

[Variation 6 of the Fifth Embodiment]

Figure 42A:
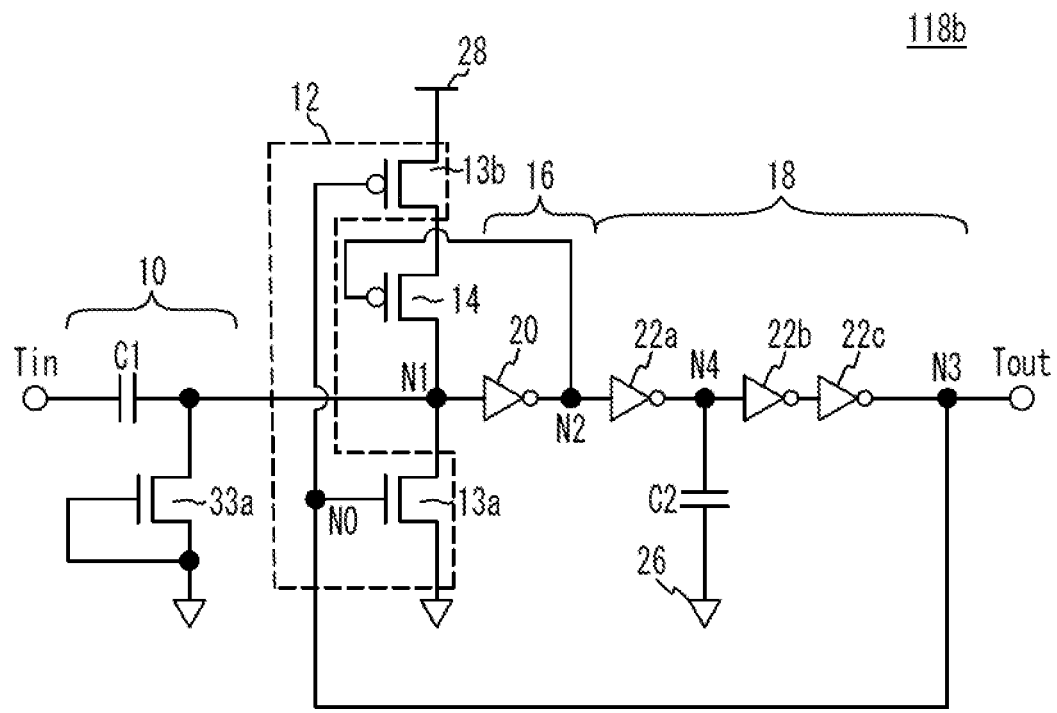
FIG. 42A is a circuit diagram of a spike generation circuit in accordance with a variation 6 of the fifth embodiment.

FIG. 42A is a diagram of a spike generation circuit in accordance with a variation 6 of the fifth embodiment circuit. As illustrated in FIG. 42A, in a spike generation circuit 118b of the variation 6 of the fifth embodiment, the input circuit 10 includes the capacitor C1 and an NFET 33a. The source of the NFET 33a is coupled to the ground line 26, and the drain is coupled to the node N1. The gate of the NFET 33a is coupled to the source. The NFET 33a serves as a resistor through which a leakage current flows. Other configurations are the same as those of the variation 2 of the fifth embodiment, and the description thereof is thus omitted.

Figure 42B:
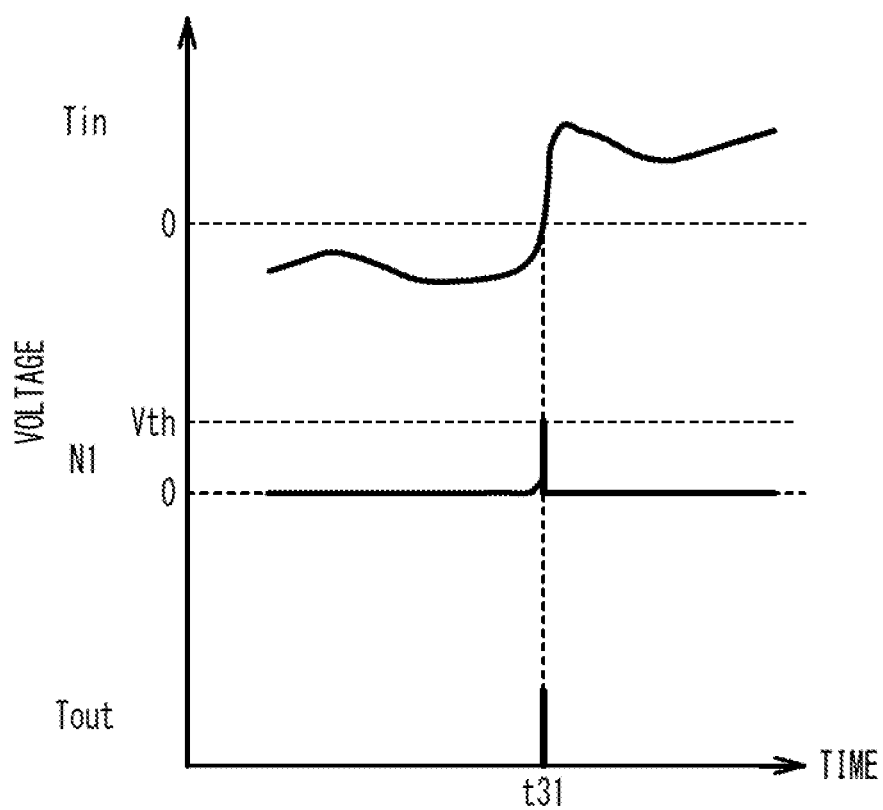
FIG. 42B is a timing chart of the variation 6 of the fifth embodiment.

FIG. 42B is a timing chart of the variation 6 of the fifth embodiment. As illustrated in FIG. 42B, the voltage of the input signal input to the input terminal Tin varies with respect to time. When the amount of change in the input signal with respect to time is small, the electric charge of the node N1 flows to the ground line 26 through the NFET 33a, and therefore, the voltage of the node N1 is approximately zero. When the input signal rapidly varies with respect to time at time t31, the electric charge of the node N1 cannot flow to the ground line 26 completely. Therefore, the voltage of the node N1 becomes Vth, and the spike signal 52 is output.

In the variation 6 of the fifth embodiment, the input circuit 10 varies the voltage of the node N1 according to the amount of change in the input signal with respect to time. The inverting circuit 18 generates the spike signal 52 when the amount of change in the input signal with respect to time is within a predetermined range, and does not generate the spike signal 52 when the amount of change in the input signal with respect to time is out of the predetermined range. As seen above, a circuit that generates the spike signal 52 based on the amount of change in the spike signal 50 with respect to time can be achieved.

As in the fifth embodiment and the variations thereof, the spike generation circuit can generate the spike signal 52 based on the voltage of the input signal, the frequency of the spike signal, the period of time from the input of the input signal, and the rate of change in the input signal with respect to time, with low power consumption.

Sixth Embodiment

Figure 43A:
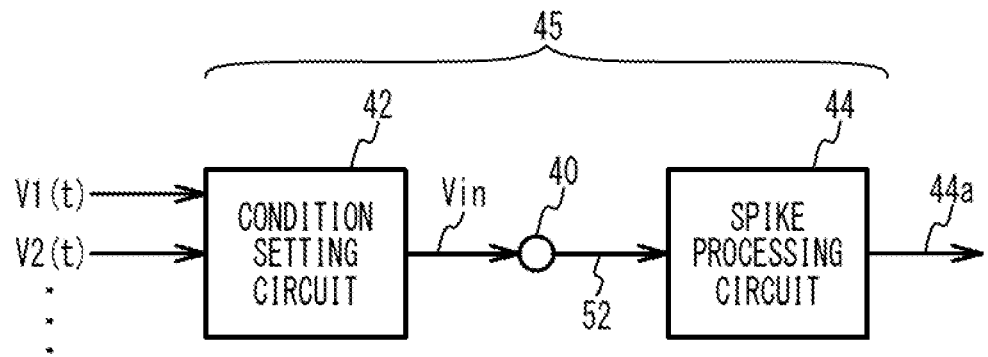
FIG. 43A to FIG. 43C are block diagrams of an information processing circuit in accordance with a sixth embodiment.
Figure 43B:
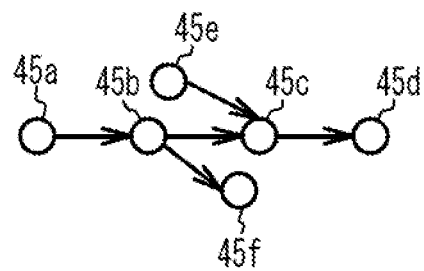
Figure 43C:
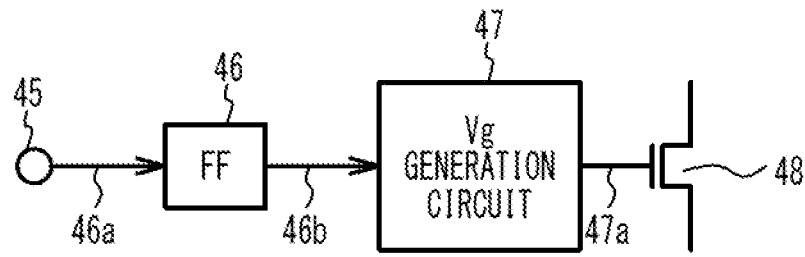

A sixth embodiment is an exemplary information processing circuit to which any one of the first to fourth embodiments and the variations thereof is applied. FIG. 43A to FIG. 43C are block diagrams of information processing circuits in accordance with the sixth embodiment. As illustrated in FIG. 43A, a node circuit 45 includes a condition setting circuit 42, a spike generation circuit 40, and a spike processing circuit 44.

One or more signals V1(t) to V2(t) dependent on time t are input to the condition setting circuit 42. The condition setting circuit 42 is a circuit that sets the condition for the spike generation circuit 40 to output the spike signal, and generates the signal (the voltage Vin) to be output to the spike generation circuit 40 based on the signals V1(t) and V2(t). The condition setting circuit 42 includes the input circuit 10 such as, for example, those in the second and third embodiments and the variations thereof.

The spike generation circuit 40 is a spike generation circuit in accordance with any one of, for example, the third and second embodiments and the variations thereof. The spike signal 52 is output based on the voltage Vin.

The spike processing circuit 44 is a circuit that processes the spike signal 52, and includes an inverter or a logic circuit such as a binary operation circuit, and/or a flip-flop. The spike processing circuit 44 processes the spike signal 52, and outputs a signal 44a such as the spike signal or an L/H (the low level and the high level) signal.

As illustrated in FIG. 43B, node circuits 45a to 45f are connected to each other. As with the node circuits 45a to 45d, the node circuits may be connected in multiple stages. As with the node circuit 45b, the output of the node circuit 45b may be branched into a plurality of the node circuits 45c to 45f. As with the node circuit 45c, the outputs of a plurality of the node circuits 45b and 45e may be input. As described above, the node circuits 45a to 45f form a network.

As illustrated in FIG. 43C, a signal 46a output by the node circuit 45 is input to a flip-flop 46. The signal 46a is a spike signal or the low level/high level signal (i.e., a binary signal having the low level or the high level). The flip-flop 46 outputs a signal 46b, which is the low level/high level signal, based on the signal 46a. A Vg generation circuit 47 generates a signal 47a to be output to the gate of an FET 48 based on the signal 46b. The Vg generation circuit 47 includes, for example, a logic circuit, a step-up circuit, and the like. The FET 48 is turned on or off based on the signal 47a.

In the sixth embodiment, the condition setting circuit 42 sets the condition for the spike generation circuit 40 to output the spike signal by processing the input signal and outputting the resulting signal to the spike generation circuit 40 of any one of the second and third embodiments and the variations thereof. The spike processing circuit 44 processes the spike signal 52 output by the spike generation circuit 40. Accordingly, an information processing circuit capable of performing various information processing with low power consumption can be achieved. Such node circuits 45 are connected in a network form. This configuration can achieve an information processing circuit capable of performing further various information processing with low power consumption.

When an event that satisfies the condition set by the condition setting circuit 42 occurs, the spike signal 52 output by the spike generation circuit 40 includes event generation information indicating that the event has occurred and timing information indicating the time of occurrence of the event. The spike signal 52 includes the event generation information and the timing information, and is transmitted to the spike generation circuit 40 or the spike processing circuit 44 in the next stage. As seen above, by connecting the condition setting circuit 42, the spike generation circuit 40, and the spike processing circuit 44, which share the same power supply, in series with each other, desired information processing can be performed without using a clock signal.

For example, by forming the network of the node circuits 45, the information processing that mimics peripheral nerves using the spike generation circuit as a neuron can be achieved. This achieves a determination circuit or a control circuit with very low power consumption.

Seventh Embodiment

A seventh embodiment is an example where the spike generation circuit of any one of the first to fourth embodiments and the variations thereof is applied, as the information processing circuit of the sixth embodiment, to a power conversion circuit. In the energy harvesting such as vibration power-generation that generates power by vibration, a current Igen from the power generation circuit is not constant, and varies from moment to moment. The voltage Vcap of a power storage circuit (for example, a capacitor) cannot rapidly vary. Therefore, the input impedance Zin of the power storage circuit becomes equal to Vcap/Igen, and varies from moment to moment with the variation in the current Igen. On the other hand, the output impedance Zout of the power generation circuit is constant. This results in a mismatch between the output impedance Zout of the power generation circuit and the input impedance Zin of the power storage circuit. In the seventh embodiment, impedance matching between the power generation circuit and the power storage circuit is achieved with low power consumption.

Figure 44:
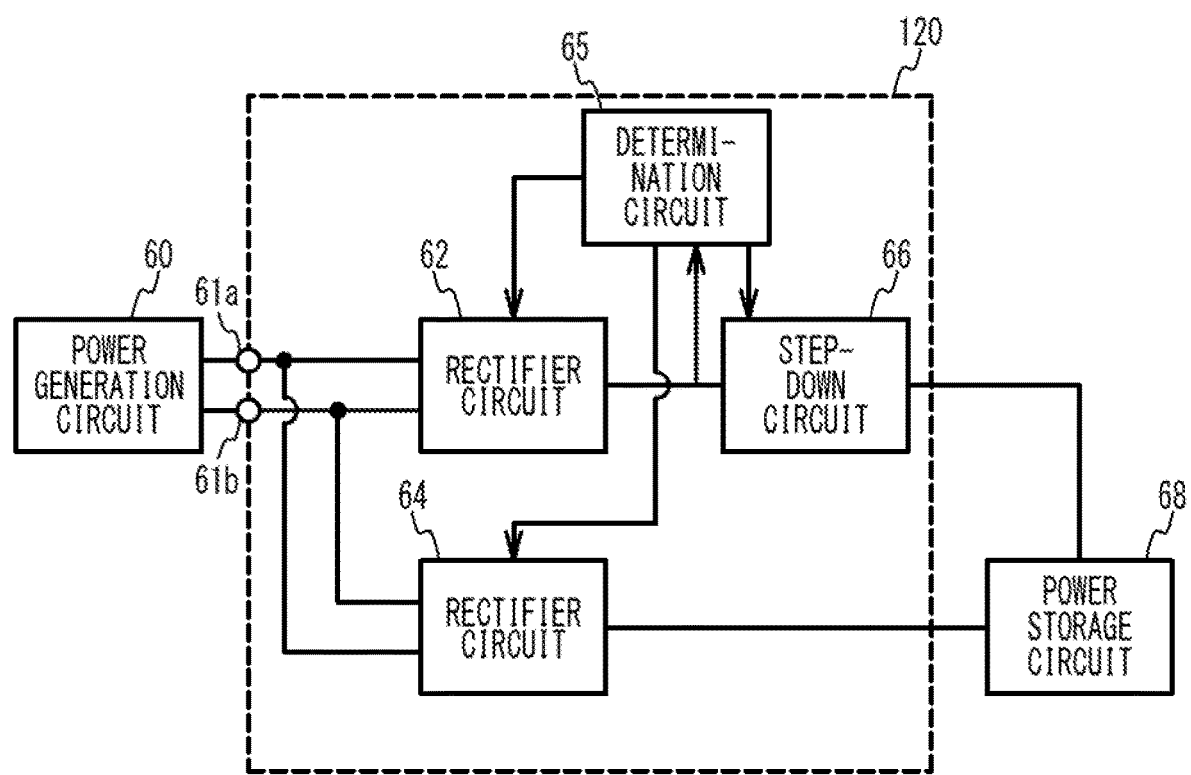
FIG. 44 is a block diagram of a power conversion circuit in accordance with a seventh embodiment.

FIG. 44 is a block diagram of a power conversion circuit in accordance with the seventh embodiment. As illustrated in FIG. 44, a power conversion circuit 120 includes rectifier circuits 62 and 64, a determination circuit 65, and a step-down circuit 66. A power generation circuit 60 is coupled to power terminals 61a and 61b. The power generation circuit 60 generates alternating power. The rectifier circuits 62 and 64 are coupled to the power terminals 61a and 61b. The rectifier circuits 62 and 64 rectify the output power of the power generation circuit 60. The step-down circuit 66 steps down the output of the rectifier circuit 62, and outputs the resulting output to a power storage circuit 68. The rectifier circuit 64 rectifies the output power of the power generation circuit 60, and outputs the resulting output to the power storage circuit 68. The power storage circuit 68 stores the power. The determination circuit 65 determines which one of the rectifier circuits 62 and 64 is to be operated, based on the output of the rectifier circuit 62. When rectification is to be performed using the rectifier circuit 62, the determination circuit 65 causes the rectifier circuit 62 and the step-down circuit 66 to operate, and does not cause the rectifier circuit 64 to operate. When rectification is to be performed using the rectifier circuit 64, the determination circuit 65 causes the rectifier circuit 64 to operate, and does not cause the rectifier circuit 62 or the step-down circuit 66 to operate.

Figure 45:
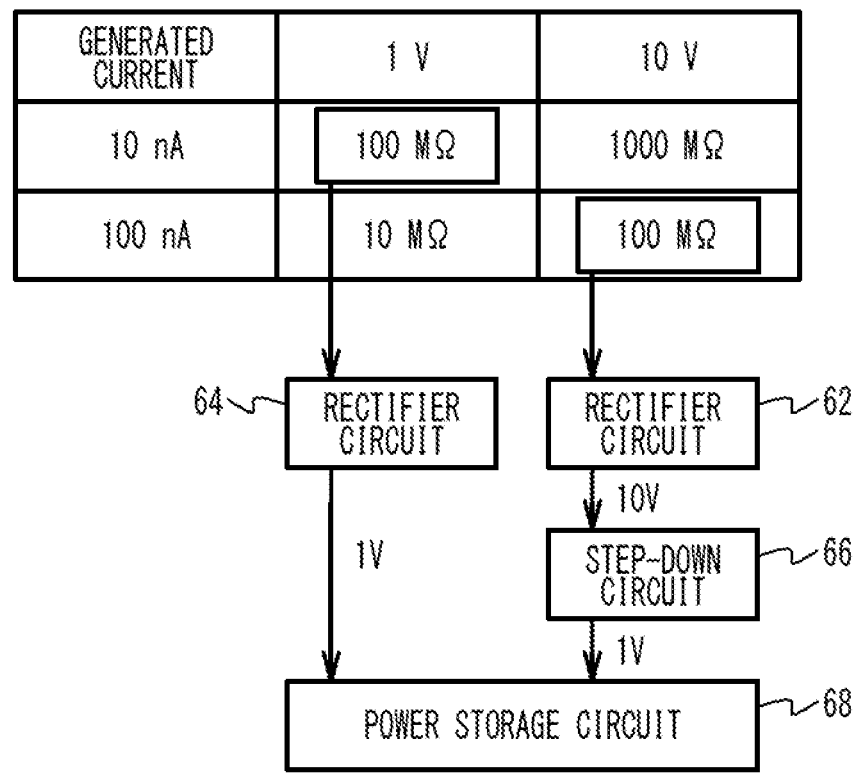
FIG. 45 is a diagram for describing the operation of a determination circuit in the seventh embodiment.

FIG. 45 is a diagram for describing the operation of the determination circuit in the seventh embodiment. In the case of the vibration power-generation using, for example, a piezoelectric material or an electret material, the output impedance Zout of the power generation circuit 60 is 10Ω to 100 MΩ, but is assumed here to be 100 MΩ. A case where the current generated by the power generation circuit 60 is 10 nA and a case where the current generated by the power generation circuit 60 is 100 nA will be discussed. When the power conversion circuit 120 receives a current of 10 nA with 1 V in the power terminals 61a and 61b, the input impedance Zin of the power conversion circuit 120 becomes 100 MΩ, and when the power conversion circuit 120 receives a current of 100 nA with 1 V in the power terminals 61a and 61b, the input impedance Zin of the power conversion circuit 120 becomes 10 MΩ. When the power conversion circuit 120 receives a current of 10 nA with 10 V in the power terminals 61a and 61b, the input impedance Zin of the power conversion circuit 120 becomes 1000 MΩ, and when the power conversion circuit 120 receives a current of 100 nA with 10 V in the power terminals 61a and 61b, the input impedance Zin of the power conversion circuit 120 becomes 100 MΩ.

Therefore, when the generated current is 10 nA, the determination circuit 65 causes the rectifier circuit 64 to operate. The rectifier circuit 64 performs rectification with 1 V. This causes the input impedance Zin of the power conversion circuit 120 to be 100 MΩ. The rectified power is stored in the power storage circuit 68. When the generated current is 100 nA, the determination circuit 65 causes the rectifier circuit 62 and the step-down circuit 66 to operate. The rectifier circuit 62 performs rectification with 10 V. This causes the input impedance Zin of the power conversion circuit 120 to be 100 MΩ. The step-down circuit 66 steps down 10 V of the rectified power to 1 V. The stepped-down power is stored in the power storage circuit 68.

In this manner, the output impedance Zout of the power generation circuit 60 and the input impedance Zin of the power conversion circuit 120 can be matched.

Hereinafter, a specific example of the seventh embodiment will be described. A diode bridge circuit is used as the rectifier circuit 62. Since the rectifier circuit 62 rectifies a high voltage (for example, 10 V), the power consumption due to the turn-on voltage of the diode is low. Since the rectifier circuit 64 rectifies a low voltage, the use of the bridge circuit increases the power consumption because of the turn-on voltage of the diode. Therefore, a synchronous rectifier circuit is used as the rectifier circuit 64.

Figure 46A:
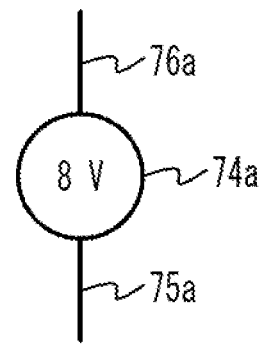
FIG. 46A to FIG. 46C illustrate symbols in the spike generation circuits in the seventh embodiment.
Figure 46B:
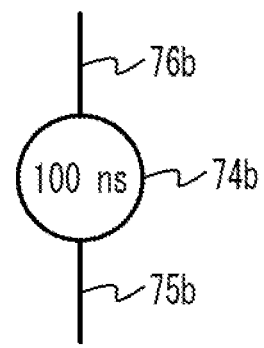
Figure 46C:
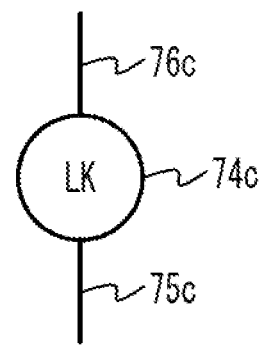

Symbols in the following circuit diagrams will be described. FIG. 46A to FIG. 46C illustrate symbols of spike generation circuits in the seventh embodiment. As illustrated in FIG. 46A, the terminal under a spike generation circuit 74a is an input terminal 75a, and a terminal above the spike generation circuit 74a is an output terminal 76a. The spike generation circuit 74a is the voltage determination circuit of the fifth embodiment. The value 8 V in the circle indicates that the threshold voltage Vinth is 8 V.

As illustrated in FIG. 46B, a terminal under a spike generation circuit 74b is an input terminal 75b, and a terminal above the spike generation circuit 74b is an output terminal 76b. The spike generation circuit 74b is the delay circuit of the variation 1 of the fifth embodiment. The value 100 ns in the circle indicates that the delay time is 100 ns.

As illustrated in FIG. 46C, a terminal under a spike generation circuit 74c is an input terminal 75c, and a terminal above the spike generation circuit 74c is an output terminal 76c. The spike generation circuit 74c is the frequency-decrease detection circuit of the variation 2 of the fifth embodiment. The letter LK in the circle indicates a frequency decrease detection circuit.

Figure 47A:
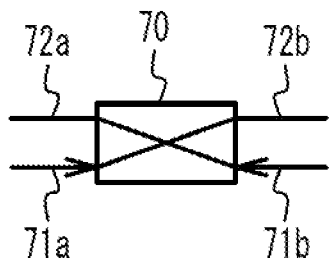
FIG. 47A to FIG. 47C illustrate the operation of a flip-flop circuit in the seventh embodiment.
Figure 47B:
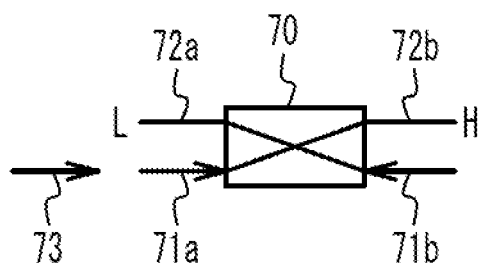
Figure 47C:
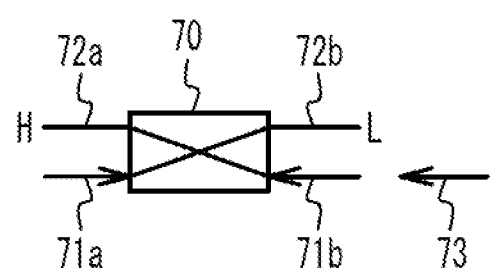

FIG. 47A to FIG. 47C illustrate the operation of a flip-flop circuit in the seventh embodiment. As illustrated in FIG. 47A, a flip-flop circuit (FF) 70 includes input terminals 71a and 71b, and output terminals 72a and 72b.

As illustrated in FIG. 47B, when a signal 73 is input to the input terminal 71a, the FF circuit 70 outputs the low level to the output terminal 72a, and the high level to the output terminal 72b. The signal 73 is a positive-going spike signal or a high-level signal. The FF circuit 70 maintains the output terminal 72a at the low level, and the output terminal 72b at the high level until the signal 73 is input to the input terminal 71b next.

As illustrated in FIG. 47C, when the signal 73 is input to the input terminal 71b, the FF circuit 70 outputs the high level to the output terminal 72a, and the low level to the output terminal 72b. The FF circuit 70 maintains the output terminal 72a at the high level, and the output terminal 72b at the low level until the signal 73 is input to the input terminal 71a next.

[Determination Circuit]

Figure 48:
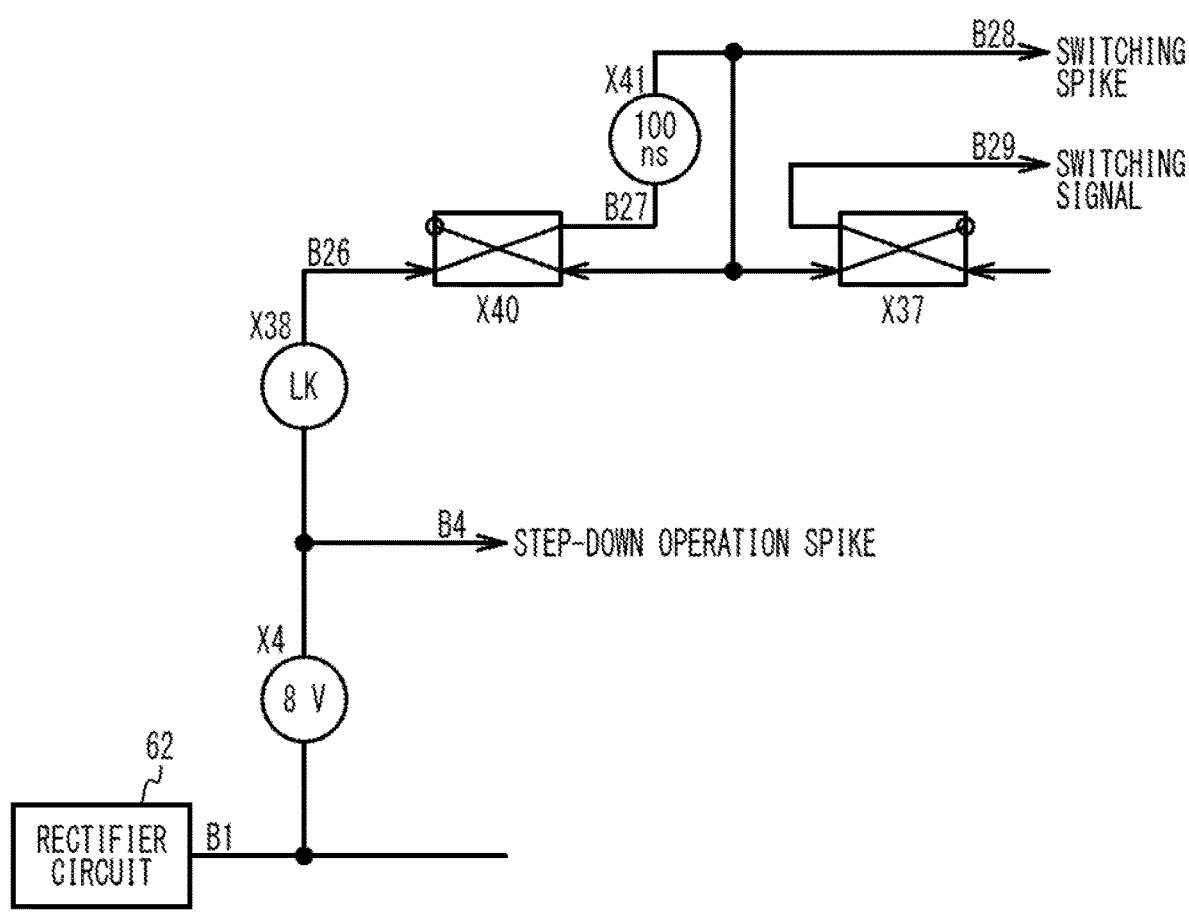
FIG. 48 is a circuit diagram of the determination circuit in the seventh embodiment.
Figure 49:
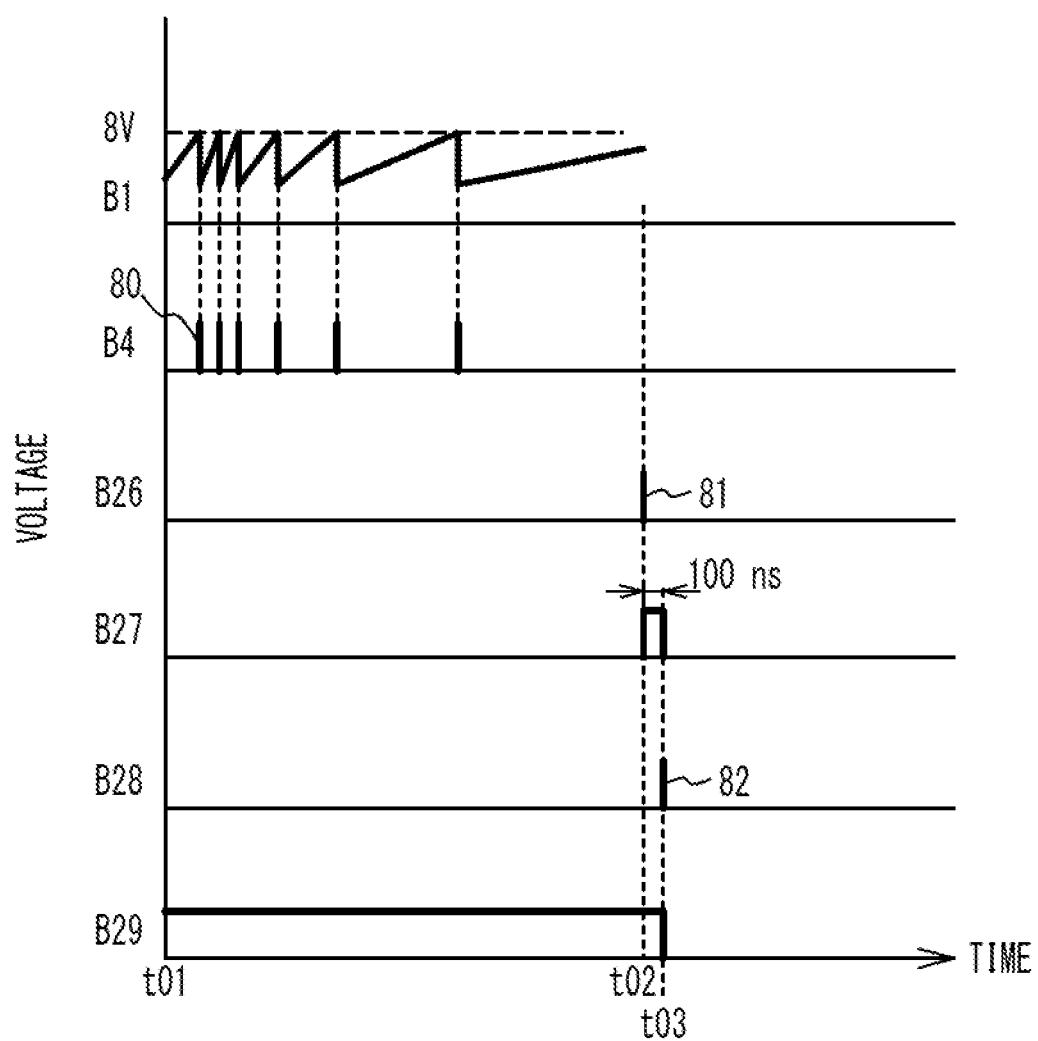
FIG. 49 illustrates respective voltages of nodes in the determination circuit with respect to time in the seventh embodiment.

FIG. 48 is a circuit diagram of the determination circuit in the seventh embodiment. FIG. 49 illustrates respective voltages of the nodes in the determination circuit with respect to time in the seventh embodiment. As illustrated in FIG. 48 and FIG. 49, a node B1 is the output of the rectifier circuit 62. A node B4 outputs a step-down operation spike. A node B28 outputs a switching spike signal that stops the operation of the step-down circuit 66 and starts the operation of the rectifier circuit 64. A node B29 outputs a switching signal that is at the high level when causing the rectifier circuit 62 and the step-down circuit 66 to operate and becomes at the low level when causing the rectifier circuit 64 to operate.

At time t01, the rectifier circuit 62 and the step-down circuit 66 are operating, and the rectifier circuit 64 is stopping. The voltages of the nodes B4, B26, B27, and B28 are the low level, and the voltage of the node B29 is the high level. When the voltage of the output node B1 of the rectifier circuit 62 becomes 8 V or higher, a spike generation circuit X4 outputs a spike signal 80 to the node B4 as a step-down operation spike signal. As the current output by the power generation circuit 60 decreases, the number of times that the voltage of the node B1 becomes 8V or higher decreases. When the frequency of the spike signal 80 of the node B4 decreases. The frequency of the spike signal 80 of the node B4 decreases to a predetermined frequency or less, a spike generation circuit X38 outputs a spike signal 81 to the node B26 at time t02. An FF circuit X40 to which the spike signal 81 has been input outputs the high level to the node B27. This changes the input of a spike generation circuit X41 from the low level to the high level. The spike generation circuit X41 outputs a spike signal 82 to the node B28 at time t03 which is 100 ns after the node B27 becomes at the high level. The FF circuit X40 to which the spike signal 82 has been input changes the node B27 from the high level to the low level. An FF circuit X37 to which the spike signal 82 has been input changes the node B29 to the low level.

As seen above, as the current generated by the power generation circuit 60 decreases, the frequency with which the node B1 becomes 8 V or higher decreases, and the switching spike signal is output to the node B28. In addition, the switching signal of the node B29 becomes at the low level. In this manner, the switching spike signal and the switching signal can be generated using the spike generation circuit with low power consumption.

The determination circuit that determines whether the voltage of the node B1 is a predetermined voltage or greater or the predetermined voltage or less can be achieved using a comparator or the like. However, the use of the comparator in the determination circuit increases the power consumption. In the seventh embodiment, the determination circuit is achieved using any one of the second and third embodiments and the variations thereof, and the power consumption can be therefore reduced.

[Rectifier Circuit 62]

Figure 50:
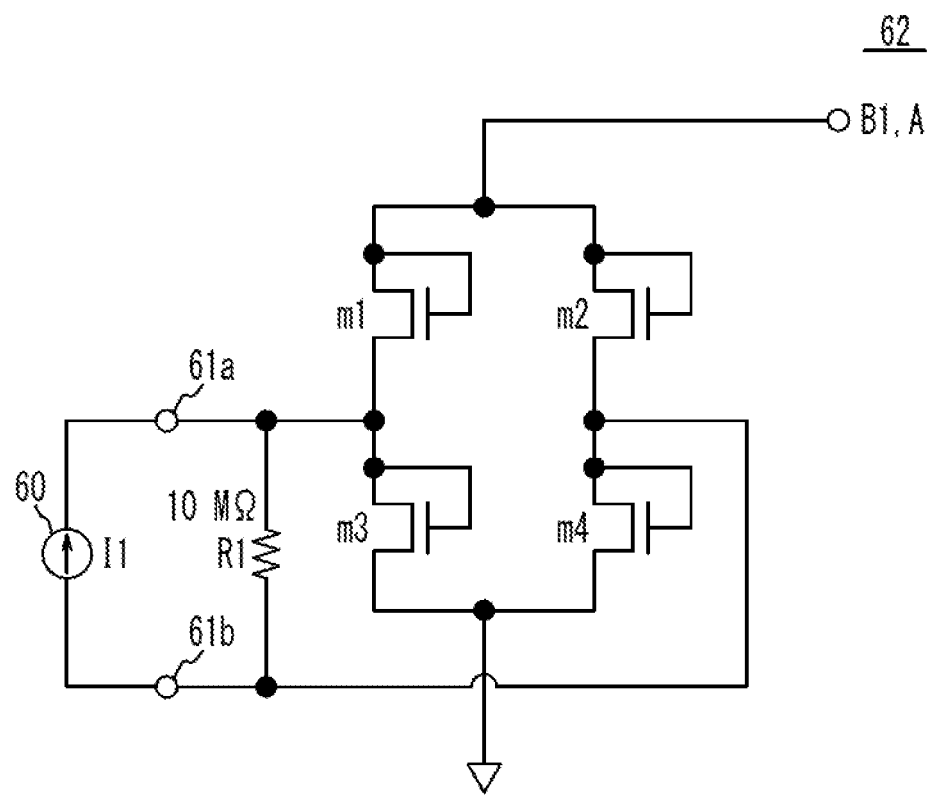
FIG. 50 is a circuit diagram illustrating a rectifier circuit in the seventh embodiment.

FIG. 50 is a circuit diagram illustrating the rectifier circuit 62 in the seventh embodiment. As illustrated in FIG. 50, the gates of NFETs m1 to m4 are coupled to the respective drains, and the NFETs m1 to m4 serve as diodes. The rectifier circuit 62 is a diode bridge circuit. The input terminal of the diode bridge circuit is coupled to the power terminals 61a and 61b. A current source of an alternating current I1 and 10 MΩ, which correspond to the power generation circuit 60, are coupled to the power terminals 61a and 61b. The output of the diode bridge circuit is coupled to the node B1 in FIG. 48 (corresponding to a node A in FIG. 51A described later).

[Step-Down Circuit]

Figure 51A:
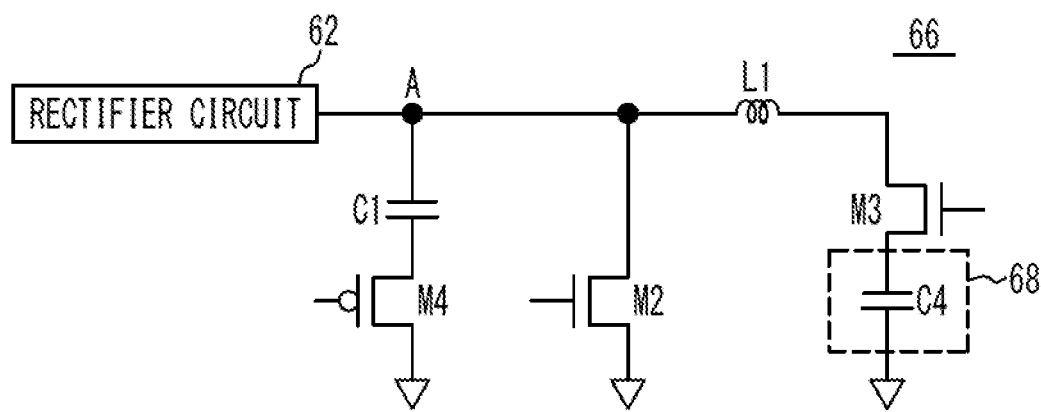
FIG. 51A to FIG. 51C are schematic views of a step-down circuit in the seventh embodiment.

FIG. 51A to FIG. MC are schematic views of a step-down circuit in the seventh embodiment. As illustrated in FIG. 51A, the output of the rectifier circuit 62 is the node A. The capacitor C1 and a PFET M4 are connected in series between the node A and a ground. The capacitor C1 is a primary capacitor. The PFET M4 is a switch. An inductor L1 and a capacitor C4 are connected in series between the node A and a ground. The capacitor C4 is a secondary capacitor, and corresponds to the power storage circuit 68. An NFET M3 is coupled as a switch between the inductor L1 and the capacitor C4. An NFET M2 is connected as a switch between the node between the capacitor C1 and the inductor L1 and a ground.

The capacitance values of the capacitors C1 and C4 are set at 100 pF and 10 nF, respectively, and the inductance of the inductor L1 is set at 0.3 nH. These values are set so that the on-resistance of the NFET M4 (for example, 10 kΩ) is ignorable. These values can be freely set.

During the operation of the step-down circuit 66, the NFET M3 is on. When the voltage of the node A decreases, the PFET M4 is turned on, and the NFET M2 is turned off. Therefore, the electric charge stored in the capacitor C1 passes through the inductor L1 as a current Ia, and is accumulated in the capacitor C4 as illustrated in FIG. MB. Simultaneously, a magnetic flux energy is accumulated in the inductor L1.

Figure 51B:
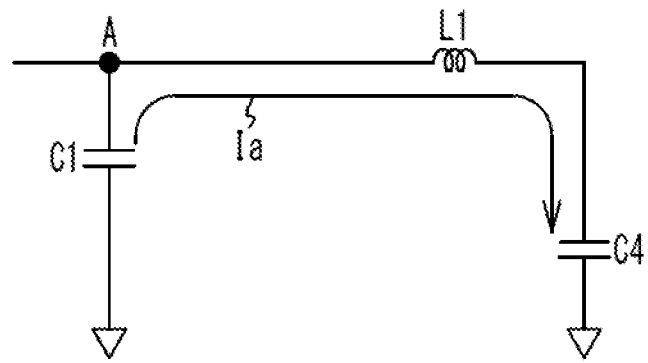
Figure 51C:
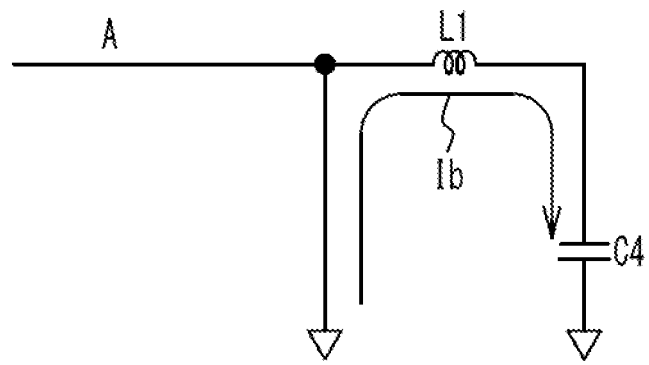

When the electric charge in the capacitor C1 becomes small, the PFET M4 is turned off, and the NFET M2 is turned on. As illustrated in FIG. 51C, the magnetic flux energy of the inductor L1 causes a current Ib to flow, which is accumulated in the capacitor C4. Therefore, the magnetic flux energy of the inductor L1 is recovered by the capacitor C4.

For example, when the charged voltages of the capacitors C1 and C4 are 10 V and 1 V, respectively, the electric charge 10 times that of the capacitor C1 is accumulated in the capacitor C4. In FIG. MB, the electric charge stored in the capacitor C1 is accumulated in the capacitor C4. At this time, the energy is stored as the magnetic flux energy of the inductor L1. In FIG. MC, the energy stored as the magnetic flux energy is converted to the current Ib to charge the capacitor C4. This allows the electric charge approximately 10 times the electric charge stored in the capacitor C1 to be accumulated in the capacitor C4.

Figure 52:
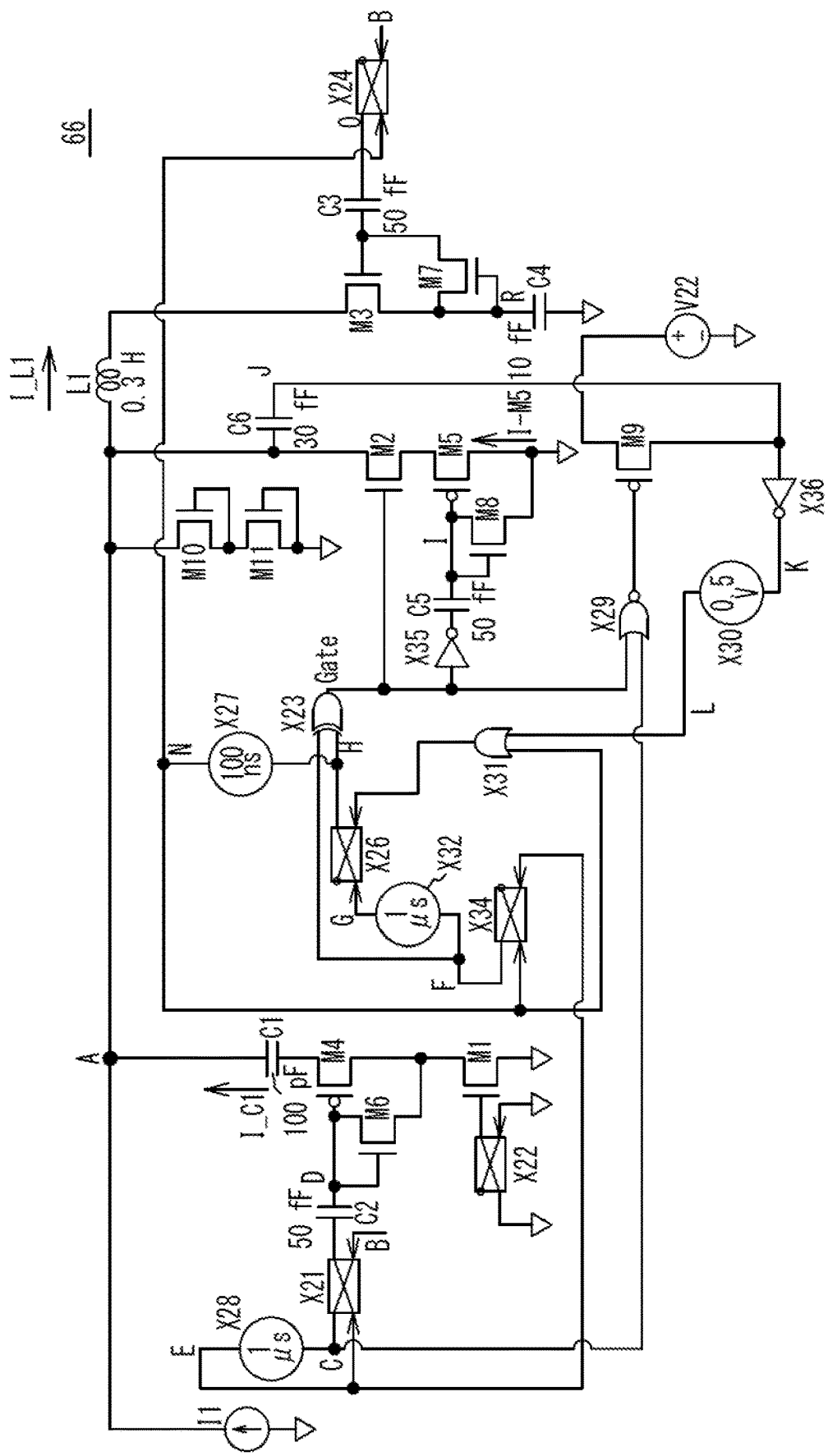
FIG. 52 is a circuit diagram of the step-down circuit in the seventh embodiment.
Figure 53:
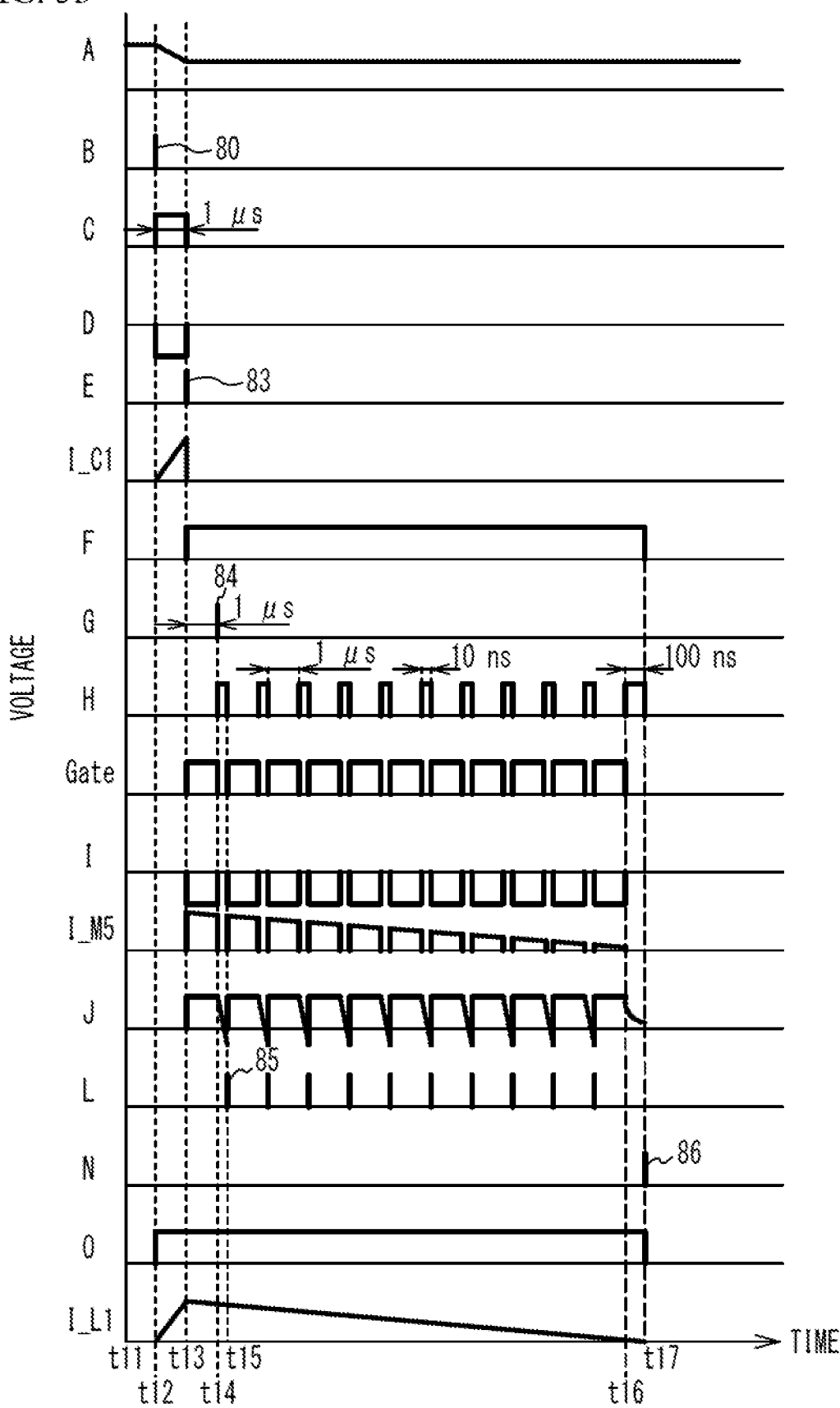
FIG. 53 illustrates respective voltages of nodes in the step-down circuit with respect to time in the seventh embodiment.

FIG. 52 is a circuit diagram of a step-down circuit in the seventh embodiment. FIG. 53 illustrates respective voltages of the nodes in the step-down circuit with respect to time in the seventh embodiment. As illustrated in FIG. 52 and FIG. 53, the voltage of the node A does not reach 8 V from time t11 to time t12. During this time period, a node O is at the low level. The NFET M3 is off when the node O is at the low level, while the NFET M3 is on when the node O is at the high level. Therefore, the NFET M3 is off between time t11 and time t12. A current I_L1 passing through the inductor L1 rightward is 0. The output of the rectifier circuit 62 charges the capacitor C1, and the voltage of the node A increases. In FIG. 53, the voltage of the node A gradually increases from the state where the voltage of the node A is lower than 8V at time t11, and becomes 8V at time t12.

The operation of the NFET M3 will be described. The threshold voltages of NFETs M3 to M7 are set at 0.4 V. The NFET M7 serves as a diode of which the forward direction is the direction from the node O to a node R. When the node O is at the low level, the voltage of the gate of the NFET M3 is less than the voltage of the node R, which is a first end of the capacitor C4, by approximately −0.3 V corresponding to the turn-on voltage of the diode. Therefore, the NFET M3 is turned off.

When the voltage of the node A exceeds 8 V at time t12, the determination circuit 65 outputs a step-down operation spike signal 80 to a node B. An FF circuit X24 outputs the high level to the node O. The voltage of the gate of the NFET M3 becomes higher than the voltage of the node R by approximately +0.7 V, and the NFET M3 is turned on. This causes the current I_L1 to start flowing through the inductor L1.

Furthermore, at time t12, the step-down operation spike signal 80 is input to the node B of an FF circuit X21. The FF circuit X21 outputs the high level to a node C, and outputs the low level to a first end of the capacitor C2. A spike generation circuit X28 outputs a spike signal 83 to a node E at time t13, 1 μs after time t12 when the node C becomes at the high level. This causes the FF circuit X21 to output the low level to the node C and the high level to the first end of the capacitor C2 at time t13. As a result, the node C is at the high level during the 1 μs period between time t12 and time t13, and is at the low level during other time periods.

A node D is coupled to a ground through the NFET M6 serving as a diode. Therefore, the node D has a negative voltage during the time period between time t12 and time t13, and has 0 V during other time periods (including time t13 and thereafter). As a result, the PFET M4, of which the gate is coupled to the node D, is turned on during the time period between time t12 and time t13. As a result, the PFET M4 and the NFET M3 are both turned on, and the connection relationship illustrated in FIG. 51B is established. The electric charge stored in the capacitor C1 flows to the node A as a current I_C1. The current I_C1 becomes the current I_L1 passing through the inductor L1, and charges the capacitor C4.

The gate of an NFET M1 is coupled to the output of an FF circuit X22. The NFET M1 is a switch to cause the step-down circuit 66 to operate, but the description thereof is omitted. NFETs M10 and M11 serve as a voltage limiter for preventing the node A from having a large negative voltage and breaking the circuit.

When the spike signal 83 is input to an FF circuit X34 at time t13, the FF circuit X34 changes the node F to the high level. A spike generation circuit X32 outputs a spike signal 84 to a node G at time t14, which is 1 μs delayed from time t13 when the node F becomes at the high level. During the time period between time t13 and time t14, the node F is at the high level, and a node H is at the low level. Therefore, an XOR circuit X23 outputs the high level to a node Gate. When the spike signal 84 is input to an FF circuit X26 at time t14, the FF circuit X26 outputs the high level to the node H. As a result, the XOR circuit X23 outputs the low level to the node Gate during the time period between time t14 and time t15.

An inverter X35 inverts the signal of the node Gate, and outputs the inverted signal to a first end of a capacitor C5. A node I coupled to a second end of the capacitor C5 is coupled to an NFET M8 serving as a diode. Thus, the voltage of the node I is 0 V when the node Gate is at the low level, and is a negative voltage when the node Gate is at the high level. That is, the node I has a negative voltage during the time period between time t13 and time t14, while the node I is 0 V during the time period between time t14 and time t15. When the node I becomes to have a negative voltage during the period between time t13 and time 14, the PFET M5 becomes in an on-state. At this time, the current I_M5 flows out from the ground as indicated by the arrow due to the current I_L1 passing through the inductor L1 described above. The current I_M5 flows to the capacitor C4 through the inductor L1. As a result, the capacitor C4 is charged. When the node I becomes to have 0V during the period between time t14 and time t15, the PFET M5 becomes in an off state, and the current I_M5 does not flow.

The NFET M2, of which the gate is coupled to the node Gate, and the PFET M5, of which the gate is coupled to the node I, are on during the time period between time t13 and time t14, and is off during the time period between time t14 and time t15.

During the time period between time t13 and time t14, the PFET M4 is off, and the PFET M5 and the NFET M3 are on. Thus, the connection relationship illustrated in FIG. 51B is established. During the time period between time t13 and time t14, a current I_M5 corresponding to the current I_L1 flowing through the inductor L1 flows through the PFET M5, and the capacitor C4 is charged.

An NOR circuit X29 outputs the NOR of the node C and the node Gate to the gate of a PFET M9. The drain of the PFET M9 is coupled to a constant-voltage source V22 of 1 V. The PFET M9 is off in the time period during which the node C and the node Gate are both at the low level, and the PFET M9 is on in other time periods. As a result, during the time period between time t13 and time t14, the PFET M9 is on, and a node J is at the high level (1 V). A first end of a capacitor C6 is coupled to the node A, and a second end of the capacitor C6 is coupled to the node J. During the time period between time t13 and time t14, the capacitor C6 is charged by the potential difference between the nodes A and J. During the time period between time t14 and time t15, when the electric charge stored in the capacitor C6 is discharged, the node J becomes at a negative voltage.

An inverter X36 inverts the voltage of the node J, and outputs the resulting voltage to a node K. A spike generation circuit X30 outputs a spike signal 85 to a node L when the voltage of the node K becomes 0.5 V or greater. An OR circuit X31 outputs the OR of the node L and a node N to the FF circuit X26. At time t15, when the voltage of the node J becomes approximately −0.5 V or less, the voltage of the node K becomes +0.5 V or greater. When the spike generation circuit X30 outputs the spike signal 85, the OR circuit X31 outputs the spike signal 85 to the FF circuit X26. As a result, the FF circuit X26 changes the node H to the low level. The node Gate becomes at the high level.

As described above, the node Gate is at the high level during a period of 1 μs, and is at the low level during the time period from when the PFET M9 is turned off to when the node J becomes approximately −0.5 V or less. During the time period when the current I_L1 of the inductor L1 flows, the node Gate alternately becomes at the high level and the low level, repeatedly.

As the magnetic flux energy stored in the inductor L1 decreases, the current I_L1 flowing through the inductor L1 gradually decreases. At time t16, the current I_L1 becomes approximately 0. Since the voltage of the node A decreases to approximately 1 V, the capacitor C6 is little charged. Therefore, even when the PFET M9 is turned off at time t16, the node J does not become approximately −0.5 V or less for a long period of time. Thus, the node K does not become +0.5 V or greater, and the spike generation circuit X30 does not output the spike signal 85. At time t17, 100 ns after the voltage of the node H becomes the high level at time t16, a spike generation circuit X27 outputs a spike signal 86 to the node N. As a result, the FF circuit X24 outputs the low level to the node O. The NFET M3 is turned off, and the step-down operation of the step-down circuit 66 ends.

Figure 54:
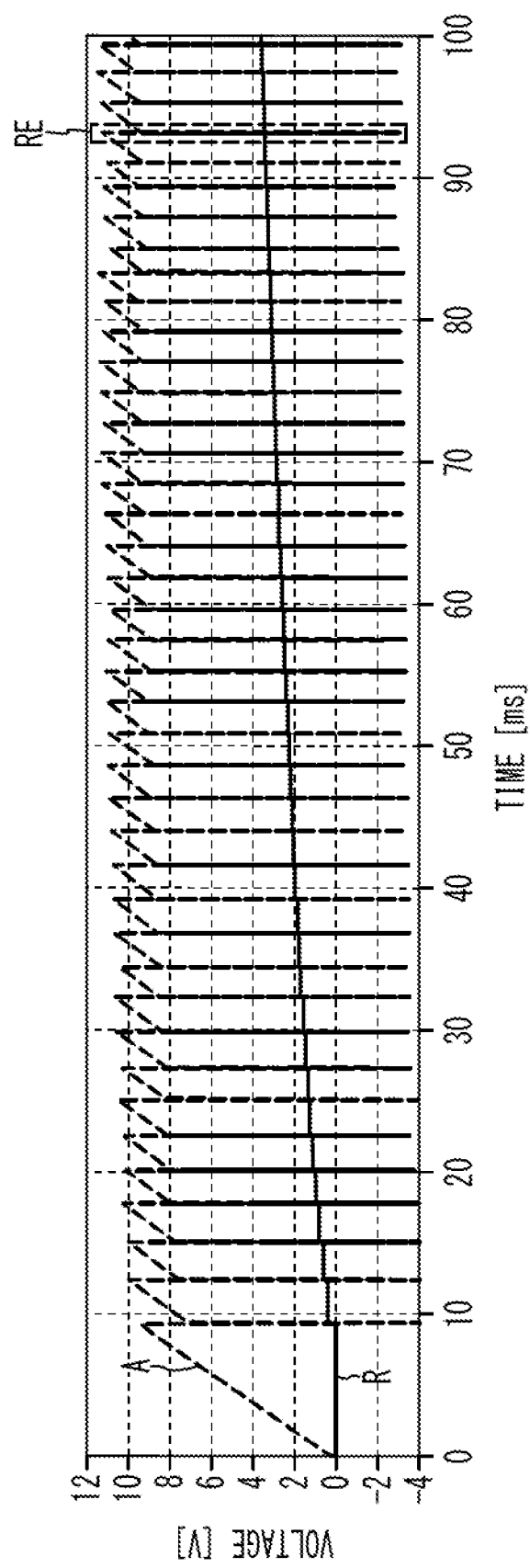
FIG. 54 illustrates respective voltages of nodes A and R with respect to time in the seventh embodiment.

FIG. 54 illustrates respective voltages of the nodes A and R with respect to time in the seventh embodiment. FIG. 53 illustrates the operation within, for example, a range RE in FIG. 54. As illustrated in FIG. 54, when the rectifier circuit 62 starts operating, the electric charge is accumulated in the capacitor C1 and the voltage of the node A increases. When the voltage of the node A becomes 8V or greater, the step-down operation during the time period between time t11 and time t17 in FIG. 53 is started. The voltage of the node A decreases, and the voltage of the node R increases. When the voltage of the node A becomes approximately 1 V, the step-down operation ends. The electric charge is accumulated in the capacitor C1, and the voltage of the node A increases. As seen above, every time the step-down operation is performed, the voltage of the node R increases, and the capacitor C4 is charged.

The use of the comparator or the like in the control circuit that controls on and off of the NFET M3 and the PFETs M4 and M5 of the step-down circuit increases the power consumption. The use of the spike generation circuit to control on and off of the NFET M3 and the PFETs M4 and M5 as in the seventh embodiment allows the step-down operation to be performed with low power consumption.

[Synchronous Rectifier Circuit]

Figure 55A:
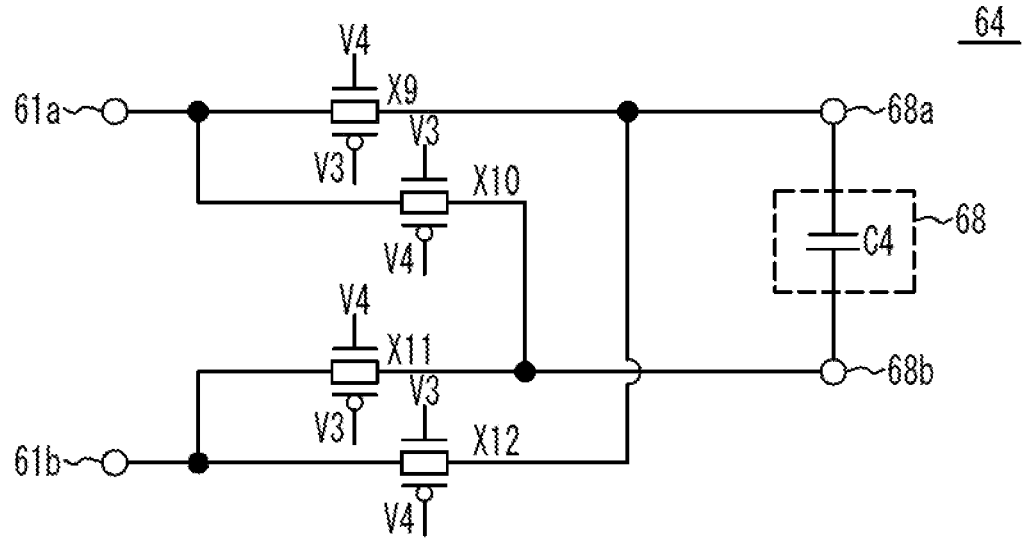
FIG. 55A to FIG. 55C are schematic views of a synchronous rectifier circuit in the seventh embodiment.
Figure 55B:
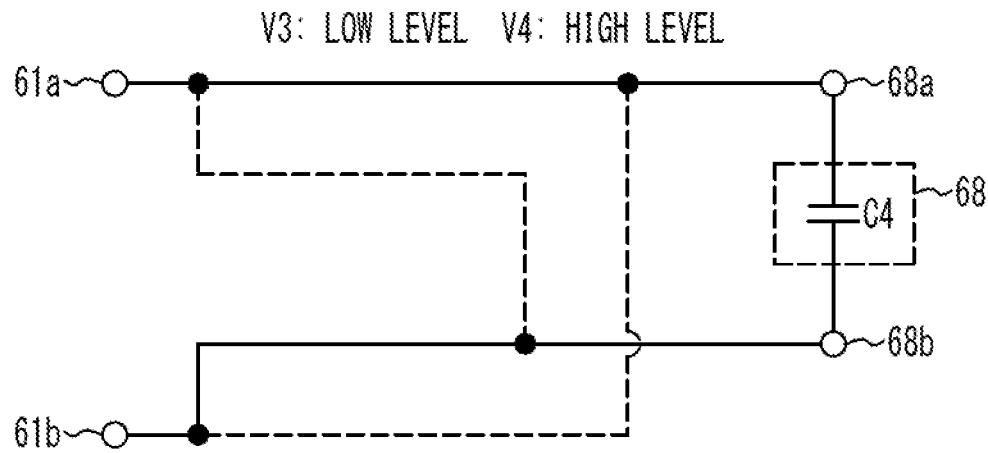
Figure 55C:
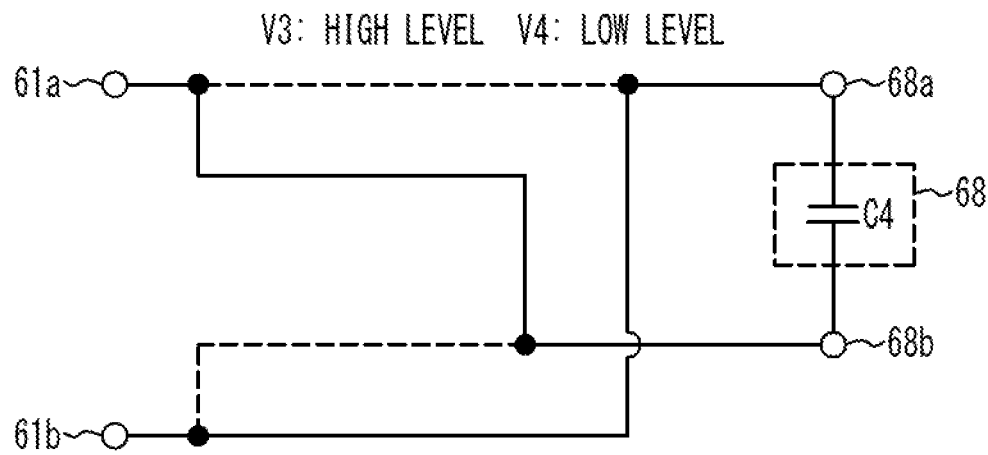

FIG. 55A to FIG. 55C schematic views of a synchronous rectifier circuit in the seventh embodiment. In FIG. 55B and FIG. 55C, electrical connection is indicated by a solid line, and electrical disconnection is indicated by a dashed line.

As illustrated in FIG. 55A, in a synchronous rectifier circuit 64, the power terminal 61a is coupled to a positive terminal 68a of the capacitor C4 through a pass gate X9, and is coupled to a negative terminal 68b (for example, a ground) of the capacitor C4 through a pass gate X10. The power terminal 61b is coupled to the positive terminal 68a of the capacitor C4 through a pass gate X12, and is coupled to the negative terminal 68b of the capacitor C4 through a pass gate X11.

The pass gates X9 and X11 are on when a voltage V3 is the low level and a voltage V4 is the high level, and are off when the voltage V3 is the high level and the voltage V4 is the low level. The pass gates X10 and X12 are on when the voltage V3 is the high level and the voltage V4 is the low level, and are off when the voltage V3 is the low level and the voltage V4 is the high level.

As illustrated in FIG. 55B, when the power terminal 61a has a positive voltage with respect to the power terminal 61b, the voltage V3 is set at the low level and the voltage V4 is set at the high level. This causes the power terminal 61a to be coupled to the positive terminal 68a of the capacitor C4 and disconnected from the negative terminal 68b. The power terminal 61b is coupled to the negative terminal 68b of the capacitor C4, and is disconnected from the positive terminal 68a.

As illustrated in FIG. 55C, when the power terminal 61a has a negative voltage with respect to the power terminal 61b, the voltage V3 is set at the high level and the voltage V4 is set at the low level. This causes the power terminal 61a to be coupled to the negative terminal 68b of the capacitor C4 and disconnected from the positive terminal 68a. The power terminal 61b is coupled to the positive terminal 68a of the capacitor C4 and is disconnected from the negative terminal 68b. In this manner, the alternating-current (AC) power can be rectified to charge the capacitor C4.

Figure 56:
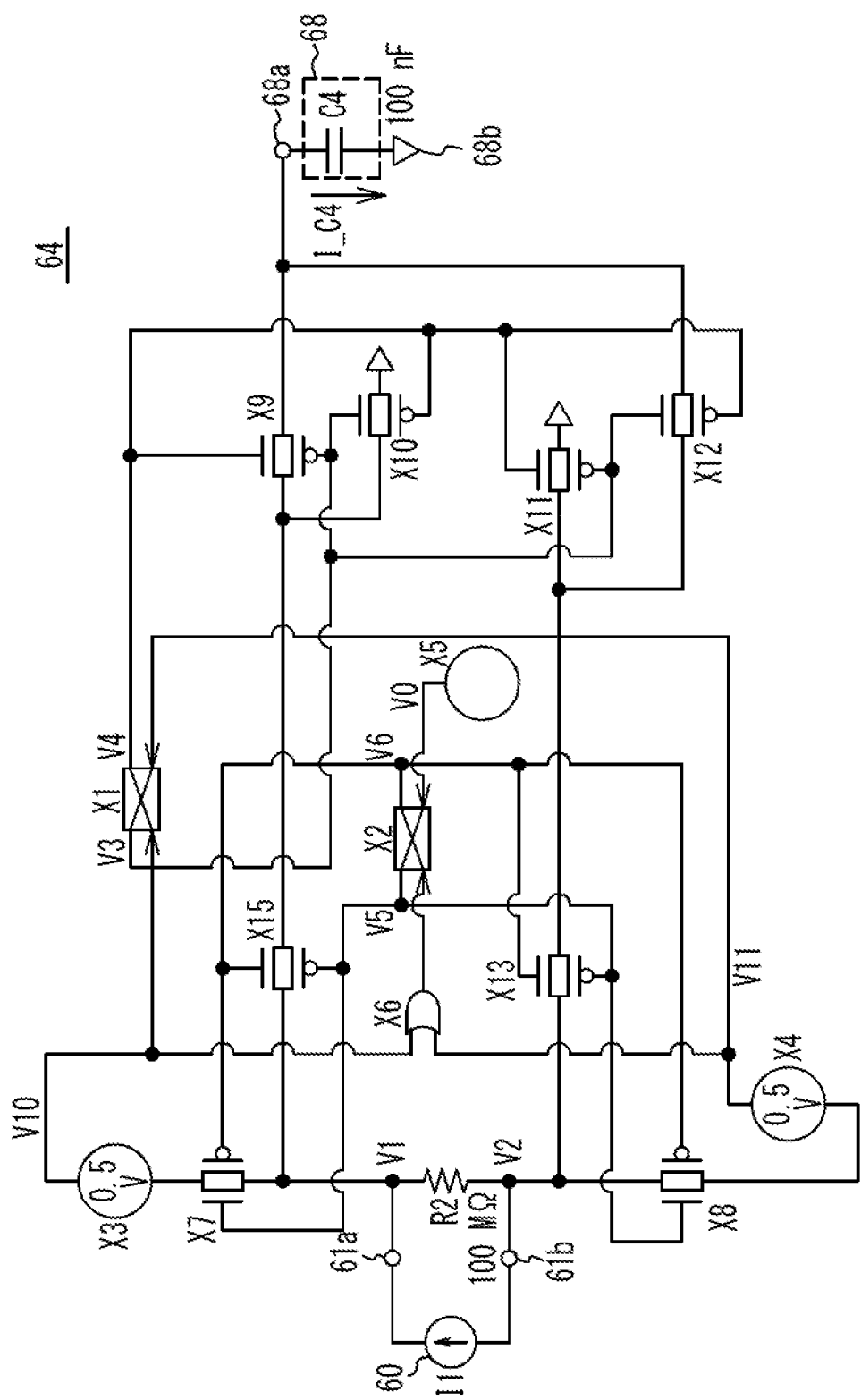
FIG. 56 is a circuit diagram of the synchronous rectifier circuit in the seventh embodiment.
Figure 57:
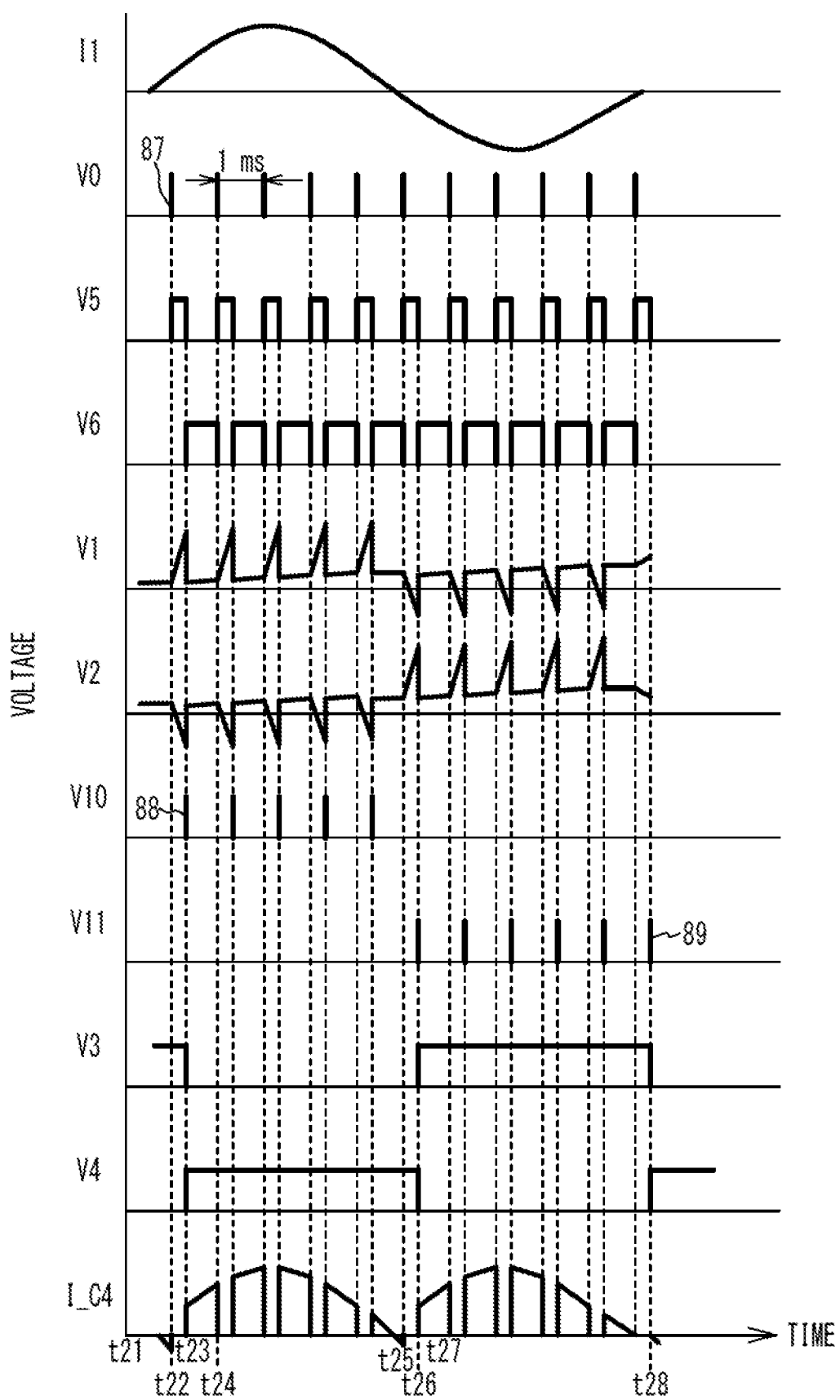
FIG. 57 illustrates respective voltages of nodes in the synchronous rectifier circuit with respect to time in the seventh embodiment.

FIG. 56 is a circuit diagram of the synchronous rectifier circuit in the seventh embodiment. FIG. 57 illustrates respective voltages of the nodes in the synchronous rectifier circuit with respect to time in the seventh embodiment. As illustrated in FIG. 56 and FIG. 57, at and after time t21, the alternating current I1 is input to the power terminals 61a and 61b from the power generation circuit 60. The terminating resistance between the power terminals 61a and 61b is 100 MΩ.

A spike generation circuit X5 autonomously outputs a spike signal 87 as a voltage V0 every 1 ms. When the spike signal 87 is output at time t22, an FF circuit X2 changes voltages V5 and V6 to the high level and the low level, respectively. This turns off pass gates X13 and X15, and turns on pass gates X7 and X8. Since the power terminals 61a and 61b have a positive voltage and a negative voltage at time t22, respectively, when the pass gates X13 and X15 are turned off, the current input from the power generation circuit 60 increases the voltage V1, and decreases the voltage V2.

When the voltage V1 becomes 0.5 V or greater, the spike generation circuit X3 outputs a spike signal 88 as a voltage V10 at time t23. The spike generation circuit X4 does not output a spike signal. An OR circuit X6 outputs the spike signal 88 to the FF circuit X2. As a result, the FF circuit X2 changes the voltages V5 and V6 to the low level and the high level, respectively. The pass gates X13 and X15 are turned on, and the pass gates X7 and X8 are turned off. The time period between time t22 and time t23 is, for example, 10 ns.

When the spike signal 88 output by the spike generation circuit X3 is input to an FF circuit X1 at time t23, the FF circuit X1 changes the voltages V3 and V4 to the high level and the low level, respectively. The pass gates X9 and X11 are turned on, and the pass gates X10 and X12 are turned off. As a result, during the time period between time t23 and time t25, the power terminals 61a and 61b are coupled to the positive terminal 68a and the negative terminal 68b of the capacitor C4, respectively, as illustrated in FIG. 55B. In the time period between time t23 and time t25, when the pass gates X13 and X15 are turned on as in the time period between time t23 and time t24, a current I_C4 of the capacitor C4 flows, and the capacitor C4 is charged.

Thereafter, until time t25, the spike generation circuit X3 outputs the spike signal 88, and the spike generation circuit X4 outputs no spike signal. Therefore, the FF circuit X1 maintains the voltages V3 and V4 at the low level and the high level, respectively.

At time t25, the power terminals 61a and 61b become to have a negative voltage and a positive voltage, respectively. When the pass gates X13 and X15 are turned off, the current input from the power generation circuit 60 increases the voltage V2, and decreases the voltage V1. When the voltage V2 becomes 0.5 V or greater, the spike generation circuit X4 outputs a spike signal 89 as a voltage V11 at time t26. The spike generation circuit X3 does not output a spike signal.

When the spike signal 89 output by the spike generation circuit X4 is input to the FF circuit X1, the FF circuit X1 changes the voltages V3 and V4 to the high level and the low level, respectively. The pass gates X9 and X11 are turned off, and the pass gates X10 and X12 are turned on. As a result, during the time period between time t26 and time t28, the power terminals 61a and 61b are coupled to the negative terminal 68b and the positive terminal 68a of the capacitor C4, respectively, as illustrated in FIG. 55C. In the time period between time t26 and time t28, when the pass gates X13 and X15 are on as in the time period between time t26 and time t27, the current I_C4 of the capacitor C4 flows, and the capacitor C4 is charged. Thereafter, when the power terminals 61a and 61b become to have a positive voltage and a negative voltage, respectively, the process is repeated from time t22.

Figure 58:
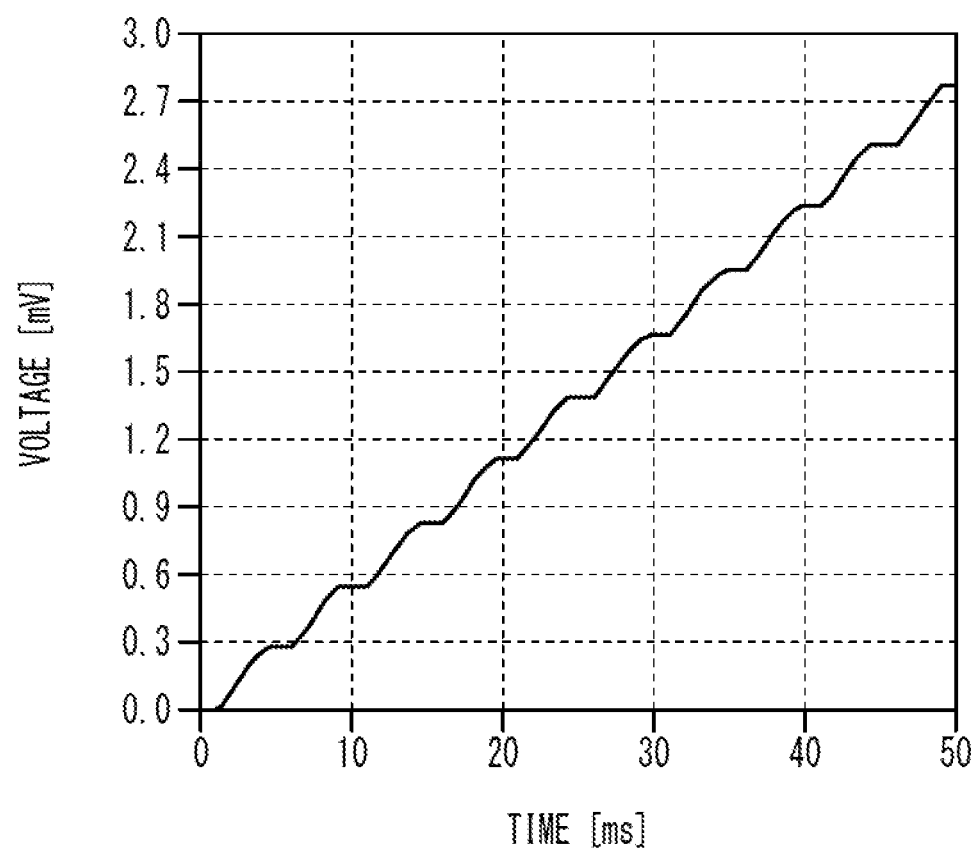
FIG. 58 illustrates the voltage of a capacitor charged by the synchronous rectifier circuit with respect to time in the seventh embodiment.

FIG. 58 illustrates the voltage of the capacitor charged by the synchronous rectifier circuit with respect to time in the seventh embodiment. The voltage of the capacitor C4 was simulated under the assumption that the current from the power generation circuit 60 was an alternating current having a maximum amplitude of 10 nA. As illustrated in FIG. 58, the capacitor C4 is charged even by a very small current having a maximum amplitude of 10 nA, and the voltage of the capacitor C4 increases.

The use of the comparator or the like in the control circuit that controls on and off of the pass gates X9 to X12 of the synchronous rectifier circuit increases the power consumption. The use of the spike generation circuit to control on and off of the pass gates X9 to X12 as in the seventh embodiment allows the synchronous rectification with low power consumption.

The simulation was conducted for the power conversion circuit of the seventh embodiment. The simulated circuit is a circuit including the determination circuit 65, the rectifier circuits 62 and 64, the step-down circuit 66, and the power storage circuit 68, which have been described, and includes 18 spike generation circuits, 17 FF circuits, and approximately 340 FETs.

Figure 59:
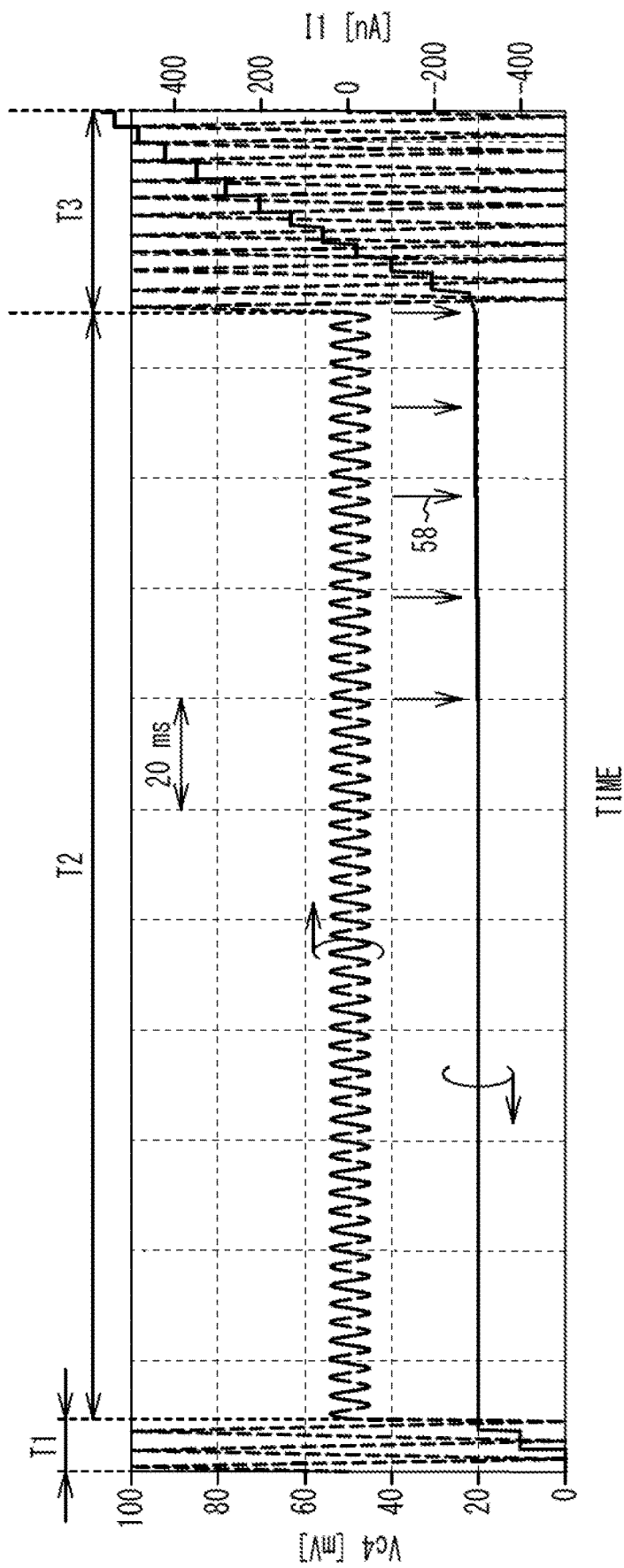
FIG. 59 illustrates a generated current and the voltage of the capacitor with respect to time in the seventh embodiment.

FIG. 59 illustrates a generated current and the voltage of the capacitor with respect to time in the seventh embodiment. As illustrated in FIG. 59, the power generation circuit 60 generates the alternating current Il having a maximum amplitude of 500 nA during the time periods T1 and T3, and generates the alternating current Il having a maximum amplitude of 40 nA during the time period T2. During the time period Ti, the determination circuit 65 causes the rectifier circuit 62 and the step-down circuit 66 to operate. This increases the voltage Vc4 of the capacitor C4 of the power storage circuit 68, and the power is stored in the power storage circuit 68.

In the time period T2, the current Il generated by the power generation circuit becomes small, and therefore, the input impedance of the rectifier circuit 62 becomes higher than the output impedance of the power generation circuit 60. Therefore, the determination circuit 65 autonomously switches from the rectifier circuit 62 to the synchronous rectifier circuit 64. This causes the input impedance of the synchronous rectifier circuit 64 to substantially match with the output impedance of the power generation circuit 60. Therefore, as indicated by arrows 58 in the time period T2, the power is stored in the power storage circuit 68. At every timing indicated by the tip of the arrow 58, the level of the voltage Vc4 increases in small increments.

In the time period T3, the current Il generated by the power generation circuit becomes large, the input impedance of the synchronous rectifier circuit 64 becomes lower than the output impedance of the power generation circuit 60. Therefore, the determination circuit 65 autonomously switches from the synchronous rectifier circuit 64 to the rectifier circuit 62. This causes the input impedance of the rectifier circuit 62 to substantially match with the output impedance of the power generation circuit 60. Therefore, during the time period T3, the power is stored in the power storage circuit 68.

The use of the spike generation circuit and the FF circuit to control the power conversion circuit 120 can reduce the power for the control of the power conversion circuit to 1 nW or less. This power for control is three orders of magnitude less than the power when the similar power conversion circuit is achieved using a control integrated circuit (IC) or the like. Therefore, even when the power generated by the power generation circuit 60 is as small as a few nW, the power conversion circuit capable of storing power can be achieved.

In the seventh embodiment, as illustrated in FIG. 44, the rectifier circuits 62 and 64 rectify the power that has been input. The determination circuit 65 includes the spike generation circuit according to any one of the first to third embodiments and the variations thereof, and causes one of the rectifier circuits 62 and 64 to rectify the power, as illustrated in FIG. 48. The use of the spike generation circuit according to any one of the first to third embodiments and the variations thereof can achieve the determination circuit 65 with low power consumption. Therefore, small power of about nW can be rectified.

In the step-down circuit 66, the control circuit that controls on and off of the NFETs M3 to M5 (switch elements) includes the spike generation circuit of any one of the second and third embodiments and the variations thereof. In the synchronous rectifier circuit 64, the control circuit that controls on and off of the pass gates X9 to X12 (switch elements) includes the spike generation circuit of any one of the second to fourth embodiments and the variations thereof. This achieves the control circuit with low power consumption.

The step-down circuit 66 and the synchronous rectifier circuit 64 have been described as an example of the power conversion circuit to which the spike generation circuit of any one of the first to third embodiments and the variations thereof is applied, but the power conversion circuit may be a step-down circuit having other circuit configurations, a step-up circuit, a DC-AC power conversion circuit, or an AC-DC power conversion circuit.

Eighth Embodiment

An eighth embodiment and a variation 1 thereof are examples where the spike generation circuit according to any one of the first to fourth embodiments and the variations thereof is applied to a threshold value determination circuit (a voltage determination circuit). In the first to fourth and eighth embodiments and the variations thereof, an isolated spike signal is a signal having a sufficiently long interval between the spike signals with respect to the pulse width of the spike signal. For example, the pulse width is equal to or less than $\frac{1}{10}$ of, or equal to or less than $\frac{1}{100}$ of the interval between the spike signals.

Figure 60A:
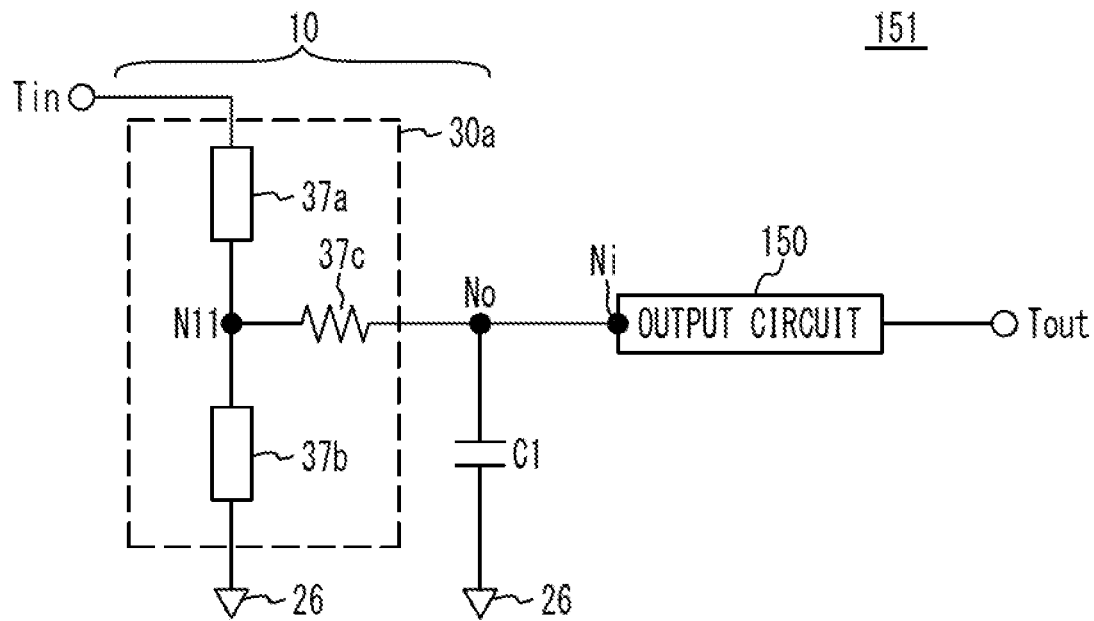
FIG. 60A and FIG. 60B are circuit diagrams of spike generation circuits in accordance with an eighth embodiment and a variation 1 thereof, respectively.

FIG. 60A is a circuit diagram of a spike generation circuit in accordance with the eighth embodiment. As illustrated in FIG. 60A, a spike generation circuit 151 includes the input circuit 10 and an output circuit 150. The input circuit 10 includes a voltage conversion circuit 30a and the capacitor C1. The voltage conversion circuit 30a has elements 37a and 37b and a resistor 37c. The elements 37a and 37b are connected in series between the input terminal Tin and the ground line 26. The resistor 37c is connected between the node N11, which is between the elements 37a and 37b, and an output node No of the input circuit 10. The capacitor C1 is connected between the output node No and the ground line 26.

The output circuit 150 is, for example, any one of the spike generation circuits 130 to 136 according to the first embodiment and the variations thereof. The output node No of the input circuit 10 is coupled to the intermediate node Ni of the output circuit 150.

The voltage of the input signal input to the input terminal Tin is divided by the elements 37a and 37b, and the divided voltage is output to the node N11, and is then output to the output node No. As seen above, as in the fifth embodiment and the variation 1 thereof, the voltage conversion circuit 30a converts the voltage of the input signal. Therefore, the output circuit 150 outputs the isolated spike signal when the voltage of the input signal is equal to or greater than a predetermined voltage, and outputs no spike signal when the voltage of the input signal is less than the predetermined voltage. Alternatively, the output circuit 150 outputs the isolated spike signal when the voltage of the input signal is equal to or less than a predetermined voltage, and outputs no spike signal when the voltage of the input signal is greater than the predetermined voltage.

The elements 37a and 37b may be any elements that divide the voltage of the input signal. For example, a resistor, a diode, or a transistor can be used. The element 37a may serve as a constant current element.

When the parasitic capacitances of the elements 37a and 37b are large, there may be a case where a spike signal with a clean waveform is not generated. The parasitic capacitances of the elements 37a and 37b can be hidden from the output circuit 150 by providing the resistor 37c. Thus, a spike signal with a clean waveform can be generated. To reduce the influence of the elements 37a and 37b on the output circuit 150, the product of the capacitance value of the capacitor C1 and the resistance value of the resistor 37c is preferably greater than the width of the spike signal output by the output circuit 150.

[Variation 1 of the Eighth Embodiment]

Figure 60B:
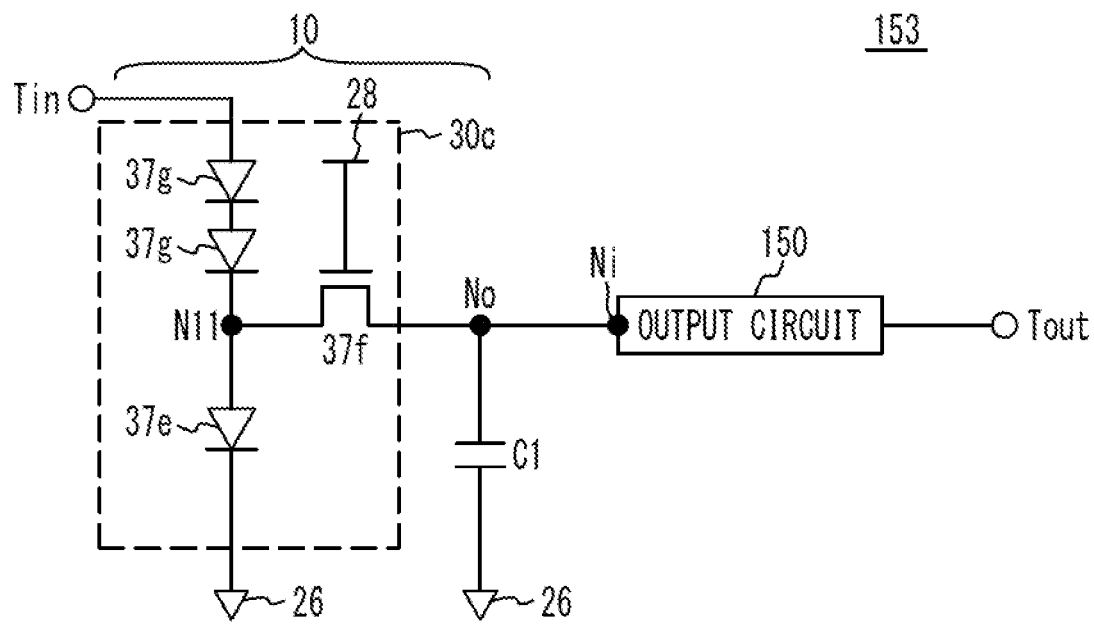

FIG. 60B is a circuit diagram of a spike generation circuit in accordance with a variation 1 of the eighth embodiment. As illustrated in FIG. 60B, in a spike generation circuit 153, a voltage conversion circuit 30c includes diodes 37e and 37g, and an FET 37f. Two diodes 37g are connected in the forward direction between the input terminal Tin and the node N11, and the diode 37e is connected in the forward direction between the node N11 and the ground line 26. The diodes 37e and 37g may be transistor diodes in which the gate of the FET is coupled to the source. The input signal input to the input terminal Tin is resistance-divided by the diodes 37g and 37e.

One of the source and the drain of the FET 37f is coupled to the node N11, and the other of the source and the drain is coupled to the node No. The gate is coupled to the power line 28. The FET 37f serves as a resistor. Other configurations are the same as those of the eighth embodiment, and the description thereof is thus omitted.

When the voltage applied to both ends of each of the diodes 37e and 37g is sufficiently smaller than the forward voltage (the voltage drop) of the diode, because the current flowing through each of the diodes 37e and 37g is very small, the power consumed in the voltage conversion circuit 30c can be reduced to nW or less. For example, when the maximum voltage of the input signal is 1 V and the forward voltages of the diodes 37e and 37g are adjusted to be approximately 0.8 V, the current flowing through the diodes 37e and 37g becomes very small.

Each of the diodes 37e and 37g may be connected in the backward direction. However, the element-to-element variability in the forward current of the diode is small, while the element-to-element variability in the backward current is large. Therefore, the diodes 37e and 37g are preferably connected in the forward direction. Resistance elements may be used as the elements 37a and 37b of the eighth embodiment. However, it is difficult to manufacture a resistance element with a high resistance. Therefore, the use of the diodes 37e and 37g connected in the forward direction is preferable as in the variation 1 of the eighth embodiment.

When the resistor 37c of the eighth embodiment is formed of a resistance element, it is difficult to fabricate the resistor 37c with a high resistance. The resistor 37c having an appropriate resistance value can be achieved by using the on-resistance of the FET 37f as the resistor 37c. For example, when the FET 37f is a PFET, the voltage of the power line 28 is 1 V, and the threshold voltage of the FET 37f is approximately 0.8, the resistance between the source and the drain of the FET 37f is 1 MΩ or greater.

Figure 61A:
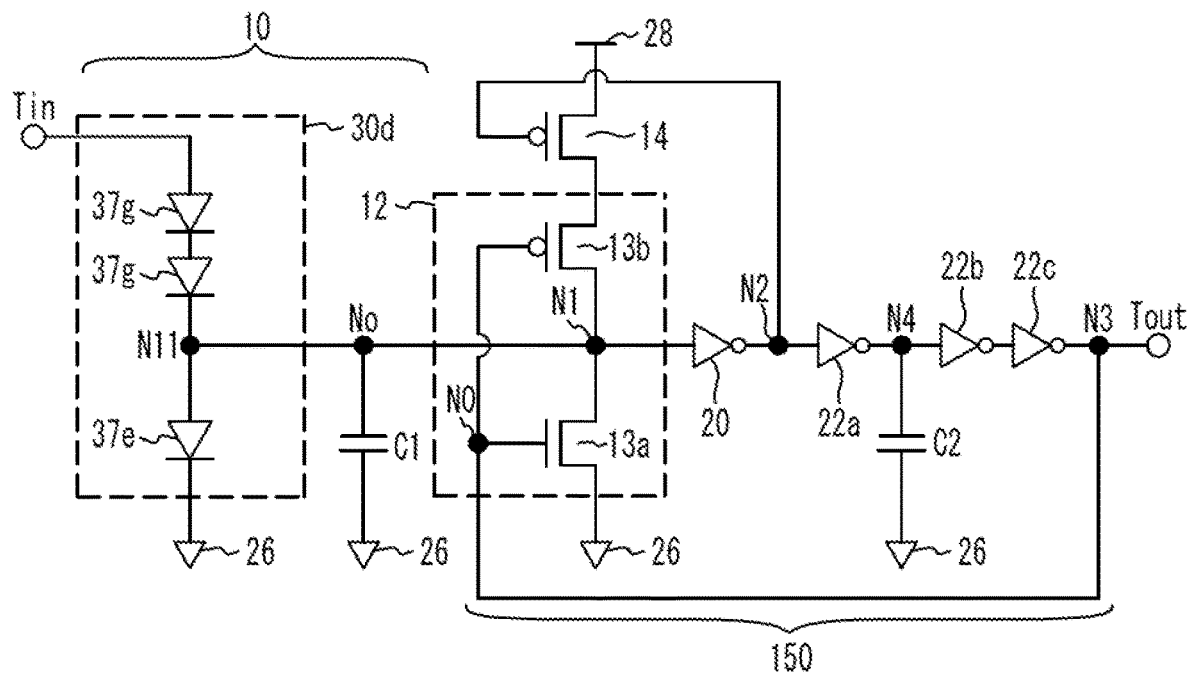
FIG. 61A and FIG. 61B are circuit diagrams of spike generation circuits in accordance with variations 1A and 1 of the eighth embodiment used for a simulation, respectively.
Figure 61B:
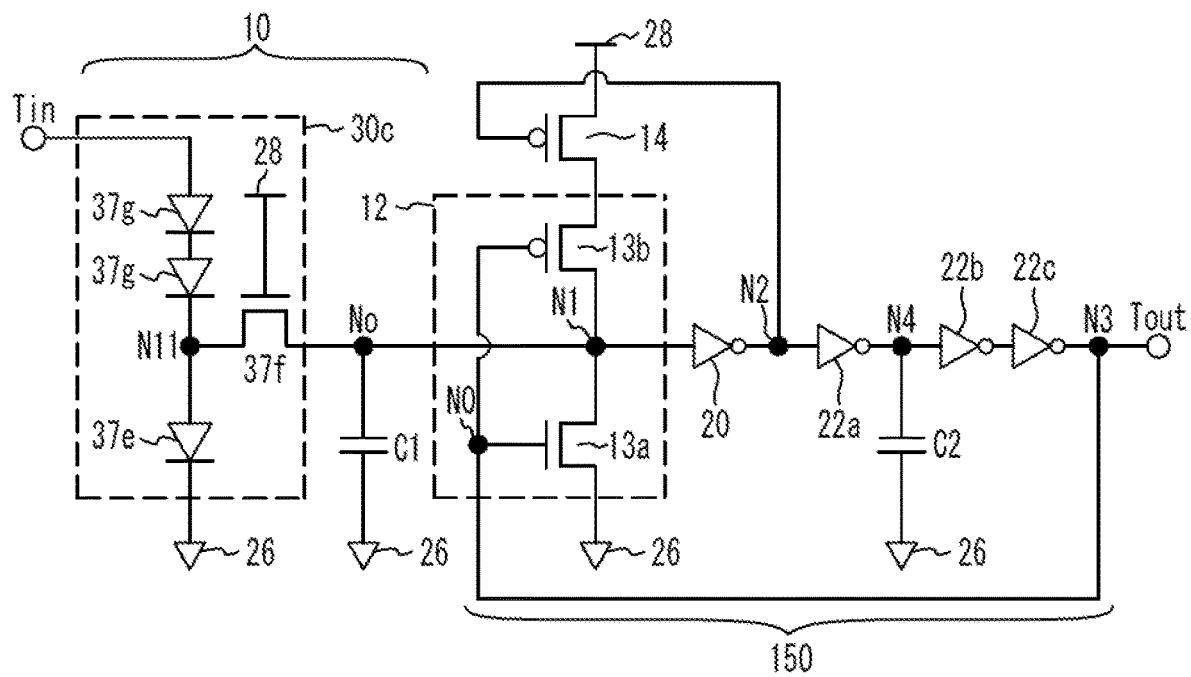

The spike signal in the spike generation circuit of the variation 1 of the eighth embodiment was simulated. FIG. 61A and FIG. 61B are circuit diagrams of spike generation circuits in accordance with variations 1A and 1 of the eighth embodiment used in the simulation.

As illustrated in FIG. 61A, a voltage conversion circuit 30d of the variation 1A of the eighth embodiment has no FET 37f, and the node N11 is directly connected to the node No. The circuit of the output circuit 150 is the same as the spike generation circuit illustrated in FIG. 8 of the third embodiment except in that the connection between the PFET 14 and the PFET 13b is inverted.

As illustrated in FIG. 61B, in the variation 1 of the eighth embodiment, the voltage conversion circuit 30c has the FET 37f. The circuit configuration of the output circuit 150 is the same as the circuit configuration illustrated in FIG. 61A of the variation 1A of the eighth embodiment. In the simulation, the capacitance values of the capacitors C1 and C2 were configured to be 2 fF and 4 fF, respectively. The conditions of the FETs and the voltages of the power line 28 and the ground line 26 are the same as those in the simulation of the third embodiment.

Figure 62A:
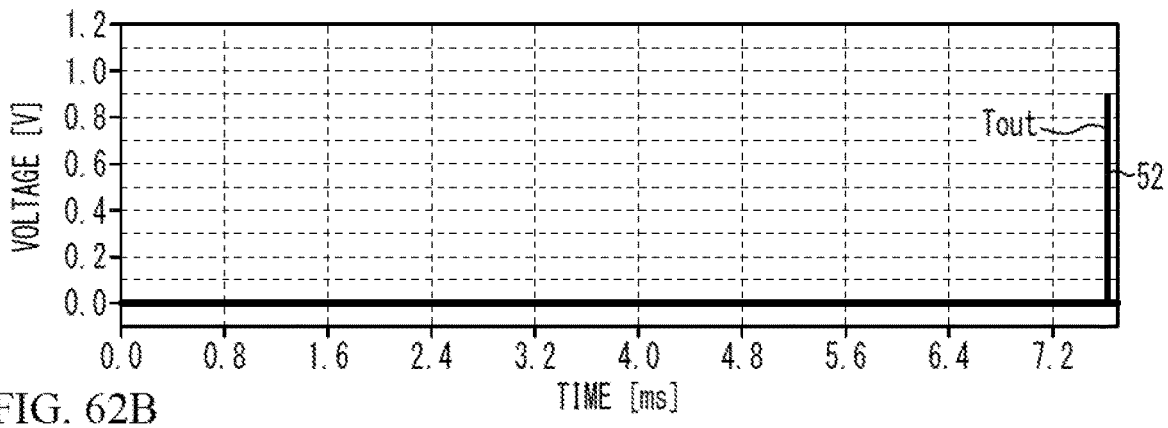
FIG. 62A to FIG. 62D present simulation results of the variation 1A of the eighth embodiment and illustrate voltages with respect to time.
Figure 62B:
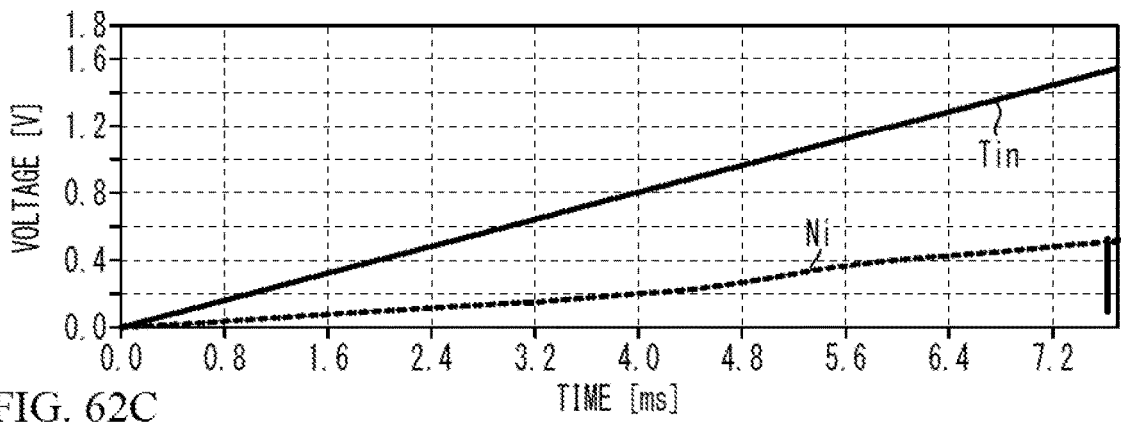
Figure 62C:
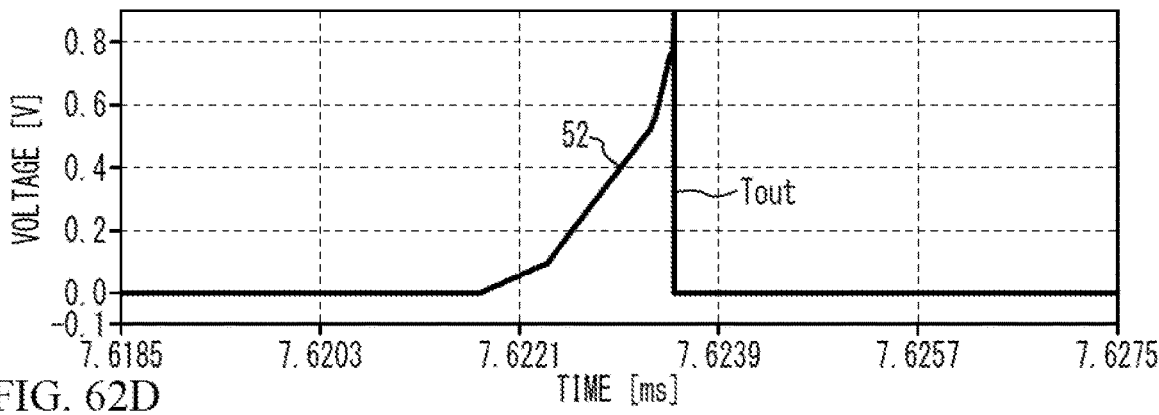
Figure 62D:
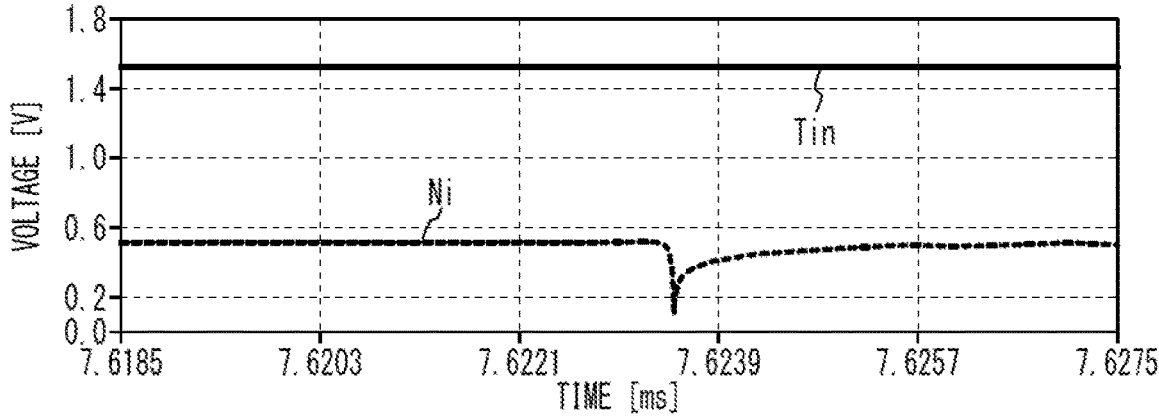

FIG. 62A to FIG. 62D present simulation results of the variation 1A of the eighth embodiment, and illustrate voltages with respect to time. FIG. 62A illustrates the voltage of the output terminal Tout with respect to time, and FIG. 62B illustrates the voltages of the input terminal Tin and the node N1 with respect to time. FIG. 62C and FIG. 62D are enlarged views around the time at which the spike signal is output in FIG. 62A and FIG. 62B, respectively.

As illustrated in FIG. 62B, the voltage of the input terminal Tin is gradually increased with respect to time. The voltage of the node N1 gradually increases with respect to time. When the voltage of the node N1 becomes 0.5 V, which is the threshold voltage, the spike signal 52 is output as illustrated in FIG. 62A.

As illustrated in FIG. 62C, the rise of the spike signal 52 is gradual, and the waveform of the spike signal 52 is deformed. In addition, the height of the spike signal 52 does not reach 1 V. As illustrated in FIG. 62D, the voltage of the node N1 is around 0.5 V, and is different from the voltage when the normal spike signal 52 illustrated in FIG. 9B is generated. In the variation 1A of the eighth embodiment, it is considered that the normal spike signal 52 is not generated because the parasitic capacitances of the diodes 37e and 37g affect the output circuit 150.

Figure 63A:
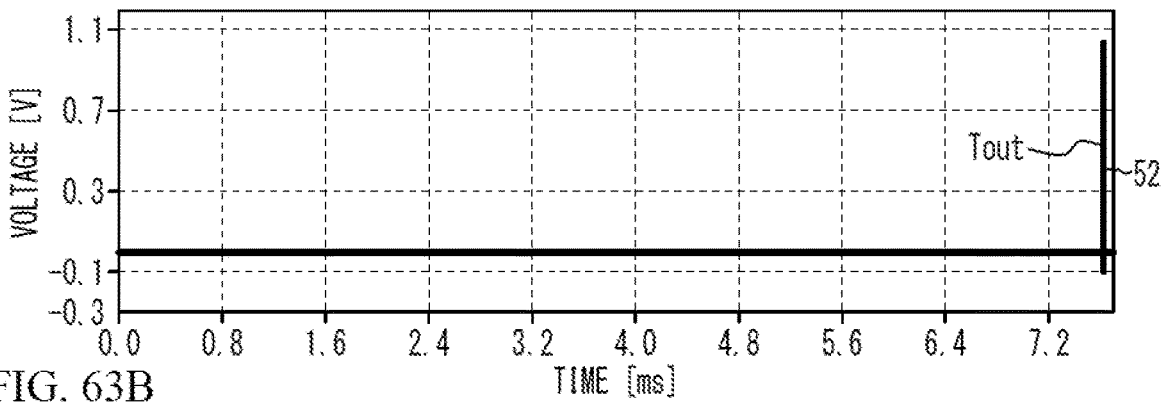
FIG. 63A to FIG. 63D present simulation results of the variation 1 of the eighth embodiment and illustrate voltages with respect to time.
Figure 63B:
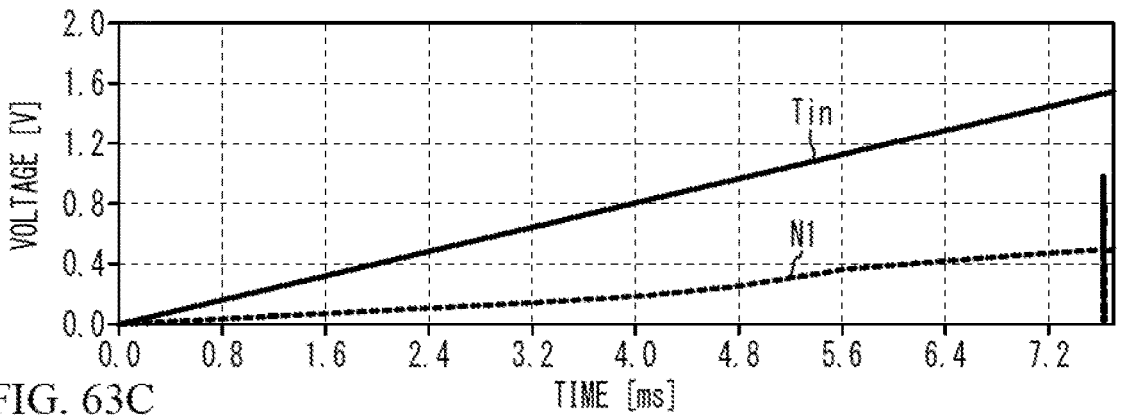
Figure 63C:
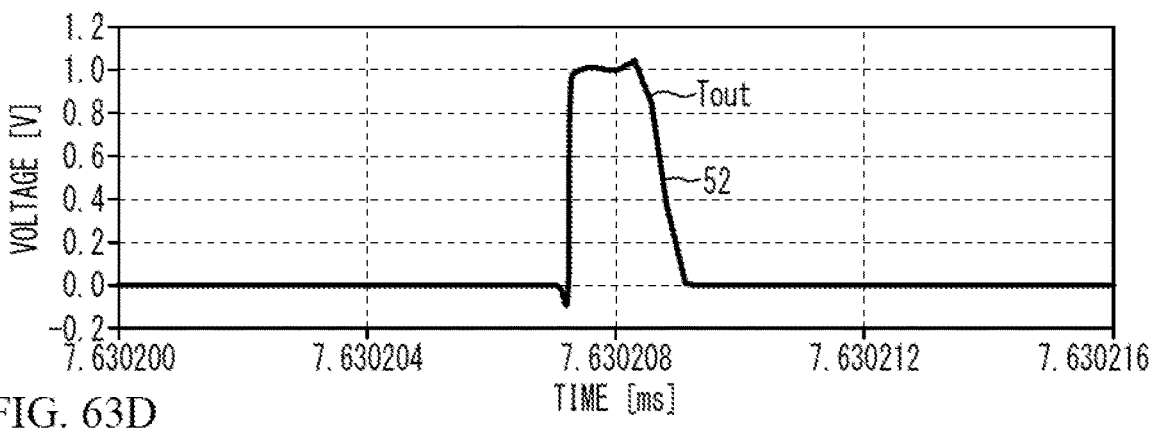
Figure 63D:
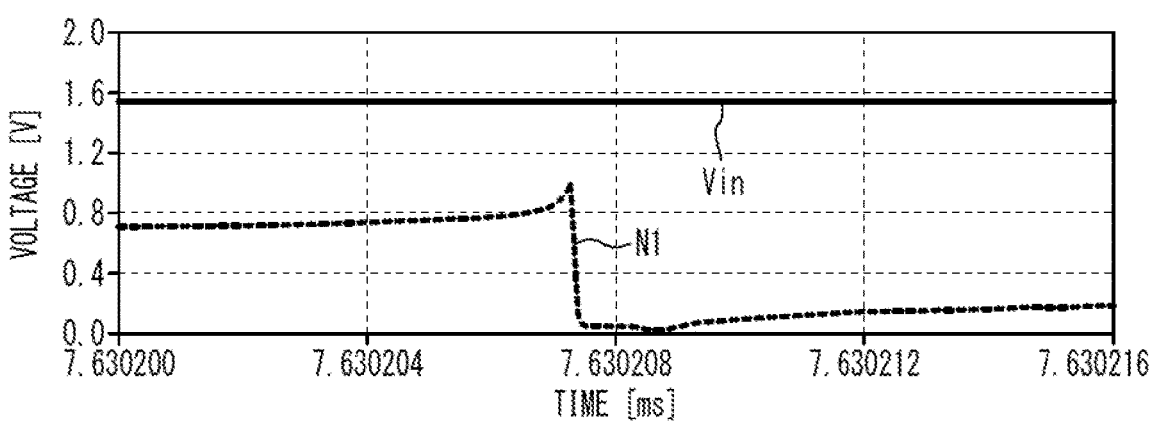

FIG. 63A to FIG. 63D present simulation results of the variation 1 of the eighth embodiment, and illustrate voltages with respect to time. FIG. 63A illustrates the voltage of the output terminal Tout with respect to time, and FIG. 63B illustrates the voltages of the input terminal Tin and the node N1 with respect to time. FIG. 63C and FIG. 63D are enlarged views around the time at which the spike signal is output in FIG. 63A and FIG. 63B, respectively.

As illustrated in FIG. 63A and FIG. 63B, the behaviors of the voltages of the input terminal Tin, the node N1, and the output terminal Tout with respect to time are almost the same as those of the variation 1A of the eighth embodiment.

As illustrated in FIG. 63C, in the variation 1 of the eighth embodiment, the rise of the spike signal 52 is steep, and the waveform of the spike signal 52 is almost the same as that of FIG. 9A. The height of the spike signal 52 reaches 1 V. As illustrated in FIG. 63D, the voltage of the node N1 decreases to 0.2 V or less after exceeding 0.8 V. This behavior is the same as the behavior of the voltage of the node N1 in FIG. 9B. As seen above, in the variation 1 of the eighth embodiment, by using the FET 37*f* as the resistor 37*c*, the parasitic capacitances of the diodes 37*e* and 37*g* are inhibited from affecting the output circuit 150, and the normal spike signal 52 is generated.

In the eighth embodiment, a first end of the capacitor C1 is coupled to the node N1 (an intermediate node), and a second end of the capacitor C1 is coupled to the ground line 26 (a first reference potential terminal). The voltage conversion circuit 30*a* includes the element 37*a* (a first element) and the element 37*b* (a second element) connected in series between the input terminal Tin and the ground line 26 (a second reference potential terminal), and the resistor 37*c* having a first end coupled to the node N11, which is between the elements 37*a* and 37*b*, and a second end coupled to the node No (an output node). The influence of the parasitic capacitances of the elements 37*a* and 37*b* on the output circuit 150 can be reduced by the resistor 37*c*. Therefore, the spike signal 52 having an appropriate waveform can be generated. The resistor 37*c* connected between the nodes N11 and No may be the FET 37*f* illustrated in FIG. 60B of the variation 1 of the eighth embodiment. As seen above, the resistor 37*c* may be any element that has almost no reactance component and carries a current increasing almost linearly with respect to the voltage difference between both ends of the element (this element is referred to as a resistance element).

The product of the resistance value of the resistor 37*c* and the capacitance value of the capacitor C1 is preferably greater than the width of the spike signal 52. The product of the resistance value of the resistor 37*c* and the capacitance value of the capacitor C1 is more preferably equal to or greater than 10 times, further preferably equal to or greater than 50 times the width of the spike signal 52.

In the eighth embodiment and the variation 1 thereof, the output circuit 150 is an example of the threshold value determination circuit that does not output the spike signal 52 when the voltage of the input signal is equal to or less than a predetermined voltage. By replacing the voltage conversion circuits 30*a* and 30*c* of the eighth embodiment and the variation 1 of the eighth embodiment with the voltage conversion circuit 30 illustrated in FIG. 35 of the variation 1 of the fifth embodiment, the threshold value determination circuit that does not output the spike signal 52 when the voltage of the input signal is equal to or greater than the predetermined voltage can be achieved.

In the fifth embodiment and the variation 1 thereof and the eighth embodiment and the variation 1 thereof, the spike generation circuit according to any one of the first to fourth embodiments and the variations thereof is used as the output circuit, but the output circuit 150 may be any output circuit that outputs the isolated output spike signal 52 to the output terminal Tout and resets the voltage of the node Ni in response to the node Ni (the intermediate node) becoming at a predetermined electric potential, and does not output the spike signal 52 when the voltage of the input signal is within a predetermined range.

[Variation 2 of the Eighth Embodiment]

Figure 64A:
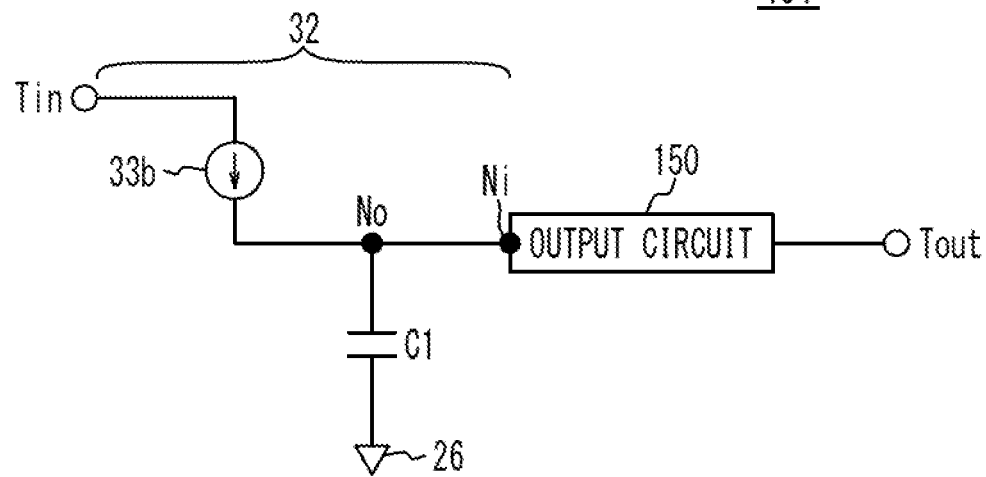
FIG. 64A to FIG. 64C are circuit diagrams of spike generation circuits in accordance with variations 2 to 4 of the eighth embodiment, respectively.

Variations 2 to 5 of the eighth embodiment are examples where the spike generation circuits according to the first to fourth embodiments and the variations thereof are applied to a delay circuit. FIG. 64A is a circuit diagram of a spike generation circuit in accordance with the variation 2 of the eighth embodiment. As illustrated in FIG. 64A, a spike generation circuit 154 includes a constant current element or constant current circuit 33*b* and the capacitor C1 as the time constant circuit 32. The time constant circuit 32 causes the spike generation circuit 154 to serve as a delay circuit as in the variation 3 of the fifth embodiment. The constant current element or constant current circuit 33*b* is an element or circuit that generates a constant current corresponding to the voltage difference between both ends of the constant current element or constant current circuit 33*b*.

The preferable circuit configuration of the constant current element or constant current circuit 33*b* depends on the time constant of the time constant circuit 32. Hereinafter, the preferable circuit of the constant current element or constant current circuit 33*b* will be described as the variations 3 to 6 of the eighth embodiment.

[Variation 3 of the Eighth Embodiment]

Figure 64B:
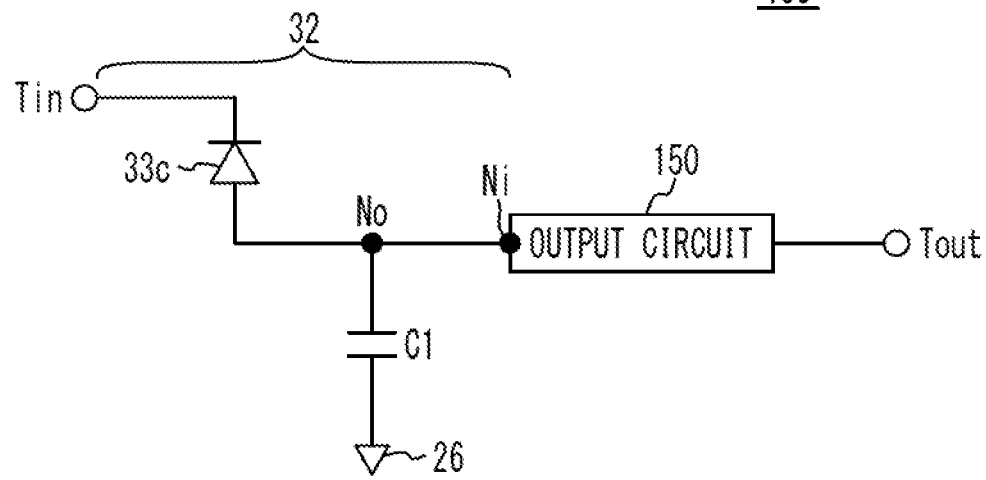

The variation 3 of the eighth embodiment is an example where the time constant of the time constant circuit 32 is set to be long, and is an example where the time constant is set to be, for example, 1 millisecond or greater. FIG. 64B is a circuit diagram of a spike generation circuit in accordance with the variation 3 of the eighth embodiment. As illustrated in FIG. 64B, a diode 33*c* connected in the backward direction is used as the constant current element or constant current circuit of the time constant circuit 32. Since the backward current of the diode 33*c* is small, the time constant can be set to be long. The backward current of the diode 33*c* does not vary as much as the forward current even when the voltage between both ends of the diode 33*c* varies. Therefore, even when the capacitor C1 is charged and the voltage of the node No increases, the current value of the diode 33*c* does not decrease and charging does not stop in the middle. Therefore, the time constant can be designed based on the current value of the diode 33*c* and the magnitude of the capacitance of the capacitor C1. Even when the threshold voltage of the inverter in the next stage of the node Ni varies due to the variation in the threshold voltage of the FET in the output circuit 150, the variation in the time constant of the time constant circuit 32 can be reduced. The diode 33*c* may be a transistor diode in which the gate of the FET is coupled to the source.

[Variation 4 of the Eighth Embodiment]

Figure 64C:
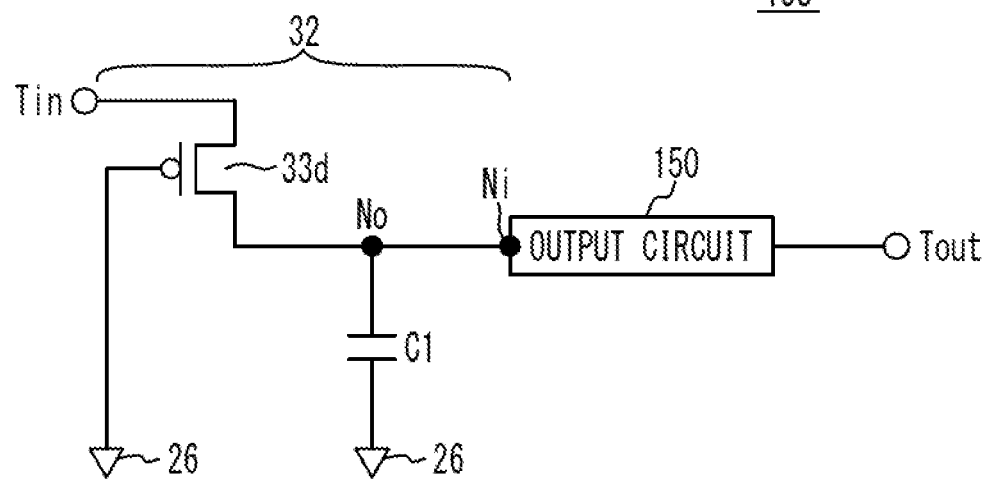

The variation 4 of the eighth embodiment is an example where the time constant of the time constant circuit 32 is set to be short, and is an example where the time constant is set to be, for example, 1 microsecond or less. FIG. 64C is a circuit diagram of a spike generation circuit in accordance with the variation 4 of the eighth embodiment. As illustrated in FIG. 64C, in a spike generation circuit 158, a PFET 33*d* is used as the constant current element or constant current circuit of the time constant circuit 32. The gate of the PFET 33*d* is coupled to the ground line 26, and the PFET 33*d* is in an on-state. The use of the on-current of the FET as the constant current of the constant current element shortens the time constant of the time constant circuit 32. The on-current of the FET does not vary largely even when the voltage between both ends of the FET varies. Thus, even when the capacitor C1 is charged, and the voltage of the node No thereby increases, the current value of the PFET 33*d* does not decrease, and therefore, charging does not stop in the middle. Thus, the time constant can be designed based on the current value of the PFET 33*d* and the magnitude of the capacitance of the capacitor C1. The PFET 33*d* may be an NFET.

When the current flowing through the PFET 33*d* is greater than the current that resets the node Ni (for example, the current flowing through the NFFET of the inverter in the next stage of the node Ni), it is impossible to reset the node Ni. Thus, the current flowing through the PFET 33*d* is preferably sufficiently smaller than the current when resetting the node Ni of the output circuit 150.

[Variation 5 of the Eighth Embodiment]

Figure 65:
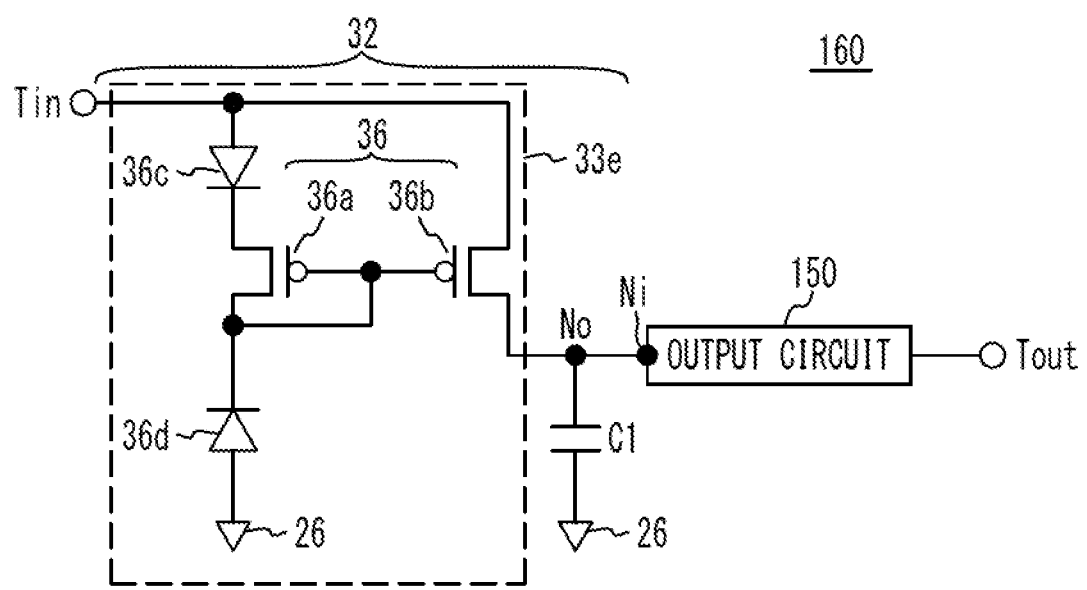
FIG. 65 is a circuit diagram of a spike generation circuit in accordance with a variation 5 of the eighth embodiment.

The variation 5 of the eighth embodiment is an example where the time constant of the time constant circuit 32 is set to be medium, and is an example where the time constant is set to be, for example, 10 nanoseconds to 10 milliseconds. FIG. 65 is a circuit diagram of a spike generation circuit in accordance with the variation 5 of the eighth embodiment. As illustrated in FIG. 65, a constant current circuit 33e of the time constant circuit 32 includes a current mirror circuit 36 and diodes 36c and 36d. The current mirror circuit 36 includes PFETs 36a and 36b. The gate of the FET 36a and the gate of the FET 36b are coupled to each other. The gate and the drain of the FET 36a are coupled to each other. The source of the FET 36b is coupled to the input terminal Tin, and the drain of the FET 36b is coupled to the node No. The diode 36c is connected in the forward direction between the input terminal Tin and the source of the FET 36a. That is, the anode is coupled to the input terminal Tin, and the cathode is coupled to the source of the FET 36a. The diode 36d is connected in the backward direction between the drain of the FET 36a and the ground line 26. That is, the anode is coupled to the ground line 26, and the cathode is coupled to the drain of the FET 36a.

In the time constant circuit 32, the diode 36c is connected in the forward direction between the input terminal Tin and the PFET 36a. Therefore, the voltage of the source of the PFET 36a becomes lower than the voltage of the source of the PFET 36b by the voltage drop Va of the diode 36c. As a result, the current larger than the backward current of the diode 36d by the current corresponding to Va flows to the PFET 36b. For example, the current that is one to six orders of magnitude greater than the current of the diode 36d flows through the PFET 36b.

Accordingly, the constant current circuit 33e can carry the current that is one to six orders of magnitude greater than that of the diode 33c illustrated in FIG. 64B of the variation 3 of the eighth embodiment. Thus, the time constant circuit 32 can have a time constant that is one to six orders of magnitude less than that of the variation 3 of the eighth embodiment.

The diode connected in the forward direction is considered as the constant current element or constant current circuit 33b that supplies the current value that is between the current value of the backward current of the diode 33c of the variation 3 of the eighth embodiment and the current value of the on-current of the FET of the variation 4 of the eighth embodiment. However, when the diode connected in the forward direction is used for the constant current element or constant current circuit 33b of the variation 2 of the eighth embodiment, the forward current of the diode increases in an exponential manner with respect to the voltages of the two ends. Therefore, when the capacitor C1 is charged, and the voltage of the node No thereby increases, the current value of the constant current element or constant current circuit 33b decreases in an exponential manner, and the voltage of the node No becomes closer to saturate. When the saturated voltage of the node No becomes close to the threshold voltage of the output circuit 150, the time constant increases in a divergent manner, and is more likely to be affected by the variation in the threshold voltage of the transistor. This causes the time constant of the time constant circuit 32 to vary by, for example, three digits.

In the variation 5 of the eighth embodiment, the current flowing through the constant current circuit 33e is determined by the backward current of the diode 36d and the forward voltage drop Va of the diode 36c. The delay circuit with low variation in the time constant can be achieved by reducing the variations in the threshold voltages of the diodes 36c and 36d.

Figure 66A:
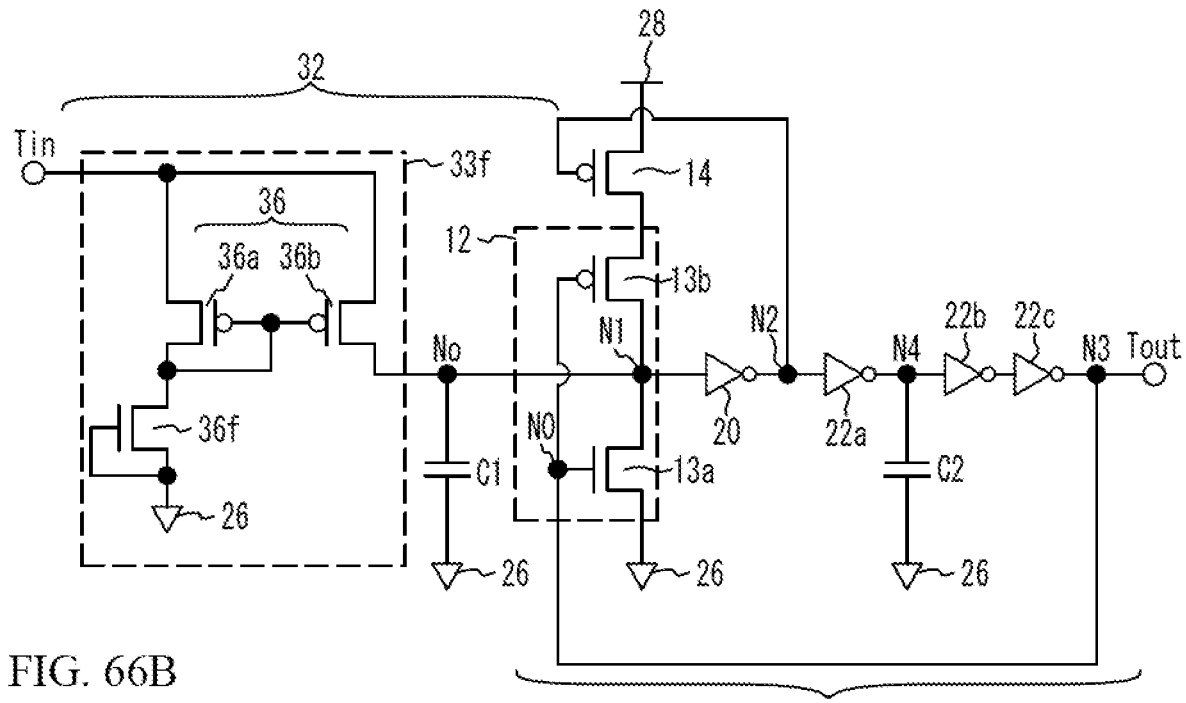
FIG. 66A and FIG. 66B are circuit diagrams of spike generation circuits in accordance with variations 5A and 5 of the eighth embodiment used for a simulation, respectively.
Figure 66B:
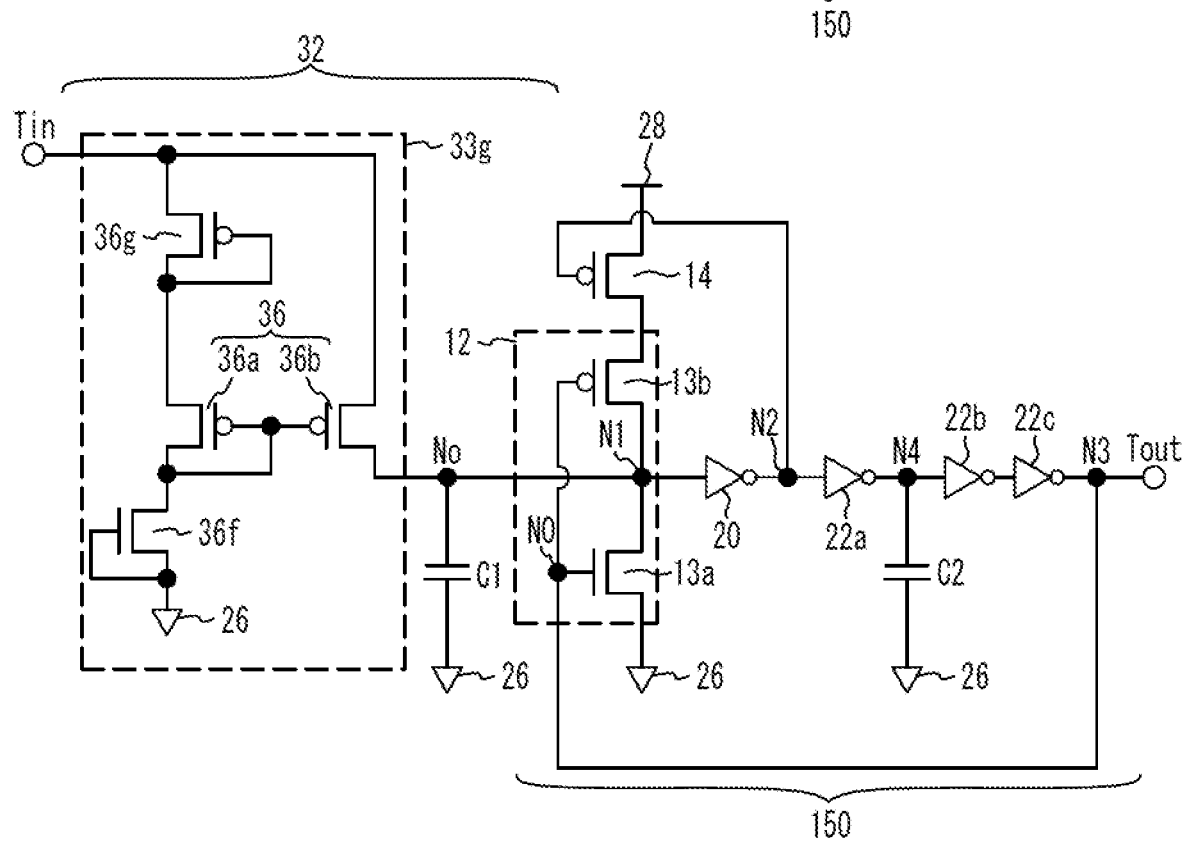

The spike signal in the spike generation circuit of the variation 5 of the eighth embodiment was simulated. FIG. 66A and FIG. 66B are circuit diagrams of spike generation circuits in accordance with variations 5A and 5 of the eighth embodiment used in the simulation, respectively.

As illustrated in FIG. 66A, a constant current circuit 33f of the time constant circuit 32 of the variation 5A of the eighth embodiment does not have the diode 36c. An NFET 36f of which the source is coupled to the gate is used as the diode 36d. The circuit of the output circuit 150 is the same as the circuit illustrated in FIG. 61B of the variation 1 of the eighth embodiment. Other circuit configurations are the same as those of FIG. 65.

As illustrated in FIG. 66B, in the variation 5 of the eighth embodiment, a constant current circuit 33g of the time constant circuit 32 uses a PFET 36g of which the drain is coupled to the gate, as the diode 36c. The circuit configuration of the output circuit 150 is the same as that of FIG. 61B. Other circuit configurations are the same as those of FIG. 65. In the simulation, the capacitance values of the capacitors C1 and C2 were configured to be 2 fF and 4 fF, respectively. The conditions of the FETs and the voltages of the power line 28 and the ground line 26 are the same as those of the simulation of the variation 3 of the fifth embodiment.

Figure 67A:
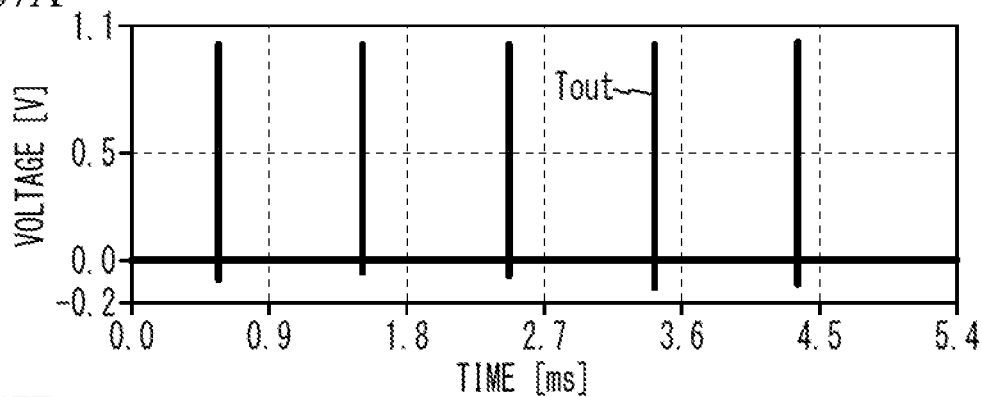
FIG. 67A and FIG. 67B present simulation results of the variation 5A of the eighth embodiment and illustrate voltage with respect to time.
Figure 67B:
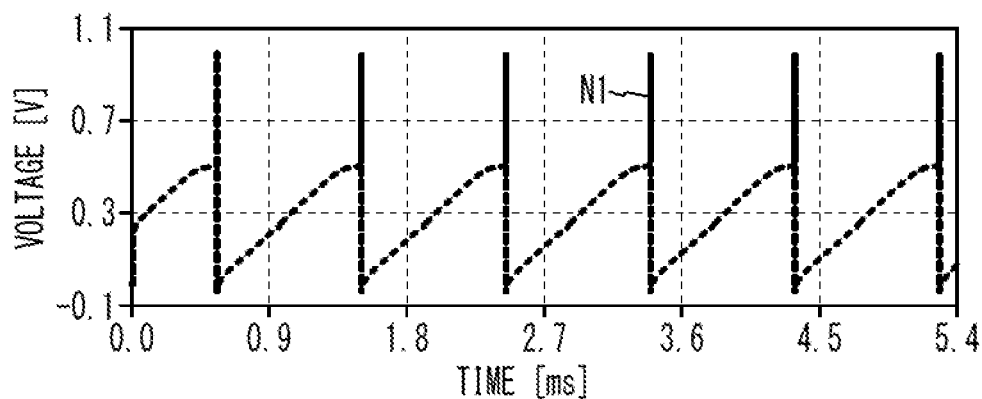

FIG. 67A and FIG. 67B present simulation results of the variation 5A of the eighth embodiment, and illustrate voltage with respect to time. FIG. 67A illustrates the voltage of the output terminal Tout with respect to time, and FIG. 67B illustrates the voltage of the node N1 with respect to time.

As illustrated in FIG. 67A and FIG. 67B, in the variation 5A of the eighth embodiment, the delay time is approximately 1 millisecond. This is because the current mirror circuit 36 supplies a current having a magnitude approximately equal to that of the backward current of the diode (the NFET 36f) as the current to be supplied by the constant current circuit 33f. Because the backward current of the diode (the NFET 36f) is small, the current supplied by the constant current circuit 33f is small, resulting in the long time constant of the time constant circuit 32. When the transistor channel width of the FET 36b is adjusted to be wider than that of the FET 36a, the current value is increased, and the time constant can be reduced. However, the parasitic capacitance of the node No increases simultaneously. Therefore, it is not preferable to make the transistor channel width of the FET 36b wider than that of the FET 36a.

Figure 67C:
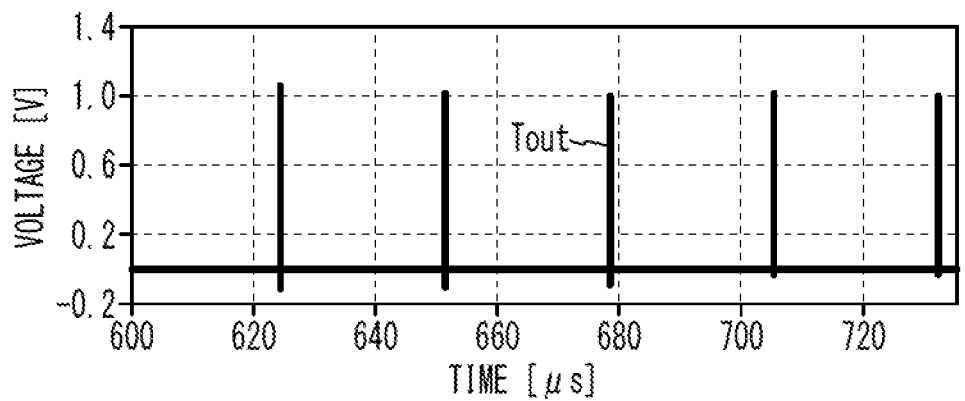
FIG. 67C and FIG. 67D present simulation results of the variation 5 of the eighth embodiment and illustrate voltages with respect to time.
Figure 67D:
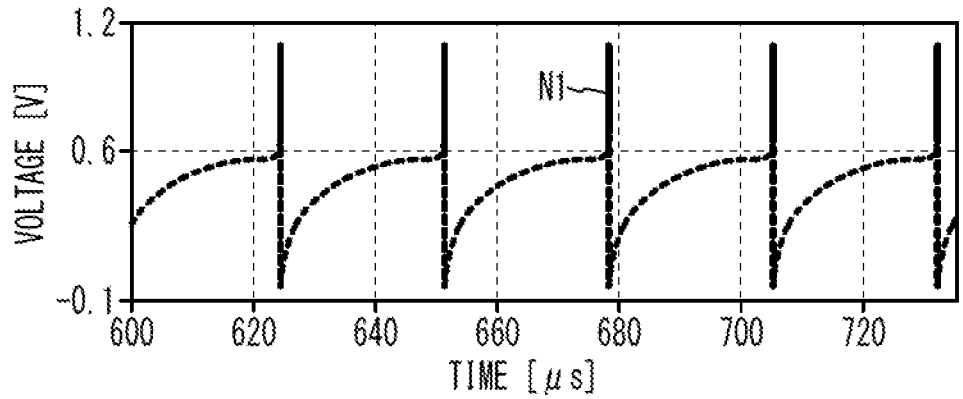

FIG. 67C and FIG. 67D present simulation results of the variation 5 of the eighth embodiment, and illustrate voltage with respect to time. FIG. 67C illustrates the voltage of the node N1 with respect to time, and FIG. 67D illustrates the voltage of the output terminal Tout with respect to time.

As illustrated in FIG. 67C and FIG. 67D, in the variation 5 of the eighth embodiment, the delay time is approximately 20 microseconds. This is because the PFET 36g causes the voltage of the source of the PFET 36a to be lower than the voltage of the source of the PFET 36b by the voltage drop Va, and thereby, the current supplied by the constant current circuit 33g becomes greater than the backward current of the diode (the NFET 36f). This allows the delay time to be medium.

In the variation 2 of the eighth embodiment, the time constant circuit 32 includes the capacitor C1 having a first end coupled to the node No (an output node) and a second end coupled to the ground line 26 (a first reference potential terminal), and the constant current element or constant current circuit 33*b* having a first end coupled to the input terminal Tin and a second end coupled to the node No. This configuration enables to set the time constant of the time constant circuit 32 and the delay time of the delay circuit by designing the current to be supplied by the constant current element or constant current circuit 33*b* as in the variations 3 to 5 of the eighth embodiment.

As in the variation 5 of the eighth embodiment, the constant current circuit 33*e* is the current mirror circuit 36 including the PFETs 36*a* and 36*b*. In the PFET 36*b* (a first transistor), the source (one of a current input terminal and a current output terminal) is coupled to the input terminal Tin, and the drain (the other of the current input terminal and the current output terminal) is coupled to the node No. In the PFET 36*a* (a second transistor), the source is coupled to the input terminal Tin through the diode 36*c* (a first diode) connected in the forward direction, and the drain is coupled to the ground line 26 (a second reference potential terminal) through the diode 36*d* (a second diode) connected in the backward direction. The gates (control terminals) of the PFETs 36*a* and 36*b* are coupled to each other. This configuration achieves a delay circuit having a moderate delay time and a small variation.

As in the variation 3 of the eighth embodiment, the constant current element or constant current circuit may be the diode 33*c* connected in the backward direction, or may be a transistor having a control terminal (a gate) to which a voltage is applied so that the transistor is in an on-state.

In the variation 3 of the fifth embodiment and the variations 2 to 5 of the eighth embodiment, the spike generation circuit according to any one of the first to fourth embodiments and the variations thereof is used as the output circuit, but the output circuit 150 may be any output circuit that outputs the isolated output spike signal 52 to the output terminal Tout and resets the voltage of the node Ni in response to the voltage of the node Ni becoming the threshold voltage, and outputs the spike signal 52 after the delay time relating to the time constant of the time constant circuit 32 after the input signal is input.

[Variation 6 of the Eighth Embodiment]

Figure 68A:
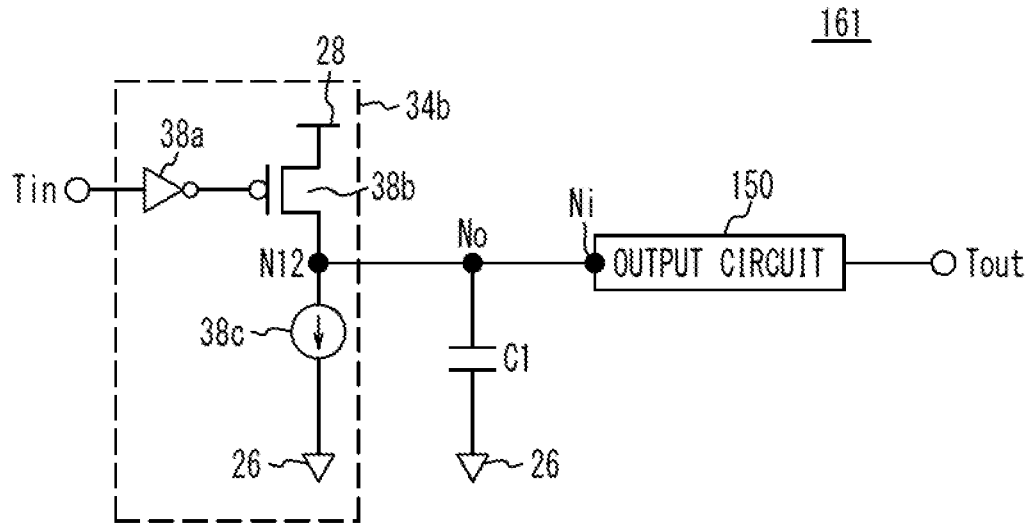
FIG. 68A to FIG. 68C are circuit diagrams of spike generation circuits in accordance with variations 6 to 8 of the eighth embodiment, respectively.

Variations 6 to 8 of the eighth embodiment are examples where the spike generation circuit according to any one of the first to fourth embodiments and the variations thereof is applied to a frequency determination circuit (a frequency detection circuit). FIG. 68A is a circuit diagram of a spike generation circuit in accordance with the variation 6 of the eighth embodiment. As illustrated in FIG. 68A, in a spike generation circuit 161, a PFET 38*b* and a constant current element 38*c* are connected in series between the power line 28 and the ground line 26, as an input circuit 34*b*. The node N12, which is between the PFET 38*b* and the constant current element 38*c*, is coupled to the node No. The input terminal Tin is coupled to the gate of the PFET 38*b* through an inverter 38*a*. A transistor, a diode, a resistor, or the like may be used as the constant current element 38*c*.

The input circuit 34*b* increases the voltage of the node Ni by the amount corresponding to the height of the input spike signal when the input spike signal is input to the input terminal Tin. When no input spike signal is input to the input terminal Tin, the voltage of the node Ni gradually decreases with the time constant longer than the width of the input spike signal. For example, because of leakage of the electric charge of the node Ni to the ground line 26 through the NFET of the inverter in the next stage of the node Ni, the voltage of the node Ni gradually decreases. Therefore, as in the variation 5 of the fifth embodiment, the spike generation circuit 161 serves as a frequency determination circuit that outputs the spike signal when the frequency of the input spike signal becomes high.

[Variation 7 of the Eighth Embodiment]

Figure 68B:
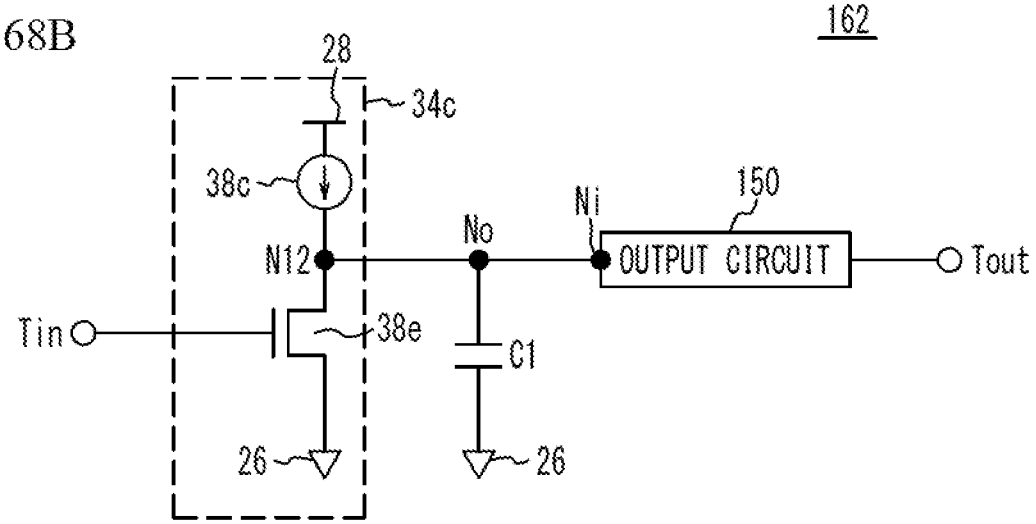

FIG. 68B is a circuit diagram of a spike generation circuit in accordance with the variation 7 of the eighth embodiment. As illustrated in FIG. 68B, in a spike generation circuit 162, an NFET 38*e* and the constant current element 38*c* are connected in series between the power line 28 and the ground line 26, as an input circuit 34*c*. The node N12, which is between the constant current element 38*c* and the NFET 38*e*, is coupled to the node No. The input terminal Tin is coupled to the gate of the NFET 38*e*. A transistor, a diode, a resistor, or the like can be used as the constant current element 38*c*.

The input circuit 34*c* decreases the voltage of the node Ni by the amount corresponding to the height of the input spike signal when the input terminal Tin is input to the input spike signal. When no input spike signal is input to the input terminal Tin, the voltage of the node Ni gradually increases with a time constant longer than the width of the input spike signal. Therefore, the spike generation circuit 162 serves as a frequency determination circuit that outputs a spike signal when the frequency of the input spike signal becomes low, as in the variation 4 of the fifth embodiment.

[Variation 8 of the Eighth Embodiment]

Figure 68C:
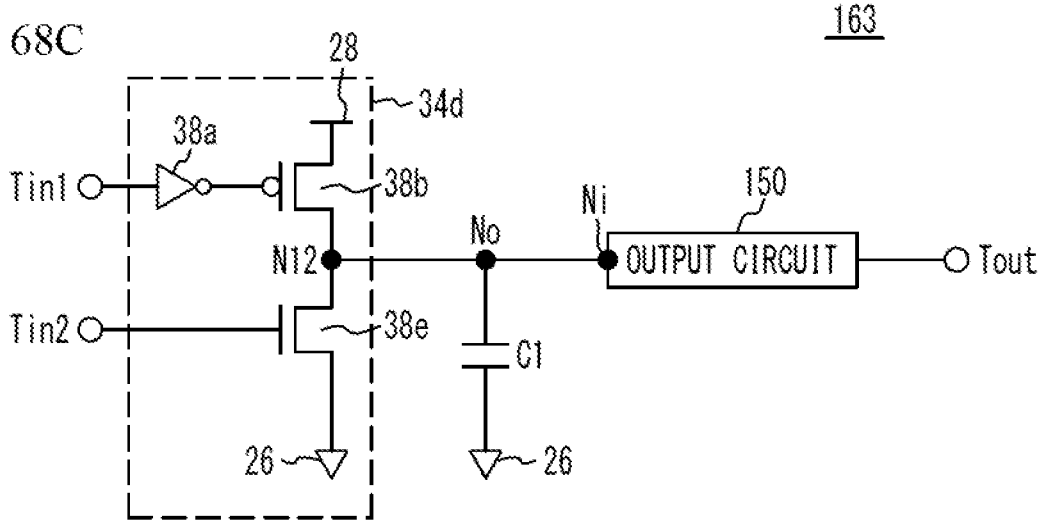

FIG. 68C is a circuit diagram of a spike generation circuit in accordance with the variation 8 of the eighth embodiment. As illustrated in FIG. 68C, in a spike generation circuit 163, the PFET 38*b* and the NFET 38*e* are connected in series between the power line 28 and the ground line 26, as an input circuit 34*d*. The node N12, which is between the PFET 38*b* and the NFET 38*e*, is coupled to the node No. An input terminal Tin1 is coupled to the gate of the PFET 38*b* through the inverter 38*a*, and an input terminal Tin2 is coupled to the gate of the NFET 38*e*.

The input circuit 34*d* increases the voltage of the node Ni by the amount corresponding to the height of the input spike signal when the input spike signal is input to the input terminal Tin1, and decreases the voltage of the node Ni by the amount corresponding to the input spike signal when the input spike signal is input to the input terminal Tin2.

As a result, in the spike generation circuit 163, the voltage of the node Ni increases and the output circuit 150 is more likely to generate the spike signal when the frequency of the spike signal input to the input terminal Tin1 is high, and the voltage of the node Ni increases and the output circuit 150 is more likely to generate the spike signal when the frequency of the spike signal input to the input terminal Tin2 is low. As seen above, the output circuit 150 serves as a frequency determination circuit that outputs a spike signal according to the balance between the spike signal input to the input terminal Tin1 and a spike signal input to the input terminal Tin2.

In the variations 6 to 8 of the eighth embodiment, one of the input circuits 34*b* to 34*d* is provided, and the output circuit 150 outputs the isolated output spike signal to the output terminal Tout and resets the voltage of the node Ni in response to the voltage of the node Ni becoming the threshold voltage, and outputs the output spike signal when the frequency with which the input spike signal is input becomes within a predetermined range. This configuration achieves the frequency determination circuit.

When the output circuit 150 is the spike generation circuit of any one of the variations 2 and 3 of the first embodiment where the input spike signal is a positive-going signal, the voltage of the node Ni gradually decreases with a time constant longer than the width of the input spike signal during the time period when no input spike signal is input to the input terminal Tin.

When the output circuit 150 is the spike generation circuit of any one of the variations 4 and 5 of the first embodiment where the input spike signal is a negative-going signal, the voltage of the node Ni gradually increases with a time constant longer than the width of the input spike signal during the time period when no input spike signal is input to the input terminal Tin. In this case, no inverter 38*a* is connected between the input terminal Tin or Tin1 and the gate of the PFET 38*b*, and an inverter is connected between the input terminal Tin or Tin2 and the gate of the NFET 38*e*.

In the variations 6 to 8 of the eighth embodiment, the spike generation circuit according to any one of the first to fourth embodiments and the variations thereof is used as the output circuit, but the output circuit 150 may be any output circuit that outputs the isolated output spike signal 52 to the output terminal Tout and resets the voltage of the node Ni in response to the voltage of the node Ni becoming the threshold voltage, and outputs the output spike signal when the frequency with which the input spike signal is input becomes within a predetermined range.

[Variation 9 of the Eighth Embodiment]

Figure 69A:
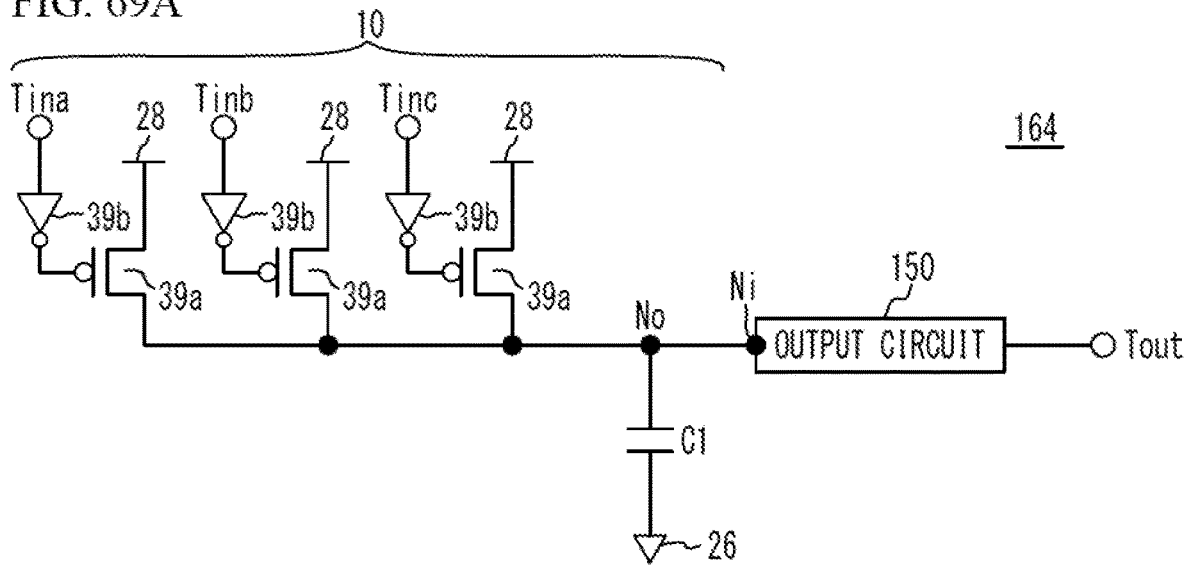
FIG. 69A to FIG. 69C are circuit diagrams of spike generation circuits in accordance with variations 9 to 11 of the eighth embodiment, respectively.

Variations 9 to 11 of the eighth embodiment are examples where the spike generation circuit according to any one of the first to fourth embodiments and the variations thereof is applied to a timing circuit. FIG. 69A is a circuit diagram of a spike generation circuit in accordance with the variation 9 of the eighth embodiment. As illustrated in FIG. 69A, in a spike generation circuit 164, a plurality of PFETs 39*a* are connected in parallel, as the input circuit 10, between the power line 28 and the node No. Input terminals Tina to Tinc are coupled to the gates of the respective PFETs 39*a* through respective inverters 39*b*. The capacitor C1 is connected between the node No and the ground line 26. The node No is coupled to the node Ni of the output circuit 150.

Figure 70A:
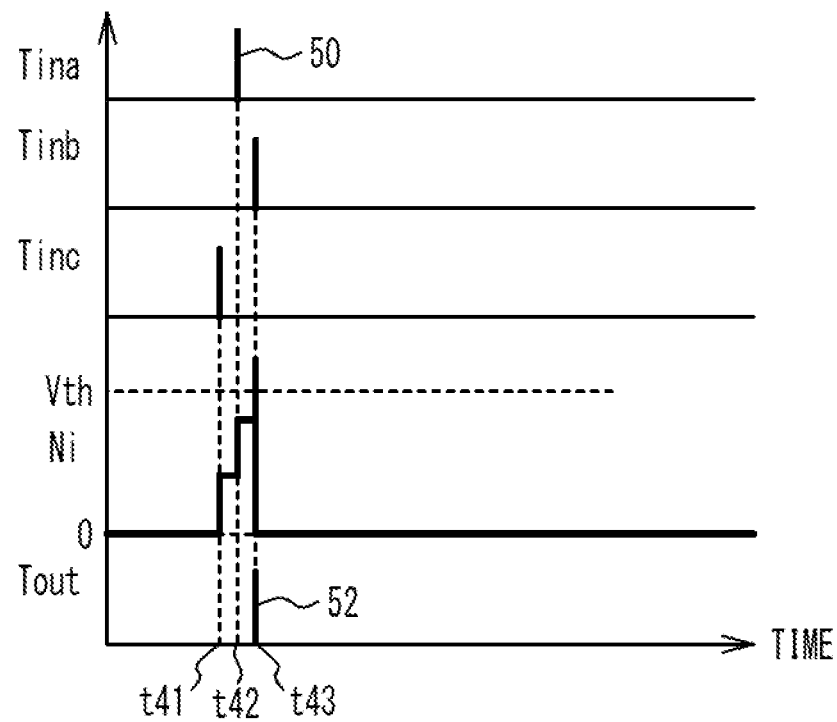
FIG. 70A and FIG. 70B illustrate voltages with respect to time in the variation 9 of the eighth embodiment.
Figure 70B:
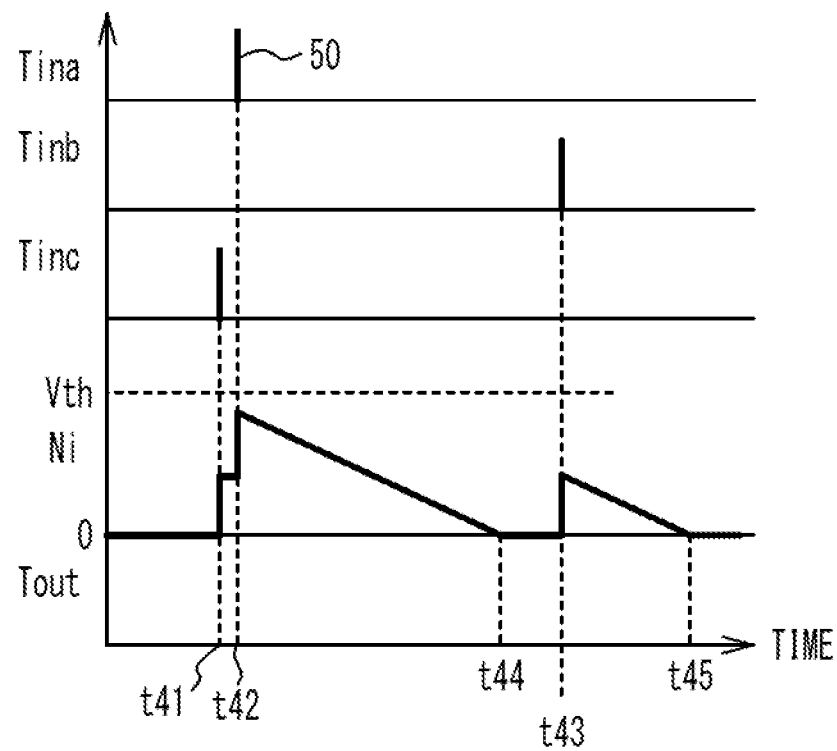

FIG. 70A and FIG. 70B illustrate voltages with respect to time in the variation 9 of the eighth embodiment. As illustrated in FIG. 70A, the spike signal 50 is input to the input terminal Tinc at time t41, is input to the input terminal Tina at time t42, and is input to the terminal Tinb at time t43. When the interval between time t41 and time t43 is less than the time period during which the voltage of the node Ni decreases, the voltage of the node Ni exceeds the threshold voltage Vth at time t43. This causes the output circuit 150 to output the spike signal 52 to the output terminal Tout.

As illustrated in FIG. 70B, time t43 when the spike signal 50 is input to the input terminal Tinb is away from time t42. The spike signal 50 is input at the times adjacent to time t41 and time t42. The voltage of the node Ni does not exceed the threshold voltage Vth. The voltage of the node Ni gradually decreases during the time period between time t42 and time t43, and the voltage of the node Ni becomes approximately 0 V at time t44. Thereafter, even when the spike signal 50 is input at time t43, the voltage of the node Ni does not exceed the threshold voltage Vth. Thereafter, the voltage of the node Ni gradually decreases, and becomes 0 V at time t45. As a result, the output circuit 150 does not output the spike signal 52 to the output terminal Tout.

The spike generation circuit according to any one of the variations 2 and 3 of the first embodiment is used as the output circuit 150, and the input circuit 10 increases the voltage of the node Ni by the amount corresponding to the spike signal 50 when the input spike signal 50 is input to at least one of the input terminals Tina to Tinc. During the time period when no input spike signal is input to the input terminals Tina to Tinc, the voltage of the node Ni gradually decreases over a time period longer than the width of the input spike signal. The output circuit 150 outputs the isolated output spike signal 52 to the output terminal in response to the voltage of the node Ni becoming the threshold voltage Vth. This allows the spike generation circuit 164 to serve as a timing circuit that outputs the spike signal 52 when the positive-going spike signals 50 input to the input terminals Tina to Tinc are input within a certain time period.

[Variation 10 of the Eighth Embodiment]

Figure 69B:
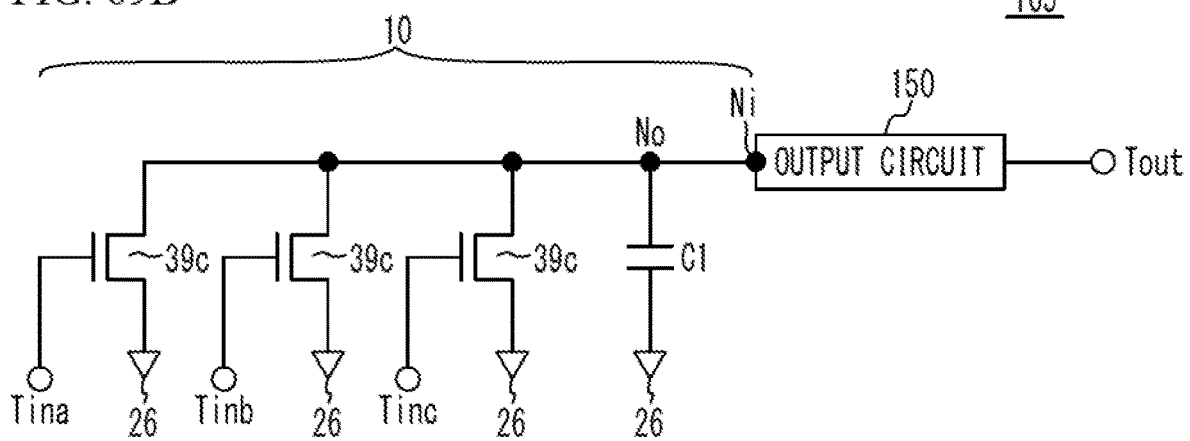

FIG. 69B is a circuit diagram of a spike generation circuit in accordance with the variation 10 of the eighth embodiment. As illustrated in FIG. 69B, in a spike generation circuit 165, a plurality of NFETs 39*c* are connected in parallel, as the input circuit 10, between the ground line 26 and the node No. The input terminals Tina to Tinc are coupled to the gates of the respective NFETs 39*c*. Other configurations are the same as those of the variation 9 of the eighth embodiment, and the description thereof is thus omitted.

The spike generation circuit according to any one of the variations 4 and 5 of the first embodiment is used as the output circuit 150, and the input circuit 10 decreases the voltage of the node Ni when the negative-going input spike signal 50 is input to at least one of the input terminals Tina to Tinc. During the time period when no input spike signal is input to the input terminals Tina to Tinc, the voltage of the node Ni gradually increases over a time period longer than the width of the input spike signal. The output circuit 150 outputs the isolated output spike signal 52 to the output terminal and resets the voltage of the node Ni in response to the voltage of the node Ni becoming the threshold voltage Vth. This allows the spike generation circuit 165 to serve as a timing circuit that outputs the spike signal 52 when the negative-going spike signals 50 input to the input terminals Tina to Tinc are input within a certain time period.

[Variation 11 of the Eighth Embodiment]

Figure 69C:
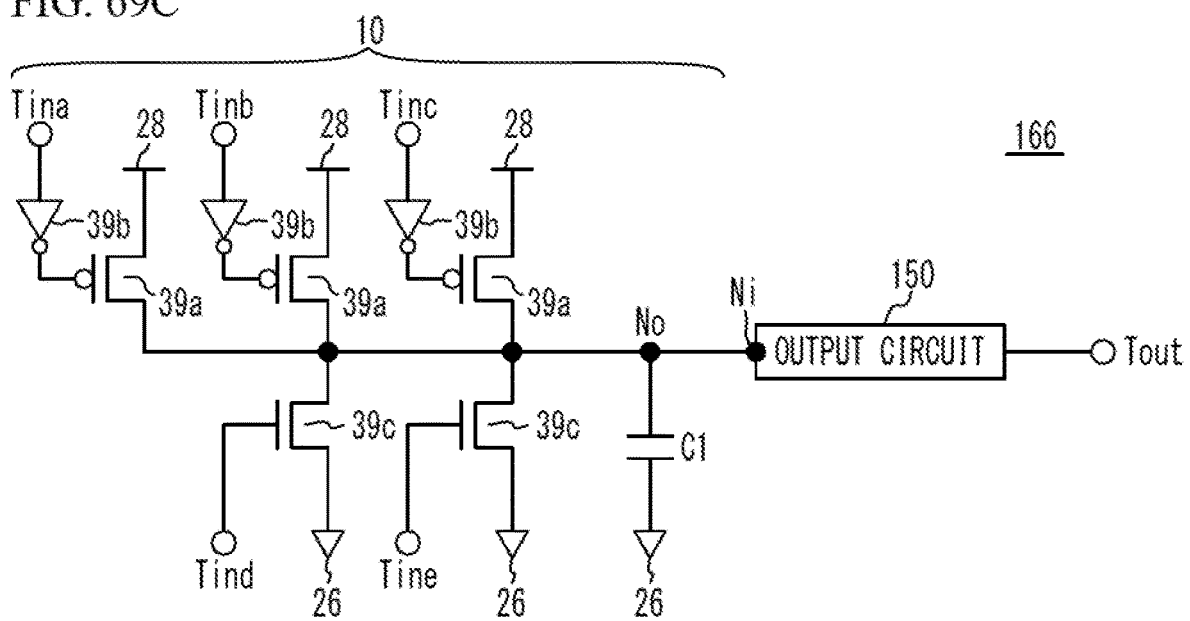

FIG. 69C is a circuit diagram of a spike generation circuit in accordance with the variation 11 of the eighth embodiment. As illustrated in FIG. 69C, in a spike generation circuit 166, a plurality of the PFETs 39*a* are connected in parallel, as the input circuit 10, between the power line 28 and the node No. The input terminals Tina to Tinc are coupled to the gates of the respective PFETs 39*a* through the respective inverters 39*b*. A plurality of the NFETs 39*c* are connected in parallel between the ground line 26 and the node No. Input terminals Tind to Tine are coupled to the gates of the respective NFETs 39*c*. Other configurations are the same as those of the variation 9 of the eighth embodiment, and the description thereof is thus omitted.

The spike generation circuit of any one of the variations 2 and 3 of the first embodiment is used as the output circuit 150, and the input circuit 10 increases the voltage of the node Ni when the input spike signal 50 is input to at least one of the input terminals Tina to Tinc, and decreases the voltage of the node Ni when the input spike signal 50 is input to at least one of the input terminals Tind to Tine. During the time period when no input spike signal is input to the input terminals Tina to Tine, the voltage of the node Ni gradually decreases over a time period longer than the width of the input spike signal. The output circuit 150 outputs the isolated output spike signal 52 to the output terminal Tout in response to the voltage of the node Ni becoming the threshold voltage Vth. This allows the spike generation circuit 166 to serve as a timing circuit that outputs the spike signal 52 when the positive-going spike signals 50 input to the input terminals Tina to Tinc are input within a certain time period, and the number of the positive-going spike signals 50 input to the input terminals Tind to Tine within the same time period is equal to or less than a certain number.

When the spike generation circuit of any one of the variations 4 and 5 of the first embodiment is used as the output circuit 150, no inverter 39b is connected between the input terminals Tina to Tinc and the gates of the respective PFET 39a, and inverters are connected between the input terminal Tind and the gate of the corresponding NFET 39c and between the input terminal Tine and the gate of the corresponding NFET 39c. During the time period when no input spike signal is input to the input terminals Tina to Tine, the voltage of the node Ni gradually increases over a time period longer than the width of the input spike signal. This allows the spike generation circuit to serve as a timing circuit that outputs the spike signal 52 when the negative-going spike signals 50 input to the input terminals Tind and Tine are input within a certain time period, and the number of the negative-going spike signals 50 input to the input terminals Tina to Tinc within the same time period is equal to or less than a certain number.

Although the order of the description is back and forth, the variation 6 of the fifth embodiment will be described. In the variation 6 of the fifth embodiment, the output circuit of the input circuit 10 may be a circuit other than those of the first to fourth embodiments and the variations thereof. The output circuit may be any circuit that outputs the isolated output spike signal to the output terminal Tout and resets the voltage of the node Ni in response to the voltage of the node Ni becoming the threshold voltage, and outputs the output spike signal when the amount of change in the input signal with respect to time becomes within a predetermined range.

Ninth Embodiment

Figure 71:
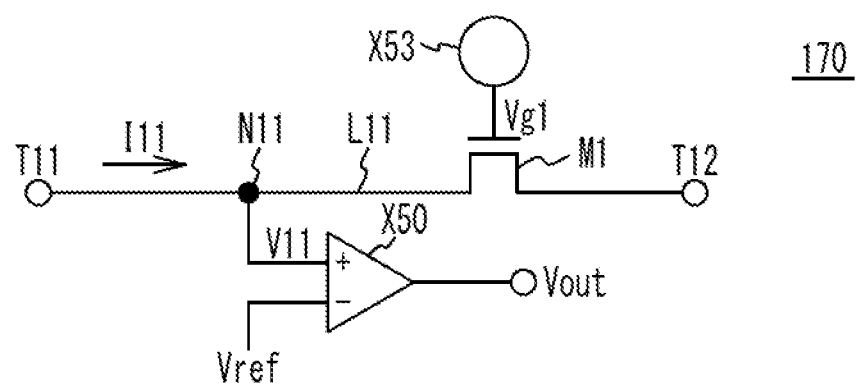
FIG. 71 is a block diagram of a detector in accordance with a ninth embodiment.

A ninth embodiment is an exemplary detector that detects the direction in which a current flows. FIG. 71 is a block diagram of a detector in accordance with the ninth embodiment. As illustrated in FIG. 71, in a detector 170, a path L11 having ends T11 and T12 between which a current I11 flows is provided. The current I11 flowing in the direction from the end T11 to the end T12 is defined as a positive current. The N-channel FET M1 is provided in the path L11.

A multivibrator circuit X53 outputs a signal Vg1 to the gate of the FET M1. A comparator X50 compares the voltage V11 of the node N11, which is closer to the end T11 of the path L11, with a reference voltage Vref, and outputs the output voltage Vout. The comparator X50 sets the output voltage Vout at the high level when V11 is equal to or greater than Vref, and sets the output voltage Vout at the low level when V11 is less than Vref. As seen above, the comparator X50 detects the direction in which the current I11 flows based on the result of the comparison between the voltage V11 and the voltage Vref.

Figure 72A:
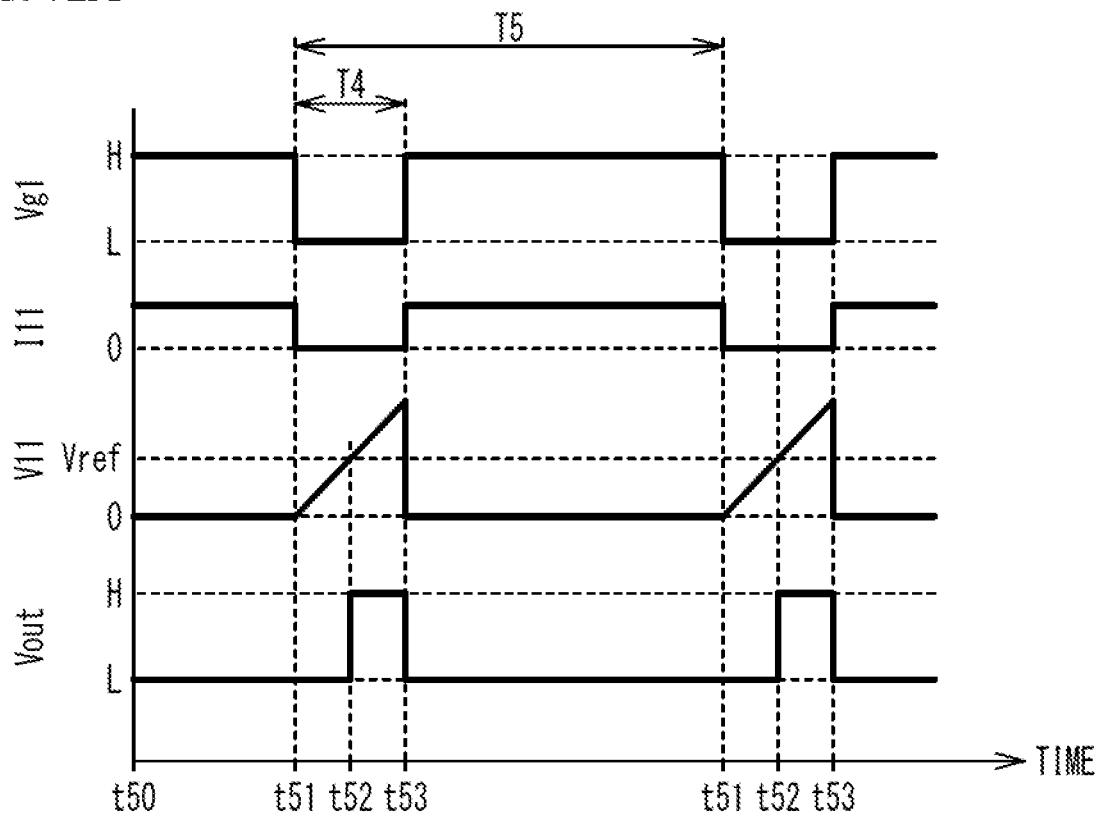
FIG. 72A and FIG. 72B illustrate voltages in the detector in accordance with the ninth embodiment with respect to time.
Figure 72B:
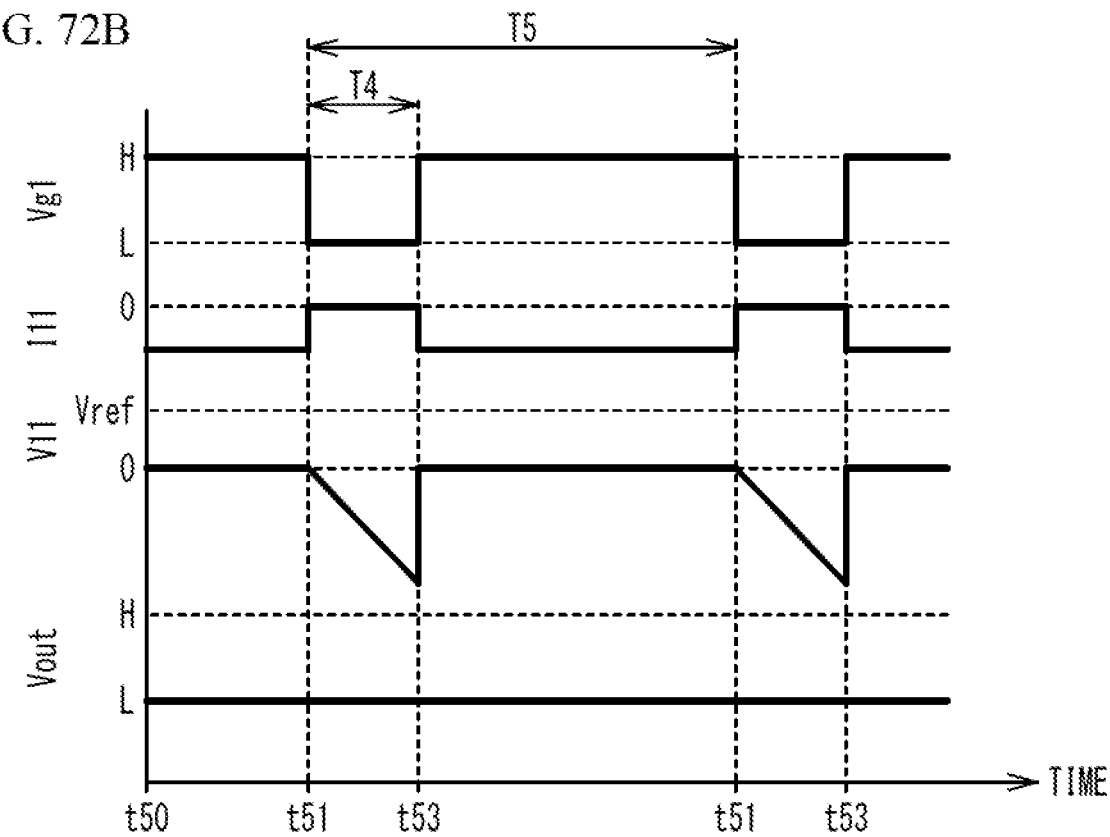

FIG. 72A and FIG. 72B illustrate voltages in the detector in accordance with the ninth embodiment with respect to time. FIG. 72A illustrates a case where the current I11 is a positive current (a current flowing from the end T11 to the end T12), and FIG. 72B illustrates a case where the current I11 is a negative current (a current flowing from the end T12 to the end T11).

As illustrated in FIG. 72A, the multivibrator circuit X53 outputs, as the signal Vg1, a low-level pulse with a period T5 with respect to a high-level base voltage. The width of the pulse is a time period T4. At time t50, Vg1 is the high level, and the FET M1 causes the path L11 to be electrically connected. The current I11 is a positive current. The voltage of the node N11 is approximately 0 V, and the output voltage Vout of the comparator X50 is the low level.

When the signal Vg1 becomes at the low level at time t51, the FET M1 disconnects the path L11. The current I11 flowing through the path L11 becomes approximately 0. The voltage V11 of the node N11 gradually increases. When the voltage V11 reaches the reference voltage Vref at time t52, the comparator X50 outputs the high level.

When the signal Vg1 becomes the high level at time t53, the FET M1 causes the path L11 to be electrically connected. The electric current flows through the path L11. This causes the voltage of the node N11 to become approximately 0 V, and the output voltage Vout to become the low level.

As illustrated in FIG. 72B, when the current I11 is a negative current and the FET M1 disconnects the path L11 at time t51, the voltage V11 of the node N11 becomes negative, and its absolute value gradually increases. In the time period T4 to time t53, the voltage V11 does not reach the reference voltage Vref. Thus, the output voltage Vout of the comparator X50 maintains the low level.

It may be considered to detect the direction in which a current flows as follows. A resistor is provided in the path L11, and the voltages at both ends of the resistor are compared with each other to detect the direction in which a current flows based on the magnitude relationship between the voltages at both ends. However, provision of the resistor in the path L11 causes the loss due to the resistor.

In the ninth embodiment, the current I11 (a first current) flows between the end T11 (a first end) and the end T12 (a second end) in the path L11 (a first path). The FET M1 (a first switch) causes the path L11 to be electrically connected and disconnected. During the disconnection time period T4 when the FET M5 disconnects the path L11, the comparator X50 (a detection circuit) detects the direction in which the current I11 flows based on the voltage V11 (a first voltage) of the path L11 at the side closer to the end T11 than the FET M1 (the side closer to one of the first and second ends than the first switch).

In the ninth embodiment, there is almost no loss except during the time period T4. Therefore, when the time period T4 is adjusted to be shorter than the period T5, the loss can be reduced. The time period T4 is preferably equal to or less than $\frac{1}{10}$ of, more preferably equal to or less than $\frac{1}{100}$ of the period T5.

The time for the voltage V11 of the node N11 to reach the reference voltage Vref when the current I11 is cut off is C0×Vref/|I11| where C0 represents the parasitic capacitance at the end T11 side of the path L11, and |I11| represents the absolute value of the current I11. To make the time period T4 less than the period T5 (a length T0), C0×Vref/|In|<T5 (i.e., C0×Vref/|In|<T0). To make the time period T4 sufficiently less than the period T5, C0×Vref/T0/10 is preferable, and C0×Vref/|In|≤T0/100 is more preferable.

For example, when the detector is used to detect the direction of the current of the vibration power generation described in the seventh embodiment, typically, C0=10 pF, Vref=0.1 V, and |I11|=10 nA. In this case, C0×Vref/|In|=0.1 ms. Therefore, the period T5 is preferably 1 ms or greater, more preferably 10 ms or greater.

[Variation 1 of the Ninth Embodiment]

Figure 73:
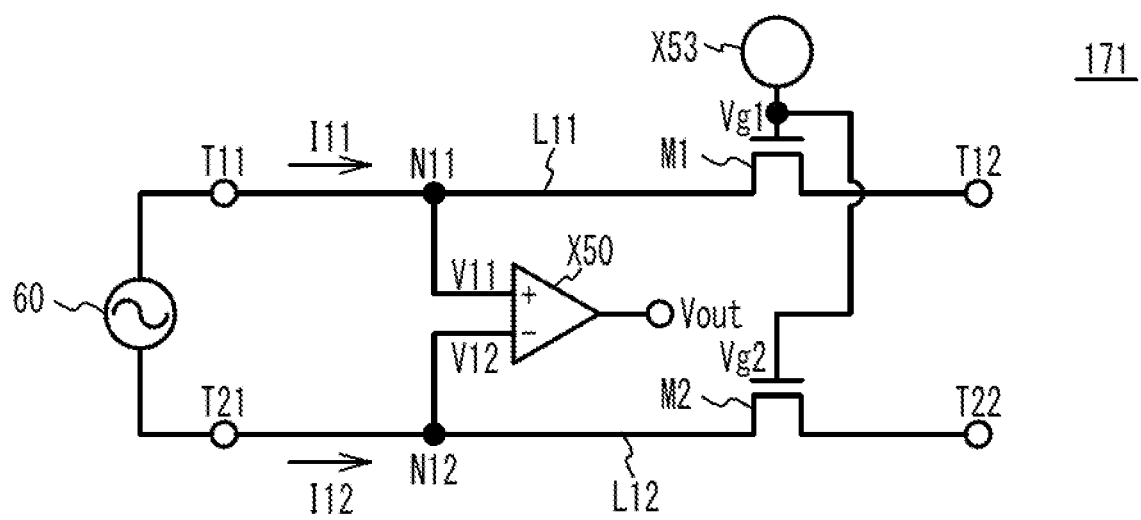
FIG. 73 is a block diagram of a detector in accordance with a variation 1 of the ninth embodiment.

FIG. 73 is a block diagram of a detector in accordance with a variation 1 of the ninth embodiment. As illustrated in FIG. 73, in a detector 171, a path L12 having ends T21 and T22 between which a current I12 flows is provided. The current I12 flowing in the direction from the end T21 to the end T22 is defined as a positive current. The N-channel FET M2 is provided in the path L12. An AC power is applied between the end T11 and the end T12. The current I11 and the current I12 are complementary to each other. That is, at a certain time, the direction in which the current I11 flows is opposite to the direction in which the current I12 flows, and the absolute value of the current I11 is approximately equal to the absolute value of the current I12.

The multivibrator circuit X53 outputs a signal Vg2 to the gate of the FET M2. The comparator X50 compares the voltage V11 of the node N11, which is closer to the end T11 of the path L11, with the voltage V12 of the node N12, which is closer to the end T12 of the path L12, and outputs the output voltage Vout. The comparator X50 sets the output voltage Vout at the high level when V11 is equal to or greater than V12, and sets the output voltage Vout at the low level when V11 is less than V12. In this manner, the detector 171 detects the direction in which the current I11 flows. Other configurations are the same as those of the ninth embodiment, and the description thereof is thus omitted.

Figure 74:
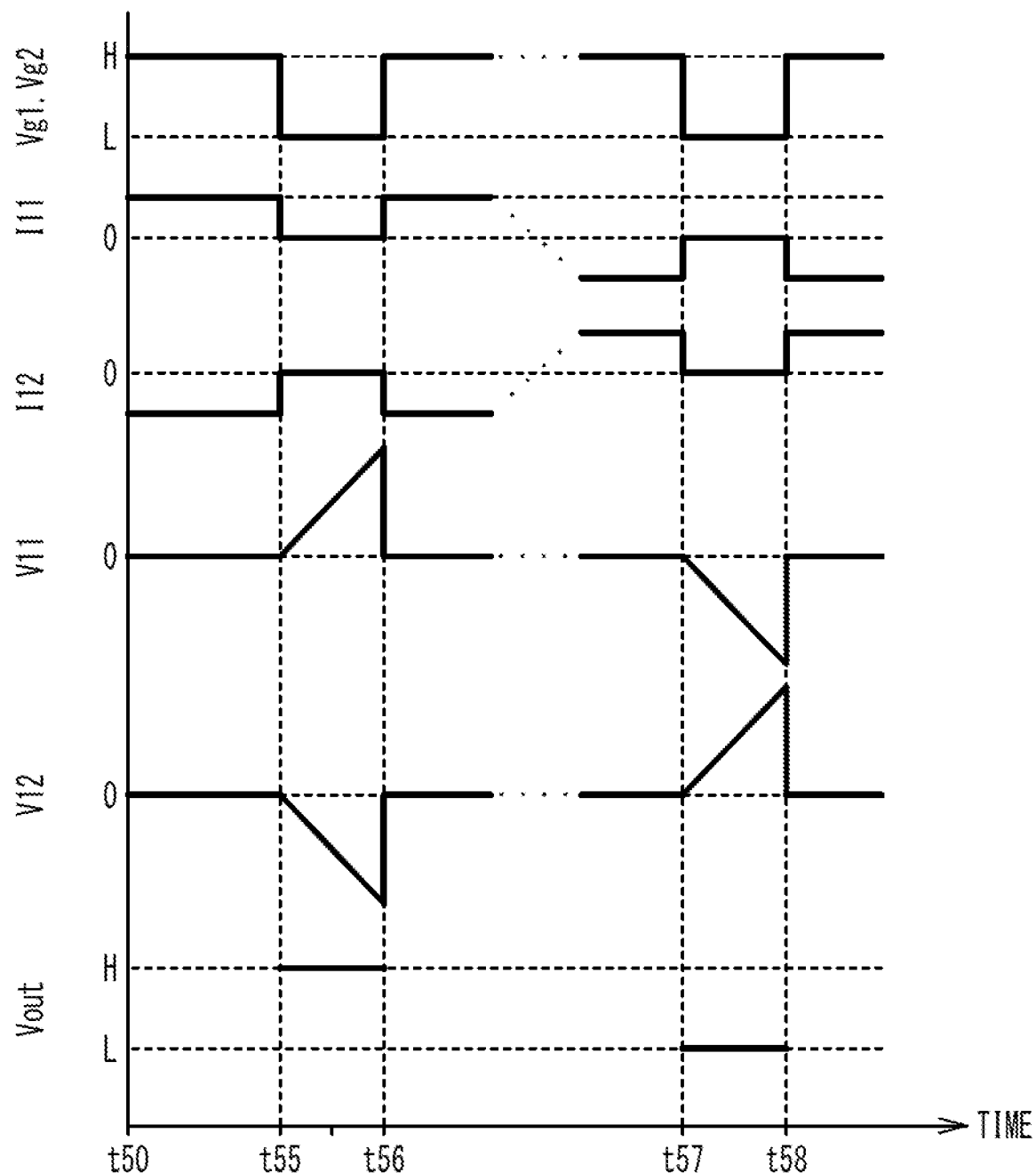
FIG. 74 illustrates respective voltages in the detector in accordance with the variation 1 of the ninth embodiment with respect to time.

FIG. 74 illustrates voltages in the detector in accordance with the variation 1 of the ninth embodiment with respect to time. As illustrated in FIG. 74, at time t50, the current I11 is a positive current, and the current I12 is a negative current. Since the difference between the voltage V11 of the node N11 and the voltage V12 of the node N12 is 0 or very small, the output voltage Vout of the comparator X50 is unstable.

At time t55, when the signals Vg1 and Vg2 become at the low level, the FETs M1 and M2 disconnect the paths L11 and L12, respectively. The current I11 flowing through the path L11 becomes approximately 0. The voltage V11 of the node N11 gradually increases, and the voltage V12 of the node N12 gradually decreases. When the difference between V11 and V12 becomes the voltage difference with which the comparator X50 can determine V11>V12, the output voltage Vout of the comparator X50 becomes the high level.

At time t56, when the signals Vg1 and Vg2 become at the high level, the FETs M1 and M2 cause the paths L11 and L12 to be electrically connected. A current flows through the paths L11 and L12. This causes the voltage of the node N11 to be approximately 0 V, and the output voltage Vout becomes unstable.

In the time period between time t56 and time t57, the current I11 becomes a negative current, and the current I12 becomes a positive current. When the signals Vg1 and Vg2 become at the low level at time t57, the voltage V11 of the node N11 gradually decreases, and the voltage V12 of the node N12 gradually increases. When the difference between V11 and V12 becomes the voltage difference with which the comparator X50 can determine V11<V12, the output voltage Vout of the comparator X50 becomes the low level.

When the signals Vg1 and Vg2 become at the high level at time t58, the FETs M1 and M2 cause the paths L11 and L12 to be electrically connected. This causes the voltage of the node N11 to be approximately 0 V, and the output voltage Vout becomes unstable.

In the variation 1 of the ninth embodiment, the current I12 (a second current) complementary to the current I11 flows between the end T21 (a third end), which is complementary to the end T11, and the end T22 (a fourth end), which is complementary to the end T12, in the path L12 (a second path). During the disconnection time period T4 (see FIG. 72), the FET M1 and the FET M2 (a second switch) disconnect the paths L11 and L12, respectively. The comparator X50 (a detection circuit) detects the direction in which the current I11 flows based on the voltage V11 (a first voltage) of the node N11, which is closer to the end T11 than the FET M1, and the voltage V12 (a second voltage) of the node N12, which is closer to the end T21 (the end complementary to the end T11) than the FET M2. This allows the direction of the current I11 to be detected without using the reference voltage Vref.

[Variation 2 of the Ninth Embodiment]

A variation 2 of the ninth embodiment is an example where the variation 1 of the ninth embodiment is applied to a power conversion circuit, and is the synchronous rectifier circuit 64 illustrated in FIG. 56 of the seventh embodiment. As illustrated in FIG. 56 and FIG. 57, during the time period when the voltage V5 is the high level, the pass gate X15 disconnects the paths from the power terminal 61a to the pass gates X9 and X10, and the pass gate X13 disconnects the paths from the power terminal 61b to the pass gates X11 and X12. When the direction of the electric current Il is positive, the voltage V1 increases, and the voltage V2 decreases, as in the time period between time t22 and time t23. When the direction of the electric current Il is negative, the voltage V1 decreases, and the voltage V2 increases, as in the time period between time t25 and time t26.

When the voltage V1 becomes 0.5 V or greater at time t24, the spike generation circuit X3 outputs the spike signal 88. The FF circuit X1 changes the voltage V3 to the low level, and the voltage V4 to the high level. This causes the pass gates X9 and X11 to be electrically connected, and the pass gates X10 and X12 to be disconnected.

When the voltage V2 becomes 0.5 V or greater at time t27, the spike generation circuit X4 outputs the spike signal 89. The FF circuit X1 changes the voltage V3 to the high level, and changes the voltage V4 to the low level. This causes the pass gates X9 and X11 to be disconnected, and the pass gates X10 and X12 to be electrically connected.

In the variation 2 of the ninth embodiment, the pass gates X15 and X13, the spike generation circuits X3 and X4, and the FF circuit X1 serve as the detector of the variation 1 of the ninth embodiment. The pass gate X15 serves as a first switch, and the pass gate X13 serves as a second switch. The spike generation circuits X3 and X4 and the FF circuit X1 serve as a detection circuit that detects the direction of the current. In other words, in the variation 2 of the ninth embodiment, the aforementioned circuits of the synchronous rectifier circuit 65 illustrated in FIG. 56 serve as the detector of the variation 1 of the ninth embodiment.

[Variation 3 of the Ninth Embodiment]

Figure 75:
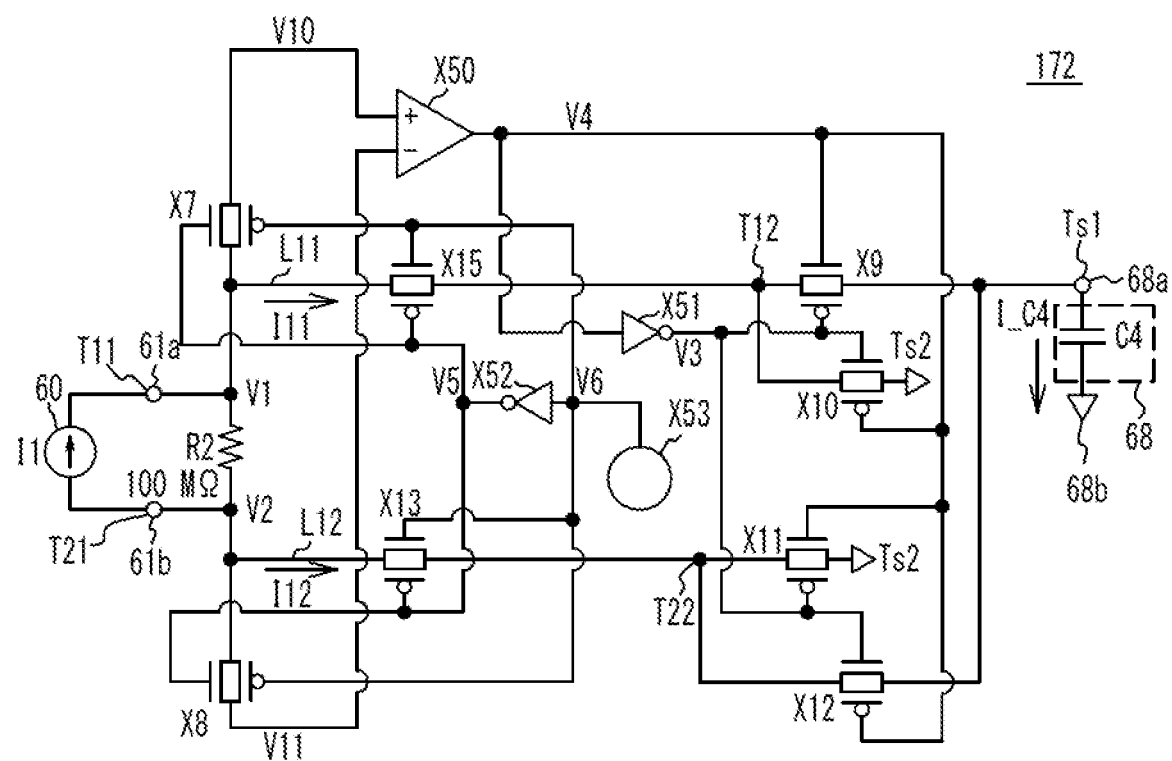
FIG. 75 is a circuit diagram of a synchronous rectifier circuit in accordance with a variation 3 of the ninth embodiment.
Figure 76:
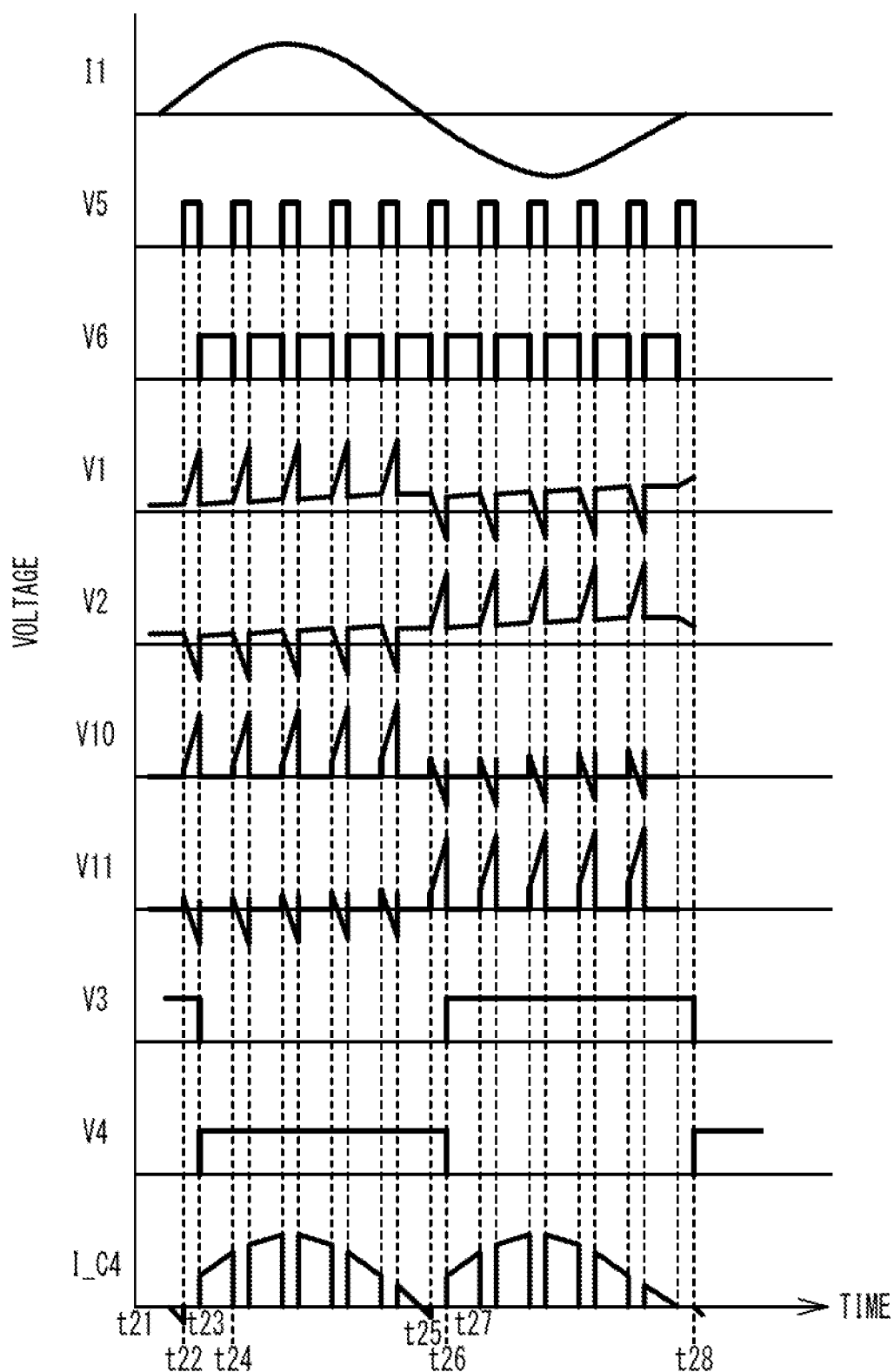
FIG. 76 illustrates respective voltages of nodes in the synchronous rectifier circuit in accordance with the variation 3 of the ninth embodiment with respect to time.

A variation 3 of the ninth embodiment is another example where the variation 1 of the ninth embodiment is applied to a power conversion circuit. FIG. 75 is a circuit diagram of a synchronous rectifier circuit in accordance with the variation 3 of the ninth embodiment. FIG. 76 illustrates respective voltages of the nodes in the synchronous rectifier circuit with respect to time in the synchronous rectifier circuit in accordance with the variation 3 of the ninth embodiment.

As illustrated in FIG. 75 and FIG. 76, in a synchronous rectifier circuit 172, the multivibrator circuit X53 outputs the output voltage V6. An inverter X52 inverts the voltage V6 to the voltage V5. During the time period when the voltage V5 is the high level (for example, the time period between time t22 and time t23 and the time period between time t25 and time t26), the voltages V10 and V11 are approximately the voltages V1 and V2, respectively. During the time period when the voltage V5 is the low level (for example, the time period between time t23 and time t24 and the time period between time t26 and time t27), the pass gates X7 and X8 are off. Thus, the voltages V10 and V11 are approximately 0 V.

During the time period between time t22 and time t23, the voltage V10 is positive, and the voltage V11 is negative.

This causes the comparator X50 to output the high level as the voltage V4. The voltage V3 becomes the low level. During the time period between time t23 and time t24, the comparator X50 maintains the voltage V4 at the high level. This causes the pass gates X9 and X11 to be electrically connected, and the pass gates X10 and X12 to be disconnected.

During the time period between time t25 and time t26, the voltage V10 is negative, and the voltage V11 is positive. This causes the comparator X50 to output the low level as the voltage V4. The voltage V3 becomes the high level. During the time period between time t26 and time t27, the comparator X50 maintains the voltage V4 at the low level. This causes the pass gates X9 and X11 to be disconnected, and the pass gates X10 and X12 to be electrically connected.

In the variation 3 of the ninth embodiment, the power terminal 61a corresponds to the end T11, and the node diverging to the pass gates X9 and X10 corresponds to the end T12. The path between the ends T11 and T12 corresponds to the path L11. The current flowing through the path L11 from the end T11 to the end T12 corresponds to the current I11. The power terminal 61b corresponds to the end T21, and the node diverging to the pass gates X11 and X12 corresponds the end T22. The path between the ends T21 and T22 corresponds to the path L12. The current flowing through the path L12 from the end T21 to the end T22 corresponds to the current I12. The pass gates X15 and X13 correspond to a first switch and a second switch, respectively. As seen above, the pass gates X15 and X13 and the comparator X50 serve as the detector of the variation 1 of the ninth embodiment. The pass gates X15 and X13 and the comparator X50 serve as a first switch, a second switch, and a detection circuit, respectively.

Furthermore, in the variations 2 and 3 of the ninth embodiment, the pass gates X9 to X12 (switch elements) are turned on and off based on the detection result (i.e., the voltage V4) of the detector. This allows the detector to detect the direction of the current with low loss, thus achieving a power conversion circuit with low loss. In particular, in the energy harvesting such as the vibration power generation or the like, the generated voltage and the generated power are small. Therefore, when the loss in power conversion is large, it is difficult to use it as a power conversion circuit for energy harvesting. The use of the detector of any one of the ninth embodiment and the variation 1 thereof as described in the ninth embodiment and the variations 2 and 3 thereof reduces the loss, and therefore, it can be used as a power conversion circuit for energy harvesting.

In the variation 3 of the ninth embodiment, when the detector detects that the direction in which the current I11 flows is the direction from the end T11 to the end T12 (a first direction), the pass gates X9 to X12 (a switch circuit) connect the end T12 to a power supply terminal Ts1 (a first power supply terminal) and disconnects the end T12 from a ground terminal Ts2 (a second power supply terminal), and connects the end T22 to the ground terminal Ts2 and disconnects the end T22 from the power supply terminal Ts1. When the detector detects that the direction in which the current I11 flows is the direction from the end T12 to the end T11 (a second direction opposite to the first direction), the pass gates X9 to X12 (a switch circuit) connect the end T12 to the ground terminal Ts2 and disconnects the end T12 from the power supply terminal Ts1, and connects the end T22 to the power supply terminal Ts1 and disconnects the end T22 from the ground terminal Ts2. This allows the operation as the synchronous rectifier circuit.

The variations 2 and 3 of the ninth embodiment describe the synchronous rectifier circuit as the power conversion circuit to which the detector in accordance with any one of the ninth embodiment and the variation 1 thereof is applied, as an example, but the power conversion circuit may be a step-down circuit, a step-up circuit, a DC-AC power conversion circuit, or an AC-DC power conversion circuit. The detector of any one of the ninth embodiment and the variation 1 thereof can be applied to an electric circuit and an electronic circuit other than the power conversion circuit.

Tenth Embodiment

Figure 77A:
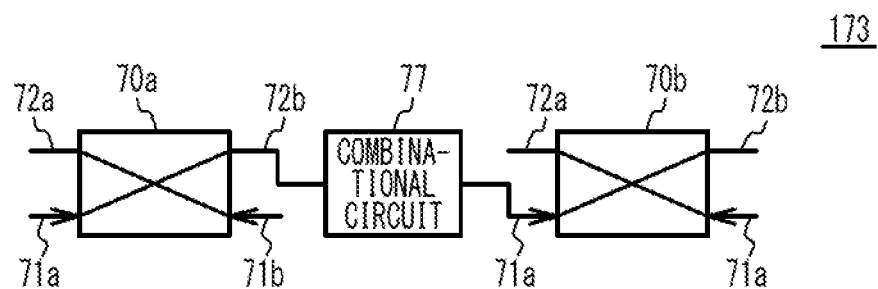
FIG. 77A and FIG. 77B are block diagrams of electronic circuits in accordance with a first comparative example and a tenth embodiment, respectively.
Figure 77B:
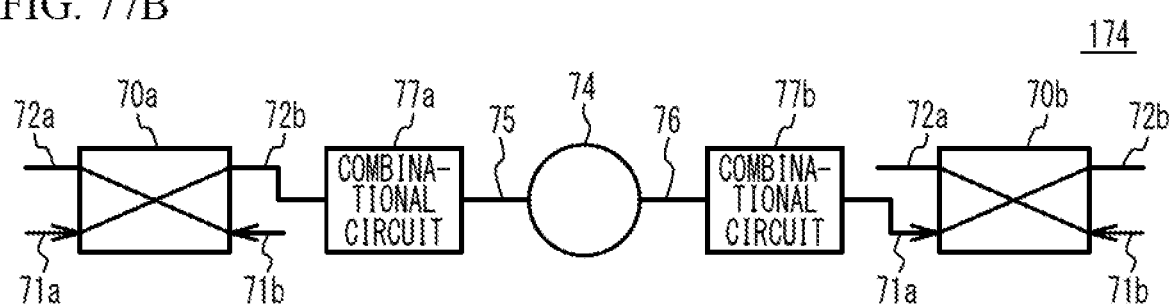

A tenth embodiment is an exemplary electronic circuit to which the spike generation circuit is applied. FIG. 77A and FIG. 77B are block diagrams of electronic circuits in accordance with a first comparative example and the tenth embodiment, respectively. As illustrated in FIG. 77A, in an electronic circuit 173 of the first comparative example, the input terminal of a combinational circuit 77 is coupled to the output terminal 72b of an FF circuit 70a, and the input terminal 71a of an FF circuit 70b is coupled to the output terminal of the combinational circuit 77.

As illustrated in FIG. 77B, in an electronic circuit 174 of the tenth embodiment, the input terminal of a combinational circuit 77a is coupled to the output terminal 72b of the FF circuit 70a. An input terminal 75 of a spike generation circuit 74 is coupled to the output terminal of the combinational circuit 77a. The input terminal of a combinational circuit 77b is coupled to an output terminal 76 of the spike generation circuit 74. The input terminal 71a of the FF circuit 70b is coupled to the output terminal of the combinational circuit 77b. The combinational circuit 77a may not be necessarily connected between the FF circuit 70a and the spike generation circuit 74, and the combinational circuit 77b may not be necessarily connected between the spike generation circuit 74 and the FF circuit 70b.

Here, the combinational circuits 77a and 77b are circuits having one or more input terminals each being supplied with the high level or the low level and outputting the high level or the low level uniquely determined according to the inputs of the one or more input terminals to each of one or more output terminals. For example, the combinational circuits 77a and 77b are an NOT circuit, an OR circuit, an AND circuit, an XOR circuit, an NOR circuit, a NAND circuit, or a circuit including any one of combinations thereof.

The FF circuits 70a and 70b are the FF circuit 70 described in FIG. 47A to FIG. 47C in the seventh embodiment. The FF circuit 70 is, for example, an RS flip-flop circuit, the input terminals 71a and 71b are a set terminal and a reset terminal, respectively, and the output terminals 72b and 72a are an output terminal Q and a complementary output terminal QB, respectively. The FF circuit 70 is a latch circuit, and may be any memory circuit that maintains the level of the output terminal 72b at one of the high level and the low level when the one of the high level and the low level is input to the input terminal 71a.

Figure 78A:
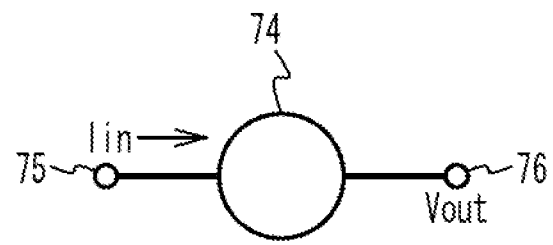
FIG. 78A illustrates a spike generation circuit.
Figure 78B:
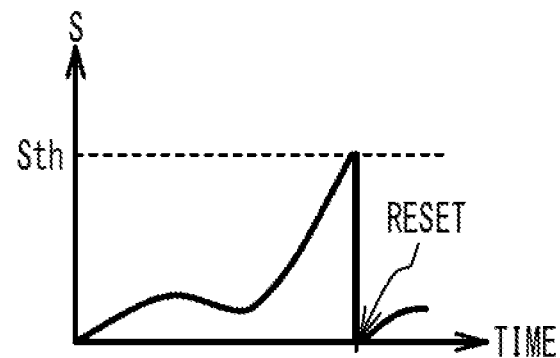
FIG. 78B illustrates an internal state S with respect to time.
Figure 78C:
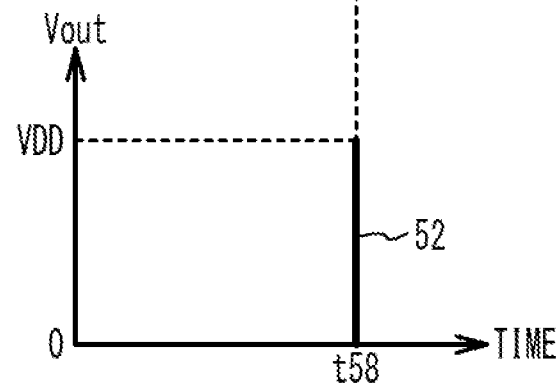
FIG. 78C illustrates an output voltage Vout with respect to time.

FIG. 78A illustrates the spike generation circuit, FIG. 78B illustrates an internal state S with respect to time, and FIG. 78C illustrates the output voltage Vout with respect to time. As illustrated in FIG. 78A, a current Iin is input to the input terminal 75 of the spike generation circuit 74. The voltage of the output terminal 76 is the voltage Vout.

As illustrated in FIG. 78B, the internal state S is a state depending on the history of the current Iin. In the first to fourth embodiments and the variations thereof, the internal state S is the voltage of the intermediate node Ni. The internal state S varies according to the history of the current Iin. For example, in FIG. 8 of the third embodiment, the voltage of the node N1 (corresponding to the intermediate node Ni) is proportional to the value of integral of the current Iin input to the input terminal 75 (Tin). At time t58, when the internal state S reaches a threshold state Sth, the spike generation circuit 74 outputs the spike signal 52 as the voltage Vout. The spike signal 52 is a voltage pulse having no meaning in the width and having a meaning only in the timing. Immediately after time t58, the internal state S is reset.

The internal state S may be the internal state of, for example, the switch element described in International Publication No. 2018/100790. For example, the internal state S may be the temperature that is the value of integral of the Joule heat generated by the current. In FIG. 78B, the internal state S varies to the positive side depending on the history of the current Iin, and when the internal state S reaches the positive threshold state Sth, the spike signal 52 is output. The internal state S may vary to the negative side depending on the history of the current Iin, and when the internal state S reaches the negative threshold state Sth, the spike signal 52 may be output. In FIG. 78C, the voltage Vout is 0 V and the spike signal 52 having the power-supply voltage VDD is output, but the voltage Vout may be VDD and the spike signal 52 having 0 V may be output.

As seen above, the spike generation circuit 74 is a circuit that outputs the isolated spike signal 52 with the high level or the low level and resets the internal state S to an initial value when the internal state S depending on the history of the input current input to the input terminal 75 reaches the threshold state Sth.

Figure 79A:
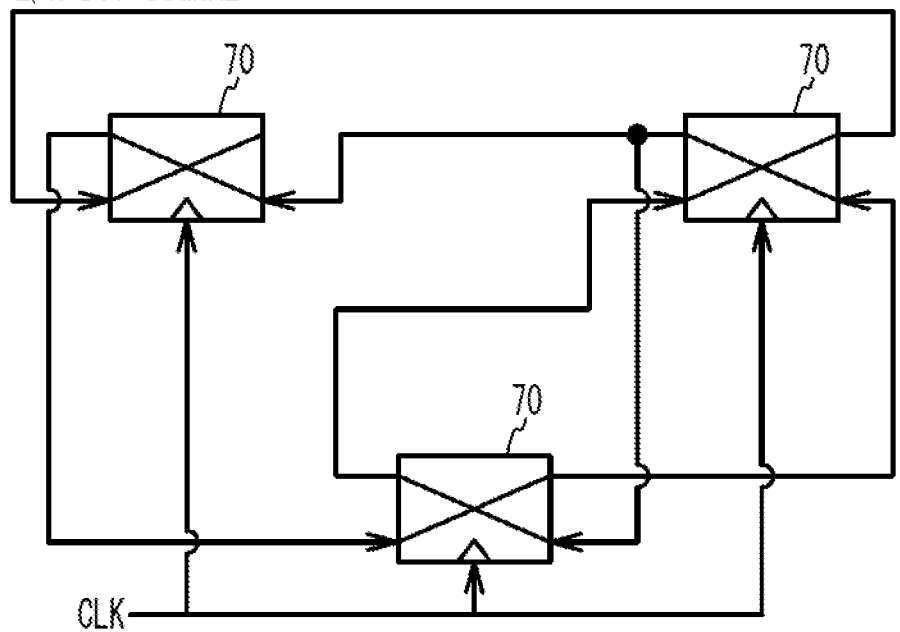
FIG. 79A and FIG. 79B are block diagrams of the electronic circuits in accordance with the first comparative example and the tenth embodiment, respectively.
Figure 79B:
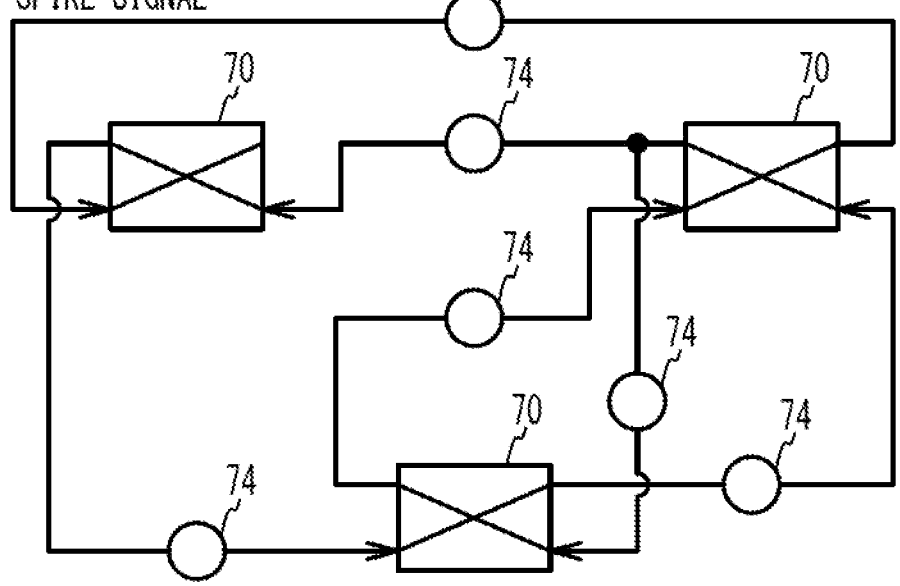

FIG. 79A and FIG. 79B are block diagrams of electronic circuits in accordance with the first comparative example and the tenth embodiment, where the electronic circuits in FIG. 77A and FIG. 77B are connected in a network form, respectively. The combinational circuit may be provided between the FF circuits 70 in FIG. 79A, and between the FF circuit 70 and the spike generation circuit 74 in FIG. 79B.

As illustrated in FIG. 79A, in an electronic circuit 175 of the first comparative example, no spike generation circuit 74 is provided between the output terminal of the FF circuit 70 and the FF circuit 70 in the next stage. A clock signal CLK is input to each FF circuit 70. The FF circuit 70 outputs the data to the FF circuit 70 in the next stage in synchronization with the clock signal CLK. The signal transmitted between the FF circuits 70 is a bit signal with the low level/high level.

As illustrated in FIG. 79B, in an electronic circuit 176 of the tenth embodiment, the spike generation circuit 74 is provided between the output terminal of the FF circuit 70 and the FF circuit 70 in the next stage. No clock signal CLK is input to each FF circuit 70. The signal transmitted from the spike generation circuit 74 to the FF circuit 70 in the next stage is a spike signal.

In the electronic circuit according to the first comparative example in FIG. 77A, the state of the FF circuit 70b is uniquely rewritten by the bit signal output by the FF circuit 70a in the previous stage. That is, when a previous stage is determined, the next stage is uniquely determined. Therefore, it is impossible to rewrite the states of only some of the FF circuits 70. In FIG. 79A, each FF circuit 70 operates in synchronization with the clock signal CLK, and the entire electronic circuit 175 operates simultaneously in a centralized manner.

For example, in the energy harvesting such as the vibration power generation, the generated power is small. Thus, the control circuit that controls the power conversion circuit used for energy harvesting is required to have lower power consumption. In the electronic circuit 175 of the first comparative example that operates in synchronization with the clock signal, a charge/discharge current flows to the CMOS circuit every time the low level and the high level of the clock signal CLK are switched. Therefore, standby power is needed. The control circuit for energy harvesting needs a relatively long time for control, for example, millisecond or greater. Therefore, it is unnecessary to operate the electronic circuit 175 in synchronization with the clock signal CLK.

In the electronic circuit according to the tenth embodiment in FIG. 77B, the output terminal 72b (a first output terminal) of the FF circuit 70a (a first memory circuit) is coupled to the input terminal 75 of the spike generation circuit 74 (a first spike generation circuit). The spike generation circuit 74 outputs the spike signal when the internal state S reaches the threshold state Sth, regardless of the output of the FF circuit 70a in the previous stage. Therefore, the FF circuit 70b (a second memory circuit) of which the input terminal 71a (a first input terminal) is coupled to the output terminal 76 of the spike generation circuit 74 is unable to rewrite the state of the FF circuit 70b in the subsequent stage until the spike generation circuit 74 outputs the spike signal 52.

In the network illustrated in FIG. 79B, the states of only some of the FF circuits 70 can be rewritten individually. Therefore, the FF circuits 70 are able to operate asynchronously, and the electronic circuit 176 is able to operate locally and dispersively.

For example, in the power conversion circuit 120 in FIG. 44 of the seventh embodiment, when the control circuits in the rectifier circuits 62 and 64, the determination circuit 65, and the step-down circuit 66 need to operate, the spike generation circuit in each control circuit generates a spike signal, and the control circuit operates. On the other hand, when it is unnecessary for the control circuit to operate, the spike generation in the control circuit generates no spike signal. When no spike signal is generated, the control circuit needs very little standby power. Therefore, the power consumption can be reduced.

As illustrated in FIG. 77B, the output terminal 72b of the FF circuit 70a may be coupled to at least one of one or more input terminals of the combinational circuit 77a. The input terminal 75 of the spike generation circuit 74 may be coupled to one or more output terminals of the combinational circuit 77a. When the output terminals of the combinational circuit 77a are coupled to the input terminal 75 of the spike generation circuit 74, the output terminals of the combinational circuit 77a are coupled to the input terminal 75 of the spike generation circuit 74 through, for example, an OR circuit or the like. In addition, the output terminal 76 of the spike generation circuit 74 may be coupled to at least one of one or more input terminals of the combinational circuit 77b, and the input terminal 71a of the FF circuit 70b may be coupled to one or more output terminals of the combinational circuit 77b.

Figure 80A:
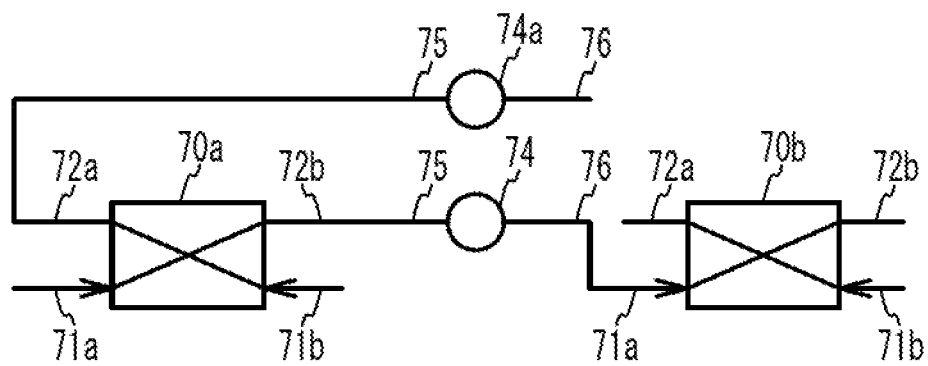
FIG. 80A and FIG. 80B illustrate examples of the electronic circuit in accordance with the tenth embodiment.
Figure 80B:
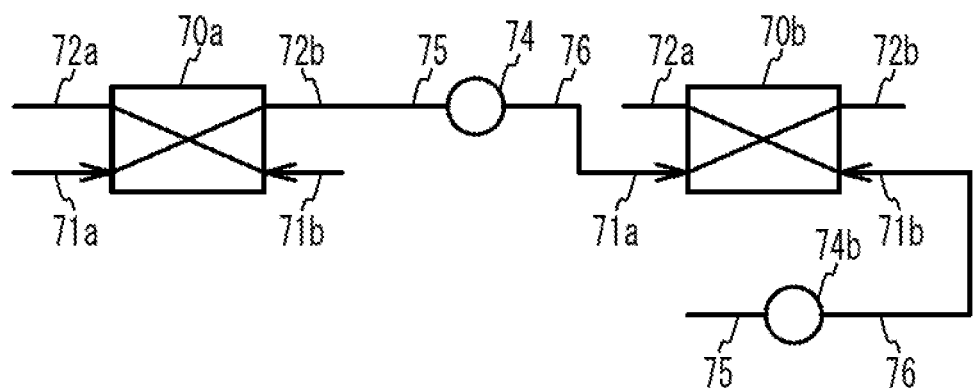

FIG. 80A and FIG. 80B illustrate exemplary electronic circuits in accordance with the tenth embodiment. The input terminal 75 of the spike generation circuit 74 may be coupled to the output terminal 72b (a first output terminal) of the FF circuit 70a, and the input terminal 75 (a second spike generation circuit) of the spike generation circuit 74a may be coupled to the output terminal 72a (a second output terminal) of the FF circuit 70a. This allows the output of the FF circuit 70a to be input to the spike generation circuits 74 and 74a. A combinational circuit may be provided between the FF circuit 70a and the spike generation circuit 74 and between the FF circuit 70a and the spike generation circuit 74a. Other configurations are the same as those of the tenth embodiment illustrated in FIG. 77B, and the description thereof is thus omitted.

As illustrated in FIG. 80B, the output terminal 76 of the spike generation circuit 74 is coupled to the input terminal 71a (a first input terminal) of the FF circuit 70b, and the output terminal 76 of the spike generation circuit 74b (a third spike generation circuit) is coupled to the input terminal 71b (a second input terminal). This configuration allows the spike generation circuits 74 and 74b to be coupled to the input of the FF circuit 70a. A combinational circuit may be provided between the FF circuit 70b and the spike generation circuit 74 and between the FF circuit 70b and the spike generation circuit 74b. Other configurations are the same as those of the tenth embodiment illustrated in FIG. 77B, and the description thereof is thus omitted.

[Variation 1 of the Tenth Embodiment]

Figure 81A:
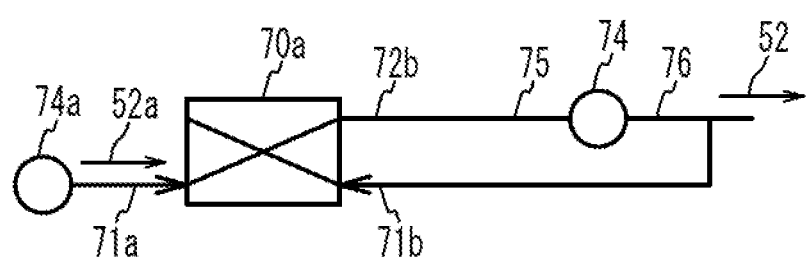
FIG. 81A and FIG. 81B are block diagrams of electronic circuits in accordance with variations 1 and 2 of the tenth embodiment, respectively.

FIG. 81A is a block diagram of an electronic circuit in accordance with a variation 1 of the tenth embodiment. As illustrated in FIG. 81A, in an electronic circuit 177 according to the variation 1 of the tenth embodiment, the spike signal is input from the spike generation circuit 74a to the input terminal 71a of the FF circuit 70a. The output terminal 72b of the FF circuit 70a is coupled to the input terminal 75 of the spike generation circuit 74. The output terminal 76 of the spike generation circuit 74 is coupled to the input terminal 71b of the FF circuit 70a.

When the spike generation circuit 74a outputs a spike signal, the FF circuit 70a outputs the high level to the spike generation circuit 74. When the spike generation circuit 74 outputs the spike signal 52, the FF circuit 70a outputs the low level to the spike generation circuit 74. This resets the level of the input terminal 75 of the spike generation circuit 74.

As in the variation 1 of the tenth embodiment, the output terminal 76 of the spike generation circuit 74, of which the input terminal 75 is coupled to the output terminal 72b of the FF circuit 70a, is coupled to the input terminal 71b of the FF circuit 70a. This configuration allows the output of the output terminal 72b of the FF circuit 70a to be reset when the spike generation circuit 74 outputs the spike signal 52.

[Variation 2 of the Tenth Embodiment]

Figure 81B:
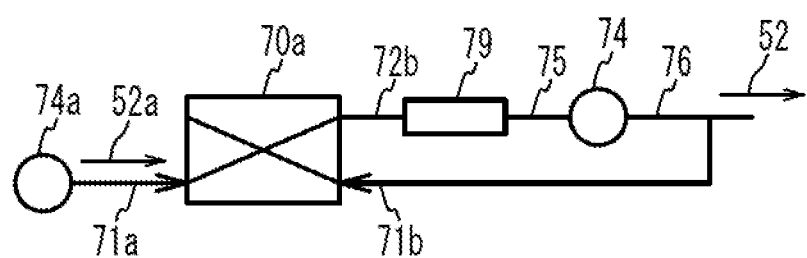

FIG. 81B is a block diagram of an electronic circuit in accordance with a variation 2 of the tenth embodiment. As illustrated in FIG. 81B, in an electronic circuit 177a according to the variation 2 of the tenth embodiment, a first end of an element or circuit 79 is coupled to the output terminal 72b of the FF circuit 70a, and a second end is coupled to the input terminal 75 of the spike generation circuit 74. The element or circuit 79 carries the current corresponding to the voltage difference between the first end and the second end. The element or circuit 79 is, for example, a transistor, a resistor, or a leakage current element, and is the constant current element or constant current circuit 33b illustrated in FIG. 64A of the variation 2 of the eighth embodiment. The spike generation circuit 74 outputs the spike signal 52 when the value of integral of the electric current input to the input terminal 75 reaches the threshold value. The spike generation circuit 74 is, for example, the capacitor C1 and the output circuit 150 in FIG. 64A. Other circuit configurations are the same as those of the variation 1 of the tenth embodiment, and the description thereof is thus omitted.

In the variation 2 of the tenth embodiment, the spike generation circuit 74 outputs the spike signal 52 and resets the FF circuit 70a after a predetermined time after the spike signal is input to the input terminal 71a of the FF circuit 70a.

[Variation 3 of the Tenth Embodiment]

Figure 82A:
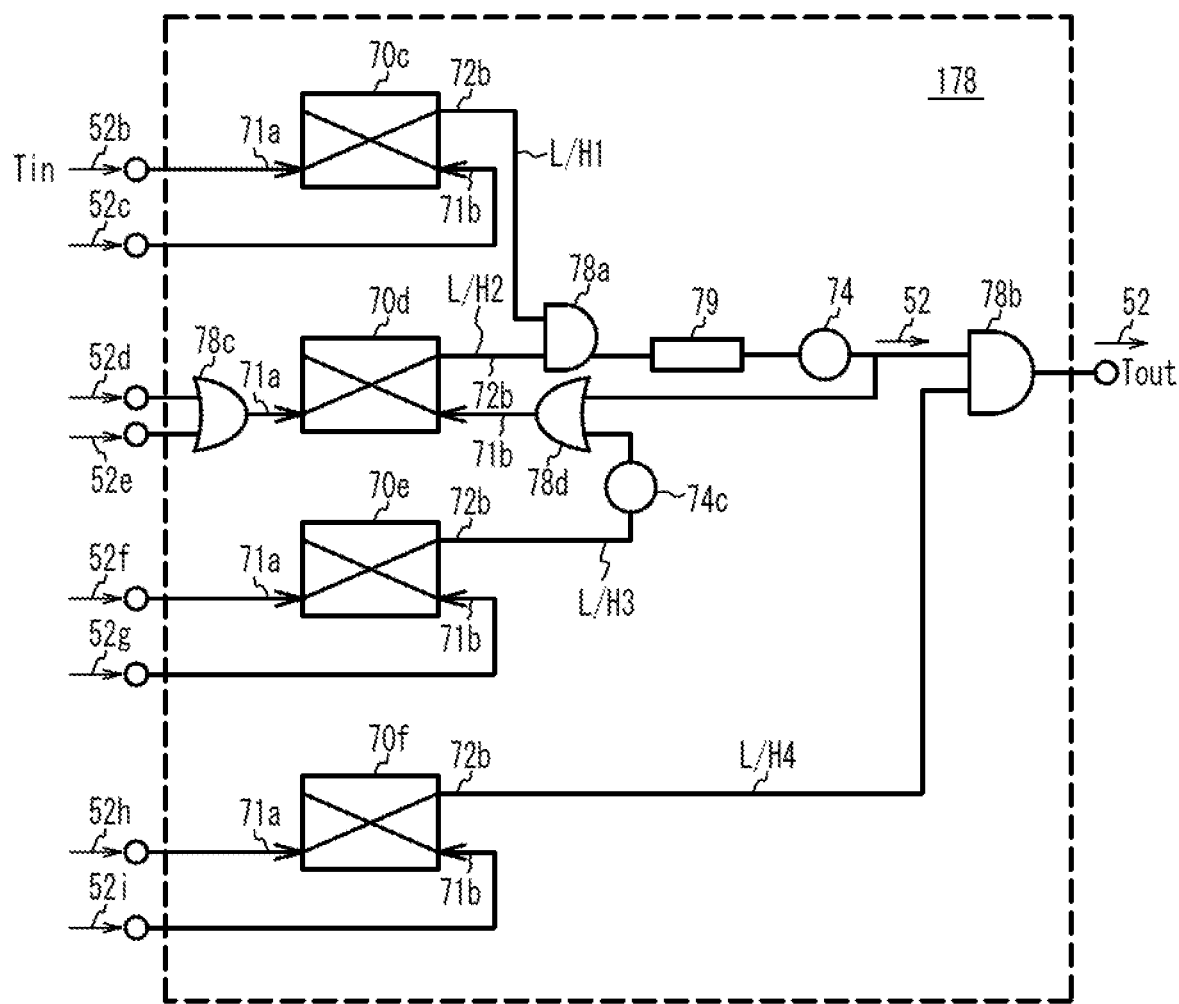
FIG. 82A and FIG. 82B are block diagrams of an electronic circuit in accordance with a variation 3 of the tenth embodiment.
Figure 82B:
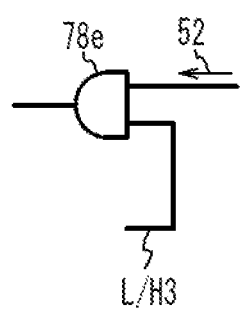

FIG. 82A and FIG. 82B are block diagrams of electronic circuits in accordance with a variation 3 of the tenth embodiment. An electronic circuit 178 includes FF circuits 70c to 70f, the spike generation circuits 74 and 74c, and AND circuits 78a and 78b and OR circuits 78c and 78d as combinational circuits. The power-supply voltage of each circuit is, for example, the same voltage VDD.

As illustrated in FIG. 82A, spike signals 52b and 52c are input to the input terminals 71a and 71b of the FF circuit 70c, respectively. This causes the FF circuit 70c to output the high level, as a bit signal L/H1, to the output terminal 72b when the spike signal 52b is input, and to output the low level, as the bit signal L/H1, to the output terminal 72b when the spike signal 52c is input.

Spike signals 52d and 52e are input to the OR circuit 78c. The output of the OR circuit 78c is input to the input terminal 71a of the FF circuit 70d. As seen above, the spike signals from a plurality of paths may be input to the input terminal 71a of one FF circuit 70d using the combinational circuit such as the OR circuit 78c. The FF circuit 70d outputs the high level, as a bit signal L/H2, to the output terminal 72b when the spike signal is input to the input terminal 71a.

The bit signals L/H1 and L/H2 are input to the AND circuit 78a, and the output of the AND circuit 78a is input to the spike generation circuit 74. After a predetermined time after both the FF circuits 70c and 70d become at the high level, the spike generation circuit 74 outputs the spike signal 52. Input to the spike generation circuit 74 may be kept waiting until a certain condition is satisfied, using the FF circuits 70c and 70d and the combinational circuit such as the AND circuit 78a.

The spike signal 52 is input to the input terminal 71b of the FF circuit 70d through the OR circuit 78d. This causes the FF circuit 70d to output the low level, as the bit signal L/H2, to the output terminal 72b. That is, the bit signal L/H2 is reset.

Spike signals 52f and 52g are input to the input terminals 71a and 71b of the FF circuit 70e, respectively. This causes the FF circuit 70e to output the high level, as a bit signal L/H3, to the output terminal 72b when the spike signal 52f is input, and to output the low level, as the bit signal L/H3, to the output terminal 72b when the spike signal 52g is input. The bit signal L/H3 is input to the OR circuit 78d through the spike generation circuit 74c with a short time constant. As a result, the bit signal L/H2 is reset when the bit signal L/H3 becomes at the high level even though the spike signal 52 is not output. In addition, when an AND circuit 78e is used instead of the OR circuit 78d as illustrated in FIG. 82B, the spike generation circuit 74 continues to output the spike signal 52 at constant time intervals during the time period when the bit signals L/H2 and L/H1 are at the high level and the bit signal L/H3 is at the low level. As seen above, the FF circuit 70d may be reset before the spike signal 52 is output, using the FF circuits 70d and 70e and the combinational circuit such as the OR circuit 78d. Alternatively, the spike signal 52 may continue to be output until a certain condition is satisfied.

Spike signals 52h and 52i are input to the input terminals 71a and 71b of the FF circuit 70f, respectively. This causes the FF circuit 70f to output the high level, as a bit signal L/H4, to the output terminal 72b when the spike signal 52h is input, and to output the low level, as the bit signal L/H4, to the output terminal 72b when the spike signal 52i is input. The bit signal L/H4 is input to the AND circuit 78b. The AND circuit 78b allows the spike signal 52 to pass therethrough when the bit signal L/H4 is at the high level, but does not allow the spike signal 52 to pass therethrough when the bit signal L/H4 is at the low level. As seen above, the spike signal 52 may be allowed to pass only when a certain condition is satisfied, using the FF circuit 70f and the combinational circuit such as the AND circuit 78b.

Figure 82C:
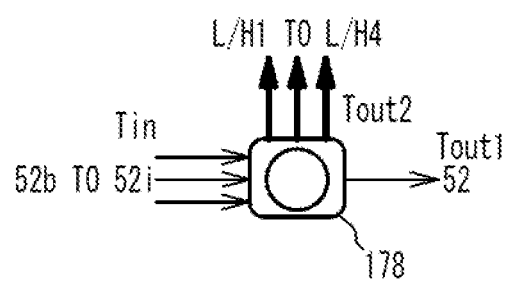
FIG. 82C illustrates a symbol of the electronic circuit in accordance with the variation 3 of the tenth embodiment.

FIG. 82C illustrates a symbol of the electronic circuit in accordance with the variation 3 of the tenth embodiment. As illustrated in FIG. 82C, the spike signals 52b to 52i are input to the input terminal Tin of the electronic circuit 178. The spike signal 52 is output from the output terminal Tout1 of the electronic circuit 178. The bit signals L/H1 to L/H4 are output from the output terminal Tout2. As seen above, when one or more spike signals are input, the electronic circuit 178 outputs one or more spike signals and one or more bit signals. Circuit configurations other than the circuit configuration of FIG. 82A may be employed as long as the electronic circuit 178 outputs at least one of the following signals: one or more bit signals and one or more spike signals, when one or more spike signals are input.

Figure 83A:
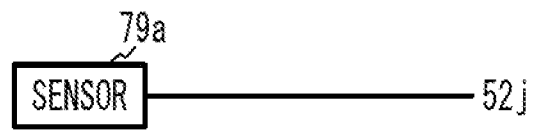
FIG. 83A and FIG. 83B illustrate exemplary spike signals input to the electronic circuit in the variation 3 of the tenth embodiment.
Figure 83B:
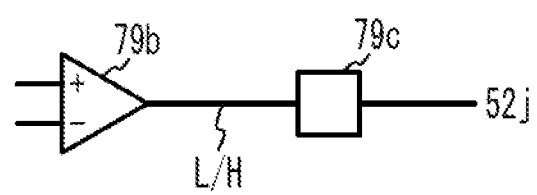

Examples of the spike signal input to the electronic circuit 178 will be described. FIG. 83A and FIG. 83B illustrate examples of the spike signal input to the electronic circuit in the variation 3 of the tenth embodiment. As illustrated in FIG. 83A, a spike signal 52j may be a signal output by a sensor 79a. As illustrated in FIG. 83B, a comparator 79b outputs a bit signal L/H to the input terminal of an electronic circuit 79c. The electronic circuit 79c outputs the spike signal 52j when the bit signal L/H rises and falls. The spike signal 52j may be a signal that is output when the bit signal L/H rises and falls.

Figure 84A:
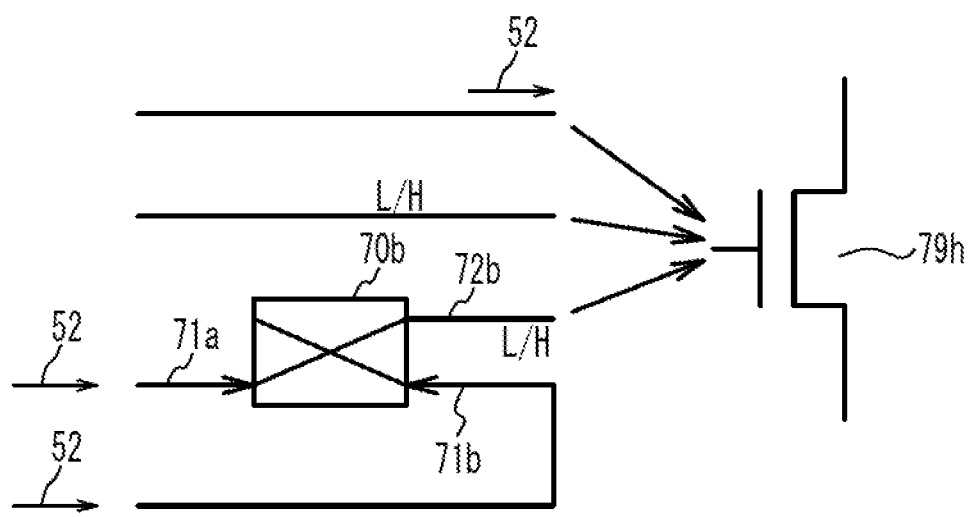
FIG. 84A and FIG. 84B illustrate exemplary circuits in which the spike signal output from the electronic circuit in the variation 3 of the tenth embodiment is used.
Figure 84B:
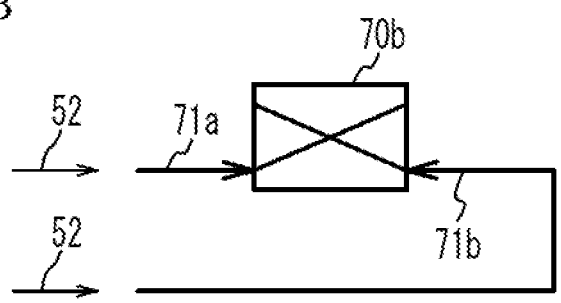

An exemplary circuit in which the spike signal output by the electronic circuit 178 is used will be described. FIG. 84A and FIG. 84B illustrate exemplary circuits in which the spike signal output from the electronic circuit in the variation 3 of the tenth embodiment is used. As illustrated in FIG. 84A, the spike signal 52 and/or the bit signal L/H output by the electronic circuit 178 is input to the control terminal of a transistor 79h. The spike signal 52 output by the electronic circuit 178 may be input to the input terminal 71a or 71b of the FF circuit 70b, and the bit signal L/H output by the FF circuit 70b may be input to the control terminal of the transistor 79h. As seen above, the spike signal 52 and/or the bit signal L/H output by the electronic circuit 178 may control the transistor 79h.

As illustrated in FIG. 84B, the spike signal 52 output by the electronic circuit 178 is input to the input terminal 71a or 71b of the FF circuit 70b. As seen above, the spike signal 52 output by the electronic circuit 178 can be used to rewrite the FF circuit 70b.

Figure 85A:
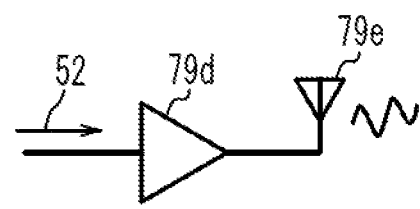
FIG. 85A and FIG. 85C are circuit diagrams illustrating examples where the spike signal output from the electronic circuit in the variation 3 of the tenth embodiment is used.
Figure 85B:
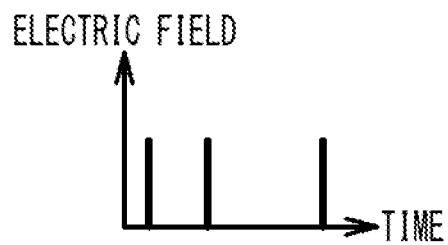
FIG. 85B and FIG. 85D illustrate the magnitude of an electromagnetic wave output from an antenna.
Figure 85C:
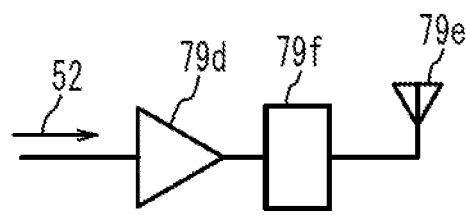
Figure 85D:
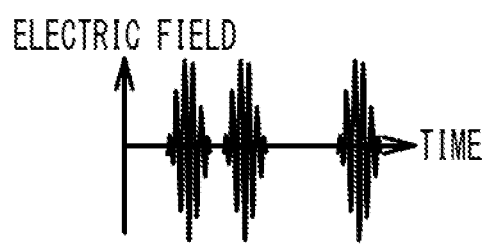

FIG. 85A and FIG. 85C are circuit diagrams illustrating examples where the spike signal output from the electronic circuit in the variation 3 of the tenth embodiment is used, and FIG. 85B and FIG. 85D illustrate the magnitude (the electric field) of the electromagnetic wave output from an antenna.

As illustrated in FIG. 85A, a power amplifier 79d amplifies the spike signal 52 output by the electronic circuit 178. An antenna 79e outputs the amplified spike signal as an electromagnetic wave. As illustrated in FIG. 85B, the spike signal corresponding to the spike signal 52 is output from the antenna 79e.

As illustrated in FIG. 85C, a bandpass filter 79f is connected between the power amplifier 79d and the antenna 79e. The bandpass filter 79f allows only the components in a specific frequency band suitable for wireless communication to pass therethrough, among the spike signals 52. As illustrated in FIG. 85D, the signal corresponding to the specific frequency band is output from the antenna 79e, among the spike signals 52.

As illustrated in FIG. 85A to FIG. 85D, the spike signal 52 output from the electronic circuit 178 may be used for impulse communication.

[Variation 4 of the Tenth Embodiment]

Figure 86:
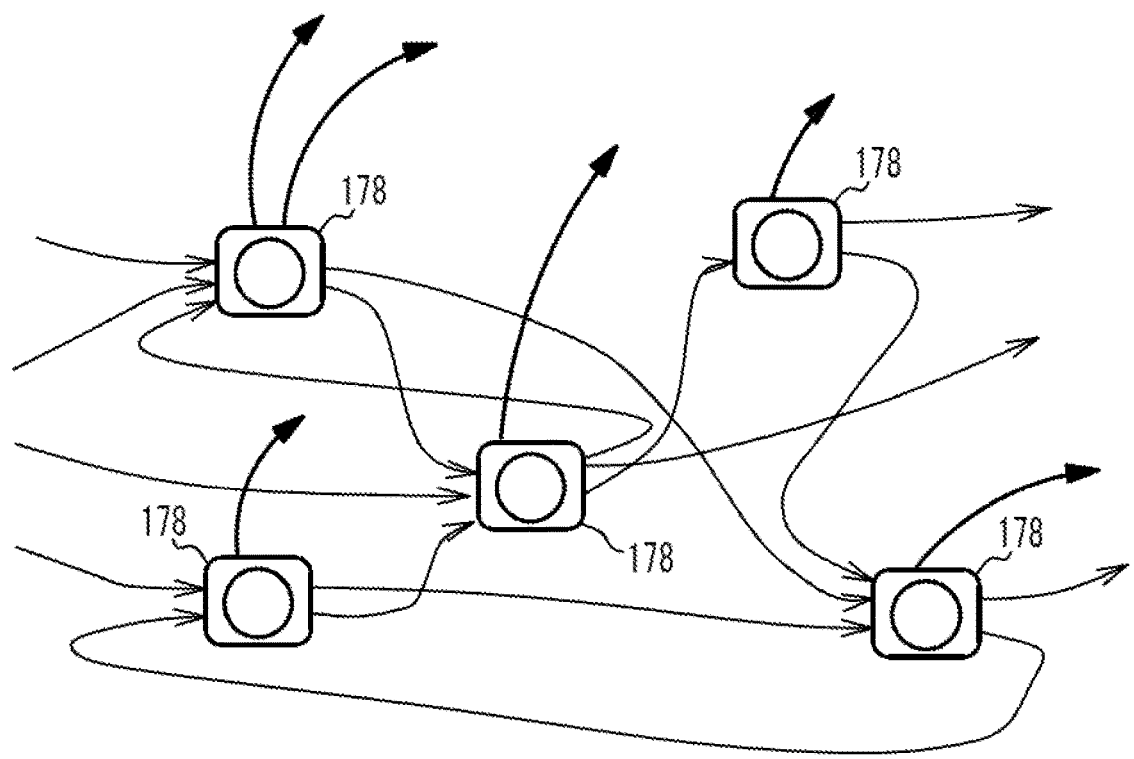
FIG. 86 is a schematic view of a network circuit in accordance with a variation 4 of the tenth embodiment.

FIG. 86 is a schematic view of a network circuit in accordance with a variation 4 of the tenth embodiment. The electronic circuit to which one or more spike signals are input and that outputs one or more spike signals and one or more bit signals as in the variation 4 of the tenth embodiment is indicated by the symbol illustrated in FIG. 82C. The spike signal is input to this electronic circuit from the left side, the electronic circuit outputs the spike signal to the right side, and outputs the bit signal to the upper side. As illustrated in FIG. 86, the electronic circuits 178 may be connected in a network form.

The present specification discloses the following technical features 30 to 43 conceived by the inventor.

[Technical Feature 30]

A spike generation circuit including:

an input circuit that varies a voltage of an intermediate node according to an amount of change in a voltage with respect to time in an input signal input to an input terminal; and an output circuit that outputs an isolated output spike signal to an output terminal and resets the voltage of the intermediate node in response to the voltage of the intermediate node becoming a threshold voltage, wherein the amount of change in the voltage with respect to time in the input signal varies with time, wherein the output circuit outputs the isolated output spike signal when the amount of change in the input signal with respect to time becomes within a predetermine range.

[Technical Feature 31+32]

A detector including:

a first switch that causes a first path, which has a first end and a second end between which a first current flows, to be electrically connected and disconnected;

a second switch that causes a second path, which has a third end and a fourth end between which a second current flows, to be electrically connected and disconnected, the second current being complementary to the first current, the third end being complementary to the first end, the fourth end being complementary to the second end; and a detection circuit that detects a direction in which the first current flows, based on a first voltage of the first path at a side closer to one of the first end and the second end than the first switch and a second voltage of the second path at a side closer to one end, which is complementary to the one of the first end and the second end, of the third end and the fourth end than the second switch in a disconnection time period during which the first switch disconnects the first path and the second switch disconnects the second path.

[Technical Feature 34]

A power conversion circuit includes:

the detector according to technical feature 31+32; and a switch element that controls on and off based on a detection result of the detector.

[Technical Feature 35]

A power conversion circuit including:

the detector according to technical feature 31+32; and a switch circuit that connects the second end to a first power supply terminal, disconnects the second end from a second power supply terminal, connects the fourth end to the second power supply terminal, and disconnects the fourth end from the first power supply terminal when the detector detects that the direction in which the first current flows is a first direction, and connects the second end to the second power supply terminal, disconnects the second end from the first power supply terminal, connects the fourth end to the first power supply terminal, and disconnects the fourth end from the second power supply terminal when the detector detects that the direction in which the first current flows is a second direction opposite to the first direction.

[Technical Feature 36]

An electronic circuit including:

one or more spike generation circuits that output an isolated spike signal with a high level or a low level to an output terminal and resets the internal state to an initial value when an internal state depending on a history of an input current input to an input terminal reaches a threshold value; and one or more memory circuits that maintain a level of a first output terminal at one of the high level and the low level when the one of the high level and the low level is input to a first input terminal, wherein the one or more memory circuits include a first memory circuit having the first output terminal coupled to an input terminal of a first spike generation circuit of the one or more spike generation circuits.

[Technical Feature 37]

The electronic circuit according to technical feature 36, wherein the one or more memory circuits include a second memory circuit having a first input terminal coupled to an output terminal of the first spike generation circuit.

[Technical Feature 38]

The electronic circuit according to technical feature 36 or 37, wherein the one or more memory circuits maintain a level of the first output terminal at the high level and a level of a second output terminal at the low level when the high level is input to the first input terminal, and maintain the level of the first output terminal at the low level and the level of the second output terminal at the high level when the high level is input to a second input terminal.

[Technical Feature 39]

The electronic circuit according to technical feature 38, wherein the one or more spike generation circuits include a second spike generation circuit having an input terminal coupled to a second output terminal of the first memory circuit.

[Technical Feature 40]

The electronic circuit according to technical feature 38 or 39, wherein the one or more memory circuits include a second memory circuit having the first input terminal coupled to an output terminal of the first spike generation circuit, and wherein the one or more spike generation circuits include a third spike generation circuit having an output terminal coupled to a second input terminal of the second memory circuit.

[Technical Feature 41]

The electronic circuit according to technical feature 38, wherein an output terminal of the first spike generation circuit is coupled to a second input terminal of the first memory circuit.

[Technical Feature 42]

The electronic circuit according to technical feature 41, further including: an element or circuit that has a first end coupled to a first output terminal of the first memory circuit and a second end coupled to an input terminal of the first spike generation circuit, and carries a current corresponding to a voltage difference between the first end and the second end, wherein the spike generation circuit outputs a spike signal when a value of integral of a current input to an input terminal reaches a threshold value.

[Technical Feature 43]

The electronic circuit according to any one of technical feature 36 to 42, further including: a combinational circuit having one or more input terminals and one or more output terminals, the high level or the low level being input to each of the one or more input terminals, the combinational circuit outputting the high level or the low level uniquely determined by inputs of the one or more input terminals to each of the one or more output terminals, a first output terminal of the first memory circuit being coupled to at least one of the one or more input terminals, an input terminal of the first spike generation circuit being coupled to at least one of the one or more output terminals.

Although preferred embodiments of the present invention have been described so far, the present invention is not limited to those particular embodiments, and various changes and modifications may be made to them within the scope of the invention claimed herein.

What is claimed is:

1. A spike generation circuit comprising:
   a first CMOS inverter connected between a first power supply and a second power supply, an output node of the first CMOS inverter being coupled to a first node that is an intermediate node coupled to an input terminal to which an input signal is input;
   a switch connected in series with the first CMOS inverter, between the first power supply and the second power supply;
   a first inverting circuit that outputs an inversion signal of a signal of the first node to a control terminal of the switch; and
   a delay circuit that delays the signal of the first node, outputs a delayed signal to an input node of the first CMOS inverter, and outputs an isolated output spike signal to an output terminal.

2. The spike generation circuit according to claim 1, wherein the first inverting circuit outputs the inversion signal of the signal of the first node to the control terminal of the switch and a second node, and
   wherein the delay circuit includes the first inverting circuit, and a second inverting circuit that outputs an inversion signal of a signal of the second node to the input node of the first CMOS inverter and a third node coupled to the output terminal.

3. The spike generation circuit according to claim 2, wherein the first inverting circuit includes an odd number of second CMOS inverters connected in an odd number of stages between the first node and the second node, an input node of each of the odd number of second CMOS inverters being coupled to the first node, an output node of each of the odd number of second CMOS inverters being coupled to the second node, and
   wherein the second inverting circuit includes an odd number of third CMOS inverters connected in an odd number of stages between the second node and the third node, an input node of each of the odd number of third CMOS inverters being coupled to the second node, an output node of each of the odd number of third CMOS inverters being coupled to the third node.

4. The spike generation circuit according to claim 3, wherein the second inverting circuit includes three or more odd number of third CMOS inverters.

5. The spike generation circuit according to claim 4, further comprising a first capacitance element having a first end coupled to a fourth node and a second end coupled to a first reference potential terminal, the fourth node being between any adjacent two of the three or more third CMOS inverters.

6. The spike generation circuit according to claim 5, wherein a capacitance value of the first capacitance element is equal to or greater than a gate capacitance value of one FET in the three or more third CMOS inverters.

7. The spike generation circuit according to claim 1, further comprising a second capacitance element having a first end coupled to the first node and a second end coupled to a second reference potential terminal.

8. The spike generation circuit according to claim 1,
wherein a voltage of the second power supply is higher than a voltage of the first power supply, and
wherein the switch is an N-channel transistor and is connected between the first node and the first power supply, or the switch is a P-channel transistor and is connected between the first node and the second power supply.

9. The spike generation circuit according to claim 1, further comprising a voltage conversion circuit that is provided between the input terminal and the intermediate terminal and outputs, to the intermediate node, a signal obtained by converting a voltage of the input signal,
wherein the delay circuit does not output the isolated output spike signal when the voltage of the input signal is within a predetermined range.

10. The spike generation circuit according to claim 1, further comprising a time constant circuit that is provided between the input terminal and the intermediate node and increases a time constant of a rise of the input signal, and outputs a resulting signal to the intermediate node,
wherein the delay circuit outputs the isolated output spike signal after a delay time relating to a time constant of the time constant circuit after the input signal is input.

11. The spike generation circuit according to claim 1, further comprising an input circuit that is provided between the input terminal and the intermediate node and increases or decreases a voltage of the intermediate node when an input spike signal is input as the input signal,
wherein the delay circuit outputs the isolated output spike signal when a frequency with which the input spike signal is input becomes within a predetermined range.

12. The spike generation circuit according to claim 1, further comprising an input circuit that is provided between the input terminal and the intermediate node and varies a voltage of the intermediate node according to an amount of change in the input signal with respect to time,
wherein the delay circuit outputs the isolated output spike signal when the amount of change in the input signal with respect to time becomes within a predetermined range.

13. An information processing circuit comprising:
the spike generation circuit according to claim 1;
a condition setting circuit that processes an input signal and outputs a processed signal to the spike generation circuit to set a condition for the spike generation circuit to output the isolated output spike signal; and
a spike processing circuit that processes the isolated output spike signal output by the spike generation circuit.

14. A power conversion circuit comprising:
a switch element; and
a control circuit that includes the spike generation circuit according to claim 1, and controls on and off of the switch element.

15. A spike generation circuit comprising:
a first CMOS inverter connected between a first power supply and a second power supply, an output node of the first CMOS inverter being coupled to a first node;
a first switch connected in series with the first CMOS inverter, between the first power supply and the second power supply;
an inverting circuit that outputs an inversion signal of a signal of the first node to a control terminal of the first switch;
a delay circuit that delays the signal of the first node, outputs a delayed signal to an input node of the first CMOS inverter, and outputs an isolated outputs spike signal to an output terminal; and
an intermediate node provided in the inverting circuit and coupled to an input terminal to which an input signal is input.

16. The spike generation circuit according to claim 15,
wherein the first CMOS inverter outputs a first level, which is one of a high level and a low level, and outputs a second level, which is the other of the high level and the low level,
wherein the first switch is turned on when the first level is input to a control terminal, and turned off when the second level is input to the control terminal,
wherein the inverting circuit includes a first inverting circuit and a second inverting circuit, the first inverting circuit being configured to output the first level to the control terminal of the first switch when the first node changes from the first level to the second level, the second inverting circuit being configured to output the second level to the control terminal of the first switch when an output of the delay circuit becomes the second level, and
wherein the intermediate node is provided in the second inverting circuit.

17. The spike generation circuit according to claim 16, wherein the second inverting circuit includes a second switch that has a control terminal coupled to an output of the delay circuit and connects the intermediate node to a power supply, to which an initial level of the input signal is supplied, when the delay circuit outputs the second level.

18. The spike generation circuit according to claim 17, wherein the first inverting circuit includes a third switch that has a control terminal coupled to the first node and connects the control terminal of the first switch to a power supply, to which the first level is supplied, when the first node becomes at the second level.

19. The spike generation circuit according to claim 16, further comprising a fourth switch that has a control terminal coupled to the control terminal of the first switch and connects the first node to a power supply, to which the first level is supplied, when the control terminal of the first switch is at the second level.

20. The spike generation circuit according to claim 15, further comprising a second CMOS inverter having an input node coupled to the intermediate node and an output node coupled to the control terminal of the first switch.

21. The spike generation circuit according to claim 15, further comprising a voltage conversion circuit that is provided between the input terminal and the intermediate terminal and outputs, to the intermediate node, a signal obtained by converting a voltage of the input signal,
wherein the delay circuit does not output the isolated output spike signal when the voltage of the input signal is within a predetermined range.

22. The spike generation circuit according to claim 15, further comprising a time constant circuit that is provided between the input terminal and the intermediate node and increases a time constant of a rise of the input signal, and outputs a resulting signal to the intermediate node,
wherein the delay circuit outputs the isolated output spike signal after a delay time relating to a time constant of the time constant circuit after the input signal is input.

23. The spike generation circuit according to claim 15, further comprising an input circuit that is provided between the input terminal and the intermediate node and increases or decreases a voltage of the intermediate node when an input spike signal is input as the input signal,
wherein the delay circuit outputs the isolated output spike signal when a frequency with which the input spike signal is input becomes within a predetermined range.

24. The spike generation circuit according to claim 15, further comprising an input circuit that is provided between the input terminal and the intermediate node and varies a voltage of the intermediate node according to an amount of change in the input signal with respect to time,
wherein the delay circuit outputs the isolated output spike signal when the amount of change in the input signal with respect to time becomes within a predetermined range.

25. An information processing circuit comprising:
the spike generation circuit according to claim 15;
a condition setting circuit that processes an input signal and outputs a processed signal to the spike generation circuit to set a condition for the spike generation circuit to output the isolated output spike signal; and
a spike processing circuit that processes the isolated output spike signal output by the spike generation circuit.

26. A power conversion circuit comprising:
a switch element; and
a control circuit that includes the spike generation circuit according to claim 15, and controls on and off of the switch element.

27. A spike generation circuit comprising:
a first CMOS inverter connected between a first power supply and a second power supply, an output node of the first CMOS inverter being coupled to a first node that is an intermediate node coupled to an input terminal to which an input signal is input;
a capacitance element having a first end coupled to the first node and a second end coupled to a reference potential terminal, an electric charge by the input signal being accumulated in the capacitance element; and
a delay circuit that includes an even number of second CMOS inverters connected in an even number of stages between the first node and an output terminal, an input node of each of the even number of second CMOS inverters being coupled to the first node, an output node of each of the even number of second CMOS inverters being coupled to the output terminal, the delay circuit outputting an isolated output spike signal to the output terminal by outputting a signal to reset a charge accumulated in the capacitance element to an input node of the first CMOS inverter to cause a voltage of the first node to fall when the voltage of the first node becomes a predetermined value,
wherein the even number of second CMOS inverters are six or more even number of second CMOS inverters.

28. The spike generation circuit according to claim 27, further comprising a voltage conversion circuit that is provided between the input terminal and the intermediate terminal and outputs, to the intermediate node, a signal obtained by converting a voltage of the input signal,
wherein the delay circuit does not output the isolated output spike signal when the voltage of the input signal is within a predetermined range.

29. The spike generation circuit according to claim 27, further comprising a time constant circuit that is provided between the input terminal and the intermediate node and increases a time constant of a rise of the input signal, and outputs a resulting signal to the intermediate node,
wherein the delay circuit outputs the isolated output spike signal after a delay time relating to a time constant of the time constant circuit after the input signal is input.

30. The spike generation circuit according to claim 27, further comprising an input circuit that is provided between the input terminal and the intermediate node and increases or decreases a voltage of the intermediate node when an input spike signal is input as the input signal,
wherein the delay circuit outputs the isolated output spike signal when a frequency with which the input spike signal is input becomes within a predetermined range.

31. The spike generation circuit according to claim 27, further comprising an input circuit that is provided between the input terminal and the intermediate node and varies a voltage of the intermediate node according to an amount of change in the input signal with respect to time,
wherein the delay circuit outputs the isolated output spike signal when the amount of change in the input signal with respect to time becomes within a predetermined range.

32. An information processing circuit comprising:
the spike generation circuit according to claim 27;
a condition setting circuit that processes an input signal and outputs a processed signal to the spike generation circuit to set a condition for the spike generation circuit to output the isolated output spike signal; and
a spike processing circuit that processes the isolated output spike signal output by the spike generation circuit.

33. A power conversion circuit comprising:
a switch element; and
a control circuit that includes the spike generation circuit according to claim 27, and controls on and off of the switch element.

34. A spike generation circuit comprising:
a first CMOS inverter connected between a first power supply and a second power supply, an output node of the first CMOS inverter being coupled to a first node that is an intermediate node coupled to an input terminal to which an input signal is input;
a capacitance element having a first end coupled to the first node and a second end coupled to a reference potential terminal, an electric charge by the input signal being accumulated in the capacitance element;
a delay circuit that includes an even number of second CMOS inverters connected in an even number of stages between the first node and an output terminal, an input node of each of the even number of second CMOS inverters being coupled to the first node, an output node of each of the even number of second CMOS inverters being coupled to the output terminal, the delay circuit outputting an isolated output spike signal to the output terminal by outputting a signal to reset a charge accumulated in the capacitance element to an input node of the first CMOS inverter to cause a voltage of the first node to fall when the voltage of the first node becomes a predetermined value; and
a switch that is connected in series with the first CMOS inverter between the first power supply and the second power supply and includes a control terminal to which a signal of an output node of an odd-numbered second CMOS inverter from the first node among the even number of second CMOS inverters is input.

35. A spike generation circuit comprising:
a time constant circuit that includes a capacitor, which has a first end coupled to an output node and a second end coupled to a first reference potential terminal, and a constant current element or constant current circuit, which has a first end coupled to an input terminal to which an input signal of which a voltage depends on time is input and a second end coupled to the output node and generates a constant current corresponding to a voltage difference between the first end and the second end, the time constant circuit increasing a time constant of a rise of the input signal, and outputting a resulting signal to an intermediate node from the output node; and
an output circuit that outputs an isolated output spike signal to an output terminal and resets a voltage of the intermediate node in response to the voltage of the intermediate node becoming a threshold voltage,
wherein the output circuit outputs the isolated output spike signal after a delay time relating to a time constant of the time constant circuit after the input signal is input, and
wherein the constant current element or constant current circuit includes a diode connected in a backward direction or a transistor having a control terminal to which a voltage is applied so that the transistor is in an on-state.

36. A spike generation circuit comprising:
a time constant circuit that includes a capacitor, which has a first end coupled to an output node and a second end coupled to a first reference potential terminal, and a constant current circuit, which has a first end coupled to an input terminal to which an input signal of which a voltage depends on time is input and a second end coupled to the output node and generates a constant current corresponding to a voltage difference between the first end and the second end, the time constant circuit increasing a time constant of a rise of the input signal, and outputting a resulting signal to an intermediate node from the output node; and
an output circuit that outputs an isolated output spike signal to an output terminal and resets a voltage of the intermediate node in response to the voltage of the intermediate node becoming a threshold voltage,
wherein the constant current circuit is a current mirror circuit including:
a first transistor having a current input terminal and a current output terminal, one of the current input terminal and the current output terminal being coupled to the input terminal, the other of the current input terminal and the current output terminal being coupled to the output node, and
a second transistor having a current input terminal, a current output terminal, and a control terminal, one of the current input terminal and the current output terminal being coupled to the input terminal through a first diode connected in a forward direction, the other of the current input terminal and the current output terminal being coupled to a second reference potential terminal through a second diode connected in a backward direction, the control terminal being coupled to a control terminal of the first transistor.

37. A spike generation circuit comprising:
a capacitor having a first end coupled to an intermediate node and a second end coupled to a first reference potential terminal;
a voltage conversion circuit that includes a first element and a second element connected in series between an input terminal, to which an input signal of which a voltage depends on time is input, and a second reference potential terminal, and a resistance element having a first end coupled to a node, which is between the first element and the second element, and a second end coupled to the intermediate node, and outputs, to the intermediate node, a signal obtained by dividing a voltage of the input signal by the first element and the second element; and
an output circuit that outputs an isolated output spike signal to an output terminal and resets a voltage of the intermediate node in response to the voltage of the intermediate node becoming a threshold voltage,
wherein a product of a resistance value of the resistance element and a capacitance value of the capacitor is greater than a width of the isolated output spike signal.

38. The spike generation circuit according to claim 37, wherein
the first element is one of a resistor, a diode, and a transistor, and the second element is one of a resistor, a diode, and a transistor.

* * * * *